(12) United States Patent
Papageorgiou et al.

(10) Patent No.: US 11,404,106 B2
(45) Date of Patent: Aug. 2, 2022

(54) READ ONLY MEMORY ARCHITECTURE FOR ANALOG MATRIX OPERATIONS

(71) Applicant: Robert Bosch GmbH, Stuttgart (DE)

(72) Inventors: Efthymios Papageorgiou, Sunnyvale, CA (US); Kenneth Wojciechowski, Sunnyvale, CA (US); Sayyed Mahdi Kashmiri, Sunnyvale, CA (US)

(73) Assignee: ROBERT BOSCH GMBH

( * ) Notice: Subject to any disclaimer, the term of this patent is extended or adjusted under 35 U.S.C. 154(b) by 0 days.

(21) Appl. No.: 16/940,115

(22) Filed: Jul. 27, 2020

(65) Prior Publication Data
US 2022/0028444 A1    Jan. 27, 2022

(51) Int. Cl.
| | | |
|---|---|---|
| G11C 11/40 | (2006.01) | |
| G11C 11/408 | (2006.01) | |
| G11C 11/4094 | (2006.01) | |
| G06N 3/063 | (2006.01) | |
| G11C 5/06 | (2006.01) | |
| G11C 5/05 | (2006.01) | |
| G06N 3/08 | (2006.01) | |

(52) U.S. Cl.
CPC .......... *G11C 11/4085* (2013.01); *G06N 3/063* (2013.01); *G06N 3/08* (2013.01); *G11C 5/05* (2013.01); *G11C 5/06* (2013.01); *G11C 11/4094* (2013.01)

(58) Field of Classification Search
CPC ...... G06N 3/063; G06N 3/08; G11C 11/4085; G11C 5/05; G11C 5/06; G11C 11/4094
See application file for complete search history.

(56) References Cited

U.S. PATENT DOCUMENTS 5,247,206 A * 9/1993 Castro .................... G06N 3/063
706/35
2016/0343452 A1* 11/2016 Ikeda .................. H01L 27/1255
(Continued)

FOREIGN PATENT DOCUMENTS

CN        110491847 A  * 11/2019

OTHER PUBLICATIONS

E. Leobandung, M. J. Rasch and Y. Li, "Synchronized Analog Capacitor Arrays for Parallel Convolutional Neural Network Training," 2020 IEEE 63rd International Midwest Symposium on Circuits and Systems (MWSCAS), Springfield, MA, USA, 2020, pp. 387-390, doi: 10.1109/MWSCAS48704.2020.9184482. (Year: 2020).*
(Continued)

*Primary Examiner* — Ajay Ojha
(74) *Attorney, Agent, or Firm* — Dickinson Wright PLLC

(57) ABSTRACT

A read-only memory (ROM) computing unit utilized in matrix operations of a neural network comprising a unit element including one or more connections, wherein a weight associated with the computing unit is responsive to either a connection or lack of connection internal to the unit cell or between the unit element and a wordline and a bitline utilized to form an array of rows and columns in the ROM computing unit, and one or more passive or active electrical elements located in the unit element, wherein the passive or active electrical elements are configured to adjust the weight associated with the compute unit, wherein the ROM computing unit is configured to receive an input and output a value associated with the matrix operation, wherein the value is responsive to the input and weight.

20 Claims, 69 Drawing Sheets

(56) References Cited

U.S. PATENT DOCUMENTS

| | | | |
|---|---|---|---|
| 2020/0035305 A1* | 1/2020 | Choi | G06N 3/063 |
| 2020/0356488 A1* | 11/2020 | Malladi | G06F 12/0879 |
| 2020/0356847 A1* | 11/2020 | Yi | G06F 17/15 |
| 2020/0372331 A1* | 11/2020 | Chang | G06N 3/0635 |

OTHER PUBLICATIONS

J. Schemmel, F. Shurmann, S. Hohmann and K. Meier, "An integrated mixed-mode neural network architecture for megasynapse ANNs," Proceedings of the 2002 International Joint Conference on Neural Networks. Honolulu, HI, USA, 2002, pp. 2704-2709 vol. 3, doi: 10.1109/IJCNN.2002. (Year: 2002).*
Sze, Vivienne et al. "Hardware for Machine Learning: Challenges and Opportunities." 2017 IEEE Custom Integrated Circuits Conference (CICC), 2017, 8 pages.
S. Bai, J. Kolter, and V. Koltun, "Deep equilibrium models," in Neural Information Processing Systems, 2019, 12 pages.
S. Bai, J. Kolter, V. Koltun, D Willmott, "Multiscale Deep Equilibrium Models", submitted for publication in the Proceedings of the International Conference on Machine Learning 2020, 10 pages.
Website for Wikipedia "Root-Finding Algorithms", https://en.wikipedia.org/wiki/Root-finding_algorithms, Downloaded Dec. 4, 2020, 9 pages.
Website for Wikipedia "Broydens Method", https://en.wikipedia.org/wiki/Broyden%27s_method, Downloaded: Dec. 4, 2020, 4 pages.
Charles G Broyden, "A class of methods for solving nonlinear simultaneous equations. Mathematics of Computation," 1965, 17 pages.
Website for Wikipedia "Fabric Computing", https://en.wikipedia.org/wiki/Fabric_computing, Downloaded: Dec. 4, 2020, 3 pages.
Y. Chen, T. Yang, J. Emer and V. Sze, "Eyeriss v2: A Flexible Accelerator for Emerging Deep Neural Networks on Mobile Devices," in IEEE Journal on Emerging and Selected Topics in Circuits and Systems, vol. 9, No. 2, pp. 292-308, Jun. 2019, doi: 10.1109/JETCAS.2019.2910232, 17 pages.
D. Bankman, L. Yang, B. Moons, M. Verheist and B. Murmann, "An Always-On 3.8 µJ/86% CIFAR-10 Mixed-Signal Binary CNN Processor With All Memory on Chip in 28-nm CMOS," in IEEE Journal of Solid-State Circuits, vol. 54, No. 1, Jan. 2019, 15 pages.
N. Verma et al., "In-Memory Computing: Advances and Prospects," in IEEE Solid-State Circuits Magazine, vol. 11, No. 3, pp. 43-55, Summer 2019, doi: 10.1109/MSSC.2019.2922889, 13 pages.
E. A. Vittoz, "Future of analog in the VLSI environment," ISCAS 1990, 4 pages.
Y. P. Tsividis and D. Anastassiou, "Switched-capacitor neural networks," in Electronics Letters, vol. 23, No. 18, pp. 958-959, Aug. 27, 1987, 2 pages.
Website for Wikipedia "Rectifier (Neural Networks)", https://en.wikipedia.org/wiki/Rectifier_(neural_networks), Downloaded: Dec. 4, 2020, 5 pages.
Website for Wikipedia "Asynchronous Circuit", https://en.wikipedia.org/wiki/Asynchronous_circuit, Downloaded: Dec. 4, 2020, 11 pages.
Website for Wikipedia "Signal-Flow Graph", https://en.wikipedia.org/wiki/Signal-flow_graph#Nonlinear_flow_graphs, Downloaded: Dec. 4, 2020, 18 pages.
S. Ioffe and C. Szegedy, "Batch Normalization: Accelerating Deep Network Training by Reducing Internal Covariate Shift," arXiv:1502.03167 [cs], Mar. 2015, Accessed: May 28, 2020, 11 pages.
H. Wu and X. Gu, "Max-Pooling Dropout for Regularization of Convolutional Neural Networks," in Neural Information Processing, vol. 9489, S. Arik, T. Huang, W. K. Lai, and Q. Liu, Eds. Cham: Springer International Publishing, 2015, 9 pages.
N. P. Jouppi et al., "In-Datacenter Performance Analysis of a Tensor Processing Unit,"arXiv: 1704.04760 [cs], Apr. 2017, Accessed: May 28, 2020, 12 pages.
Y.-H. Chen, T. Krishna, J. S. Emer, and V. Sze, "Eyeriss: An Energy-Efficient Reconfigurable Accelerator for Deep Convolutional Neural Networks," IEEE Journal of Solid-State Circuits, vol. 52, No. 1, pp. 127-138, Jan. 2017, doi 10.1109/JSSC.2016.2616357, 12 pages.
Y.-H. Chen, T.-J. Yang, J. Emer, and V. Sze, "Eyeriss v2: A Flexible Accelerator for Emerging Deep Neural Networks on Mobile Devices," Jul. 2018, Accessed: Feb. 10, 2020, 17 pages.
X. Si et al., "24.5 A Twin-8T SRAM Computation-In-Memory Macro for Multiple-Bit CNNBased Machine Learning," in 2019 IEEE International Solid-State Circuits Conference—(ISSCC), Feb. 2019, pp. 396-398, doi: 10.1109/ISSCC.2019.8662392, 3 pages.
C.-X. Xue et al., "24.1 A 1Mb Multibit ReRAM Computing-In-Memory Macro with 14.6ns Parallel MAC Computing Time for CNN Based AI Edge Processors," in 2019 IEEE International Solid-State Circuits Conference—(ISSCC), San Francisco, CA, USA, Feb. 2019, pp. 388-390, doi: 10.1109/ISSCC.2019.8662395, 3 pages.
Q. Dong et al., "15.3 A 351TOPS/W and 372.4GOPS Compute-in-Memory SRAM Macro in 7nm FinFET CMOS for Machine-Learning Applications," in 2020 IEEE International Solid-State Circuits Conference—(ISSCC), Feb. 2020, pp. 242-244, doi: 10.1109/ISSCC19947.2020.9062985, 3 pages.
H. Valavi, P. J. Ramadge, E. Nestler, and N. Verma, "A Mixed-Signal Binarized Convolutional-Neural-Network Accelerator Integrating Dense Weight Storage and Multiplication for Reduced Data Movement," in 2018 IEEE Symposium on VLSI Circuits, Jun. 2018, pp. 141-142, doi: 10.1109/VLSIC.2018.8502421, 2 pages.
H. Valavi, P. J. Ramadge, E. Nestler, and N. Verma, "A 64-Tile 2.4-Mb In-Memory-Computing CNN Accelerator Employing Charge-Domain Compute," IEEE Journal of Solid-State Circuits, vol. 54, No. 6, pp. 1789-1799, Jun. 2019, doi: 10.1109/JSSC.2019.2899730.
S. Mittal, "A Survey of ReRAM-Based Architectures for Processing-In-Memory and Neural Networks," Make, vol. 1, No. 1, pp. 75-114, Apr. 2018, doi: 10.3390/make1010005, 40 pages.
R. Mochida et al., "A 4M Synapses integrated Analog ReRAM based 66.5 TOPS/W Neural-Network Processor with Cell Current Controlled Writing and Flexible Network Architecture," in 2018 IEEE Symposium on VLSI Technology, Jun. 2018, pp. 175-176, doi: 10.1109/VLSIT.2018.8510676, 2 pages.
C.-X. Xue et al., "24.1 A 1Mb Multibit ReRAM Computing-In-Memory Macro with 14.6ns Parallel MAC Computing Time for CNN Based AI Edge Processors," in 2019 IEEE International Solid-State Circuits Conference—(ISSCC), San Francisco, CA, USA, Feb. 2019, pp. 388-390, doi: 10.1109/ISSCC.2019.8662395.
A. Sebastian et al., "Computational memory-based inference and training of deep neural networks," in 2019 Symposium on VLSI Technology, Jun. 2019, pp. T168-T169, doi: 10.23919/VLSIT.2019.8776518, 2 pages.
Y. Pan et al., "A Multilevel Cell STT-MRAM-Based Computing In-Memory Accelerator for Binary Convolutional Neural Network," IEEE Transactions on Magnetics, vol. 54, No. 11, pp. 1-5, Nov. 2018, doi: 10.1109/TMAG.2018.2848625, 5 pages.
A. D. Patil, H. Hua, S. Gonugondla, M. Kang, and N. R. Shanbhag, "An MRAM-Based Deep In-Memory Architecture for Deep Neural Networks," in 2019 IEEE International Symposium on Circuits and Systems (ISCAS), May 2019, pp. 1-5, doi: 10.1109/ISCAS.2019.8702206, 5 pages.
D. Reis, M. Niemier, and X. S. Hu, "Computing in memory with FeFETs," in Proceedings of the International Symposium on Low Power Electronics and Design, Seattle, Wa, USA, Jul. 2018, pp. 1-6, doi 10.1145/3218603.3218640, 6 pages.
L. Fick, D. Blaauw, D. Sylvester, S. Skrzyniarz, M. Parikh, and D. Fick, "Analog in-memory subthreshold deep neural network accelerator," in 2017 IEEE Custom Integrated Circuits Conference (CICC), Apr. 2017, pp. 1-4, doi: 10.1109/CICC.2017.7993629, 4 pages.
R. Han et al., "A Novel Convolution Computing Paradigm Based on NOR Flash Array With High Computing Speed and Energy Efficiency," IEEE Transactions on Circuits and Systems 1: Regular Papers, vol. 66, No. 5, pp. 1692-1703, May 2019, doi: 10.1109/TCSI.2018.2885574, 12 pages.
M. Donato, L. Pentecost, D. Brooks, and G.-Y. Wei, "MEMTI: Optimizing On-Chip Nonvolatile Storage for Visual Multitask Infer-

(56) References Cited

OTHER PUBLICATIONS ence at the Edge," IEEE Micro, vol. 39, No. 6, pp. 73-81, Nov. 2019, doi: 10.1109/MM.2019.2944782, 9 pages.

Hsinyu Tsai, et al., "Recent progress in analog memory-based accelerators for deep learning," Journal of Physics D Applied Physics, vol. 51, No. 28, 2018, 28 pages.

W. Haensch, et al., "The Next Generation of Deep Learning Hardware: Analog Computing," Proceedings of IEEE, vol. 107. Jan. 2019, 15 pages.

M. Perrot, "Making Better Use of Time in Mixed Signal Circuits," 6th IEEE Dallas Circuits and Systems Workshop on System-on-Chip, 2007, 8 pages.

A. Keshavarzi, W. van der Hoek, "Edge Intelligence—On the Challenging Road to a Trillion Smart Connected IoT Devices," IEEE Design & Test Journal, vol. 36, Issue: 2, Apr. 2019, 24 pages.

M. Kang, et al., "An energy-efficient VLSI architecture for pattern recognition via deep embedding of computation in SRAM," IEEE International Conference on Acoustics, Speech and Signal (ICASSP) 2014, 5 pages.

D. Bankman et al., "RRAM-Based In-Memory Computing for Embedded Deep Neural Networks," 53rd Asilomar Conference on Signals, Systems, and Computers, 2019, 5 pages.

S. Gopal, et al., "A Spatial Multi-Bit Sub-1-V Time-Domain Matrix Multiplier Interface for Approximate Computing in 65-nm CMOS," IEEE Journal on Emerging and Selected Topics in Circuits and Systems vol. 8, Issue: 3, Sep. 2018, 13 pages.

J. Zhang et al., "In-Memory Computation of a Machine-Learning Classifier in a Standard 6T SRAM Array," IEEE Journal of Solid-State Circuits, vol. 52, Issue: 4, Apr. 2017, 10 pages.

H. Valavi et al., "A 64-Tile 2.4-Mb In-Memory-Computing CNN Accelerator Employing Charge-Domain Compute," IEEE Journal of Solid-State Circuits, vol. 54, Issue: 6, Jun. 2019, 11 pages.

L. Fick, et al., "Analog In-Memory Subthreshold Deep Neural Network Accelerator," IEEE Custom Integrated Circuits Conference—CICC, 2017, 4 pages.

Y. Du, et al., "An Analog Neural Network Computing Engine Using CMOS-Compatible Charge-Trap-Transistor (CTT)," IEEE Transactions on Computer-Aided Design of Integrated Circuits and Systems, vol. 38, Issue: 10, Oct. 2019, 9 pages.

M.R. Mahmoodi, et al., "An Ultra-Low Energy Internally Analog, Externally Digital Vector-Matrix Multiplier Based on NOR Flash Memory Technology," 55th ACM/ESDA/IEEE Design Automation Conference (DAC), 2018, 6 pages.

R. Chawla, et al., "A 531 nW/MHz, 128x32 Current-Mode Programmable Analog Vector-Matrix Multiplier with Over Two Decades of Linearity," IEEE Custom Integrated Circuits Conference—CICC, 2004, 4 pages.

A. Aziz, et al., "Computing with Ferroelectric FETs: Devices, Models, Systems, and Applications," Design, Automation & Test in Europe Conference & Exhibition—DATE, 2018, 10 pages.

X. Chen, et al., "Design and Optimization of FeFET-based Crossbars for Binary Convolution Neural Networks," Design, Automation & Test in Europe Conference & Exhibition—DATE, 2018, 6 pages.

\* cited by examiner

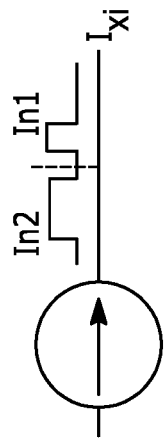 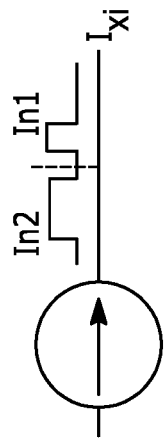 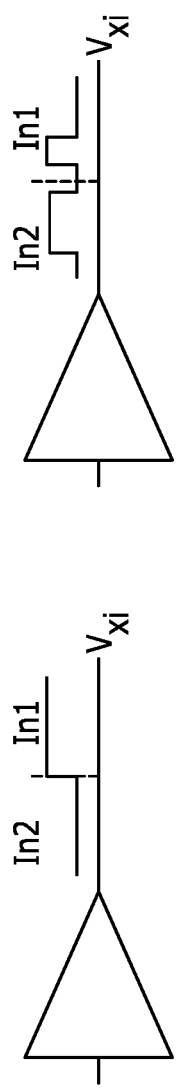 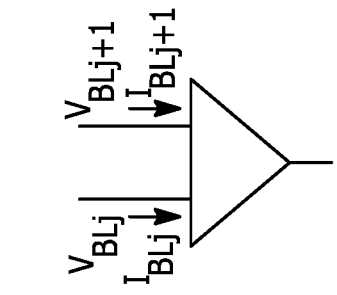 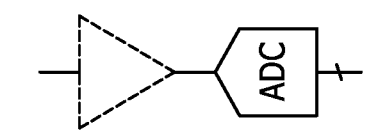 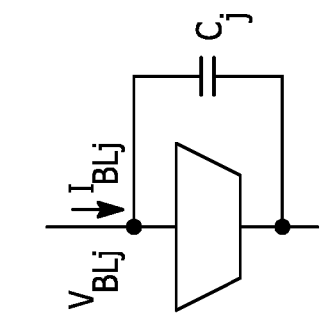 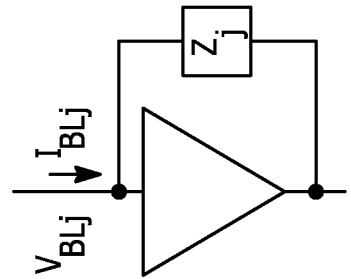
FIG. 18a
FIG. 18b
FIG. 18c
FIG. 18d
FIG. 18e
FIG. 18f
FIG. 18g
FIG. 18h

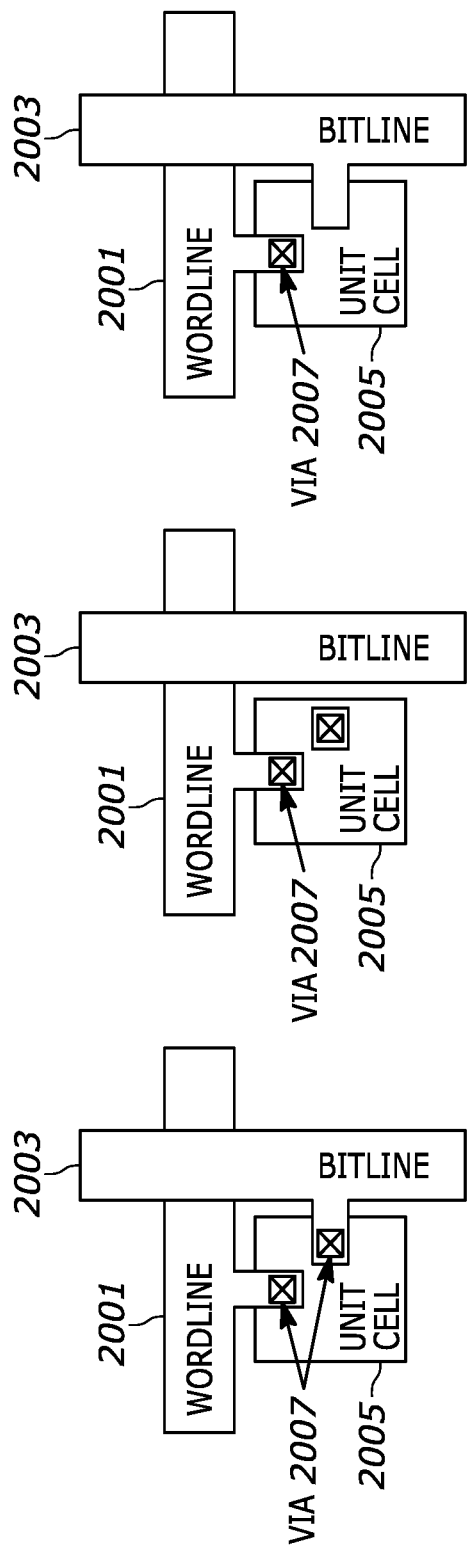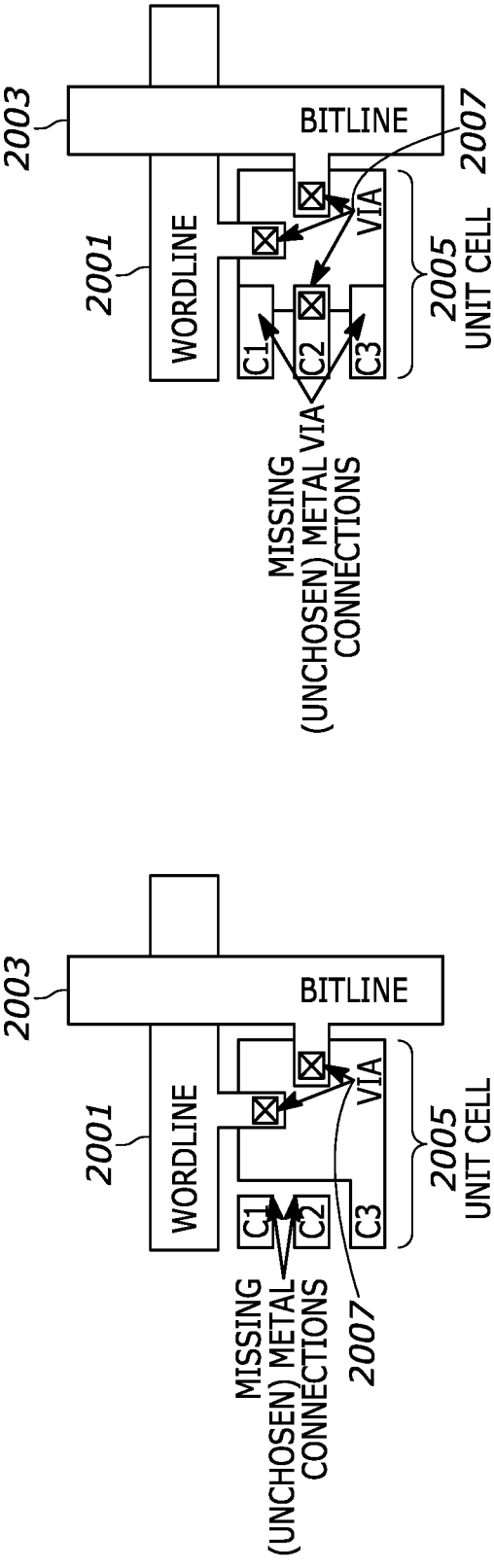

OMITTED UNIT CELLS

DIFFERENTIAL COLUMNS

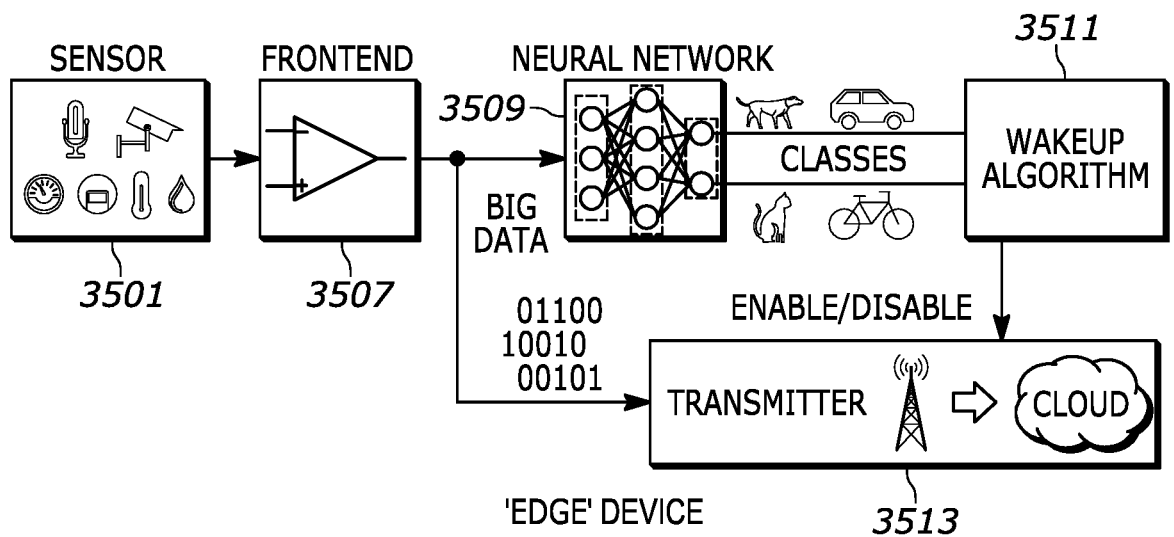
FIG. 35a
$$[Y_1\ Y_2\ Y_3\ Y_4] = [X_1\ X_2\ X_3] \times \begin{bmatrix} W_{11} & W_{12} & W_{13} & W_{14} \\ W_{21} & W_{22} & W_{23} & W_{24} \\ W_{32} & W_{32} & W_{33} & W_{34} \end{bmatrix}$$
FIG. 35b
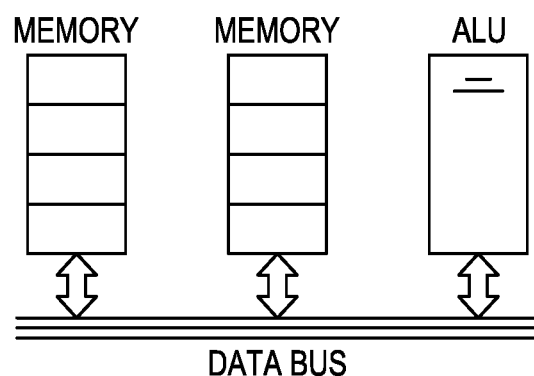
FIG. 35c

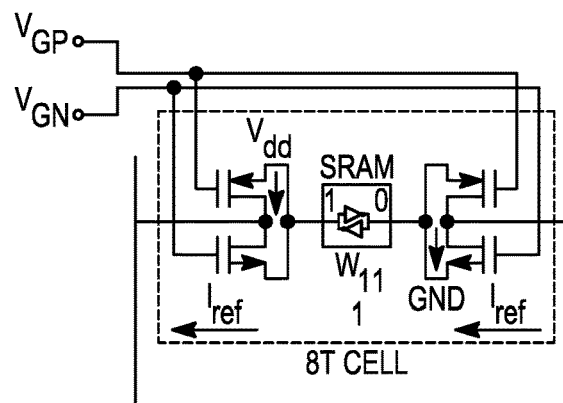
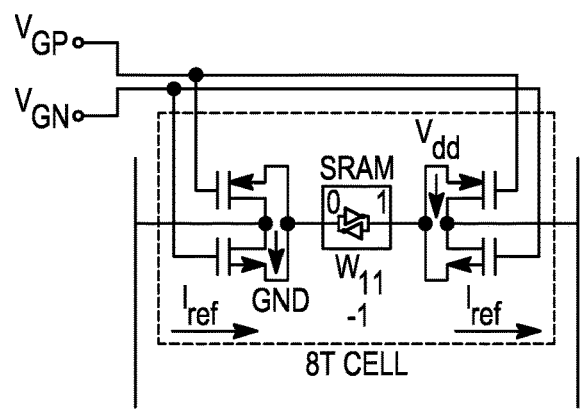
BALANCED CHARGING POLARITY WITH 8T CELL
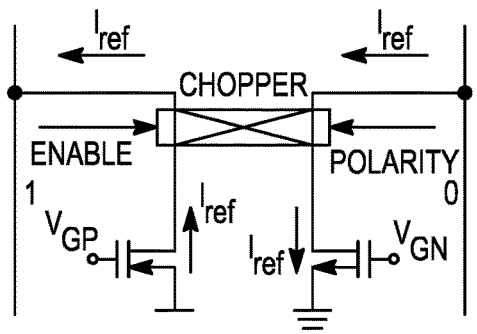
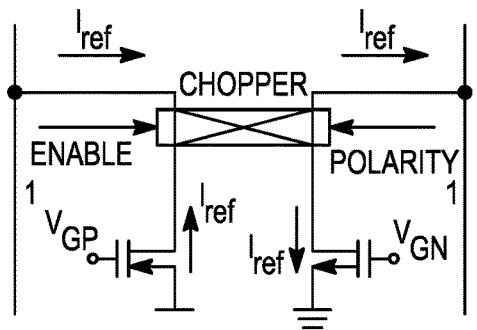
BALANCED DISCHARGING POLARITY WITH CHOPPER
FIG. 42b

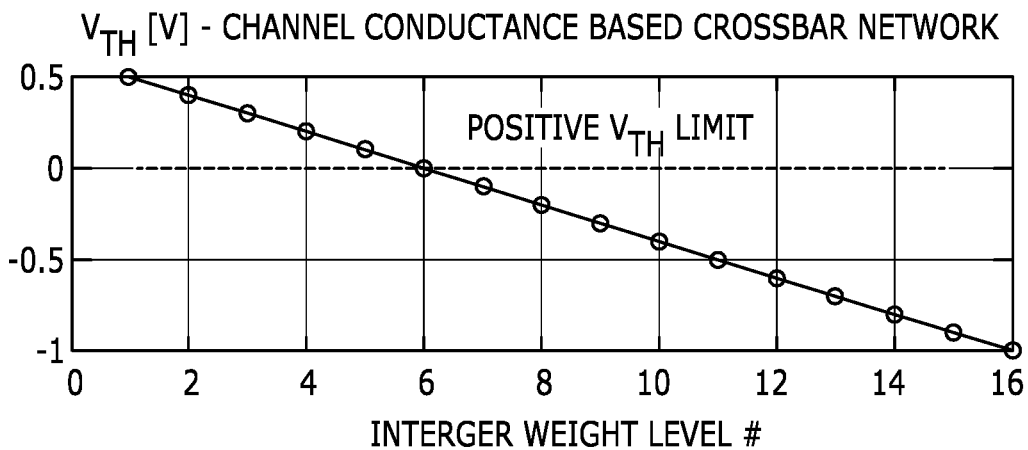
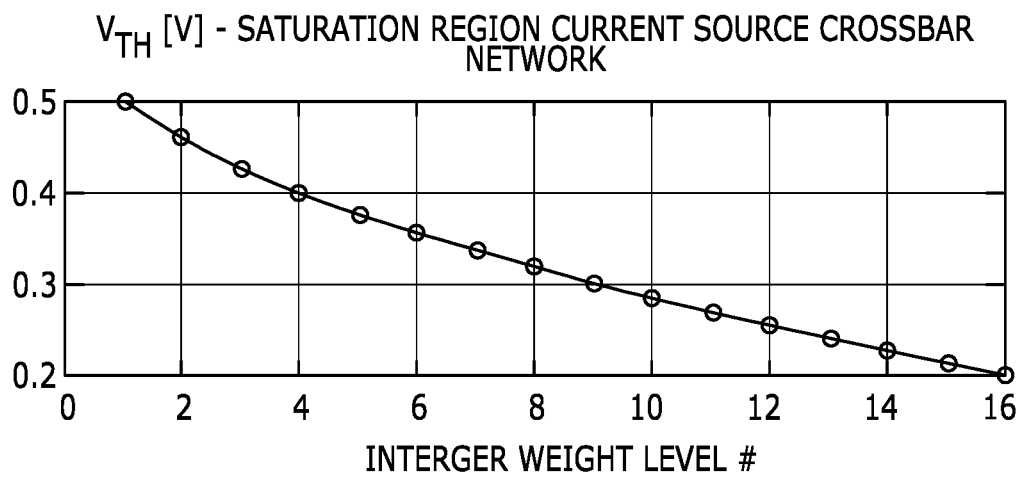
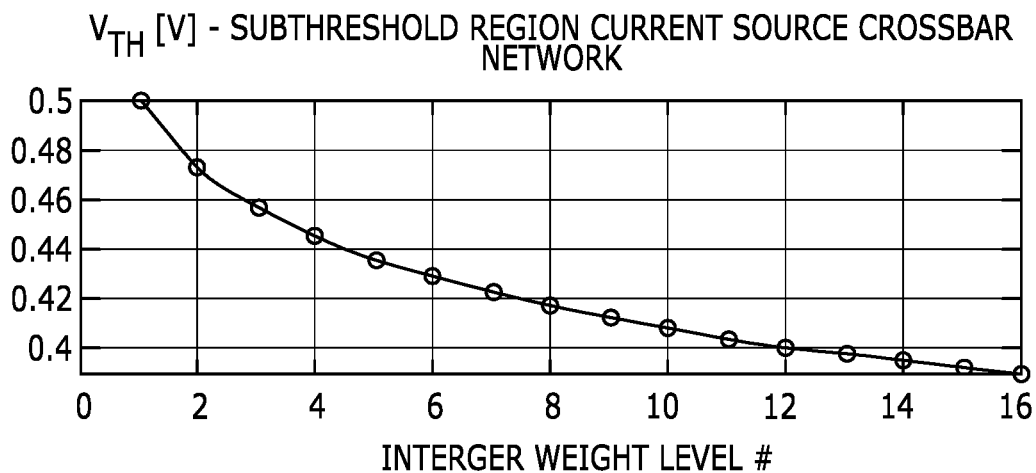
FIG. 47

READ ONLY MEMORY ARCHITECTURE FOR ANALOG MATRIX OPERATIONS

TECHNICAL FIELD

The present disclosure relates to computer systems that have capability for artificial intelligence, including neural networks.

BACKGROUND

Current machine learning and especially neural network (NN) models may include a combination of multiple layers with varying number of weights in each layer. Each layer may compute a number of multiply-accumulate (MAC) operations involving the stored weights as well as the input to each layer. While NNs have been very successful in classification tasks (inference), as the difficulty of tasks increase, larger networks with more layers and more weights per layer may be needed. As the neural network size increases the required memory for weights and the computational power needed to implement the network increases as well. In typical digital hardware implementations, the large number of weights cannot all be stored on the same application-specific integrated circuit (ASIC) that performs the MAC operations and significant data transfer with off-chip memory is required. Both the MAC operation, which consists of a number of multiplication and accumulate steps, and the data transfer, are costly in terms of time and energy. Alternatively, in-memory computation and mixed-signal operations can be used in order to increase performance and efficiency. Analog computation (multiplication and addition) can be performed inside a high-density memory that functions as a MAC compute unit (e.g., in a processor, controller, microprocessor, etc.). Weights are stored and computation occurs at the same location, reducing the required amount of data transfer. An entire MAC operation can be performed simultaneously for a large set of inputs and weights, amortizing the cost relative to the sequential operation in a digital processor.

SUMMARY

According to one embodiment, a read-only memory (ROM) computing unit utilized in matrix operations of a neural network comprising a unit element including one or more connections, wherein a weight associated with the computing unit is responsive to either a connection or lack of connection internal to the unit cell or between the unit element and a wordline and a bitline utilized to form an array of rows and columns in the ROM computing unit, and one or more passive or active electrical elements located in the unit element, wherein the passive or active electrical elements are configured to adjust the weight associated with the compute unit, wherein the ROM computing unit is configured to receive an input and output a value associated with the matrix operation, wherein the value is responsive to the input and weight.

According to a second embodiment, a hybrid memory computing unit utilized in matrix operations of a neural network including a first layer including random access memory (RAM) including a RAM compute unit, wherein the RAM compute unit is configured to store reprogrammable task parameters, a second layer including a read only memory (ROM) that includes a unit element including one or more connections, wherein a weight associated with the computing unit is responsive to either a connection or lack of connection internal to the unit cell or between the unit element and a wordline and a bitline utilized to form an array of rows and columns in the ROM computing unit, and one or more passive or active electrical elements located in the unit element, wherein the passive or active electrical elements are configured to adjust the weight associated with the compute unit, wherein the ROM computing unit is configured to receive an input and output a value associated with the matrix operation, wherein the value is responsive to the input and weight.

According to a third embodiment, a read-only memory (ROM) computing unit utilized in matrix operations of a neural network includes a plurality of levels forming a three dimensional (3D) structure containing at least a unit element including one or more connections, wherein a weight associated with the computing unit is responsive to either a connection or lack of connection internal to the unit cell or between the unit element and a wordline and a bitline utilized to form an array of rows and columns in the ROM computing unit, and one or more passive or active electrical elements located in the unit element, wherein the passive or active electrical elements are configured to adjust the weight associated with the compute unit, wherein the ROM computing unit is configured to receive an input and output a value associated with the matrix operation, wherein the value is responsive to the input and weight.

BRIEF DESCRIPTION OF THE DRAWINGS

FIG. 18(a)-(h) illustrates example interface circuits are shown.

FIG. 20(a)-(e) illustrates various examples on embodiments between connections of a unit cell with a wordline and a bitline and internal connections in the unit cell.

FIG. 35(a)-(c) illustrates an example of an "edge" sensing device.

FIG. 42(a)-(b) illustrates a SRAM based multi-level input, multi-level output time-domain interface to a crossbar network for dot product calculation.

FIG. 47 illustrates the range of transistor threshold voltages to implement linearly scaled weights of a crossbar network utilizing channel conductance or current sources in saturation or sub-threshold.

DETAILED DESCRIPTION

Figure 1:
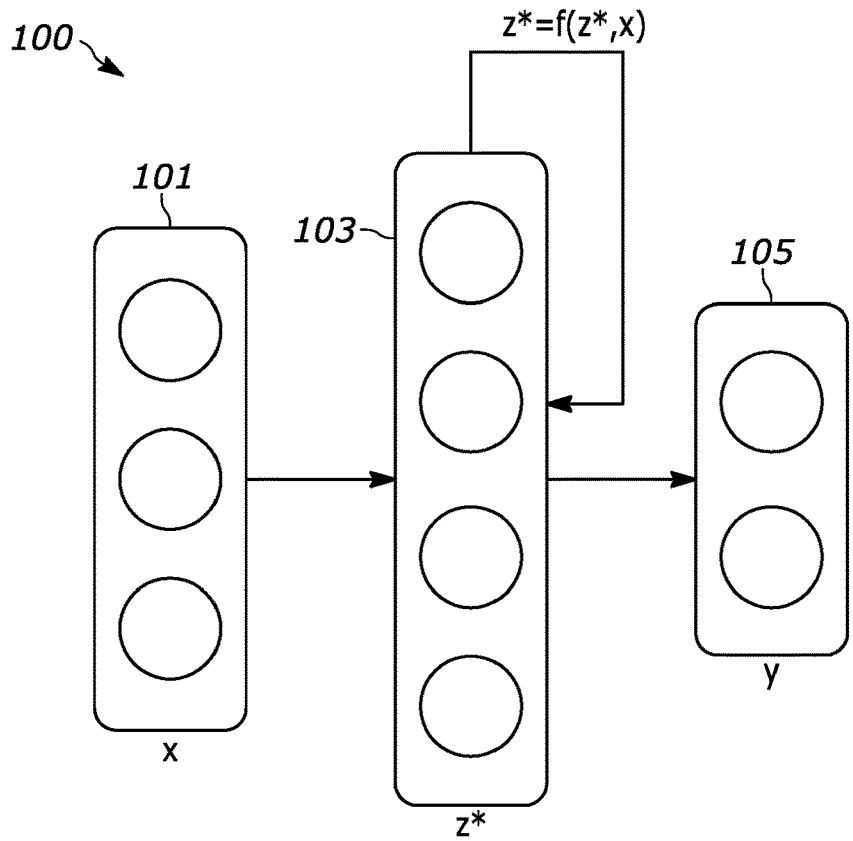
FIG. 1 illustrates a representation of a DEQ network.

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the embodiments. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

There has been recent developments in specialized processors for machine learning (ML) and specifically neural network (NN) computation. Such algorithms require a sequence of matrix-vector multiplications between input data values and stored weights that are typically trained using a learning algorithm based on stochastic gradient descent. The specialized processors are designed to efficiently compute the multiply-accumulate (MAC) operation (dot product) that forms the basis for most NN algorithms. The MAC operation takes as input a vector or tensor of values (also called activations). The inputs are element-wise multiplied with a vector or tensor of weight values. The output of the MAC operation is the summation of the vector of products. Each MAC operation is analogous to a neuron in the NN and each layer in the network requires the computation of a multitude of MACs. Other functions, such as batch-normalization or pooling may be supported by a custom processor, but these operations are not fundamentally required like the MAC. Custom neural network processors may also need to facilitate the handling of input data and weights including storage and transfer to the blocks computing the MAC operation in an efficient way.

Custom digital processors for machine learning are becoming more common. Most of these follow a GPU-like architecture that includes a large number of parallel processing elements. These processing elements compute multiplications and partial sums that are sequentially accumulated in order to compute the entire MAC operation. There are a number of implementations of these custom digital processors which handle the distribution and reuse of input activations, weights, and partial sums in a variety of ways each with their own advantages. Typically, a large number (potentially millions) of weight values need to be transferred between memory and processing units, imposing a significant overhead.

Processors based on the principal of in-memory computing (IMC) may use the physical properties of memory technologies to perform computation directly within the memory unit instead of in a separate computational unit. One advantage of IMC architectures is the storage of the weight values in the same location where the computation takes place, eliminating the need to continuously fetch and store weight values in a non-local memory. Weights can be reused for multiple MAC operations without any additional data transfer. A further advantage is the entire MAC operation for all inputs and weights can be computed simultaneously in a single operation, e.g., the computational complexity is constant (O(1)), unlike the sequential operation involving partial sums required for digital implementations as described above.

FIG. 1 illustrates a representation of a DEQ network. The DEQ network may implement functions, networks, and training as described in application Ser. No. 16/895,683, entitled "SYSTEM AND METHOD FOR MULTISCALE DEEP EQUILIBRIUM MODELS," filed on Jun. 8, 2020, which is hereby incorporated by reference in its entirety. The DEQ may have a single layer. Two important equations are utilized in the DEQ model and network of FIG. 1. The first equation, Equation (e.g, Eq.) 1 (shown below), the equation may define a single layer DEQ model. It may consist of a nonlinear function, $\sigma(\cdot)$ of the state of the model/network, $z$. The input to the network may be defined as $x$ and an input bias may be defined as $b$. Note while Eq. 1 is a general representation, it may not represent all possible embodiments of a DEQ network. For example, the linear operator $Wz$ may refer not only to a matrix multiplication, but also to a convolution or other structured linear operator, common in deep networks. And the hidden unit or hidden state $z$ can represent more than just a typical "single" hidden unit, and could represent e.g., a concatenation of multiple hidden units over multiple different temporal or spatial scales. Equation 2 describes the implicit nonlinear differential equation for which the roots, $z^*$, are unknown and need to be solved to evaluate the DEQ network. To solve for the roots a cost function, Eq. 3, can be iteratively solved for $z^*$. When iteratively solving Eq. 3, the network is set to an initial state, $z_{n=0}$. The iteration then progresses calculating the next value of the cost function, $C_{n=1}(z_{n=1}, x, b)$, which is known as Equation 3 below. Root finding may be considered complete, (roots are solved), when the cost function is less than a predefined tolerance, $\varepsilon$, as shown in Equation 4. When this condition is met after k iterations, it is assumed, $z_k \approx z^*$, Equation 4. Note that the inputs, x and b, are considered constant during root solving and that both training and inference, for DEQ networks, are implemented using this iterative process.

TABLE 1

Equations of a DEQ Model

| Equation | # |
|---|---|
| $z = f(z, x, b) = \sigma(Wz + Ux + b)$ | 1 |
| $z^* - f(z^*, x, b) = 0$ | 2 |

TABLE 1-continued

Equations of a DEQ Model

| Equation | # |
|---|---|
| $C_n(z_n, x, b) = z_n - f(z_n, x, b)$ | 3 |
| $|C_k(z_k, x, b))| \leq \varepsilon \rightarrow z_k \approx z^*$ | 4 |

Figure 2:
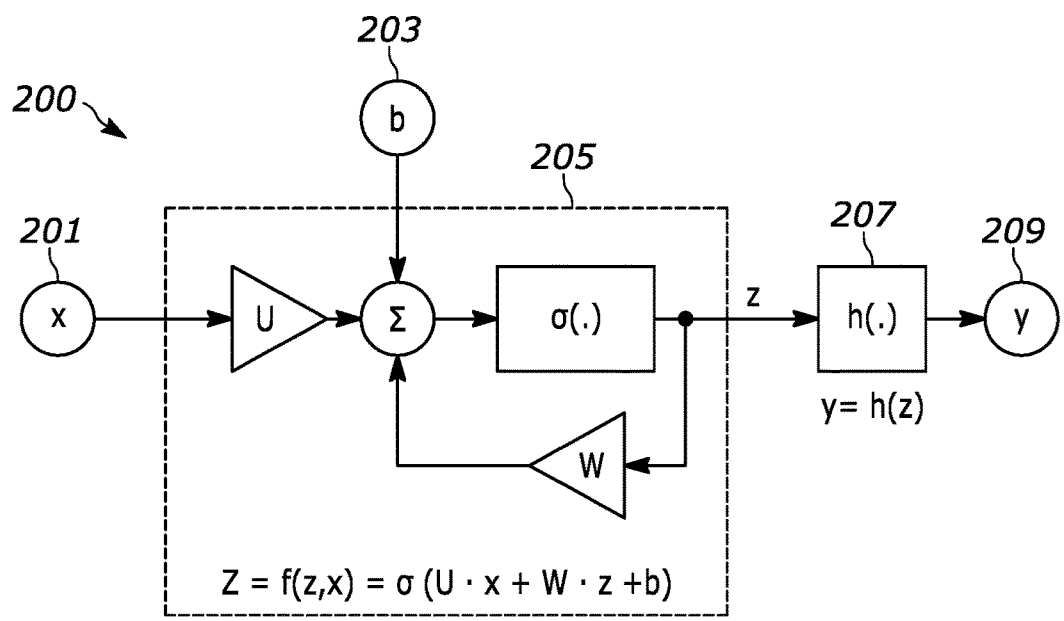
FIG. 2 illustrates an embodiment of a signal flow diagram for DEQ networks.

From Equation 1 and Equation 2 above, a signal flow graph that describes the calculation of Equation 2 can be developed, as shown in FIG. 2. The signal flow graph can be represented as matrix based operations with a nonlinear function, $\sigma$. This can be implemented by an electronic compute fabric which will be discussed further.

Definitions for the variables in FIG. 2 are provided below:

TABLE 2

Variable definitions

| Variable | Description |
|---|---|
| x | Model input. It can be a scalar, vector or a full tensor |
| z | Current state of the DEQ model. It can be a scalar, vector or a full tensor |
| z* | Equilibrium state of the DEQ model. It can be a scalar, vector or a full tensor |
| W, U | Weights of the DEQ model. They can be a scalar, vector or a full tensor |
| The operator "·" | U · x, and W · z: "·" can be any linear operation between the variables U, x and W, z. e.g. a scalar operation, simple matrix multiplications or convolution. |
| b | DEQ input bias. It can be a scalar, vector or a full tensor. |
| Σ | Summation |
| $\sigma(\cdot)$ | A nonlinear function that operates on a scalar, vector or tensor input. Its output can be a scalar, vector or tensor |
| y | Output of the DEQ model. It can be a scalar, vector or a full tensor. It is an arbitrary function of the DEQ network states. |
| $h(\cdot)$ | Any function of the DEQ states. Its input can be a scalar, vector or tensor. Its output can be a scalar, vector or tensor |

As shown in FIG. 2, a DEQ network can be represented by multiple multiplications and summations, such as a convolution of the input, bias and output state. This may be often referred to as a dot product or multiply and accumulate (MAC) operation. As a result, circuits that can be used to implement standard convolutional neural networks can be modified to implement a DEQ network. The main modification is how the computation is accomplished. In standard neural networks the computation does not receive continuous time feedback of the current output states to the input of the network. Typically if feedback occurs, it occurs with a delay, i.e. it is a result of a previous computation.

Figure 3:
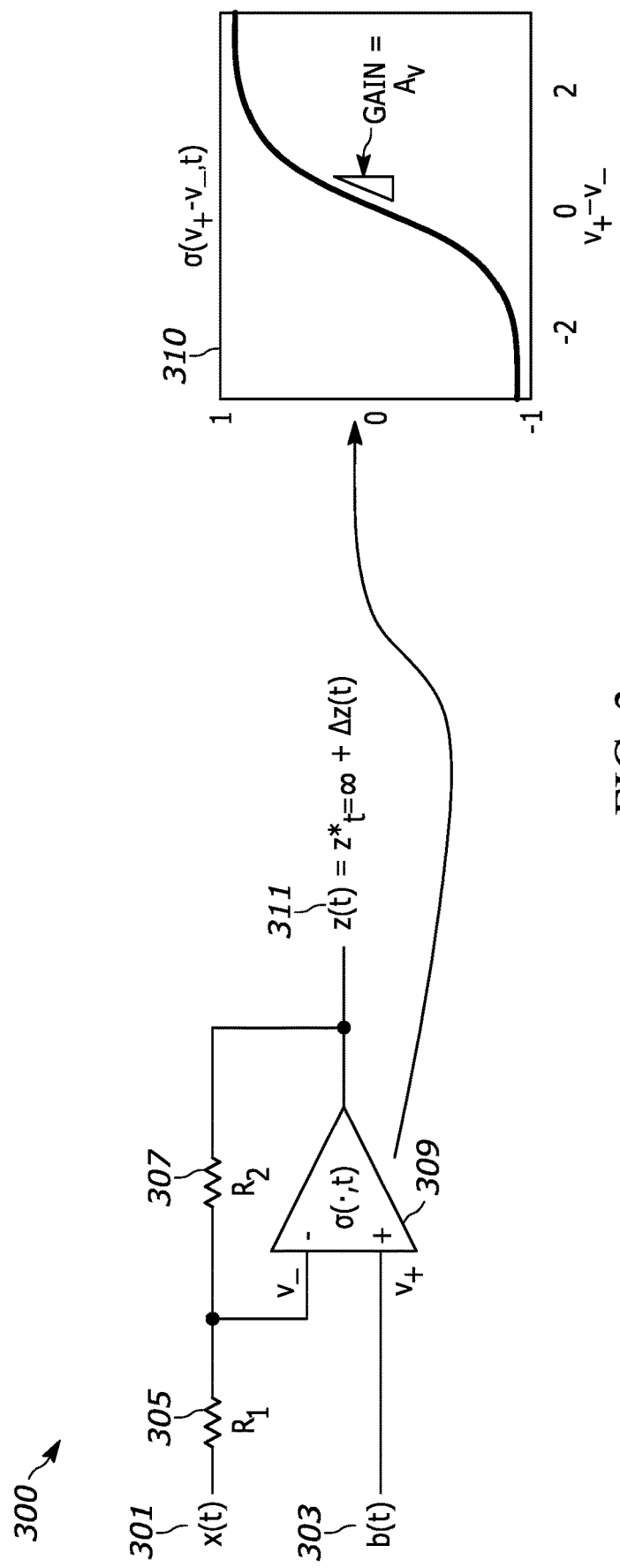
FIG. 3 illustrates an embodiment of a simple inverting circuit 300 with nonlinear amplifier 309.

Analog Computation of Roots: Settling to an Equilibrium Condition Instead of Iterating:

FIG. 3 illustrates an embodiment of a simple inverting circuit 300 with nonlinear amplifier 309. The nonlinear amplifier 309 may have a delay, such as a single pole amplifier. The circuit may have a first resistor 305 and second resistor 307. The first resistor 305 may receive an input 301 over time. One aspect of the DEQ method is that root-finding used for inference and training in DEQ may be analogous to a physical system (electrical, mechanical, fluidic etc.) settling to an equilibrium. Effectively inference and training in a DEQ model can be implemented using a physical system that settles to an equilibrium point 311 (root-A finding). As an example we can consider a simple inverting amplifier, as the one shown as amplifier 309 in circuit 300. This analog circuit may have a nonlinear gain

301, σ, with a small signal gain of $A_v$ and a single pole (a simple delay of $\tau_a$), FIG. 3a. In this case we can show that this circuit implements a function, Equation 5 (shown in the table below), similar to Equation 1. For this example the roots of Equation 5 can be solved as a function of time, e.g., as in Equations 6, 7, and 8. It can be shown in Equations. 6, 7 and 8 that the analog computation will asymptotically (exponentially) approach or settle to an equilibrium state, $z_{t=\infty}^*$. The time constant for the exponential settling of this circuit is defined by Equation 8. Note that the ideal equilibrium state, $z^* = z_{t=\infty}^*$, may be never reached due to the finite gain of the amplifier and the exponential settling.

The following equations may represent the inverting circuit 300 of FIG. 3:

$$v_+ - v_- = \left(\frac{-R_2}{R_1+R_2}x(t) + \frac{-R_1}{R_1+R_2}z(t) + b(t), t\right);$$

$$\sigma(v_+ - v_-, t) \sim \tanh[A_v \cdot (v_+ - v_-) \cdot (1 - e^{-t/\tau_a})]$$

The approximate solution (roots) for output for an example of a simple inverting circuit:

$$z^* \approx \sigma\left[\frac{A_v}{A_v+1}\left(\frac{R_1+R_2}{R_1}\cdot b(t) - \frac{R_2}{R_1}x(t)\right)\left(1 + e^{-\frac{t}{\tau_p}}\right)\right] \approx$$

$$z_{t=\infty}^* \frac{A_v}{A_v+1}\cdot\left(1 + e^{-\frac{t}{\tau_p}}\right)$$

and $$\tau_p \approx \tau_a \frac{R_1+R_2}{(1+A_v)\cdot R_1}$$

The simple inverting circuit 300 with nonlinear amplifier 309 may have a delay 310 (e.g., single pole amplifier). Such an analog feedback circuit 300 may be an example implementation of a basic building block for analog DEQ network. The Equations representing simple inverting circuit and approximate solution (roots) of output for a simple inverting circuit are shown in the table below in Table 3:

TABLE 3

Equations for a Simple Inverting Circuit

| EQUATION | # |
|---|---|
| $z(t) - \sigma\left(\frac{-R_2}{R_1+R_2}x(t) + \frac{-R_1}{R_1+R_2}Z^*(t) + b(t), t\right) = 0$ | 5 |
| $z_{t=\infty}^* \approx \sigma\left[\frac{R_1+R_2}{R_1}\cdot b(t) - \frac{R_2}{R_1}x(t)\right]$ | 6 |
| $z^* \approx z_{t=\infty}^* \frac{A_v}{A_v+1}\cdot\left(1 + e^{-\frac{t}{\tau_p}}\right)$ | 7 |
| $\tau_p \approx \tau_a \frac{R_1+R_2}{(1+A_v)\cdot R_1}$ | 8 |

The example above illustrates that a DEQ network can be implemented using a continuous time analog circuit to compute the roots of the DEQ network. Note the that roots of the DEQ network are the final state of z(t) of the network. It also illustrates how a finite amplifier gain, $A_v$, and finite bandwidth, $BW \propto 1/\tau_a$, can cause error in the final equilibrium state or roots, $z^*$. For DEQ networks using analog compute, its accuracy and or error in $z^*$ depend on how long the circuit is allowed to settle or how many time constants, Ty, are allowed to elapse before its output is readout, as shown in Equation 9. This may be analogous to the iterative root solving approach in digital computation, where the number of iterations or time needed to compute the solution depends on the required accuracy or final error tolerance, E. However for analog circuitry the amount of error in the final state also depends the finite gain error set by the amplifier gain, $A_v$, Equation 9. From Equations. 9, 10 one can compute requirements on amplifier gain and bandwidth to get to a desired accuracy. For instance, 99.9% or an error of 0.1% requires ~9.9 bits of accuracy. This may require a latency of longer than seven time constants, $7 \cdot \tau_p$, and an amplifier gain greater than 1000. Thus, desired accuracy and latency of an analog or mixed signal DEQ network must be accounted for in the design of the amplifier and the network used to implement the DEQ network.

TABLE 4

Equations for Amplifier Gain and Bandwidth

| Equation | # |
|---|---|
| $\text{Error} = \frac{\Delta z^*(t)}{z_{t=\infty}^*} = \frac{z_{t=\infty}^* - Z^*(t)}{z_{t=\infty}^*} \approx 1 - \frac{A_v}{A_v+1}\left(1 + e^{\frac{-t}{\tau_p}}\right)$ | 9 |
| $\%\text{ of Bits Accuracy} = \log_2\left(\frac{1}{1 - \frac{\Delta z^*(t)}{z_{t=\infty}^*}}\right)$ | 10 |

In general, analog methods may not deliver computational accuracy commensurate with digital implementations. However, there can be an advantage in terms of overall system power, when processing in analog, for applications that can be implemented using lower accuracy or lower SNR applications. As such, analog compute using DEQ networks could enable very low energy machine learning for embedded applications for which the energy of these DEQ networks can be tailored to the desired latency/speed of the application.

In the previous section we described how DEQ models can be implemented with continuous time analog compute. This is based on the knowledge that a DEQ network can be modeled with Eq. 1 and that it can be modeled with a signal flow graph shown in FIG. 2 200. This graph and further extensions of it form the basis for all inventions below.

Many embodiments of mixed signal circuit architectures can be used to implement DEQ models/networks based on the signal flow graph in FIG. 2.

Figure 4:
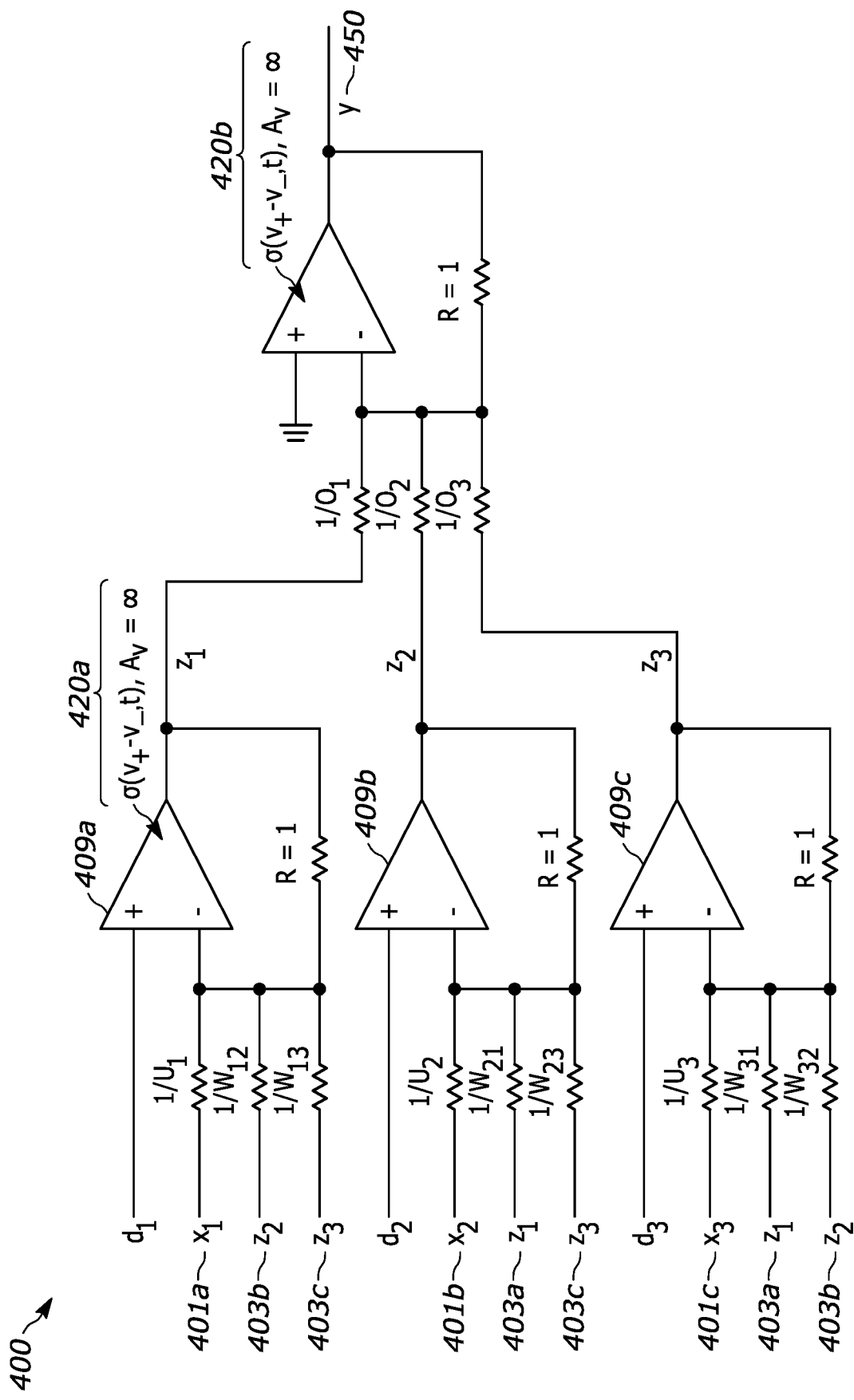
FIG. 4 illustrates an example of a multi input, multi-state DEQ model based on inverting amplifiers.

FIG. 4 illustrates an example of a multi input, multi-state DEQ model 400 based on inverting amplifiers 409a, 409b, 409c. Thus, the DEQ model may be based on both inverting amplifiers and resistive networks. In such an example, there may be three inputs 401a, 401b, 401c, ($x_1$ to $x_3$), three states 403a, 403b, 403c ($z_1$ to $z_3$), and an output 450, γ. The output layer 420b may utilizing the resistors $1/O_1$, $1/O_2$ and $1/O_3$ to apply the weights of the inputs and direct through an activation function as an output 450. The hidden state (z) may be the outputs of the amplifiers 409a, b, c. The first of these may be an extension of the inverting amplifier, for example from FIG. 3, to a multi-input and multi-output DEQ network, FIG. 4. This example may implement a fully-connected network in terms of DEQ network states, $z_i$, e.g. all states feedback to every input. For completeness the equations for the DEQ models equilibrium state, Equations 11, 12 and the output, Equation 13, are provided. In such an example the gain 420a, 420b of the amplifier may be assumed to be infinite for simplicity. The equations are provided in the table below:

TABLE 5

| Equations | # |
|---|---|
| $\begin{bmatrix} z_1^* \\ z_2^* \\ z_3^* \end{bmatrix} \approx \sigma \left( -\begin{bmatrix} U_1 & 0 & 0 \\ 0 & U_2 & 0 \\ 0 & 0 & U_3 \end{bmatrix} \begin{bmatrix} x_1 \\ x_2 \\ x_3 \end{bmatrix} - \begin{bmatrix} 0 & W_{12} & W_{13} \\ W_{21} & 0 & W_{23} \\ W_{31} & W_{32} & 0 \end{bmatrix} \begin{bmatrix} z_1 \\ z_2 \\ z_3 \end{bmatrix} + \begin{bmatrix} b_1 \\ b_2 \\ b_3 \end{bmatrix} \right)$ | 11 |
| $\begin{bmatrix} b_1 \\ b_2 \\ b_3 \end{bmatrix} = \begin{bmatrix} (U_1 + W_{12} + W_{13} + 1) \cdot d_1 \\ (U_2 + W_{21} + W_{23} + 1) \cdot d_2 \\ (U_3 + W_{31} + W_{32} + 1) \cdot d_3 \end{bmatrix}$ | 12 |
| $y \approx \sigma \left( -[O_1 \; O_2 \; O_3] \begin{bmatrix} z_1^* \\ z_2^* \\ z_3^* \end{bmatrix} \right)$ | 13 |

Note that in the general case other types of connections could be used beyond a fully-connected architecture. In addition, the resistors of the network 400 could be replaced with other electrical components, such as memristors or capacitors or with combinations of components. Finally other amplifier configurations, such as non-inverting amplifiers or switched capacitor amplifiers could be used to implement DEQ networks similar to this as well.

Figure 5:
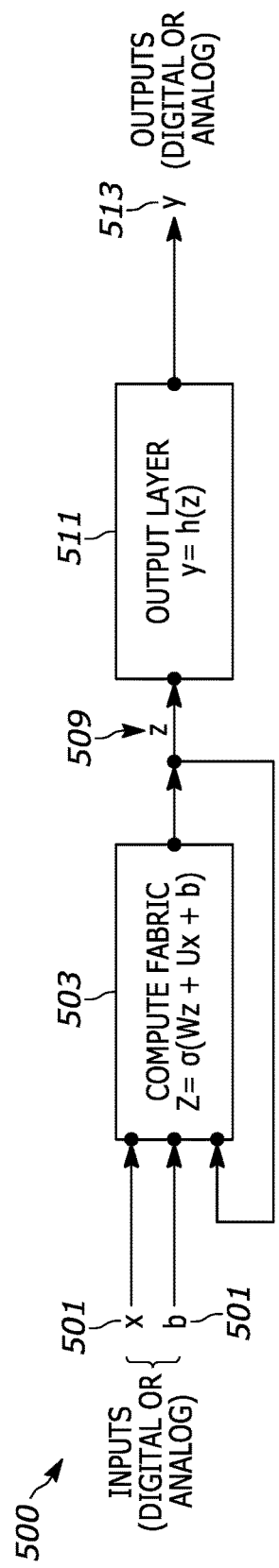
FIG. 5 illustrates a DEQ network 500 implemented with a compute fabric 503 and output layer 504.

FIG. 5 illustrates a DEQ network 500 implemented with a compute fabric 503. The output layer 511 may or may not be part of the compute fabric 503. In this example, the implicit matrix multiplications (dot products, convolutions) from Equation 1 may be implemented in the fabric 503. The nonlinear function $\sigma(\bullet)$ may be implemented inside or outside of the compute fabric. The compute fabric 503 performs the continuous time calculation of the DEQ equilibrium states in the analog domain in response to receiving the input 501 and bias 502, which may be either digital or analog. Compute fabric 503 arrays are generally arrays of impedances implemented with components such as resistors, capacitors, transistors or combinations of these devices. Some compute fabrics 503 can also be implemented using volatile memory technologies, such as SRAM or DRAM, or nonvolatile memory, NVM, technologies such as flash, RRAM, MRAM, PCM etc. When any of these memory technologies are used, compute fabrics may be referred to as an in-memory compute fabrics or IMC fabrics. The output layer 511 of the DEQ network, FIG. 5, can be implemented with digital, analog computation or a combination thereof (mixed signal). In some cases, it may be optimal to implement the output layer 511 in the same compute fabric used to calculate the equilibrium states, z*. Note that the equilibrium states are the roots of the DEQ network and are generally the final state, z=z*, of the network. The inputs, x and b can be digital signals that are converted to analog inside the compute fabric. Or they can be analog. Generally the root 509, z, of the DEQ network will be fed back into the compute fabric 503 as an analog signal. However, there could be alternative embodiments where the states 509, are fed back as digital signals or time based signals. The inputs to the output layer as well as the outputs, y and the function h($\bullet$) can be implemented with digital, analog or mixed signal circuitry.

Figure 6:
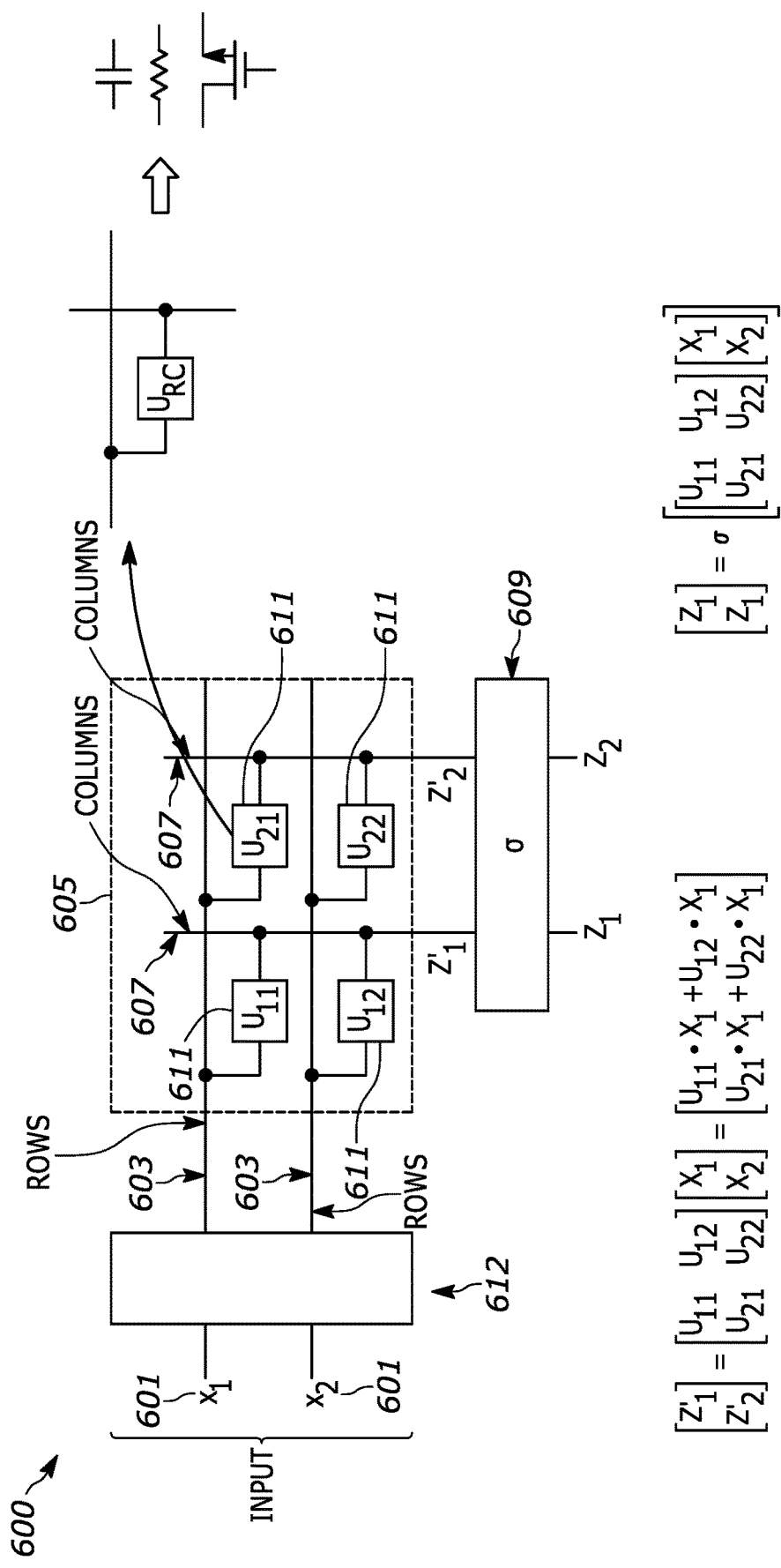
FIG. 6 illustrates an example of a compute fabric 600.

FIG. 6 illustrates an example of a compute fabric 600. The compute fabric 600 is merely exemplarity of one that may be utilized in the various embodiments. The equations may represent computation performed by the fabric 600. FIG. 6 is an example of a compute fabric. The elements 611, $U_{RC}$, can be implemented with different components such as resistors (RRAM, PCM), capacitors, transistors or combinations of these. These elements may be used to perform dot products or convolutions of the input signals on the rows 603 with weights determined by values of the elements 611, $U_{RC}$. This analog summation is based on fundamental electrical phenomena, such as current summation (Kirkoff's current law), charge conservation (charge summation, redistribution), Ohm's law, etc. These basic phenomena may intrinsically enable analog computation or summation and multiplication in the realms of charge, current and voltage. The row drivers 612 may perform different functions depending on the types of devices used in the compute fabric 600. In some cases they may be fully digital or analog. In others they perform a digital to analog conversion. Inputs 601 may be received at the row drivers 612. Generally, summation, in charge, current, voltage typically occurs on the columns 607. The sense amplifiers (or "amps") 609 may be used as the first stage of amplification for the summation and can have different functions depending on the type of network. For instance, for a DEQ network, the sense amplifiers or sense amplifiers may implement a nonlinear function, $\sigma(\bullet)$, which can take the form of a hyperbolic tangent or other well-known nonlinear activation functions such as a rectified linear unit (reLU).

Figure 7:
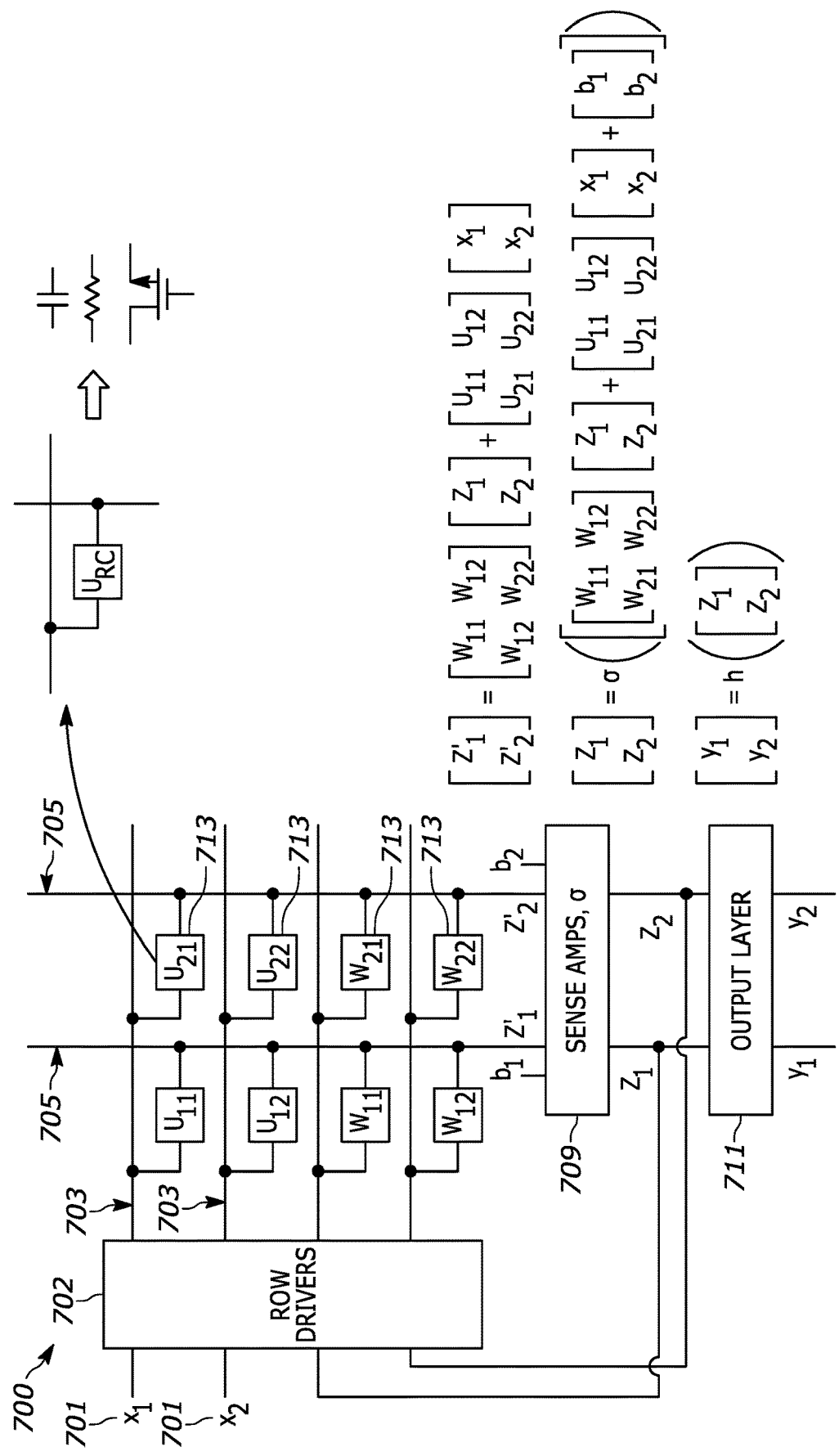
FIG. 7 an illustration of one embodiment of a general compute fabric that can be used to implement a DEQ network.

FIG. 7 an illustration of one embodiment of an embodiment of a compute fabric that can be used to implement a DEQ network. In this example the input bias, $$b = \begin{bmatrix} b_1 \\ b_2 \end{bmatrix},$$

is added using the sense amplifiers. There may be several variations associated with FIG. 7 for implementing DEQ with an analog compute fabric. For example, there may be one sense amplifier 709 or on sense amplifier for multiple columns or all of the columns. There can be one row driver 702 per row 703, or one row driver 702 for multiple or all rows 703. In another embodiment, the sense amplifiers 709 can implement any nonlinear function. Additionally, the sense amplifiers 709 can be used to add in the bias, b. In general the sense amplifiers 709 could also be replaced with or be part of an analog to digital convertor if digitization of the fabric output is required, or the output layer 711. The sense amplifiers 709 can be used to enable more accurate summation—which may include charge or current summation. In yet another variation of an embodiment, the row drivers 702 can drive analog, digital signals onto the rows 703. The row drivers 702 can also drive time-based signals (pulses, pulse-width-modulation (PWM) signals, etc.) The fabric elements 713, $U_{RC}$, can be any element that enables computation (multiplication, summation). As such, the fabric elements may be a resistor, capacitor, transistors, etc. Any combination may be utilized to solve the equations utilized in the computer fabric.

Figure 8:
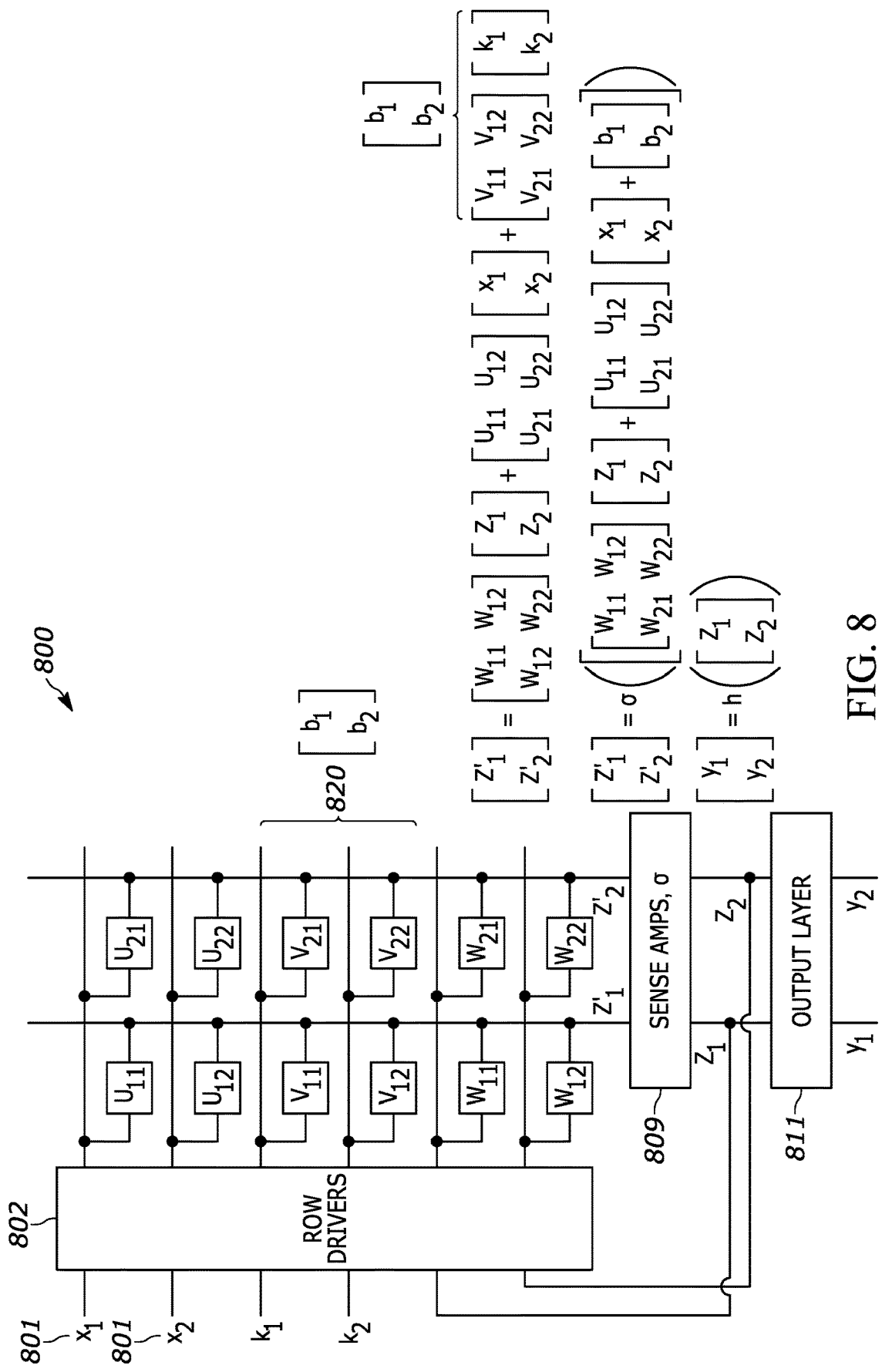
FIG. 8 illustrates how the bias may be utilized using the compute fabric.

FIG. 8 shows how the bias 820, b, can be utilized using the compute fabric 800 instead of being added through the sense amplifiers 809, in contrast to the embodiment shown in FIG. 7. In this example of FIG. 8, the input bias, $$b = \begin{bmatrix} b_1 \\ b_2 \end{bmatrix},$$

is added using the computer fabric. The bias 820 could be added through other means as well. The sense amplifiers 809 could also be replaced with or be part of an analog to digital convertor if digitization of the fabric output is required, or the output layer 811. The sense amplifier 809 may be a nonlinear function that operates on a scalar, vector, or tensor input. The output may also be scalar, vector, or tensor.

Figure 9:
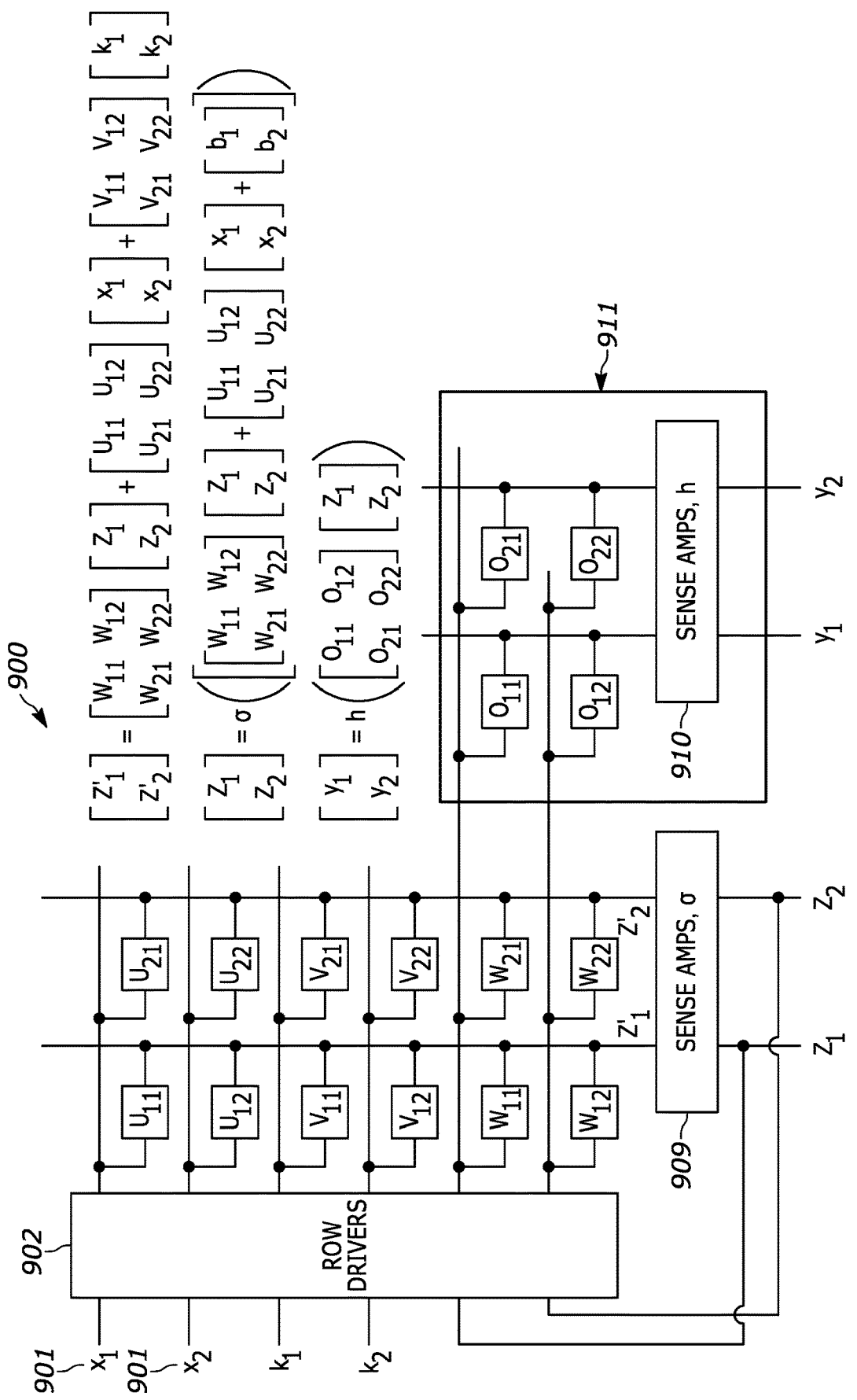
FIG. 9 illustrates an alternative embodiment that shows an embodiment of the output layer computation being incorporated into the compute fabric.

FIG. 9 illustrates an alternative embodiment that shows one way the output layer 911 computation could be incorporated into the compute fabric. The output layer 911 may also consist of a sense amplifier 910 that is distinct from the sense amplifier 909. The input 901 may be fed into the row drivers 902. The output layer 911 may include the sense amplifier 910. Another sense amplifier 909 may be utilized to output the various states back to the row drivers 902 until convergence is met. The final output of the DEQ model may be output by the sense amplifier 910.

The disclosure may also consider DEQ networks with dependencies on current and previous network roots and inputs. Earlier examples of DEQ models/networks have been shown where the output states, z, are function of the inputs, x, and feedback of the states in continuous time with no delay. However, there are cases where a DEQ network state can be a function of previous (delayed) inputs and roots. A continuous time DEQ network with dependencies on previous states and inputs may be generally described by Eqs. 14 and 15

TABLE 6

Continuous Time DEQ network:

| Equation | # |
|---|---|
| $z(t) = f(z(t), z(t - \tau_{z1}), \ldots, z(t - \tau_{zm}), x(t), x(t - \tau_{x1}), \ldots, x(t - \tau_{xk}))$ | 14 |
| $z(t) = \sigma(W_0 \cdot z(t) + \ldots + W_m \cdot z(t - \tau_{zm}) + U_0 \cdot x(t) + \ldots + U_k \cdot x(t - \tau_{xk}) + b(t))$ | 15 |

In the equations above, both inputs and states are delayed by continuous time delays, $\tau_{x1} \ldots \tau_{xk} \tau_{z1} \ldots \tau_{zm}$. One possible function for implementing a DEQ network is shown in Eq. 15.

Figure 10:
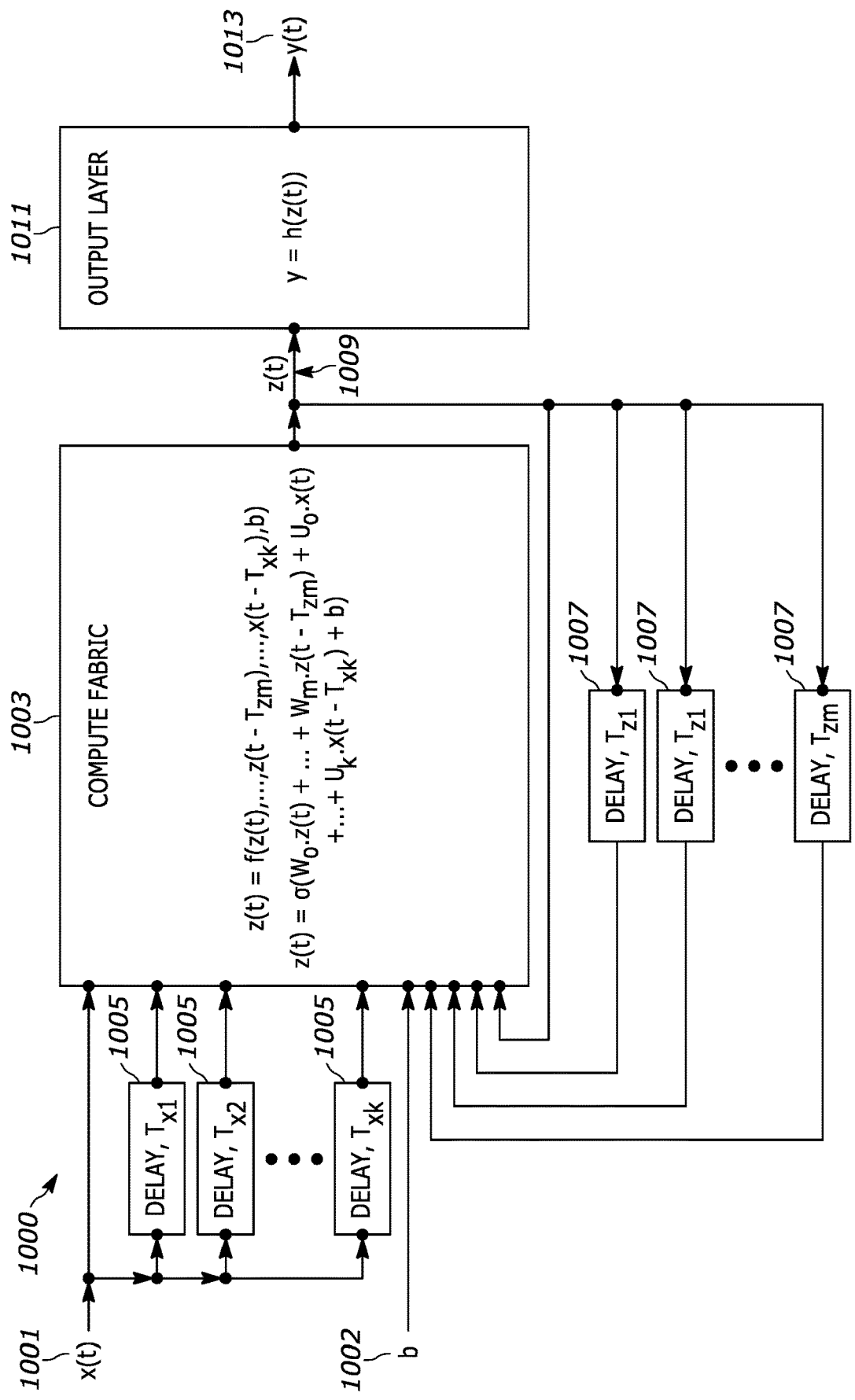
FIG. 10 is an example of a continuous time DEQ network whose output is a continuous time function of both current and previous inputs and outputs.

FIG. 10 is an example of a network that implements Equations 14 and 15. FIG. 1 illustrates an embodiment of a DEQ network 1000 with dependencies on previous states and inputs. A discrete time DEQ model can be described with Equations 16 and 17. In this case the DEQ network 1000 is a function of previous states and inputs that occurred at earlier times, t(n). Typically in these systems z(n) 1109 is considered equivalent to z(t(n)). The time between subsequent calculations of the DEQ output state is $T_{calc}=t(n)-t(n-1)$. $T_{calc}$ can be set by a system clock i.e. $T_{calc}=1/f_{clk}$. Or the system can be self timed or asynchronous. In this case, the time between subsequent calculations, is dependent only on the speed at which the hardware can calculate the next state. The input 1001 over time may be fed with a delay related to time 1005. The bias 1002 may be input to the computer fabric as well 1003. The compute fabric 1003 may refeed the states 1009 with another time delay 1007. The computer fabric 1003 may output a final state 1009 to an output layer 1011. The input 1001, the bias 1002, and output 1003 may be a scalar, vector, or a full tensor. It may also be an arbitrary function of the DEQ network states.

TABLE 7

Discrete Time DEQ network:

| Equations | # |
|---|---|
| $z(n) = f(z(t), z(n - 1), \ldots, z(n - m), x(n), x(n - 1), \ldots, x(n - k))$ | 16 |
| $z(n) = \sigma(W_0 \cdot z(t) + \ldots + W_m \cdot z(n - m) + U_0 \cdot x(n) + \ldots + U_k \cdot x(n - k) + b(n))$ | 17 |

Figure 11:
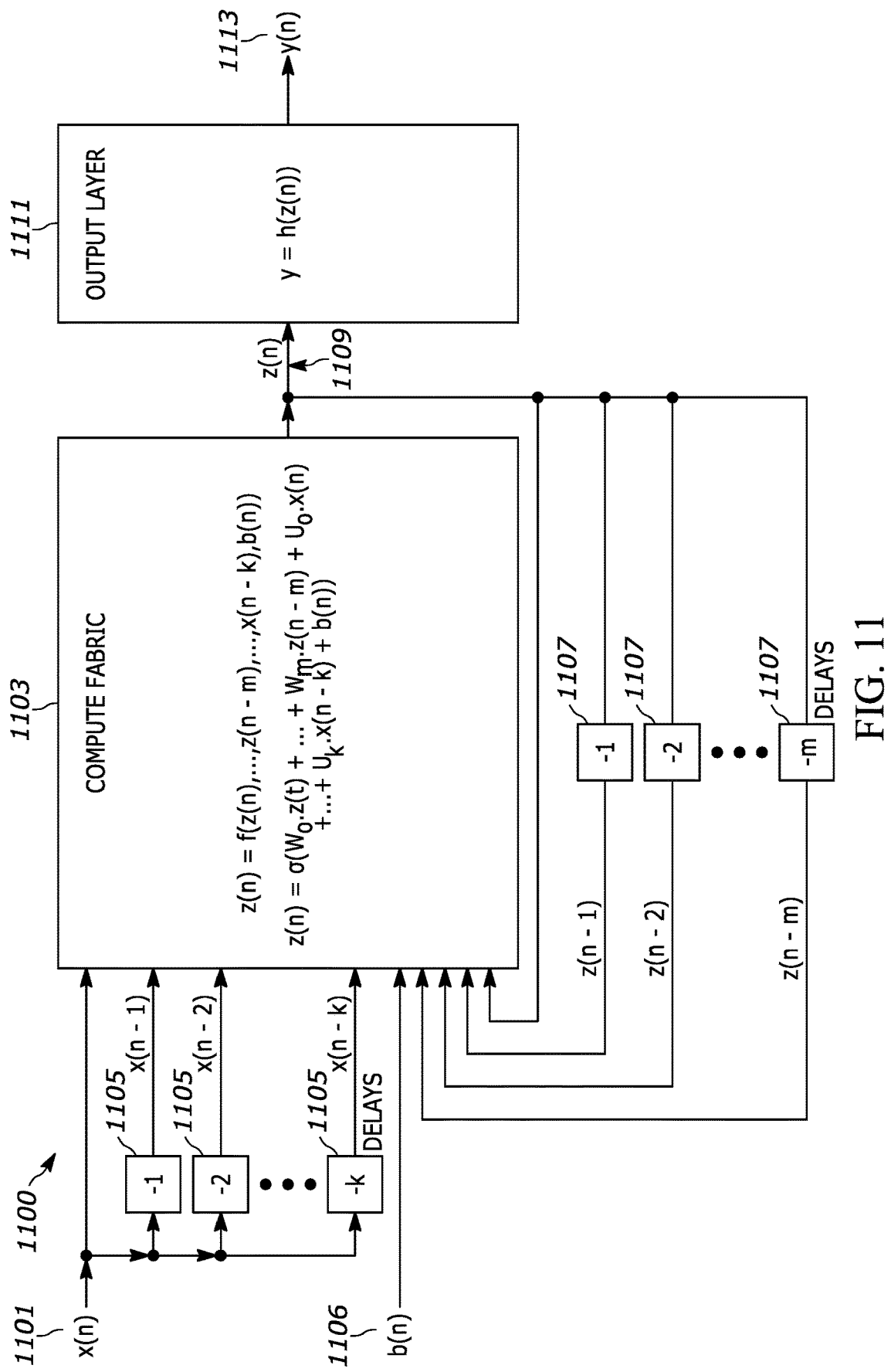
FIG. 11 is an example of a discrete time DEQ network whose output is a discrete time function of current and previous inputs and outputs.

FIG. 11 illustrates a diagram of a discrete time DEQ network 1100. In this example, the network 1100 utilizes compute fabric 1103.

FIG. 11 illustrates a shows a general example of a DEQ network described by Equations 16 and 17, shown above. The network 1100 may receive an input 1101 with a number of previous inputs provided by delays 1105 at the input to be sent to the computer fabric 1103. The sampled states 1109 may be sent to the output layer 1111. The current states 1109 may also be fed back to the compute fabric 1103 with previous state provided by delays 1107. The output layer 1111 may output final output y(n) 1113 a function the DEQ model, including the DEQ model over time. The output 1113 may be a scalar, vector, or a full tensor. It may also be an arbitrary function of the DEQ network states.

Figure 12:
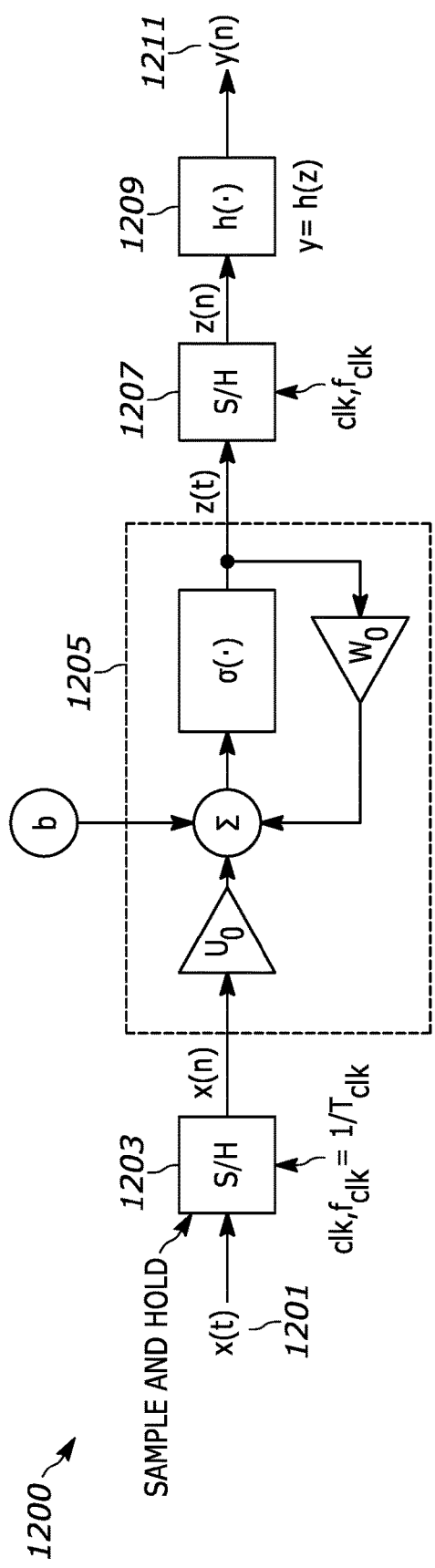
FIG. 12 illustrates a signal flow diagram for a discrete time implementation of a DEQ network with no dependence on previous inputs or outputs.
Figure 13:
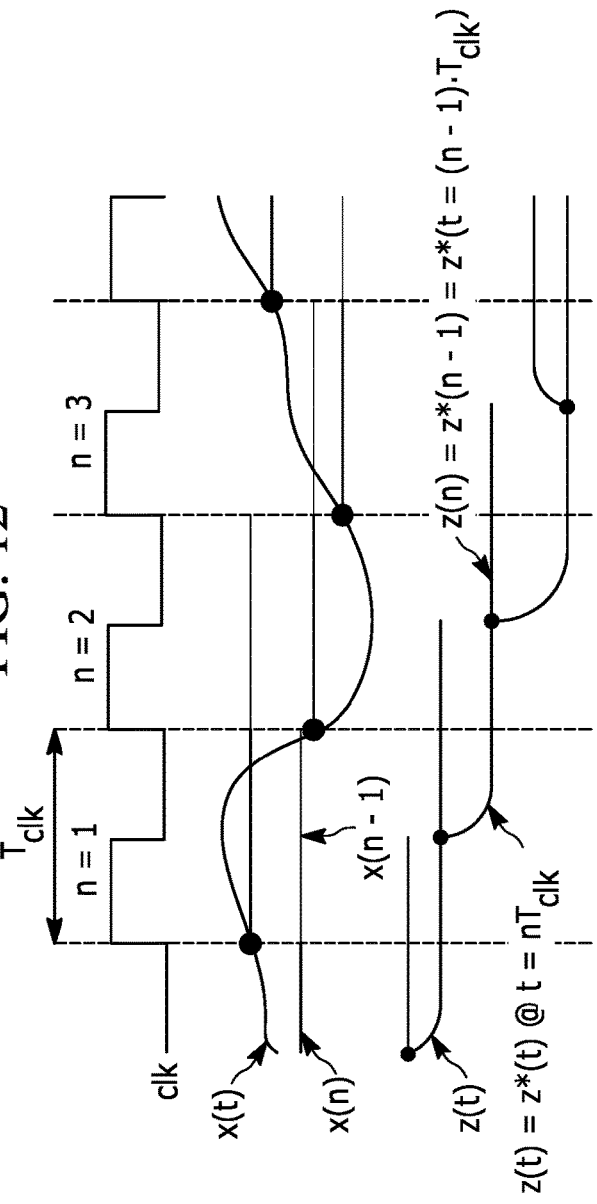
FIG. 13 illustrate waveforms for DEQ discrete time system of an embodiment from FIG. 12.

FIG. 12 signal flow diagram for DEQ. It may be a discrete time implementation. The waveforms for the DEQ discrete time system are shown in FIG. 13. In one example of a DEQ network based on discrete time is shown in FIG. 12. In this case the inputs and states of the DEQ network are sampled at times, $nT_{clk}$. The output of the sample and hold 1203, 1207 can have a delay. The second sample and hold 1207 will output a function of the DEQ states. The input can be a scalar, vector, or tensor, as well as the output being the same. The output 1211 may be a DEQ model, or a scalar, vector, or tensor.

FIG. 13 illustrates an example of waveforms for DEQ discrete time systems. For this example, the sample and hold may be ideal and has zero delay. FIG. 13 also illustrates waveforms describing the time sequence for the inputs and outputs of the DEQ network. This is an interesting example in that the compute fabric operates in continuous time on the discrete time inputs, x(n), z(n) and b(n), which remain constant, during the computation, FIG. 13. The output state, z(t), settles in continuous time to the equilibrium state, $z\hat{\phantom{}}*(t)=z(n)$. Note that the equilibrium state, $z\hat{\phantom{}}*(t)$, may be sampled and then used for computation in the output layer.

Figure 14:
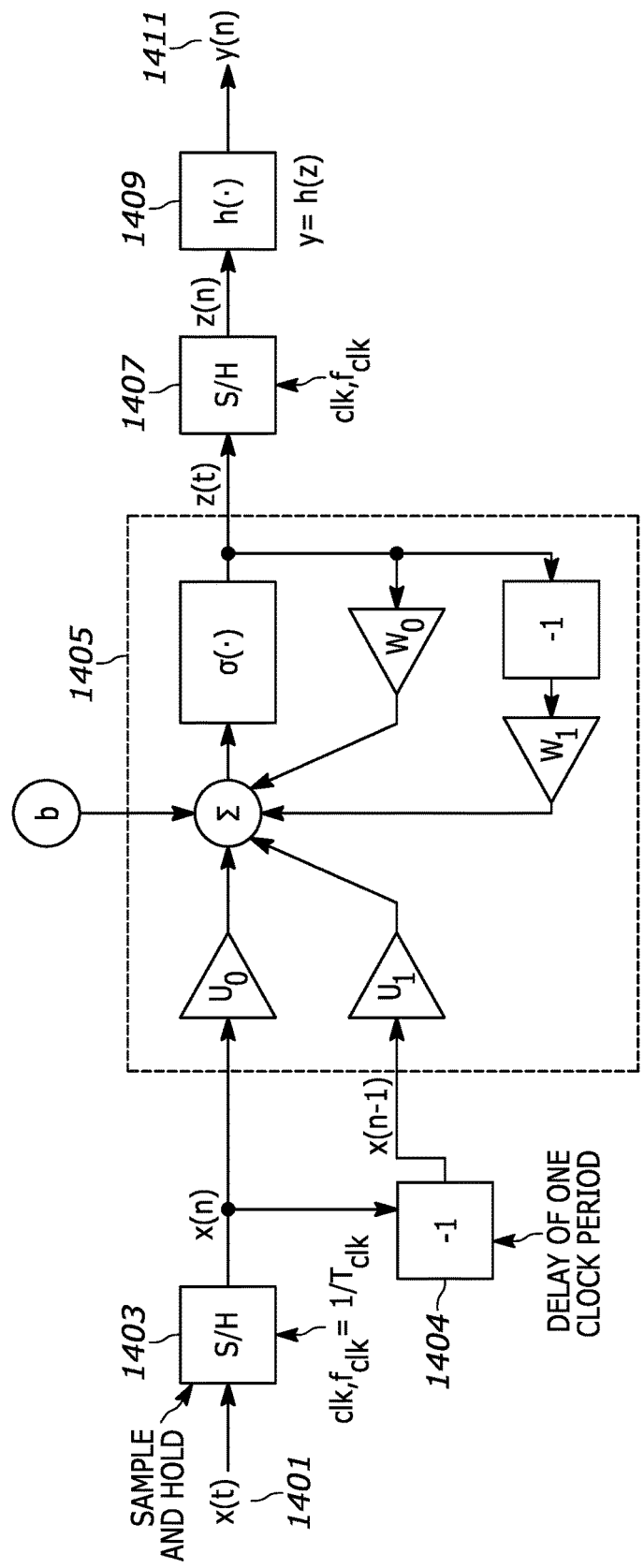
FIG. 14 illustrates a signal flow diagram for DEQ discrete time implementation with additional delayed inputs and feedback.

FIG. 14 illustrates a signal flow diagram for DEQ discrete time implementation with additional delayed inputs and feedback. A sample and hold circuit 1403 may retrieve the input 1401 over time. The time delayed input 1404 (e.g., shown as one clock period as an example, but may be any type of delay period) may be fed into the summation block 1405, which may be a compute fabric. The summation block 1405 may implement a nonlinear function based on the various inputs and states. The summation block 1405 may consider the delay of the root of one or more clock period, as shown in FIG. 14. The summation block 1405 may output a root to a second sample and hold circuit 1407. The sample and hold circuit 1407 may output a state of the DEQ model to a function 1409. Finally, an output 1411 of the DEQ model may be output as an arbitrary function of the DEQ network states.

Figure 15:
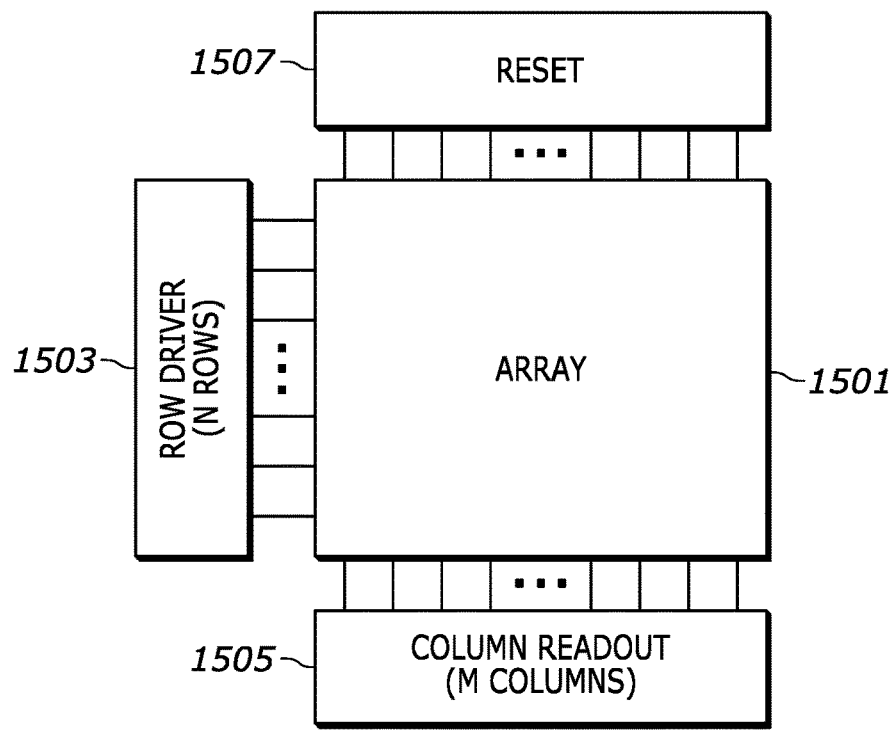
FIG. 15 illustrates a block diagram of in-memory compute MAC block.

FIG. 15 illustrates a block diagram of in-memory compute MAC block. In one simple implementation, N input activations may be provided along the horizontal dimension (one per row of unit elements) and M MAC outputs may be produced along the vertical dimension (one per column of unit elements). Thus, the row driver 1503 may output the N activations to the array 1501. The array may output the M columns to the column readout 1505. The input activations and outputs are represented by physical parameters, such as voltage. A "neuron" may refer to a single column including all the unit elements connected to that column. Multiple neurons (columns) are connected adjacently and each outputs the result of a single MAC operation. A reset block 1507 may optionally be included in order to reset the array to a specified initial condition.

Figure 16:
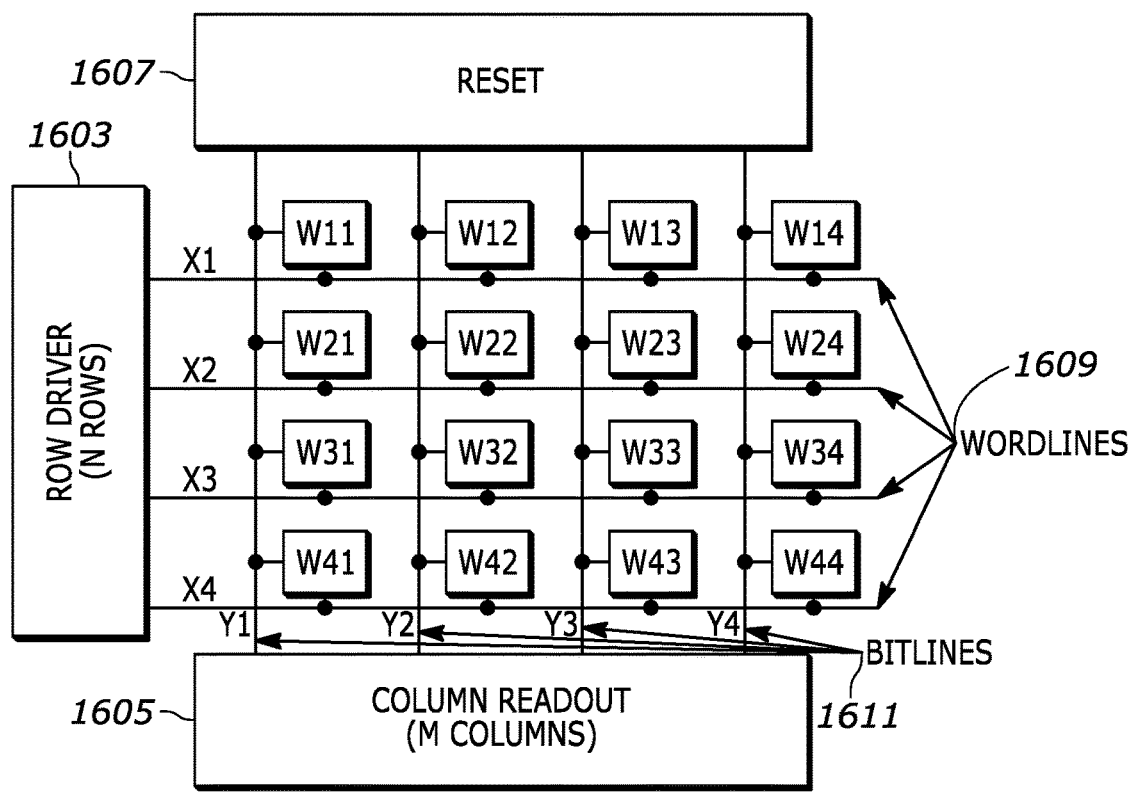
FIG. 16 illustrates a 4×4 subset of an array, such as a four by four subset of an N×M array.
Figure 17A:
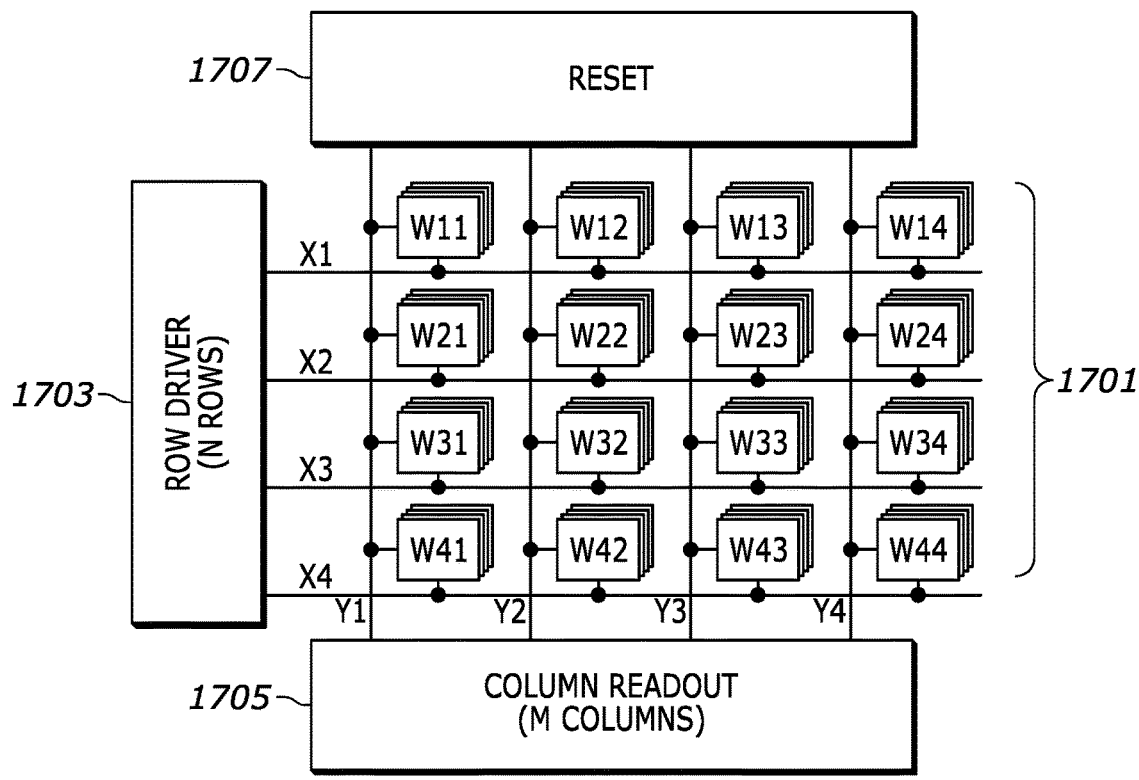
FIG. 17(a)-(g) illustrates a number of techniques to extend the architecture shown to scale to higher resolution weights, higher resolution input activations, and differential operation.
Figure 17B:
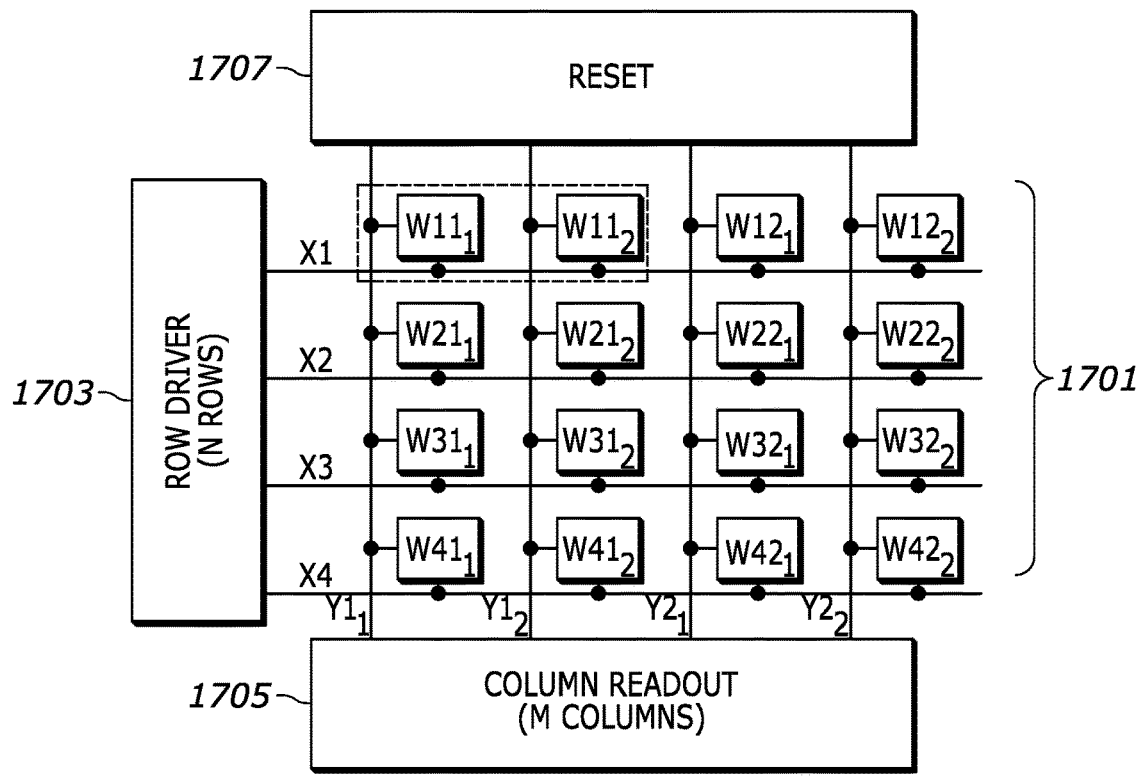
Figure 17C:
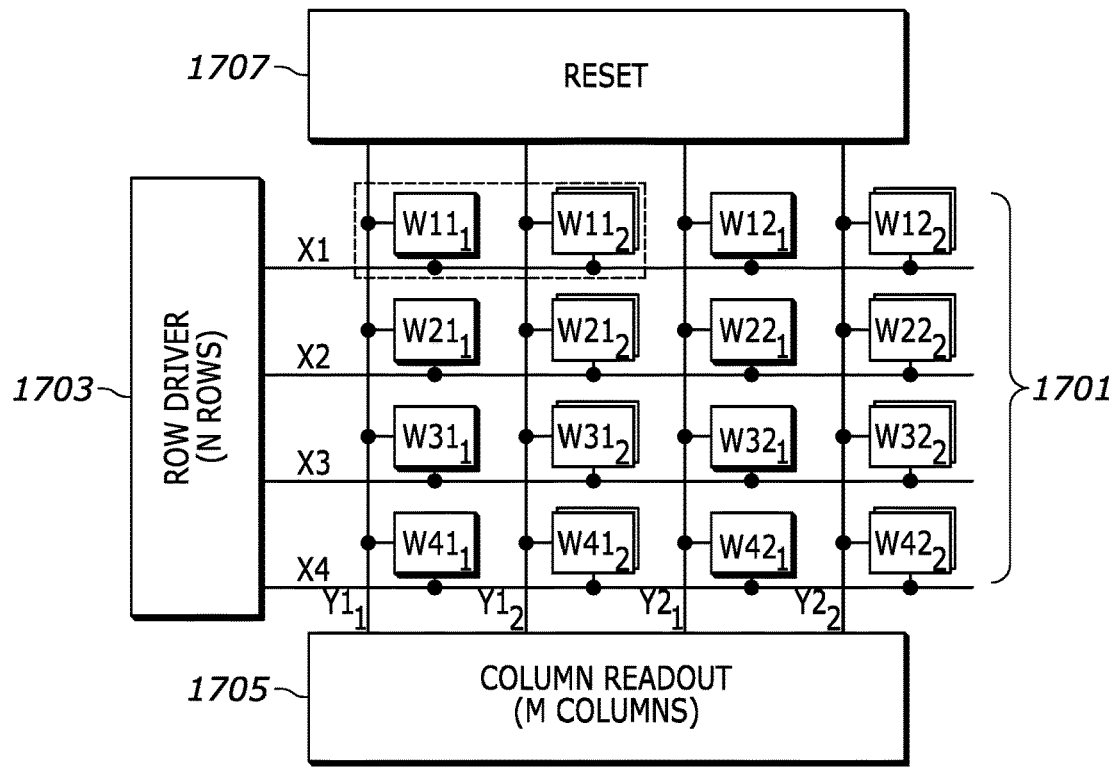
Figure 17D:
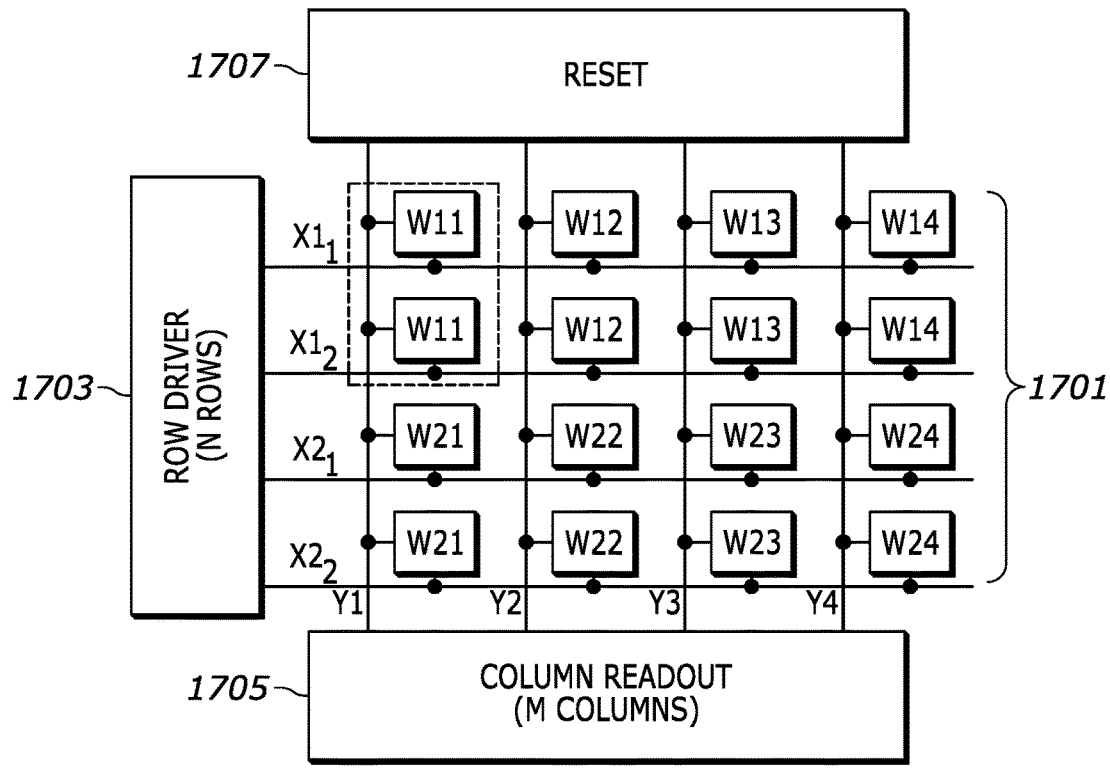
Figure 17E:
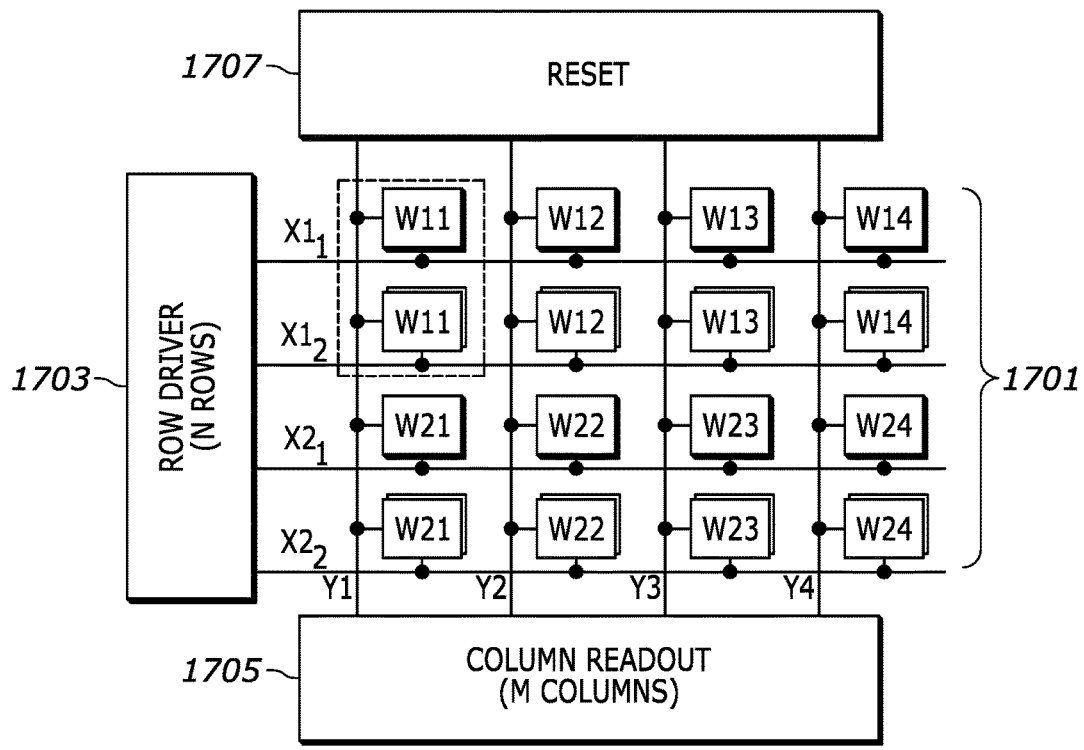
Figure 17F:
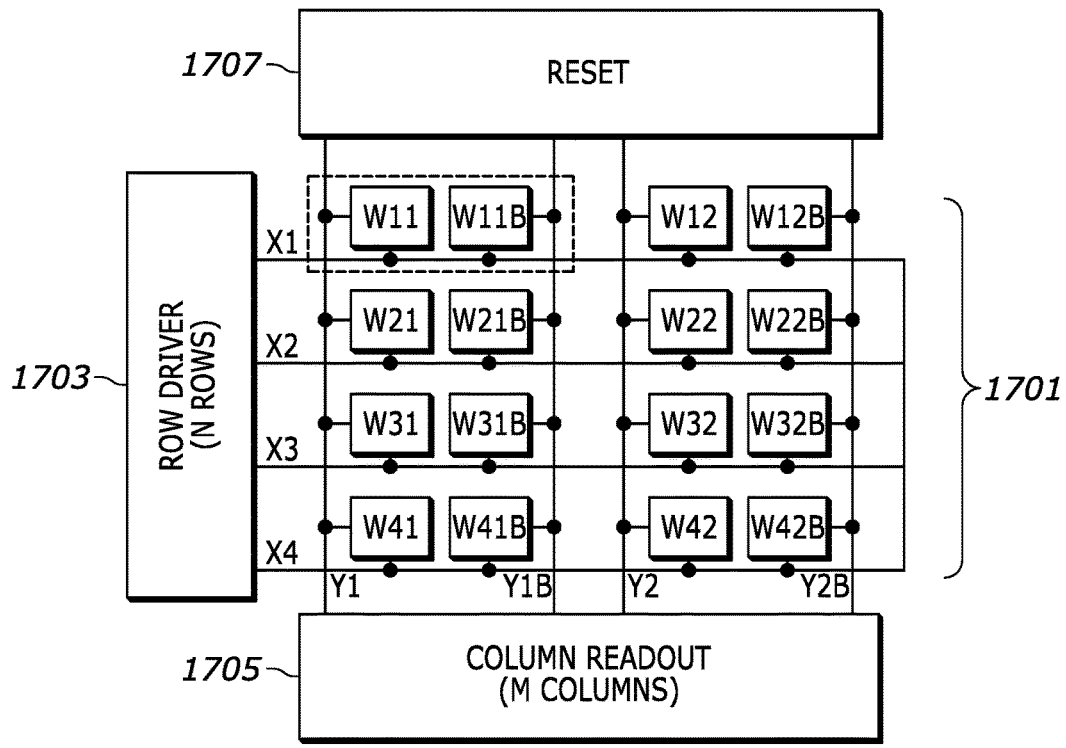
Figure 17G:
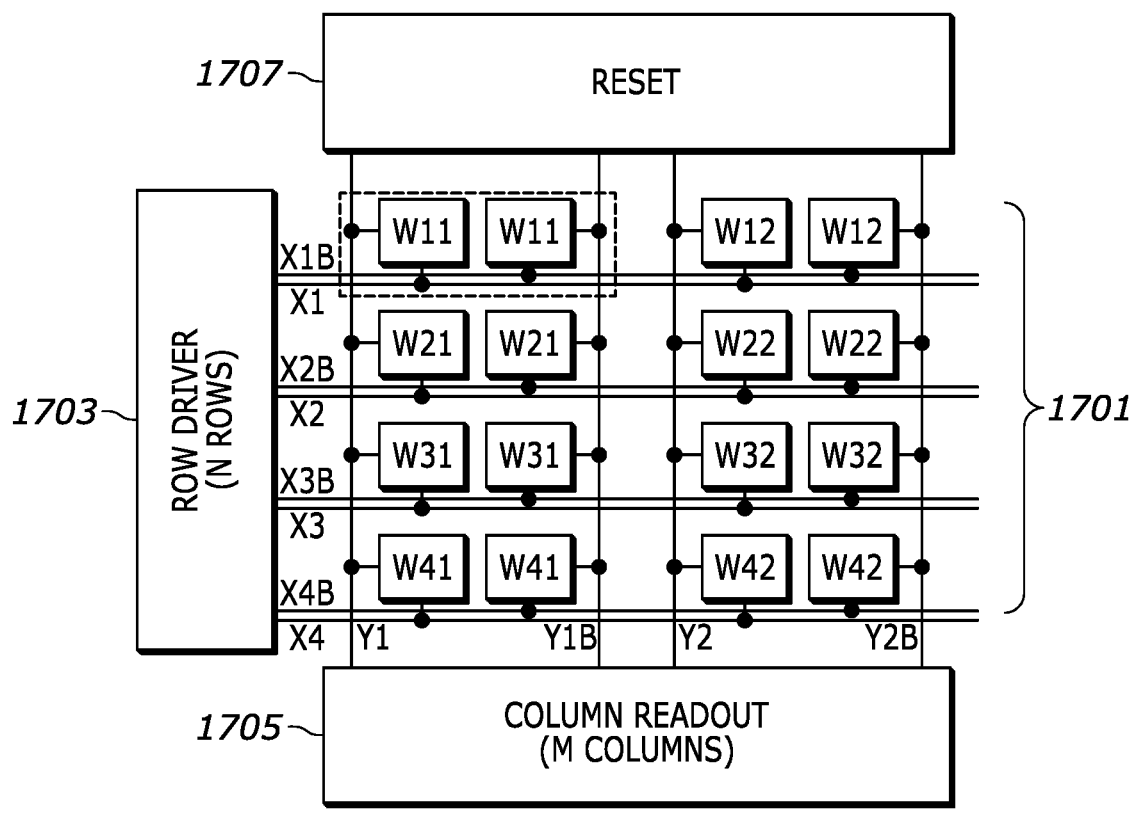

FIG. 16 illustrates a 4×4 subset of an array, such as a four by four subset of an N×M array 1501. Thus, the figure may detail the inside of a MAC array showing a single element connected to a wordline 1609 and a bitline 1611. Inputs (Xi) may be provided as single bit resolution (binary) values or with resolution higher (multi-bit) resolution, but the summation is always performed in each column in an analog fashion. Each unit element stores a weight value (Wij) that may be single bit resolution (binary) or with higher (multi-bit) resolution. The weight is stored using a physical parameter (for example, conductance) of the circuit elements in the unit cell. The output of each column of the array (Yj) is an analog value that can be kept in the analog domain, digitized for further use inside the processor, such as for the input to another MAC block, or used as a final output. For dynamic readout schemes, a reset block 1607 may optionally be included in order to reset the array to a specified initial condition.

FIG. 17 illustrates a number of techniques to extend the architecture shown to scale to higher resolution weights, higher resolution input activations, and differential operation. Multiple unit elements may be used in parallel to increase the weight resolution as shown in FIG. 17(*a*). Weight values may also be encoded using a thermometer code, binary code, or other code (i.e. weight W11 may be split into multiple encoded components, $W11_1$, $W11_2$, etc.). As shown in FIG. 17(*b*), unit cells corresponding the encoded weight components may be connected across multiple bit lines. The partial results (e.g. $Y1_1$ and $Y1_2$) of corresponding biltines are combined by the column readout circuitry in the digital or analog domain. For a thermometer coding scheme, each component of the weight (e.g. $W11_1$, $W11_2$) has the same impact on the result of the MAC operation. However for a binary or other coding scheme, each weight component has a scaled impact to the result of the MAC operation. This scaling may be accomplished digitally within the column readout 1705 circuitry. Alternatively, the physical parameter that represents the weight value within the unit cell (e.g. conductance) may be scaled appropriately to match the encoding scheme. As shown in FIG. 17(*c*), instead of scaling the physical parameter, multiple unit elements may be used in parallel in some columns to match the encoding scheme. The resolution of the input activations may also be increased using techniques similar to those shown in FIG. 17(*b*) and FIG. 17(*c*). The input activation values may also be encoded using a thermometer, binary, or other code (e.g., input X1 is split into multiple encoded components, $X1_1$, $X1_2$, etc.). As shown in FIG. 17(*d*), these input values are provided to unit elements containing the same weight value and connected to the same bitline. For example, the weight value $W_{11}$ is stored in all unit cells in a single column that are also connected to a component of X1. For a thermometer coding scheme, each component of the input (e.g. $X1_1$, X12) has the same impact on the result of the MAC operation. However for a binary or other coding scheme, each input component may have a scaled impact to the result of the MAC operation. This scaling may be accomplished by appropriately scaling the physical parameter representing the input activation (e.g. voltage) to match the encoding scheme. Instead, the physical parameter representing the weight value stored in the unit elements (e.g. conductance) in some rows may be scaled in order to scale the impact of individual components of the input activation and match the encoding scheme. Alternatively, as shown in FIG. 17(*e*), multiple unit elements may be used in parallel in some rows to scale the impact of individual components of the input activation and match the encoding scheme.

Differential techniques that offer robustness against supply noise and variation while increasing dynamic range may also be used as shown in FIG. 17(*f*) and FIG. 17(*g*). FIG. 17(*f*) shows an differential weight scheme where complementary weight values (e.g. W11 and W11*b*) are stored in unit elements connected to complementary bitlines, but to the same input activation. The outputs of the complementary bitlines (e.g. Y1 and Y1*b*) may be read out differentially by the column readout circuits. FIG. 17(*g*) shows a differential input activation scheme where complementary input activation values (e.g. X1 and X1*b*) are provided on separate wordlines. The complementary wordlines may be connected to unit elements storing the same weight value, but connected to complementary bitlines. As before, the outputs of the complementary bitlines (e.g. Y1 and Y1*b*) are readout differentially by the column readout circuits.

The techniques described in FIG. 17 are compatible with each other and may be used in the same implementation. Thus, various weight schemes may be used interchangeably.

In one embodiment, such as shown in FIG. 17(*a*), multiple unit cells may be used to increase the resolution of stored weights. In another embodiment, such as shown in FIG. 17(*b*), unit cells 1701 storing components of encoded weights 1701 may be connected to separate bitlines. The partial results of the separate bitlines may be combined in the column readout circuit in the analog or digital domain. In another embodiment, such as shown in FIG. 17(*c*), the multiple unit cells may be used in parallel on some columns in order match the encoding scheme. In another embodiment, such as shown in FIG. 17(*d*), encoded input activations may be applied to unit cells holding the same weight values and connected to the same bitline in order to increase the resolution of the input activation function(s). In another embodiment, such as FIG. 17(*e*), multiple unit cells may be used in parallel in some rows 1703 in order to scale the impact of the input activation function and match the encoding scheme. In the embodiment of FIG. 17(*f*) differential weights connected to separate bitlines. The differential output on the bitlines is read using differential column readout circuits. In the embodiment, FIG. 17(*g*) differential input activations are provided to duplicated weights connected to separate bitlines. The differential outputs on the bitlines are read using differential column readout circuits. The embodiment may also include a reset block 1707.

The row driver 1703, unit cell in the array, and column readout 1705 circuits work together to perform the MAC computation. Together the row driver and column readout circuits form the interface to the MAC engine. The input to the MAC engine may be represented in one of multiple possible domains, such as voltage, current, charge, or time. The same domain or another domain may be used as the output. For example, a voltage-driver may be used to provide the input activation along the wordlines and a current readout circuit may be used to read the output from the bitlines. These interface circuits may be static, where the output of the array naturally settles to the output of the MAC operation value whenever a new input is applied, or may be dynamic. In a dynamic implementation several clock phases may be used to complete a single MAC operation, such as in a switched-capacitor scheme. The interface circuits may also be time-based. For example, the input activation value may be encoded in the width or duration of a voltage pulse.

FIG. 18 illustrates example interface circuits are shown. FIG. 18(a) shows a voltage-based row driver (for example, a digital-to-analog converter (DAC) followed by a voltage buffer) that provides a new static voltage, $V_{Xi}$, on wordline i for each input value (In1, In2, In3, etc.). FIG. 18(b) shows a voltage pulse-width modulation (PWM) based scheme that provides a voltage pulse with variable width proportional to the input activation value. A pulse-density modulation (PDM) scheme may be used instead where a number of pulses proportional to the input activation value are applied to the wordline. In a PDM scheme, each pulse has identical width/duration. FIG. 18(c) shows a current PWM based scheme that provided a current pulse, $I_{Xi}$, with variable width proportional to the input activation value. The voltage developed on the wordline, $V_{Xi}$, for each input depends on the current level, the pulse duration, and the impedance of the wordline. Thus, current-based drivers are more suitable for implementations where the wordline impedance is constant (independent of input activation or stored weight values). A PDM scheme may also be used instead of PWM with a current driver for a similar effect. FIG. 18(d) shows a row readout circuit that directly reads the voltage, $V_{BLj}$, or current, $I_{BLj}$, from bitline j. The current, $I_{BLj}$, from bitline j may also be read out using a transimpedance (TIA) amplifier as shown in FIG. 18(e). The TIA maintains the bitline voltage, $V_{BLj}$, as a virtual ground and the bitline current is shunted through the impedance $Z_j$ to convert the value to a voltage. FIG. 18(f) shows a capacitive TIA that functions as a charge integrator. The capacitive TIA can be used along with a switched capacitor scheme to readout out a charge-based signal. An analog-to-digital converter (ADC) may be directly used on the bitline as shown in FIG. 18(g) to convert the analog value (for example voltage, current, or charge) to a digital one or it may follow another amplifier (shown in the dashed line). FIG. 18(h) shows a differential readout scheme (which may be based on any of the schemes shown in FIG. 18(d-g), reading the difference in output quantities (for example, voltage, current, or charge) between adjacent columns or sets of columns. In a differential implementation, complementary weights are stored in the unit cells in adjacent columns.

Within the MAC engine array, the unit element facilitates the multiplication operation between the input activation and the stored weight value. Additionally, the unit element may also function as a transduction element. It may also convert from the input domain, such as voltage, current, or time, to another domain, such as voltage, current, charge, or time, that will be accumulated by way of the shared bitline and read out of the MAC engine.

In many NN algorithms, a trainable bias (offset term) is added to the output of the MAC operation. This can be facilitated within the array structure, such as the one shown in FIG. 16 by dedicating one or more rows of unit elements to store the bias parameters and applying appropriate inputs to the corresponding wordlines. The bias may also be included inside analog or digital circuits inside the column readout structure or in circuitry after the MAC unit before the input to the input to the next layer of the NN.

FIG. 18 illustrates examples of implementations for the interface circuitry for the MAC engine. For example, FIG. 18(a) is an illustration of static voltage input. In another example, FIG. 18(b) illustrates pulse-density modulated voltage pulses. In yet another embodiment, FIG. 18(c) illustrates direct voltage or current readout. In another exemplary embodiment, FIG. 18(d) shows a transimpedance amplifier readout. In another embodiment, FIG. 18(e) illustrates capacitive transimpedance amplifier (charge integrator) for charge-based readout. In another illustration, FIG. 18(g) an ADC may be used to directly to read out the result of the MAC operation or may follow an amplifier. In yet another illustration, FIG. 18(h) utilizes a differential readout between adjacent columns or sets of columns, j and j+1.

Several types of random-access memory (RAM) technologies have been used for mixed-signal IMC NN processors, such as SRAM, resistive RAM (RRAM) or phase change memory (PCM), magnetoresistive RAM (MRAM), ferroelectric field-effect transistors (FeFETs), and flash memory. Memories using these RAM technologies can be read and updated in any order. SRAM is a volatile RAM memory technology typically organized as unit cells with six, eight, or more transistors that can store binary weight values. Additionally, SRAM is widely available in most standard integrated circuit processes and does not require any special processing. The other technologies listed above, besides flash memory, are emerging non-volatile memory (called eNVM or NVRAM) and may store binary values, values with more bits of resolution, or analog values. The unit elements in these different NVRAM technologies can be physically smaller than an SRAM cell, potentially down to the minimum feature size of the technology (e.g. on the order of the size of a single transistor). However, many NVRAM technologies are still under development, are not typically available in standard integrated circuit processes, and have higher cost. Additionally, since these NVRAM technologies require reprogramming a physical parameter such as resistance, they have issues from poor stability, retention, yield, and drift performance.

A one-time programmable read-only memory (ROM) can be used in the unit element of an IMC processor. The ROM array can be programmed either during or shortly after the fabrication of the processor. ROM-based processors can be designed in any integrated circuit process using components inherent to the technology and have advantages in terms of performance, security, and cost. They are well-suited to applications that do not require reprogramming in the field, such as low-cost sensors deployed at the edge for internet-of-things (IoT) applications. For other applications, ROM-based compute units can also be used alongside compute units containing RAM. The majority of the model parameters can be fixed while maintaining a dedicated set of reprogrammable task-specific parameters for some NN algorithms. This can be accomplished in a processor based on IMC by storing the majority of model parameters inside the ROM-based compute units with a fewer number of task-specific parameters stored in a RAM-based compute unit using a technology such as SRAM. This method maintains most of the advantages of a ROM-based IMC architecture while allowing programmability for task specialization, dealing with operating conditions that vary over time, and training at the edge.

Figure 19:
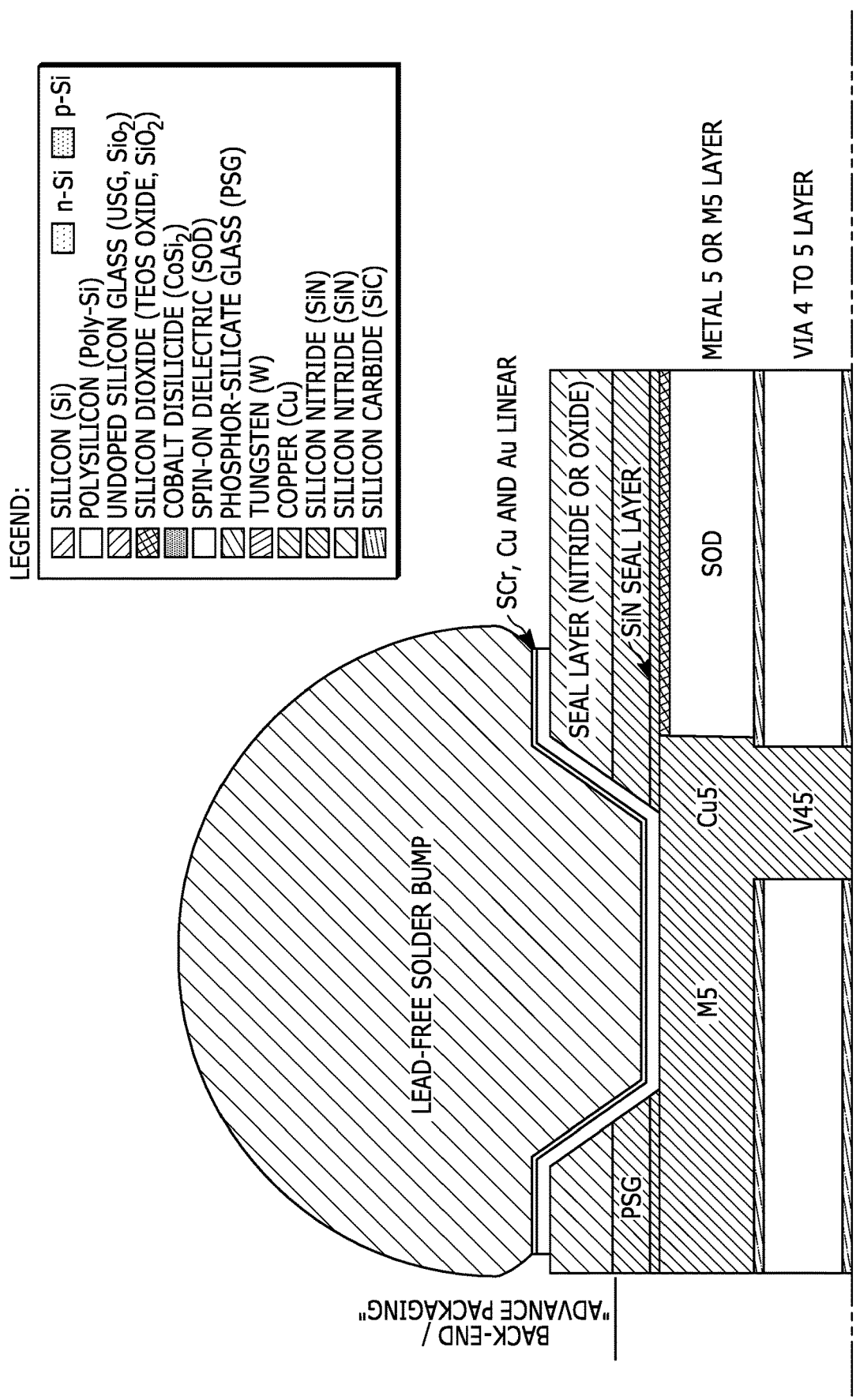
FIG. 19 illustrates an example of CMOS semiconductor process.
Figure 19:
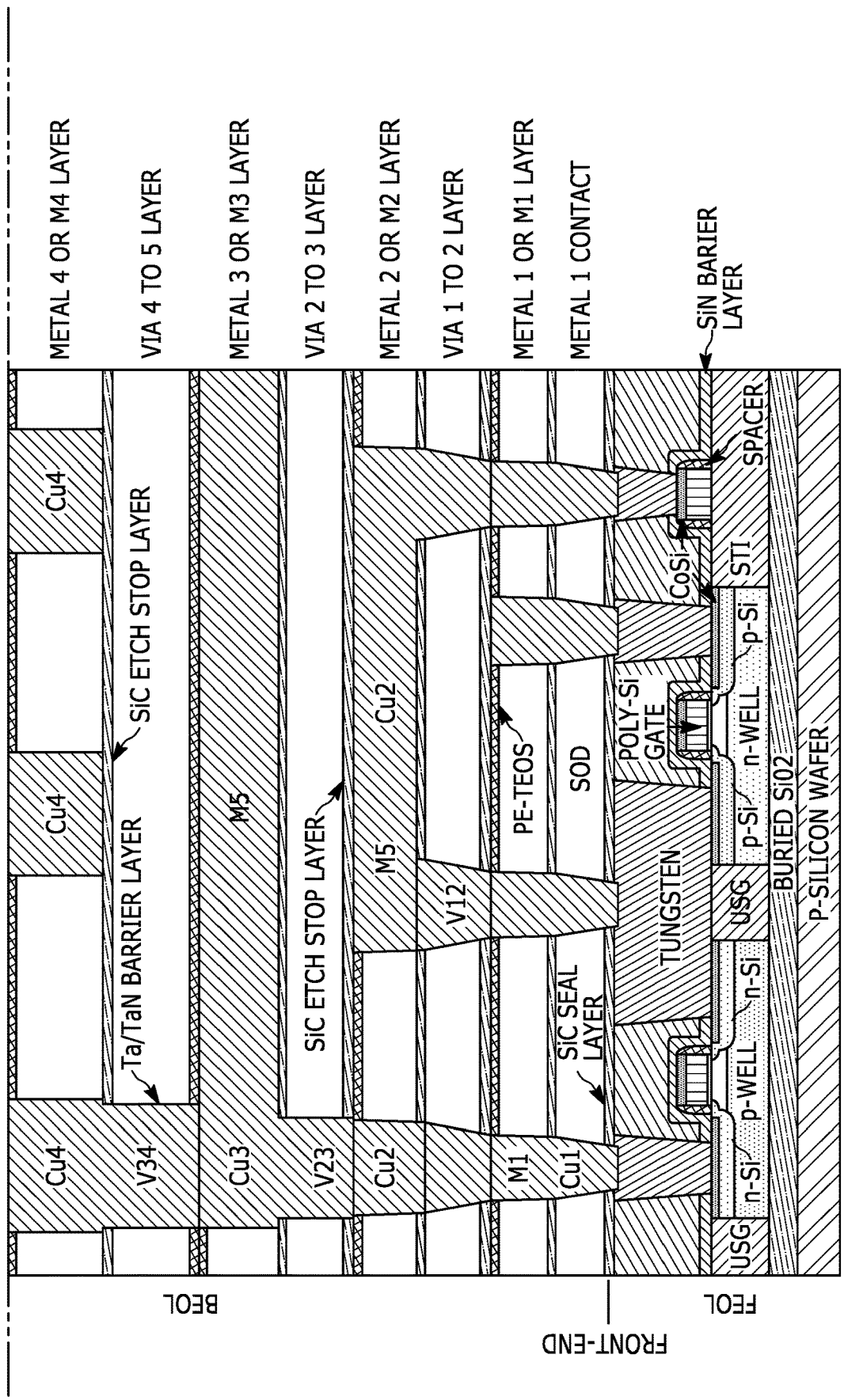

FIG. 19 illustrates an example of CMOS semiconductor process. The weight values in the IMC ROM-based compute units are one-time programmable during or shortly after fabrication. The back end of line (BEOL) electrical interconnect in a CMOS semiconductor process (shown in FIG. 19) is used to enable programmability. For example, metal connections, contacts to silicon-based devices (such as transistors, resistors, or diodes), or vias between metal layers can be used to reconfigure the weights stored in a NN. This can be done cheaply after the front end of line (FEOL) processing is complete by changing the lithographic masks used to define the metal, contact, or via layers in the BEOL process. Finally, it may be possible to store partially-processed CMOS wafers for configuration later. The wafer processing can be stopped before processing the layer (such as a metal, contact, or via layer) and may be used to define the weights stored in the ROM-based compute units. At that point the wafers can be stored for programming later while processing the remaining layers. This enables the quick production of different versions of ROM-based compute units at low cost with only changes to a small number of masks or even just a single mask layer.

As shown, a cross section of a typical CMOS semiconductor process showing the front end of line (FEOL) containing devices made in silicon—resistors, transistors, capacitors. As well as the back end of line, (BEOL) which defines the electrical interconnect on the chip. Note the BEOL layer stack can also typically contain electrical devices, such as capacitors, inductors, resistors, etc. In more advance processes, the BEOL layer stack can also have nonvolatile memory such as PCM, RRAM and 3D NAND flash.

FIG. 20 illustrates various examples on embodiments between connections of a unit cell with a wordline 2001 and a bitline 2003. For example, in FIG. 20(a), the embodiment illustrates a unit cell 2005 that is connected to both the bitline 2003 and wordline 2001. In FIG. 20(b), metal connections are changed in order to change the weight value stored in the cell. In FIG. 20(c), the embodiment shows a similar example where contact or via connections 2007 are changed in order to change the weight value. Thus, the unit cell weight is changed by removing a contact or via connection. Alternatively, internal metal connections within the unit cell may be modified in order to program the weight stored in the unit cell. For example, as shown in FIG. 20(d) metal layer connections can be used to connect to zero, one, or multiple connection options (e.g. C1, C2, or C3). In such an embodiment, the weight is changed by choosing internal metal connections 2009. FIG. 20(e) shows that contact or via connections can be used instead of metal layer connections. One-time programmable eFuses may also be used to program the weight values, however, these may not be as area-efficient as programming using metal, contact, or vias.

ROM-based compute units programmed using the methods shown in FIG. 20 may also be compatible with the implementations shown in FIG. 17 and the readout schemes described above and shown in FIG. 18. For example, the scheme shown in FIG. 17(a), where multiple unit cells are connected in parallel, can be combined with the programming method shown in FIG. 20(d) and FIG. 20(e). Passive (e.g., resistors and capacitors) and/or active (e.g. transistors) elements may be included in the unit cell with the stored weight value determining how they are interconnected. For example, to store a weight value of "3," three transistors may be connected in parallel and to the wordline and bitline. Instead of multiple transistors, multiple fingers of a single transistor may also be used that are reconfigured according to the desired weight.

There may be multiple implementations for an in-memory compute (IMC) ROM-based compute unit. These may involve a combination of transistors and/or passive elements (resistors and capacitors). Each of these implementations takes advantage of elements that are commonly available in widely used standard integrated circuit processes, do not require a specialized technology, and thus can be implemented at low cost. Moreover, since these implementations are using well-modeled components in the technology, their performance is robust and can be guaranteed compared to the experimental or emerging technologies (e.g. RRAM and MRAM) mentioned above. Transistors and passive elements can be made on the order of the minimum feature size in the technology, allowing these implementations to be very compact and have a low area overhead, which directly translates to a low cost. Several specific implementations of the ROM-based compute unit and their operation will be described below. These are mainly differentiated by the structure of the unit element in the ROM, as discussed further below.

For these reasons, ROM-based IMC units have the following advantages over other technologies. For example, they do not suffer from the stability, retention, yield, or drift issues that can be a problem for long-lifetime operation with non-volatile memory technologies like PCM, RRAM, MRAM, FeFET, or Flash. Additionally, the ROM-based IMC units do not suffer from the leakage currents that consume significant static power in technologies like SRAM.

ROM-based unit cells can be designed using elements widely available in all integrated circuit processes (e.g. resistors, capacitors, and transistors) and do not require a specialized technology with high cost. ROM unit elements can be made with high density, with size on the order of a single transistor, further reducing cost and allowing algorithms requiring a large number (e.g. millions) of parameters to be stored on a single chip.

No circuitry may be required for programming the unit elements, saving area, cost, and power. ROM-based compute units may provide confidentiality, since no circuits that are included to reprogram or read the memory directly and thus it is very difficult to copy the model parameters (and the algorithm) out of the compute unit. ROM-based compute units may also have high integrity and authenticity for similar reasons. Thus, after the sensor is deployed, it may be impossible to reprogram the stored model parameters, making the compute unit tamperproof.

The ROM-based compute units can be programmed using BEOL metal, contact, or via connections alone. If one layer, such as the top or last metal layer, or a small number of layers is used to program the compute unit, wafers can be fabricated up until the programming layer and stored. When desired, the BEOL processing can be completed with changes to only one mask, or a small number of masks, in order to fabricate compute units with updated or different algorithms for improved performance, task specialization, or entirely new applications. This can be done at low cost as modifications are only required for a small number of masks or even a single mask.

All of the following compute unit implementations using ROM-based elements shown in FIG. 21-34 can be programmed using metal, contact, or via connections as shown in FIG. 20. In order to illustrate the operation of each implementation, an example is presented using unipolar weight encoding (e.g. weight values of "0" or "1") and a single interface scheme for each. Other weight encodings, such as bipolar weights (e.g. weight values of "−1" or "1") or multi-bit weight values are possible using the schemes shown in FIG. 17. It is possible to use other interface schemes, such as the different variants in FIG. 18. The choice of encoding method and interface (driver and readout scheme) will depend on technology limitations as well as performance metrics, such as area, cost, latency, throughput, and signal-to-noise ratio.

Figure 21:
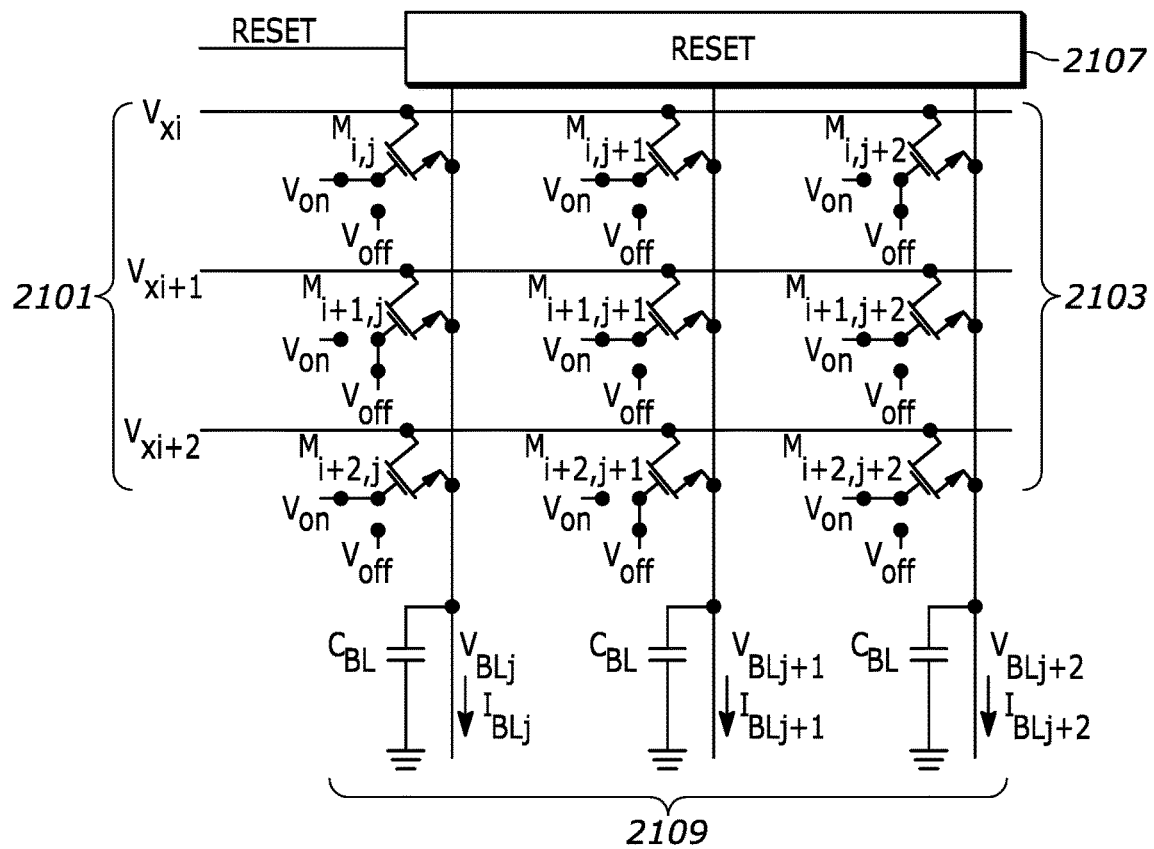
FIG. 21 illustrates an example of a single transistor (1T) ROM-based compute unit utilizing a first implementation.

FIG. 21 illustrates an example of a single transistor (1T) ROM-based compute unit utilizing a first implementation. A single-transistor can be used as a ROM unit element that stores a binary weight value, for example either "0" or "1." This may be accomplished with several implementations. FIG. 21 illustrates a first implementation in which a single NMOS transistor 2103 that may be used as the unit element with the first (drain) terminal connected to the wordline and the second (source) terminal connected to the bitline. A three by three array subsection of an N by M array is shown. PMOS transistors can be used instead of NMOS devices. Additionally, the source and the drain terminal connections can be switched. The weight may be encoded in the gate connection of the transistor, either to a voltage $V_{on}$ or to a voltage $V_{off}$. If the gate of transistor $M_{i,j}$ is connected to $V_{on}$, the device is on and the corresponding stored weight, $W_{i,j}$, may be considered to be "1." The transistor may act as a resistor with effective resistance $R_{i,j}=R_{on}$ and conductance $G_{i,j}=G_{on}$. Alternatively, if the transistor gate is connected to $V_{off}$, the device may be off and the $W_{i,j}$ is considered to be a "0." The weight may also be set to "0" by leaving the gate connected to $V_{on}$ and disconnecting one or both terminals from the wordline or bitline. The transistor may act as a resistor with effective resistance $R_{i,j}=R_{off}$ and conductance $G_{i,j}=G_{off}$. Such an implementation may also be compatible with the techniques shown in FIG. 17 for increasing the resolution of the input activations or weights, as well as differential operation. The relationship between the conductance value and the weight value can be described in the formula below:

$$G_{i,j}=G_{scale} \cdot W_{i,j}+G_{offset} \quad (18)$$

The term, $G_{scale}$, may be a scaling factor that converts the weight to a conductance and $G_{offset}$ is an offset that may also be equal to zero.

As described above, there may be multiple possible implementations of the row driver and column readout circuits (voltage or current based, static or dynamic). In one embodiment, a single possible drive and readout scheme may be an example (static, voltage based input activation and current readout). In this implementation, the reset block is not needed and can be omitted. Considering only a single bitline and column (corresponding to a single neuron in the NN), the multiplication operation is performed by applying input activations ($X_i$) as voltages ($V_{Xi}$) 2101 along the wordline which can carry binary information (digital) or multiple bits of information (up to analog values):

$$V_{Xi}=V_{Xscale} \cdot X_i+V_{Xoffset} \quad (19)$$

The term $V_{Xscale}$ is a scaling factor that converts the activation value to a voltage and the $V_{Xoffset}$ term is an offset that may also be equal to zero. The activation voltage generates a current in the transistor that is proportional to its effective conductance and thus represents multiplication with the stored weight value:

$$I_{i,j}=\frac{V_{Xi}-V_{BL}}{R_{i,j}}=(V_{Xi}-V_{BL}) \cdot G_{i,j} \quad (20)$$

If the second terminal of each transistor in a column are connected to the same bitline at the input of a transimpedance amplifier (as shown in FIG. 18) and held at a constant voltage level ($V_{BL}$), the current summation represents the accumulation operation:

$$I_{BLj}=\sum_{i=1}^{N} I_{i,j} = \sum_{i=1}^{N} (V_{Xi}-V_{BL}) \cdot G_{i,j} \quad (21)$$

In an example implementation using binary weight values where $G_{offset}=0$, $V_{BLj}=0V$, $V_{Xoffset}=0V$, combining Equation (Eq.) 18, 19, and 21 gives:

$$I_{BLj}=\sum_{i=1}^{N} V_{Xscale} \cdot X_i \cdot G_{scale} \cdot W_{i,j} = V_{Xscale} \cdot G_{scale} \cdot \sum_{i=1}^{N} X_i \cdot W_{i,j} \quad (22)$$

The summation 2109 in Eq. 22 represents the entire MAC operation. The current can be transformed to a voltage using a transimpedance amplifier and then digitized in a subsequent analog-to-digital converter stage. Alternatively, the current can be digitized directly using a current input ADC or buffered and passed to a subsequent stage. This operation is performed in each column (neuron) of the array using the weights stored in that column. The circuit may also include a reset block 2107.

Figure 22:
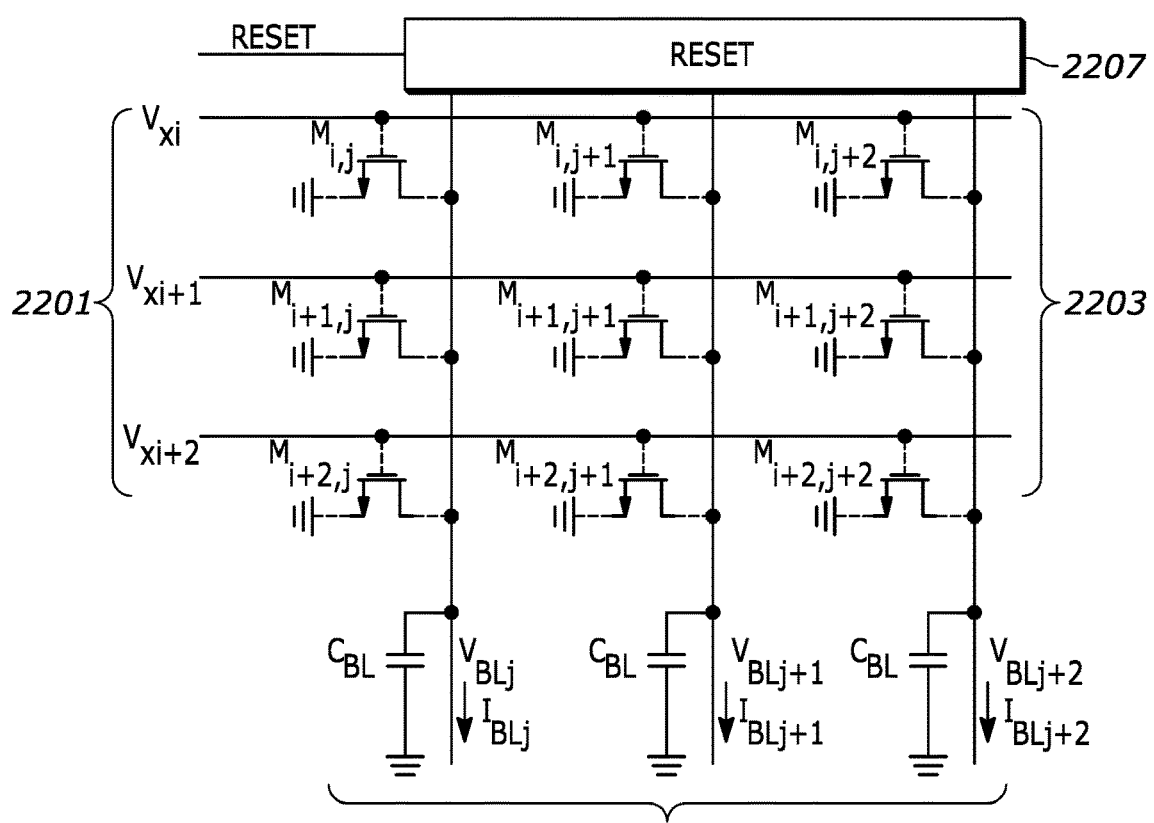
FIG. 22 illustrates an alternate implementation using a single transistor as the unit element.

FIG. 22 illustrates an alternate implementation using a single transistor as the unit element. In this embodiment, the transistor gate terminal is connected to the wordline, the first terminal (drain) is connected to the bitline, and the second terminal (source) is connected to a reference voltage. A three by three array subsection of an N by M array is shown. PMOS transistors can be used instead of NMOS devices. Additionally the source and the drain terminal connections can be switched. This reference voltage may be shown as signal ground, but can also be another voltage depending on the system design. The weight may be encoded in the unit cell by connecting or disconnecting one or more of the gate, drain, or source from the wordline, bitline, or reference voltage using metal, contact, or via connections in the CMOS process (the dotted lines in FIG. 22). When all of these terminals are connected, the weight, $W_{i,j}$, stored in transistor $M_{i,j}$ is "1." Depending on the biasing scheme of the transistor, there are multiple ways to model the effect of the weight on device parameters. If the transistor is biased in the triode region, it can be modeled as a resistor with effective resistance $R_{i,j}=R_{on}$ and conductance $G_{i,j}=G_{on}$. Alternatively, if the transistor is biased in the saturation or subthreshold regions, it can be modeled as a current source providing a current $I_{i,j}=I_{on}$. If any of the terminals are disconnected, the weight, $W_{i,j}$, stored in transistor $M_{i,j}$ is "0." If the transistor is biased in the triode region, it can be modeled as a resistor with effective resistance $R_{i,j}=R_{off}$ and conductance $G_{i,j}=G_{off}$ ($R_{off}$ may be very large if the terminals are disconnected from the bitline or the reference voltage). Alternatively, if the transistor is biased in the saturation or subthreshold regions, it can be modeled as a current source providing a current $I_{i,j}=I_{off}$. This implementation is also compatible with the techniques shown in FIG. 17 for increasing the resolution of the input activations or weights as well as differential operation. For the case when the "on" transistor is in the triode region and modeled as an impedance, the relationship between the conductance value and the weight value can be described using Eq. 18.

As described above, there are multiple possible implementations of the row driver and column readout circuits (voltage or current based, static or dynamic). Here we will describe only a single possible drive and readout scheme as an example (static, voltage based input activation and current readout) for the case where the transistor is modeled in the triode region 2203 as an impedance. In this implementation, the reset block is not needed and can be omitted. The input activations $X_i$ can be encoded in the voltages $V_{Xi}$ as described above and in Eq. 19. The voltage $V_{Xi}$ (shown as voltages 2201) may take analog values that further modulate the conductance of the transistor. Alternatively $V_{Xi}$ can be a digital signal with only two levels, low or high, corresponding to $X_i=0$ and $X_i=1$, respectively. In the case where $V_{Xi}$ is low, the transistor is always off, regardless of the weight value. The current through the unit element corresponds to the multiplication of the activation and the weight and is described by:

$$I_{i,j} = -V_{BL} \cdot X_i \cdot G_{i,j} \tag{23}$$

Considering only a single bitline and column (corresponding to a single neuron in the NN), all of the currents from the unit elements are summed along the bitline as described above:

$$I_{BLj} = \sum_{i=1}^{N} I_{i,j} = \sum_{i=1}^{N} -V_{BL} \cdot X_i \cdot G_{i,j} \tag{24}$$

Combining Eq. 24 with Eq. 18 and using $G_{offset}=0$, gives:

$$I_{BLj} = -V_{BL} \cdot G_{scale} \cdot \sum_{i=1}^{N} X_i \cdot W_{i,j} \tag{25}$$

In this implementation the voltage $V_{BL}$ cannot also be 0V and must be different than the reference voltage connected at the source of each transistor in order to generate a current. The summation 2109 in Eq. 25 represents the entire MAC operation. The current can be transformed to a voltage using a transimpedance amplifier and then digitized in a subsequent analog-to-digital converter stage. Alternatively, the current can be digitized directly using a current input ADC or buffered and passed to a subsequent stage. This operation is performed in each column (neuron) of the array using the weights stored in that column.

Figure 23:
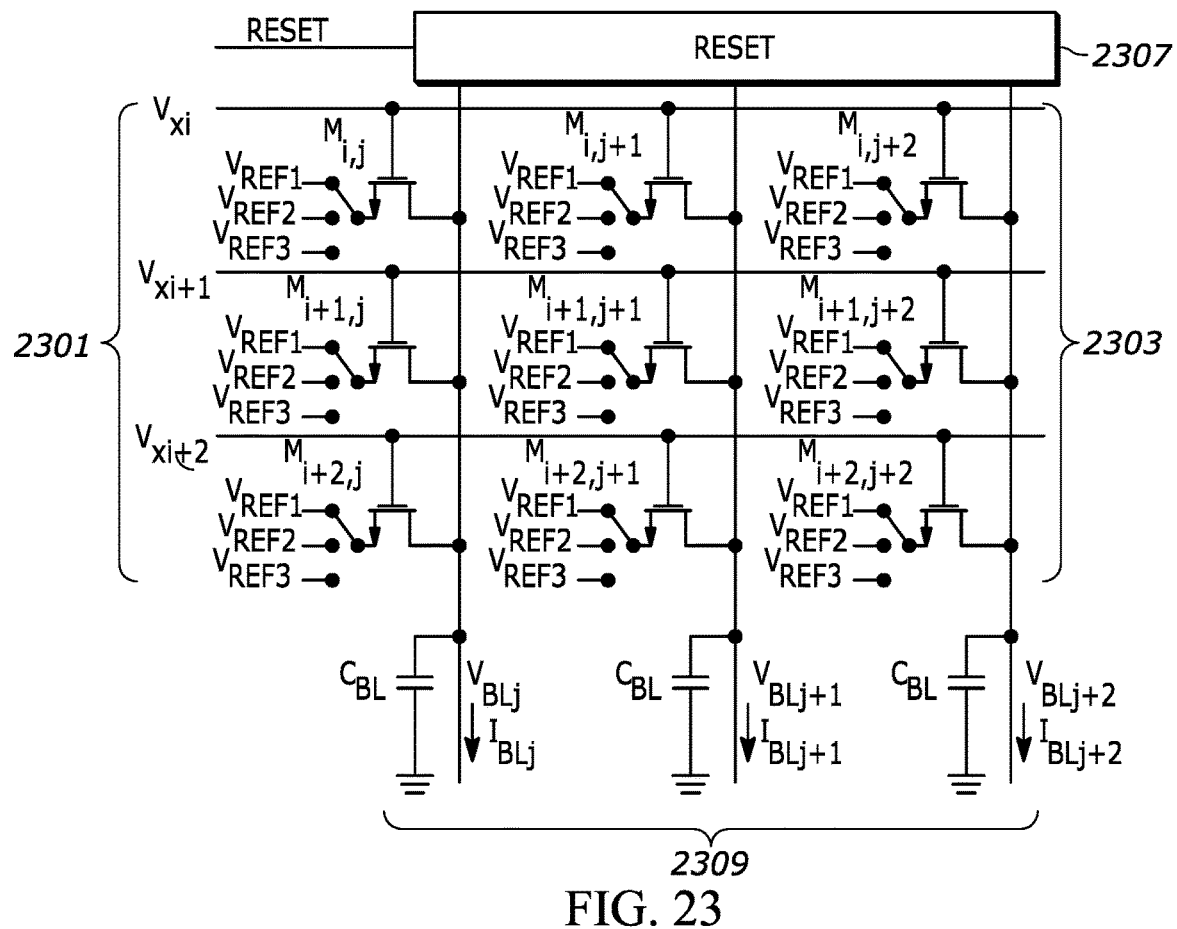
FIG. 23 illustrates an alternative embodiment using a single transistor as the unit element.

FIG. 23 illustrates an alternative embodiment using a single transistor as the unit element. In this embodiment, the transistor gate terminal is connected to the wordline, the first terminal (drain) is connected to the bitline, and the second terminal (source) is connected to one of a set of reference voltages. A three by three array subsection of an N by M array is shown. PMOS transistors can be used instead of NMOS devices. Additionally, the source and the drain terminal connections can be switched. The weight is programmed by choosing one of the possible reference voltages and connecting it to the transistor with each level corresponding to a single weight value. Three reference voltages 2303 are shown ($V_{REF1}$, $V_{REF2}$, and $V_{REF3}$), however any integer number, P, of reference voltages may be used. More reference voltage levels enables a larger number of weight levels (higher resolution) and fewer reference voltages only allows a smaller number of weight levels (less resolution). It is possible to allow the transistor to be disconnected from all reference voltages corresponding to one additional level (for a total of P+1). This implementation is also compatible with the techniques shown in FIG. 17 for increasing the resolution of the input activations or weights as well as differential operation. The reference voltage levels may be drawn from any distribution (i.e. they may not be evenly spaced), but a linear distribution may be used. The reference voltage level, $V_{REFi,j}$, in an individual unit cell corresponds to the weight level $W_{i,j}$ and can be described by the expression:

$$V_{REFi,j} = V_{REFscale} \cdot W_{i,j} + V_{REFoffset} \tag{26}$$

The term $V_{REFscale}$ is a scaling factor that converts the weight value to a voltage level and $V_{REFoffset}$ is an offset term that may also be equal to zero. In this case we can model the resistance and the conductance of the transistor $M_{i,j}$ as constant values: $R_0$ and $G_0$, respectively.

As described above, there are multiple possible implementations of the row driver and column readout circuits (voltage or current based, static or dynamic). Here we will describe only a single possible drive and readout scheme as an example (static, voltage based input activation and current readout). In this implementation, the reset block is not needed and can be omitted. The input activations $X_i$ can be encoded in the voltages $V_{Xi}$ (shown as 2301) as described above and in Eq. 19. The voltage $V_{Xi}$ may take analog values that modulate the conductance of the transistor. Alternatively, $V_{Xi}$ can be a digital signal with only two levels, low or high, corresponding to $X_i=0$ and $X_i=1$, respectively. In the case where $V_{Xi}$ is low, the transistor is always off, regardless of the weight value. The current through the unit element corresponds to the multiplication of the activation and the weight and is described by:

$$I_{i,j} = \frac{(V_{REFi,j} - V_{BL}) \cdot X_i}{R_0} = (V_{REFi,j} - V_{BL}) \cdot X_i \cdot G_0 \tag{27}$$

Considering only a single bitline and column (corresponding to a single neuron in the NN), all of the currents from the unit elements are summed in the bitline as described above:

$$I_{BLj} = \sum_{i=1}^{N} (V_{REFi,j} - V_{BL}) \cdot X_i \cdot G_0 \tag{28}$$

Combining Eq. 28 with Eq. 26 and using $V_{REFoffset}=0V$ and $V_{BL}=0V$, gives:

$$I_{BLj} = V_{REFscale} \cdot G_0 \cdot \sum_{i=1}^{N} X_i \cdot W_{i,j} \tag{29}$$

The summation 2309 in Eq. 29 represents the entire MAC operation. The current can be transformed to a voltage using a transimpedance amplifier and then digitized in a subsequent analog-to-digital converter stage. Alternatively, the current can be digitized directly using a current input ADC or buffered and passed to a subsequent stage. This operation is performed in each column (neuron) of the array using the weights stored in that column.

Figure 24:
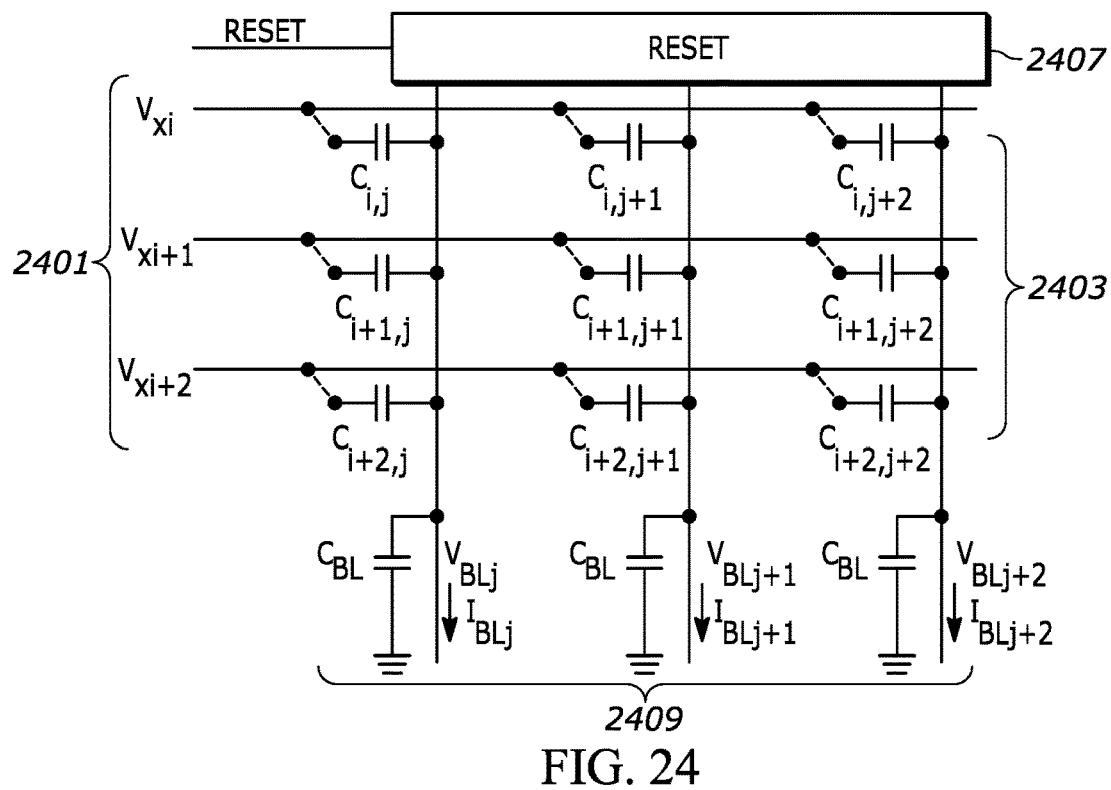
FIG. 24 illustrates an implementation of a ROM-based MAC array that utilizes a single capacitor as a unit element.

FIG. 24 illustrates an implementation of a ROM-based MAC array that utilizes a single capacitor as a unit element. A three by three array subsection of an N by M array is shown. One terminal is connected to the bitline and one to the wordline. The weight is encoded in the connection of the terminals. For binary weight values (e.g. $W_{i,j}$ is either "0" or "1"), the terminals are either both connected or one or both terminals are disconnected. When both terminals are connected the stored weight $W_{i,j}=1$ and otherwise $W_{i,j}=0$. The connection to the wordline may be programmable as shown with a dashed line, however the bitline connection or both connections may be used instead. More capacitors may be used in parallel in order to have further weight levels. This implementation is also compatible with the techniques shown in FIG. 17 for increasing the resolution of the input activations or weights as well as differential operation. The capacitor value may be encoded with the weight level and can be described as:

$$C_{i,j} = C_u \cdot W_{i,j} + C_{offset} \tag{30}$$

The term $C_u$ is a scaling factor that converts the weight value to a capacitance and $C_{offset}$ is an offset term (for example a fixed parasitic capacitance) that may also be equal to zero. Note that if only a single unit capacitor is used with binary weight values ("0" or "1"), $C_u$ is the unit capacitance. If only a single capacitor is used for binary weight values the maximum value that $C_{i,j}$ can take is defined as $C_{max}$ and represents the summation of the capacitance and $C_{offset}$. If k capacitors are used in each unit element to provide k+1 weight levels, $C_{max}$ is equal to the summation of all the capacitors as well as $C_{offset}$. Generally, $C_{max} = W_{max} \cdot C_u + C_{offset}$, where $W_{max}$ is the largest possible weight value.

As described above, there may be multiple possible implementations of the row driver and column readout circuits (dynamic voltage, current, charge, or time based). In one embodiment, the system discloses a single possible drive and readout scheme as an example (dynamic, voltage based input activation and voltage based readout). In this embodiment, the reset block is used. The input activations $X_i$ can be encoded in the voltages $V_{Xi}$ (shown as 2401) as described above and in Eq. 19. The voltage $V_{Xi}$ may take analog values. Alternatively, $V_{Xi}$ can be a digital signal with only two levels, low or high, corresponding to $X_i=0$ and $X_i=1$, respectively. Initially, all the wordlines are set to a reset voltage, $V_{Xreset}$, and the reset block (which may also be integrated with the readout circuit) is used to reset the bitline voltage to a voltage, $V_r$. In the next step, the bitline is released and the input activation voltages $V_{Xi}$ are asserted on the wordlines. The input activation voltage along with the capacitance value causes a small charge from each unit element to be shared along the corresponding total bitline capacitance:

$$\Delta Q_{i,j} = V_{Xi} \cdot C_{i,j} \tag{31}$$

The total capacitance connected to the bitline, $C_T$, is given by:

$$C_T = C_{BL} + \sum_{i=1}^{N} C_{i,j} = C_{BL} + C_u \cdot \sum_{i=1}^{N} W_{i,j} + N \cdot C_{offset} \tag{32}$$

The term $C_{BL}$ represents any additional fixed capacitance connected on the bitline. Considering only a single bitline and column (corresponding to a single neuron in the NN), the total voltage, $V_{BLj}$, that develops on the bitline is proportional to the sum of all $\Delta Q_{i,j}$ and factors related to $V_{Xreset}$ and $V_r$:

$$V_{BLj} = \tag{33}$$

$$V_r + \sum_{i=1}^{N} \left[ \frac{\Delta Q_{i,j}}{C_T} - V_{Xreset} \frac{C_{i,j}}{C_T} \right] = V_r + \sum_{i=1}^{N} \left[ V_{Xi} \frac{C_{i,j}}{C_T} - V_{Xreset} \frac{C_{i,j}}{C_T} \right]$$

Combining Eq. 19, 30, and 33 with $V_{Xoffset}=0V$, $C_{offset}=0F$, $C_{BL}=0F$, $V_{Xreset}=0V$, and $V_r=0V$ gives:

$$V_{BLj} = V_{Xscale} \cdot \frac{C_u}{C_T} \cdot \sum_{i=1}^{N} X_i \cdot W_{i,j} \tag{34}$$

The summation in Eq. 34 represents the entire MAC operation. This voltage can be read from each bitline using a voltage-voltage buffer or amplifier and then digitized in a subsequent analog-to-digital converter stage. This operation is performed in each column (neuron) of the array using the weights stored in that column. Note from Eq. 32 that the capacitance $C_T$ depends on the weight values and thus expanding Eq. 34 gives:

$$V_{BLj} = \frac{V_{Xscale}}{\sum_{i=1}^{N} W_{i,j}} \sum_{i=1}^{N} X_i \cdot W_{i,j} \tag{35}$$

From Eq. 35, there is an additional term in the denominator related to the sum of all the weight values that will introduce an error into the MAC operation. If the result of the summation 2409 of all the weights is predictable and/or has minimal variation this error can be calibrated out at the system level or during training of the neural network algorithm to be run on the compute unit in order to make it negligible.

Figure 25:
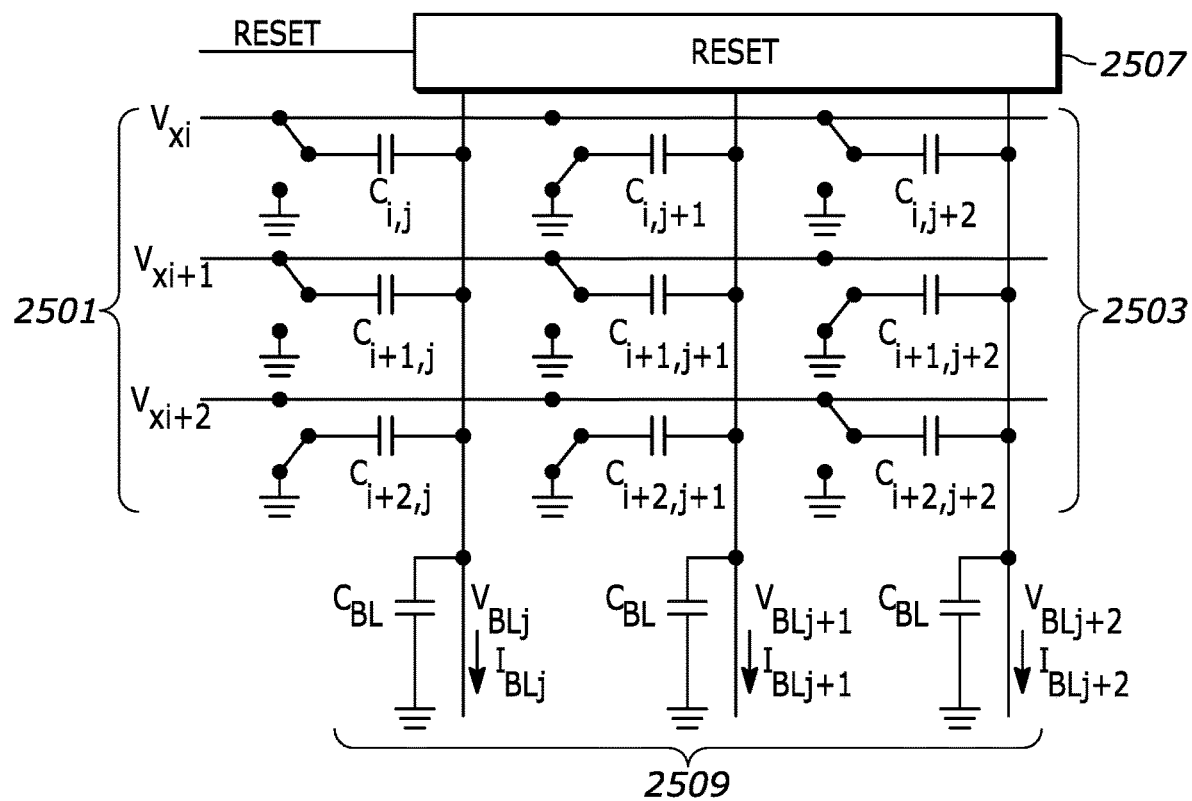
FIG. 25 illustrates an alternate embodiment of a ROM-based MAC array that utilizes a single capacitor as a unit element.

FIG. 25 illustrates an alternate embodiment of a ROM-based MAC array that utilizes a single capacitor as a unit element which solves the issue mentioned in the previous section. In this embodiment, one of the terminals of the capacitor is either connected to the wordline or to a reference voltage that is shown as ground, but may be any other voltage level. In this embodiment, the total capacitance on the bitline is independent of the weight values and is given by Eq. 36 below:

$$C_T = C_{BL} + \sum_{i=1}^{N} C_{max} = C_{BL} + N \cdot C_{max} \tag{36}$$

By using the same dynamic voltage based input activation and voltage based readout scheme as described for the previous implementation may lead to the same expression for the bitline voltage $V_{BLj}$ as in Eq. 34 while using Eq. 36 for $C_T$ (assuming $V_{Xoffset}=0F$, $C_{offset}=0F$, $C_{BL}=0F$, $V_r=0V$). This summation may represent the entire MAC operation and there is no error term or dependency based on the total summation 2509 of all the weight values. This voltage can be read from each bitline using a voltage-voltage buffer or amplifier and then digitized in a subsequent analog-to-digital converter stage. This operation may be performed in each column (neuron) of the array using the weights stored in that column.

Figure 26A:
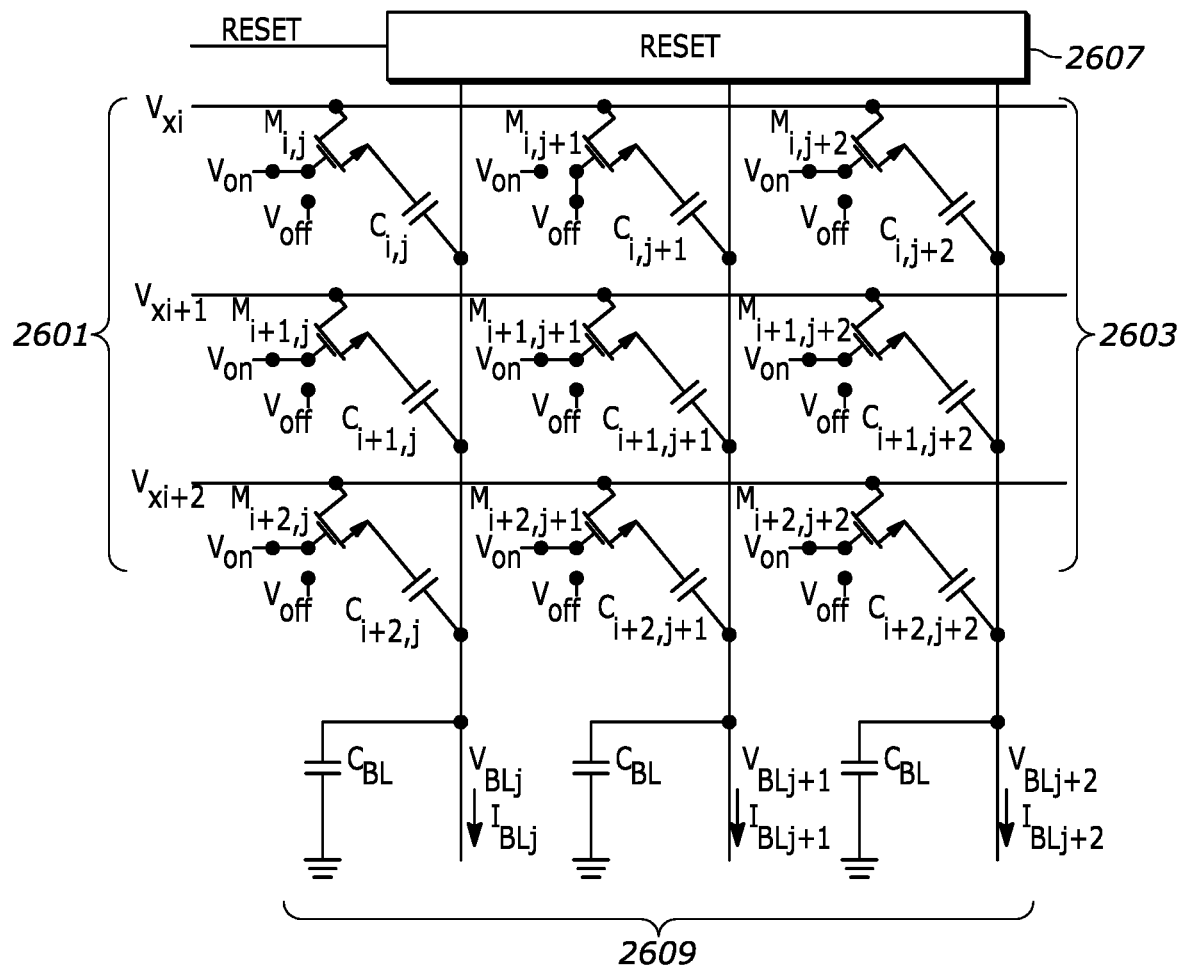
FIG. 26(a)-(b) illustrates an implementation of a ROM-based MAC array utilizing a single transistor and single capacitor in the unit element.

FIG. 26(a) illustrates an implementation of a ROM-based MAC array utilizing a single transistor and single capacitor in the unit element. The capacitor may be a separate element from the transistor or could be one of the capacitances, such as the source (or drain) diode capacitance itself. A three by three array subsection of an N by M array is shown. The transistor and capacitor are connected in series between each wordline and bitline. The order of the transistor and capacitor can be switched. PMOS transistors can be used instead of NMOS devices. Additionally, the source and the drain terminal connections can be switched. The weight is encoded in the gate connection of the transistor, either to a voltage $V_{on}$ or to a voltage $V_{off}$. In this implementation, each transistor acts as a switch that opens or closes the shunt connection of the corresponding capacitor between the bitline and wordline. The transistor conductance value is not critical, but it should be high enough to allow proper dynamic settling with the capacitor value depending on the desired frequency of operation. If the gate of transistor $M_{i,j}$ is connected to $V_{on}$, the device is on and the corresponding stored weight, $W_{i,j}$, is considered to be "1." Alternatively, if the transistor gate is connected to $V_{off}$, the device is off and the $W_{i,j}$ is considered to be a "0." This implementation is also compatible with the techniques shown in FIG. 17 for increasing the resolution of the input activations or weights as well as differential operation. The transistor is acting as a one-time programmable voltage-controlled switch that opens or closes the shunt connection of the capacitor between the wordline and the bitline. Thus the circuit described above (e.g., FIG. 26) can be modeled in the same method as FIG. 24. The weight modifies the effective capacitance of the unit element, $C_{i,j}$, as seen by the bitline using Eq. 30 through the state of the gate of transistor $M_{i,j}$.

As described above, there are multiple possible implementations of the row driver and column readout circuits (dynamic voltage, current, or charge based). This implementation can operate following the same dynamic input activation and voltage based readout described above for the circuit of FIG. 24. Equations 31-35 can be used to compute the output of the MAC operation given a set of input activations and weight values. This voltage can be read from each bitline using a voltage-voltage buffer or amplifier and then digitized in a subsequent analog-to-digital converter stage. This operation may be performed in each column (neuron) of the array using the weights stored in that column. There may be an additional term in the denominator (Eq. 18) related to the sum of all the weight values that will introduce an error into the MAC operation. If the result of the summation of all the weights is predictable and/or has minimal variation, this error can be calibrated out at the system level and be negligible as described previously.

Figure 26B:
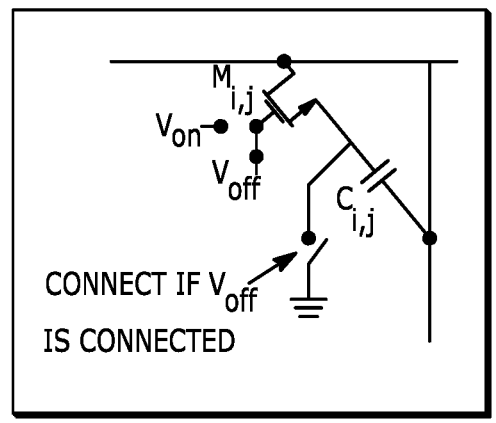

An alternate embodiment of the unit cell in FIG. 26(a) is shown in FIG. 26(b) which may solve the issue of $C_T$ depending on the weight values. In this implementation of the unit cell, an extra potential metal, contact, or via connection to a reference voltage (shown as ground, but it may be another voltage) is included that is only connected in the case where the gate of the transistor is connected to $V_{off}$. Otherwise this implementation is identical to the implementation shown in FIG. 26(a). In this way, the total capacitance of each bitline remains constant, independent of the weight values, and is given by Eq. 36.

Figure 27A:
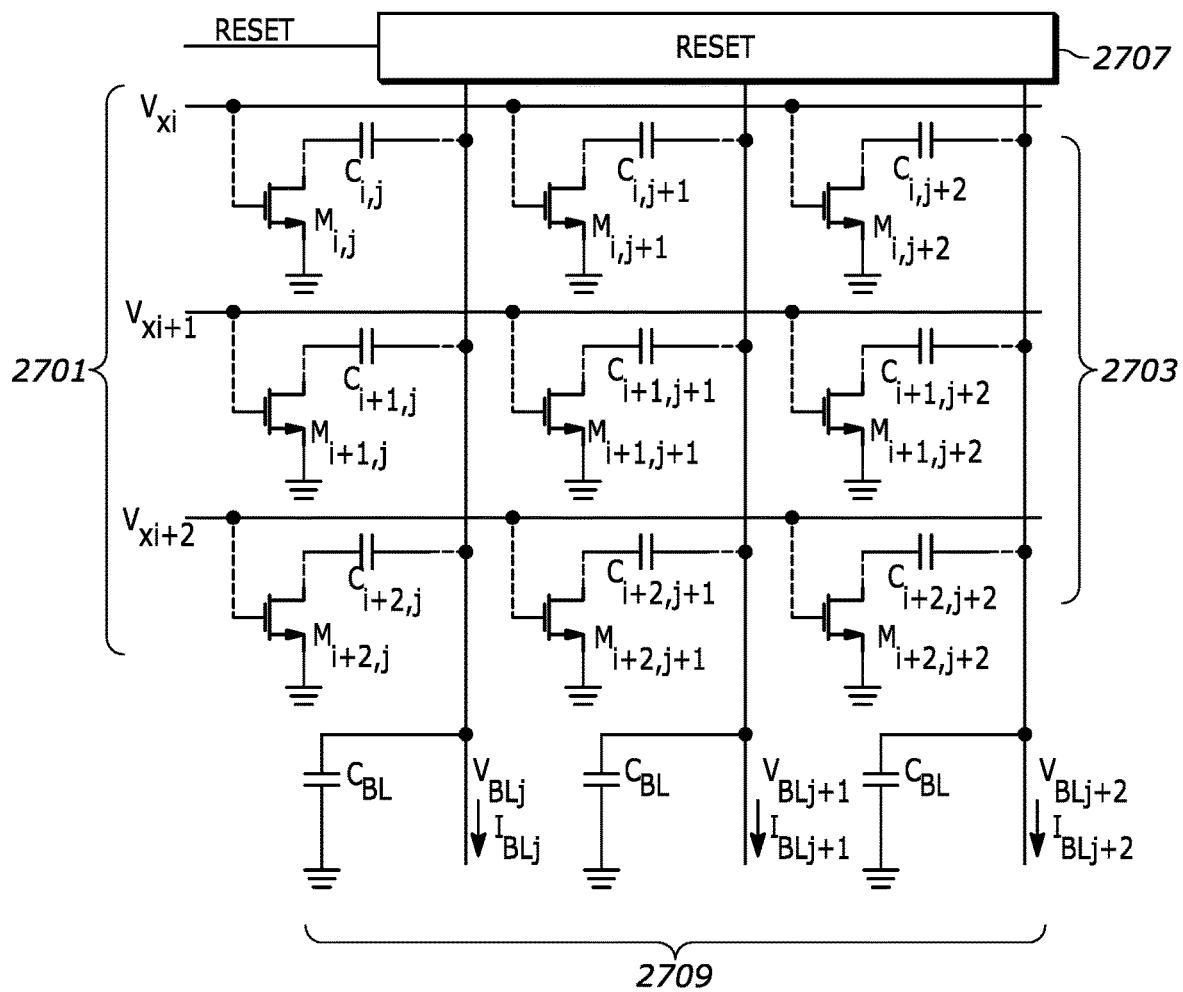
FIG. 27(a)-(b) illustrates an alternate implementation using a single transistor and capacitor as the unit element.

FIG. 27(a) illustrates an alternate implementation using a single transistor and capacitor as the unit element. A three by three array subsection of an N by M array 2703 is shown. The transistor and capacitor may be connected in series between each bitline and a reference voltage shown as ground, but another reference voltage may be used. The order of the transistor and capacitor can be switched. PMOS transistors can be used instead of NMOS devices. Additionally, the source and the drain terminal connections can be switched. The weight is encoded in the unit cell by connecting or disconnecting one or more of the transistor gate, transistor drain, transistor source, or capacitor terminal from the wordline, bitline, or reference voltage using metal, contact, or via connections in the CMOS process (as illustrated by the dotted lines in FIG. 27(a)). When all of these terminals are connected, the weight, $W_{i,j}$, stored in the unit cell is "1." If any of the terminals are disconnected, the weight, $W_{i,j}$, stored in transistor is "0." This implementation may also compatible with the techniques shown in FIG. 17 for increasing the resolution of the input activations or weights as well as differential operation. Similar to the previous capacitive implementations, the weight modifies the effective capacitance of the unit element, $C_{i,j}$, as seen by the bitline based on the weight value as in Eq. 30.

As described above, there are multiple possible implementations of the row driver and column readout circuits (dynamic voltage, current, charge, or time based). In one embodiment, only a single possible drive and readout scheme as an example (dynamic, voltage based input activation and voltage based readout). In this implementation, the reset block is used. The input activations $X_i$ can be encoded in the voltages $V_{Xi}$ as described above and in Eq. 19. $V_{Xi}$ is a digital signal with only two levels, low or high, corresponding to $X_i=0$ and $X_i=1$ respectively. For the low voltage level the transistor is off and for the high level the transistor is on (connecting the capacitor between the bitline and the reference voltage). Initially, all the activations, $V_{Xi}$, are asserted on the wordlines and the bitlines are precharged to a voltage, $V_r$, using the reset block (which may also be integrated with the readout circuit). In the next step, the bitlines are released and all the wordlines are asserted to the high voltage level such that all the transistors turn on. The input activation voltage along with the unit capacitance value causes a small charge from each unit element to be shared along the corresponding total bitline capacitance:

$$\Delta Q_{i,j} = X_i \cdot V_r \cdot C_{i,j} \tag{37}$$

The total capacitance connected to the bitline, $C_T$, is giving by Eq. 32. Considering only a single bitline and column (corresponding to a single neuron in the NN), the total voltage, $V_{BLj}$, that develops on the bitline is proportional to the sum of all $\Delta Q_{i,j}$ and a factor related to the reset voltage $V_r$:

$$V_{BLj} = V_r \cdot \frac{C_{BL}}{C_T} + \sum_{i=1}^{N} \frac{\Delta Q_{i,j}}{C_T} = V_r \cdot \frac{C_{BL}}{C_T} + \sum_{i=1}^{N} V_r \cdot X_i \cdot \frac{C_{i,j}}{C_T} \tag{38}$$

Combining Eq. 30 and 38 with $C_{offset}=0F$ and $C_{BL}=0F$ gives:

$$V_{BLj} = V_r + V_r \cdot \frac{C_u}{C_T} \cdot \sum_{i=1}^{N} X_i \cdot W_{i,j} \tag{39}$$

The summation in Eq. 39 represents the entire MAC operation. This voltage can be read from each bitline using a voltage-voltage buffer or amplifier and then digitized in a subsequent analog-to-digital converter stage. This operation is performed in each column (neuron) of the array using the weights stored in that column. Note from Eq. 32 that the capacitance $C_T$ depends on the weight values and thus expanding Eq. 39 gives:

$$V_{BL,j} = V_r + \frac{V_r}{\sum_{i=1}^{N} W_{i,j}} \sum_{i=1}^{N} X_i \cdot W_{i,j} \quad (40)$$

This is similar to Eq. 35 for the implementation shown in FIG. 24. There is an additional term in the denominator related to the sum of all the weight values that will introduce an error into the MAC operation. If the result of the summation of all the weights is predictable and/or has minimal variation this error can be calibrated out at the system level and be negligible as described previously.

Figure 27B:
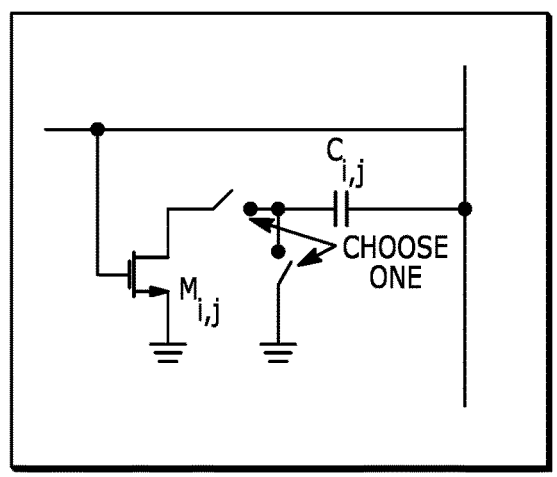

An alternate implementation of the unit cell in FIG. 27(a) is shown in FIG. 27(b) which solves the issue of $C_T$ depending on the weight values. Similar to FIG. 27(a), when the transistor gate is connected to the bitline, its source is connected to a reference voltage (e.g. ground), its drain is connected to the capacitor, and the capacitor is connected to the bitline, the weight value stored in the unit cell is "1." In order to store a "0" value, the transistor is not connected to the capacitor and instead the capacitor is connected to a reference voltage (shown as ground, but it may be another voltage). This implementation may be identical to the implementation shown in FIG. 27(a). In this way, the total capacitance of each bitline may remain constant, independent of the weight values, and is given by Eq. 36.

Figure 28:
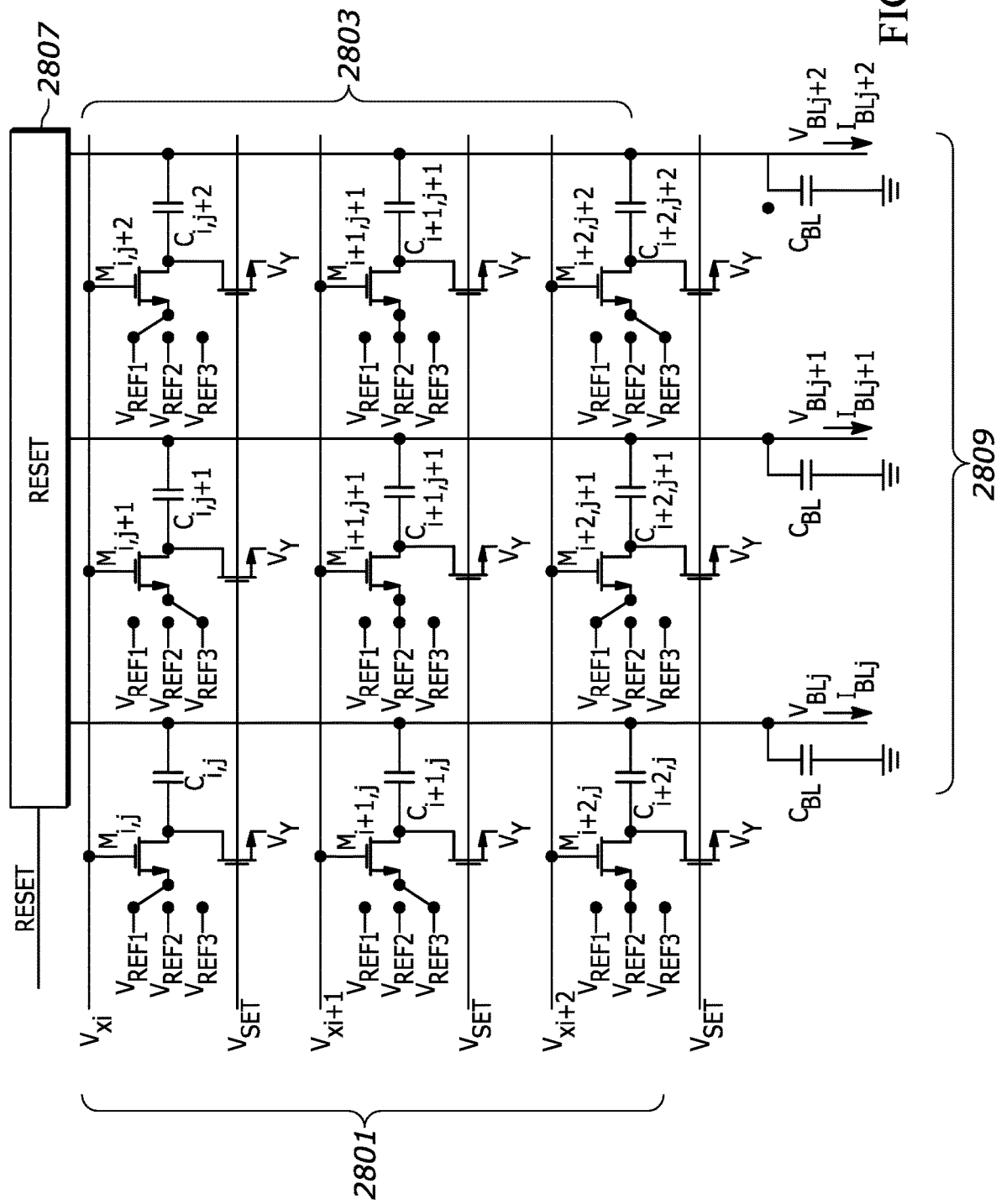
FIG. 28 illustrates an implementation using two transistors and a capacitor in the unit element.

FIG. 28 illustrates an implementation using two transistors and a capacitor in the unit element. A three by three array subsection 2805 of an N by M array is shown. The capacitor is connected to the corresponding bitline and the gate of one transistor is connected to the wordline. That same transistor connects the other end of the capacitor to one of a set of reference voltages. Three reference voltages are shown ($V_{REF1}$, $V_{REF2}$, and $V_{REF3}$), however any integer number, P, of reference voltages may be used. More reference voltage levels enables a larger number of weight levels (higher resolution) and fewer reference voltages levels only allows a smaller number of weight levels (less resolution). The other transistor connects the node shared between the two transistors and the capacitor to another reference voltage, $V_Y$. This gate of the second transistor is connected to a voltage signal $V_{SET}$ that turns the transistor on and off. PMOS transistors can be used instead of NMOS devices. Additionally the source and the drain terminal connections can be switched. The weight is encoded in the unit cell by connecting or disconnecting one of the P references using metal, contact, or via connections in the CMOS process. Only one reference voltage should be connected in each unit element. This method allows P many weight levels to be encoded inside each unit element. Additionally, it is possible to allow the transistor to be disconnected from all reference voltages, providing one additional level (for a total of P+1). The reference voltages can be supplied throughout the MAC array using metal layers stacked vertically in order to save area and allow high-density unit elements that also can support arbitrarily high weight precision. The reference voltage levels may be drawn from any distribution (i.e. they may not be evenly spaced), but a linear distribution may be commonly used. The reference voltage level, $V_{REFi,j}$, in an individual unit cell corresponds to the weight level $W_{i,j}$ and can be described by the expression in Eq. 26. This implementation is also compatible with the techniques shown in FIG. 17 for increasing the resolution of the input activations or weights as well as differential operation. For example, the capacitor, $C_{i,j}$ may also be programmable using metal, contact, or via connections as described for previous implementations. If the capacitor is not programmable, it has a value of $C_0$.

As described above, there are multiple possible implementations of the row driver and column readout circuits (dynamic voltage, current, or charge based). Here we will describe only a single possible drive and readout scheme as an example (dynamic, voltage based input activation and voltage based readout). In this implementation, the reset block is used. The input activations $X_i$ can be encoded in the voltages $V_{Xi}$ as described above and in Eq. 19. $V_{Xi}$ may be a digital signal with only two levels, low or high, corresponding to $X_i=0$ and $X_i=1$ respectively. For the low voltage level the transistor, $M_{i,j}$, is off and for the high level the transistor is on (connecting the capacitor between the bitline and the chosen reference voltage, $V_{REFi,j}$). Initially, all the activations, $V_{Xi}$, are asserted on the wordlines, $V_{SET}$ is brought low to turn off the second transistor, and the bitlines are precharged to a voltage, $V_r$, using the reset block (which may also be integrated with the readout circuit). In the next step, the bitlines are released and all the wordlines are brought to a low voltage level such that all the transistors $M_{i,j}$ turn off. Then $V_{SET}$ is brought high in order to connect the voltage $V_Y$ to the capacitor. Considering the case where the unit cell capacitor is fixed at $C_0$, this procedure causes a small charge $\Delta Q_{i,j}$ from each unit element capacitance to be shared along the corresponding total bitline capacitance:

$$\Delta Q_{i,j} = -X_i \cdot V_{REFi,j} \cdot C_0 \quad (41)$$

The total capacitance connected to the bitline, $C_T$, is given as:

$$C_T = C_{BL} + \Sigma_{i=1}^{N} C_0 = C_{BL} + N \cdot C_0 \quad (42)$$

In this case $C_T$ does not depend on the weight values. Considering only a single bitline and column (corresponding to a single neuron in the NN), the total voltage, $V_{BL,j}$, that develops on the bitline is proportional to the sum of all $\Delta Q_{i,j}$ and factors related to $V_Y$ and $V_r$:

$$V_{BL,j} = V_r \frac{C_{BL} + C_0 \sum_{i=1}^{N} X_i}{C_T} + N \cdot V_Y \cdot \frac{C_0}{C_T} + \sum_{i=1}^{N} \frac{\Delta Q_{i,j}}{C_T} = \\ V_r \frac{C_{BL} + C_0 \sum_{i=1}^{N} X_i}{C_T} + N \cdot V_Y \cdot \frac{C_0}{C_T} - \frac{C_0}{C_T} \sum_{i=1}^{N} X_i \cdot V_{REFi,j} \quad (43)$$

Combing Eq. 26 and 43 with $V_{REFoffset}=0V$, $V_r=0V$, $V_Y=0V$, and $C_{BL}=0F$ gives:

$$V_{BL,j} = -V_{scale} \cdot \frac{C_0}{C_T} \cdot \sum_{i=1}^{N} X_i \cdot W_{i,j} \quad (44)$$

The summation in Eq. 44 represents the entire MAC operation. Note that the operation is inverting in this scenario. This voltage can be read from each bitline using a voltage buffer or amplifier and then digitized in a subsequent analog-to-digital converter stage. This operation is performed in each column (neuron) of the array using the weights stored in that column.

Figure 29:
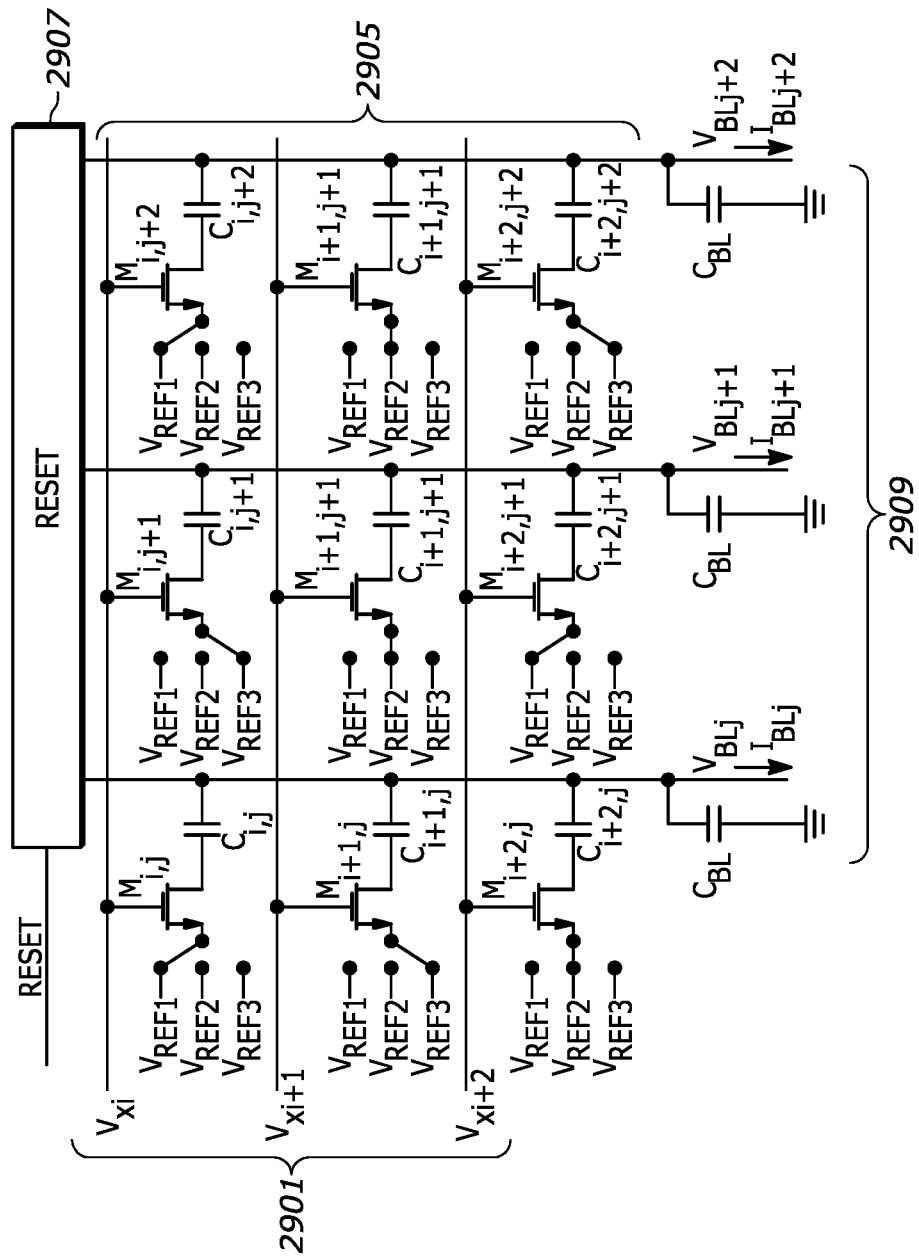
FIG. 29 illustrates an embodiment of a single transistor and single capacitor ROM-based compute unit.

FIG. 29 illustrates an embodiment of a single transistor and single capacitor ROM-based compute unit. This implementation is identical to the implementation in FIG. 28 except that the transistor connected to $V_Y$ is omitted.

As described above, there are multiple possible implementations of the row driver and column readout circuits (dynamic voltage, current, or charge based). In one embodiment, a single possible drive and readout scheme can be used that is similar to the one described for FIG. 28 as an example (dynamic, voltage based input activation and voltage based readout). In this implementation, the reset block is used. The input activations $X_i$ can be encoded in the voltages $V_{Xi}$ as described above and in Eq. 19. $V_{Xi}$ may be a digital signal with only two levels, low or high, corresponding to $X_i=0$ and $X_i=1$ respectively. For the low voltage level the transistor, $M_{i,j}$, is off and for the high level the transistor is on (connecting the capacitor between the bitline and the chosen reference voltage, $V_{REFi,j}$). Initially, all the activations, $V_{Xi}$, are asserted on the wordlines. The bitlines are precharged to a voltage, $V_r$, using the reset block (which may also be integrated with the readout circuit). In the next step, the bitlines are released and all the wordlines are brought to a high voltage level (so that all the transistors $M_{i,j}$ turn on) and all the reference voltage levels are set to the same voltage level, $V_Y$, using a driver that is external to the array. During the readout phase, all the unit capacitors will be connected between the bitline and a voltage $V_Y$. In this way, this implementation operates in the same manner as the implementation of FIG. 28 and the MAC computation can be represented by following Eq. 41-44. The output voltage can be read from each bitline using a voltage buffer or amplifier and then digitized in a subsequent analog-to-digital converter stage. This operation is performed in each column (neuron) of the array using the weights stored in that column.

Figure 30:
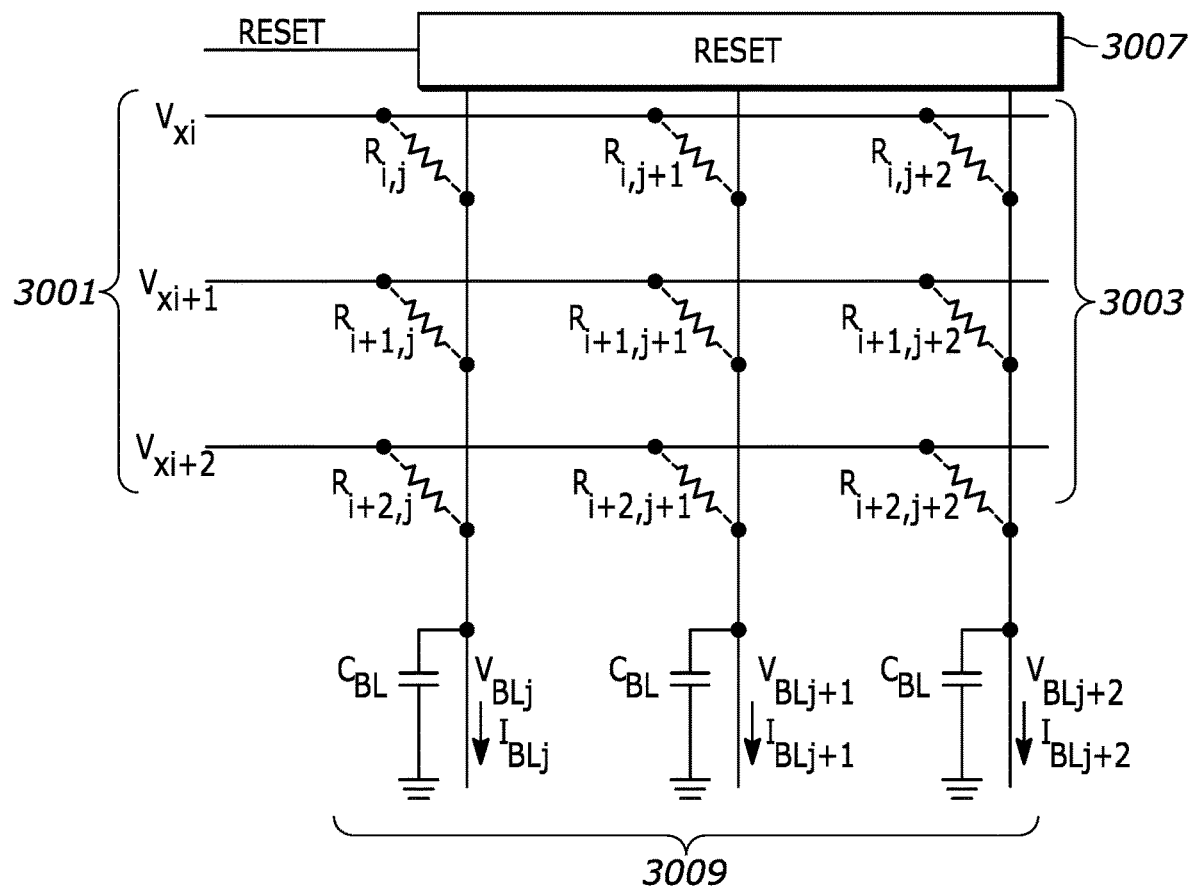
FIG. 30 illustrates an embodiment of a ROM-based MAC array that uses a single resistor as a unit element.
Figure 31A:
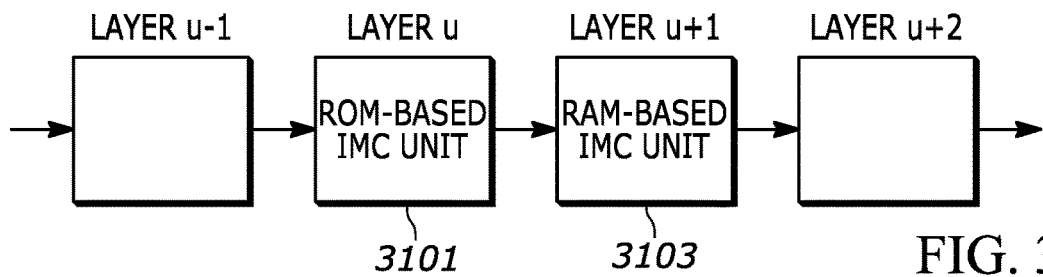
FIG. 31(a)-(d) illustrates several embodiments of compute units within an IMC-based processor for an arbitrary machine learning algorithm.
Figure 31B:
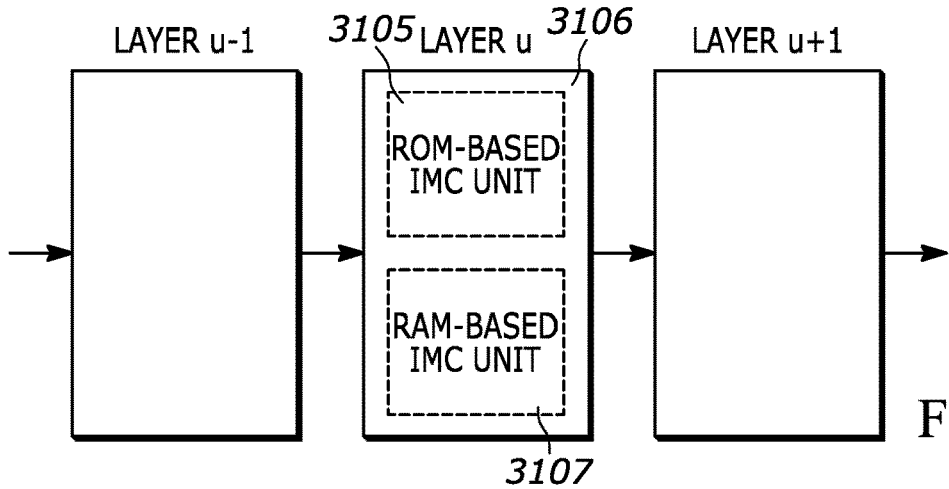
Figure 31C:
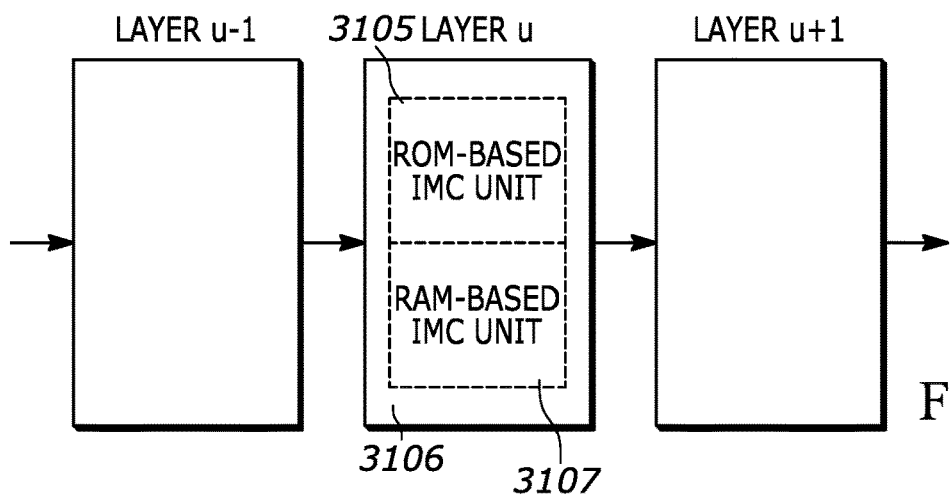
Figure 31D:
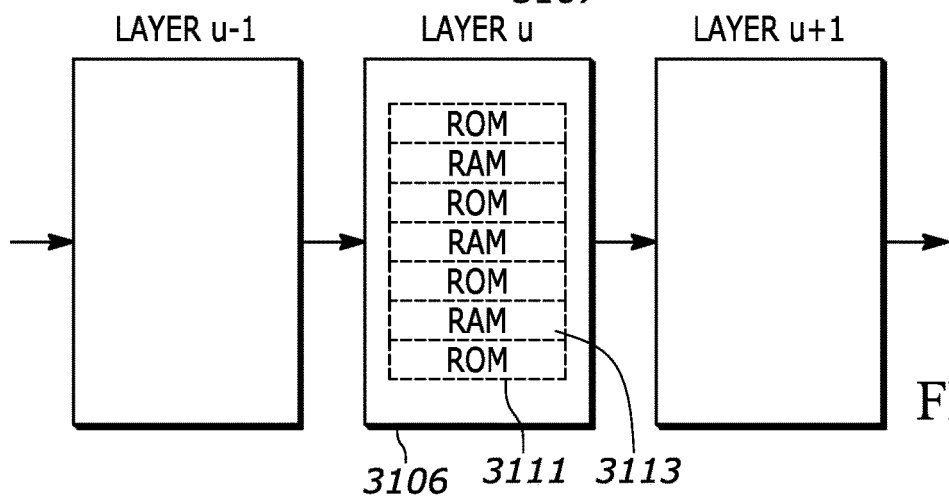
Figure 32A:
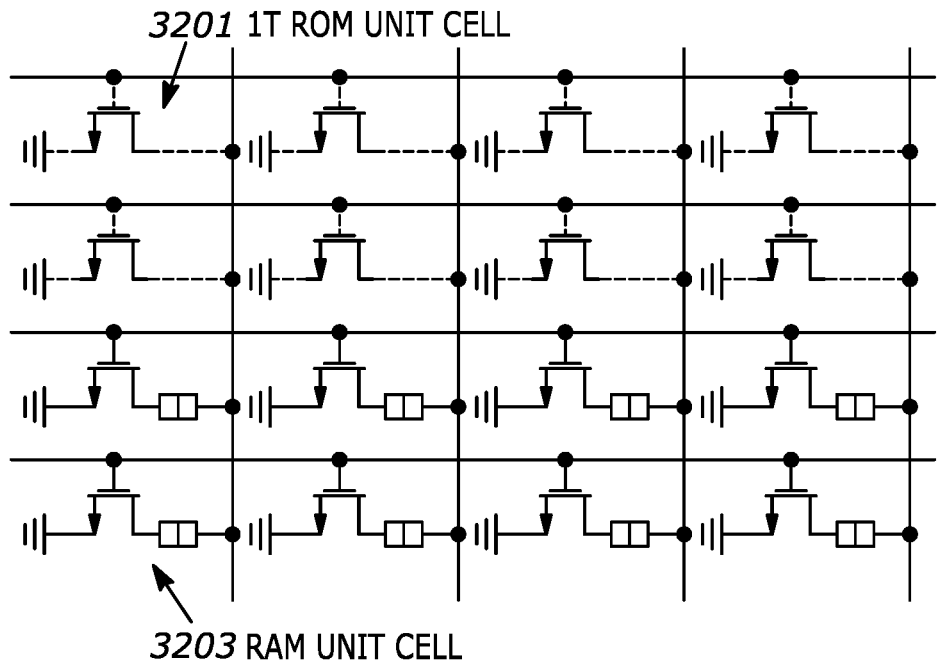
FIG. 32(a-d) illustrates an embodiment with different types of unit cells are interleaved and connected to the same bitline.
Figure 32B:
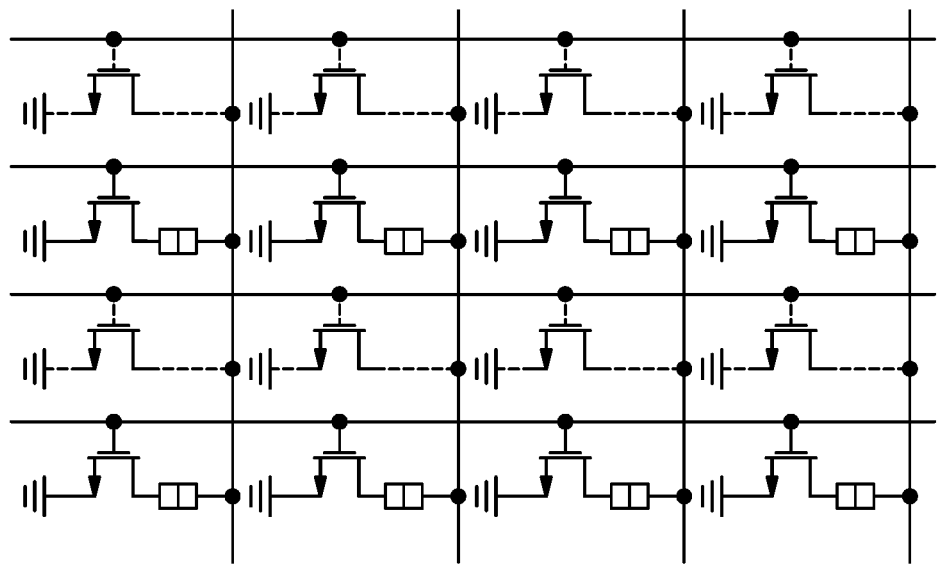
Figure 32C:
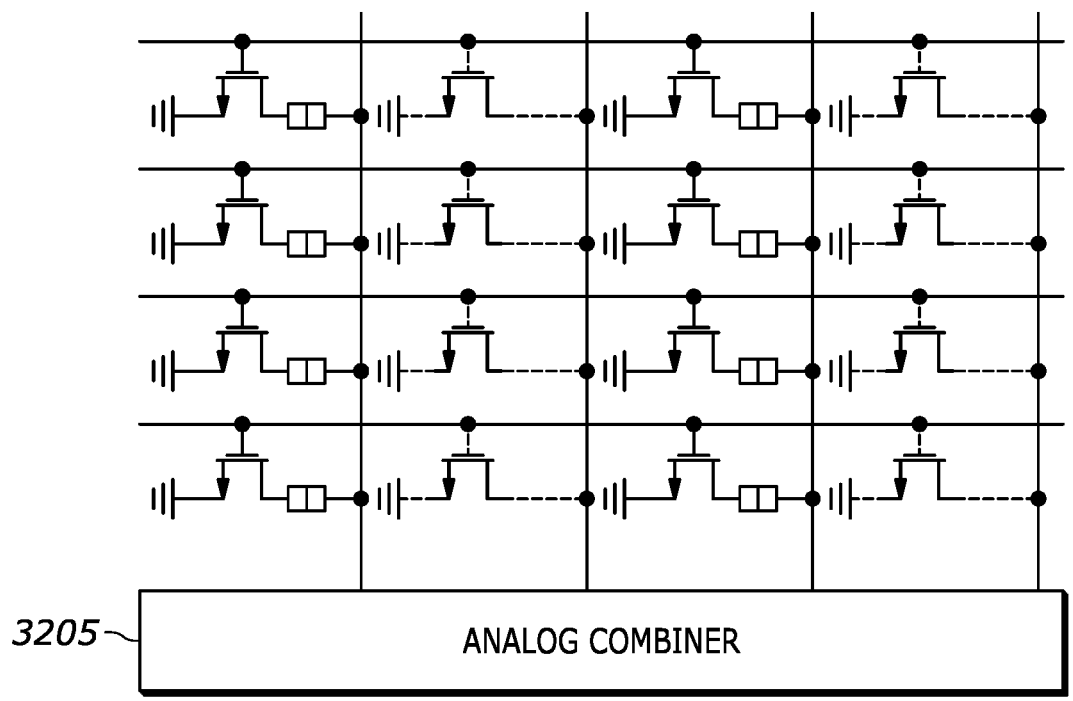
Figure 32D:
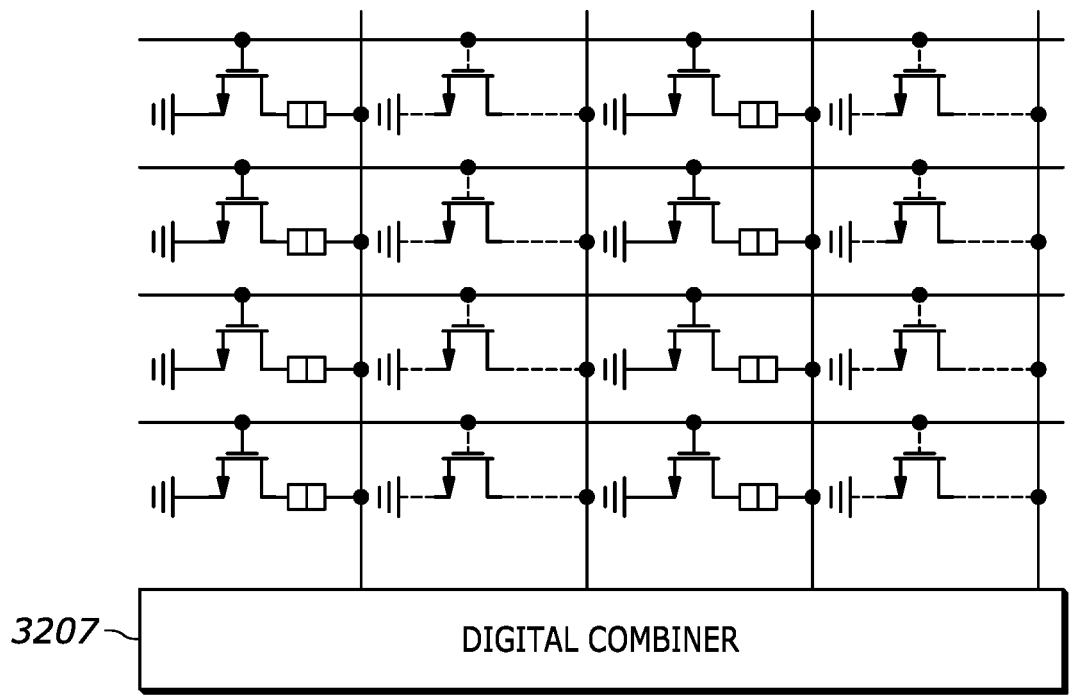

FIG. 30 illustrates an embodiment of a ROM-based MAC array that uses a single resistor as a unit element. A three by three array subsection of an N by M array is shown. The weight is encoded in the connection of the resistor to the wordline and/or bitline. For binary weight values (e.g. $W_{i,j}$ is either "0" or "1"), the terminal is either connected to both the wordline and bitline for a $W_{i,j}=1$ and disconnected from the wordline and/or bitline for $W_{i,j}=0$. More resistors can be used in parallel in order to have further weight levels. This implementation is also compatible with the techniques shown in FIG. 17 for increasing the resolution of the input activations or weights as well as differential operation. The conductance value, $G_{i,j}$, of resistor $R_{i,j}$ is encoded with the weight level and can be described using Eq. 18, the same as used for the implementation in FIG. 21.

As described above, there are multiple possible implementations of the row driver and column readout circuits (voltage or current based, static or dynamic). Here we will describe only a single possible drive and readout scheme as an example (static, voltage based input activation and current readout). In this implementation, the reset block is not needed and can be omitted. Considering only a single bitline and column (corresponding to a single neuron in the NN), the multiplication operation is performed by applying input activations ($X_i$) as voltages ($V_{Xi}$) along the wordline which can carry binary information (digital) or multiple bits of information (analog values) as in Eq. 19.

The MAC operation that is described using Eq. 20, 21, and 22, may be the same as for FIG. 21. The column current can be transformed to a voltage using a transimpedance amplifier and then digitized in a subsequent analog-to-digital converter stage. Alternatively, the current can be digitized directly using a current input ADC or buffered and passed to a subsequent stage. This operation is performed in each column (neuron) of the array using the weights stored in that column.

As described above, ROM-based compute units can be used alongside RAM-based compute units within the same IMC-based processor. The ROM-based compute unit may be any one of the implementations mentioned in the previous sections. Additionally any of the types of RAM (or NVRAM) mentioned above, such as SRAM, RRAM, PCM, MRAM, FeRAM, or Flash, may be used. The advantages of a ROM-based compute unit in terms of performance, reliability, and security can be maintained by storing the majority of the fixed model parameters inside the ROM elements. A smaller subset of memory can store task-specific parameters that can be reprogrammed in RAM. This scheme maintains most of the advantages of RAM, while allowing task specialization, updates after deployment to deal with varying operating conditions or improve algorithms, and training at the edge.

FIG. 31 illustrates several embodiments of compute units within an IMC-based processor for an arbitrary machine learning algorithm. The machine learning algorithm may consist of several layers, each containing a number of neurons. Different types of compute units may be used for different layers as shown in FIG. 31(*a*) where a ROM-based compute unit is used for the computation of Layer u and a RAM-based compute is used for Layer u+1. The order of these two layers may be reversed and ROM-based compute units may be used after RAM-based or different types of IMC compute units may be interleaved in sequential layers. FIG. 31(*b*) shows an implementation where multiple types of compute units are used for computation within the same layer in the neural network. FIG. 31(*c*) and FIG. 31(*d*) show examples where layers are implemented using compute units containing hybrid ROM and RAM compute units.

This can be accomplished by using multiple types of memory directly connected in the analog domain on the same bitline as shown in FIG. 32(*a*) and FIG. 32(*b*) where one-time programmable transistors are used alongside a unit cell based on a type of RAM such as RRAM, PCM, or MRAM. In FIG. 32(*a*) adjacent blocks of unit cells with different types are connected to the same bitline. In FIG. 32(*b*) different types of unit cells are interleaved and connected to the same bitline for analog summation. Alternatively multiple columns with different types of memory may be used as shown in FIG. 32(*c*) and FIG. 32(*d*), where the results of the MAC computations are combined in the analog and digital domains, respectively. The number of ROM-based unit cells and/or RAM-based unit cells may vary from column to column. The techniques described above and shown in FIG. 32 are compatible with each other. The implementations shown in FIG. 32 are also compatible with the techniques shown in FIG. 17 for increasing the resolution of the input activations or weights as well as differential operation.

FIG. 33(*a*) illustrates an embodiment of a compute unit combining both ROM and RAM. This implementation uses the transistor-based (1T) ROM topology introduced in FIG. 21 and a standard six transistor (6T) SRAM structure shown in FIG. 33(*b*). $V_{on}$ and $V_{off}$ may be high and low supply voltages, respectively. Other standard SRAM structures, such as the seven transistor (7T), eight transistor (8T), or ten transistor (10T) structures may be used as well. A four by four subset of an N by M array is shown in FIG. 33(*a*). Any proportion of ROM-based unit cells to SRAM-based unit cells may be used. PMOS transistors can be used instead of NMOS devices. Additionally the source and the drain terminal connections can be switched. Weights are one-time programmed in ROM unit cells through metal, contact, or via connections as described above. Weights are programmed in the SRAM-based unit cells using specific control signals (SEL) and dedicated additional bitlines (P and N for positive and negative SRAM bitlines, respectively). If a weight value of "1" is stored in a unit cell's SRAM, the gate of the corresponding transistor is connected to $V_{on}$. Conversely if a weight value of "0" is stored in a unit cell's SRAM, the gate of the corresponding transistor is connected to $V_{off}$. For both the ROM elements and the SRAM-based elements, the weight can be considered encoded in the conductance of the transistor connected between the wordline and bitline as described in Eq. (1).

As described above, there are multiple possible implementations of the row driver and column readout circuits (voltage or current based, static or dynamic). For example, a static, voltage based input activation and current readout may be used as described for the implementation in FIG. 21. For such a scheme, the entire MAC operation for an individual column is described following Eq. 19-22 and as described above. The current can be transformed to a voltage using a transimpedance amplifier and then digitized in a subsequent analog-to-digital converter stage. Alternatively, the current can be digitized directly using a current input ADC or buffered and passed to a subsequent stage. This operation is performed in each column (neuron) of the array using the weights stored in that column.

In some implementations, the SRAM-based unit cells may only be included in some columns and not all of them. For example, the SRAM may only be included in every other column as shown in FIG. 33(c). Since the presence of the SRAM in the unit cell requires additional transistors, this method can be used to reduce the overall area and cost while still maintaining a degree of programmability. Additionally a differential implementation may be used as shown in FIG. 33(d). In this implementation, the differential outputs of the SRAM cell are used to control the gates of transistors in adjacent columns in the array. Corresponding ROM-based unit cells in adjacent columns must also be differentially coded as shown. The readout circuits must also be differential implementations, reading the difference in output quantities (for example, voltage, current, or charge) between adjacent columns. This implementation is also compatible with the techniques shown in FIG. 17 for increasing the resolution of the input activations or weights as well as differential operation. These implementations are also compatible with the variations shown in FIG. 32.

Figure 33A:
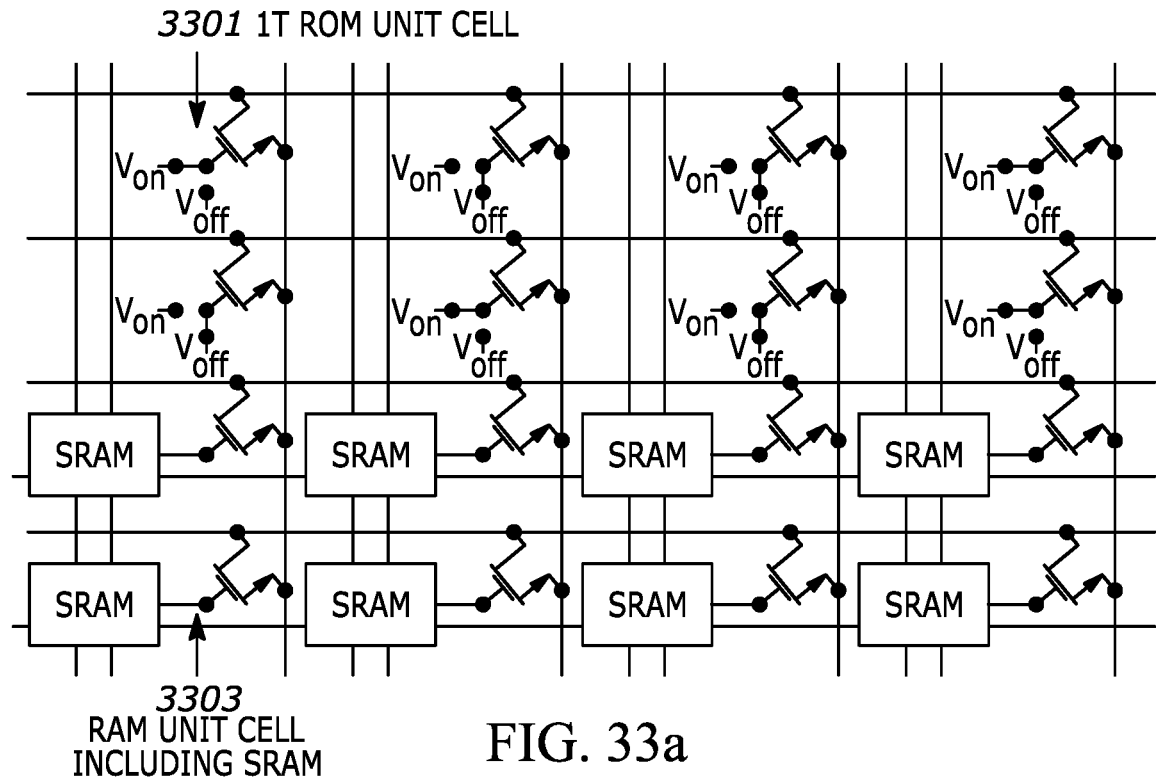
FIG. 33(a)-(d) illustrates an embodiment of a compute unit combining both ROM and RAM.
Figure 33B:
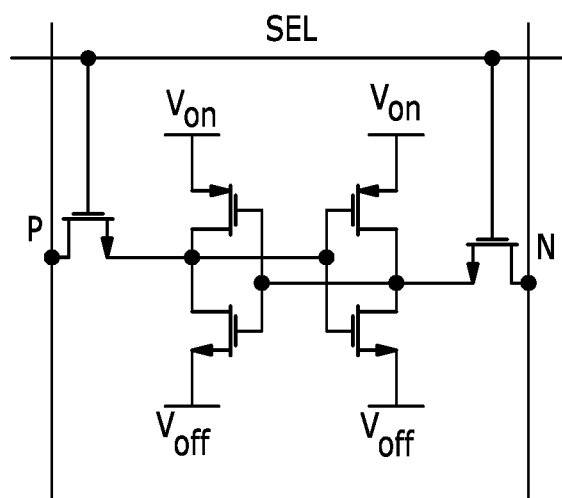
Figure 33C:
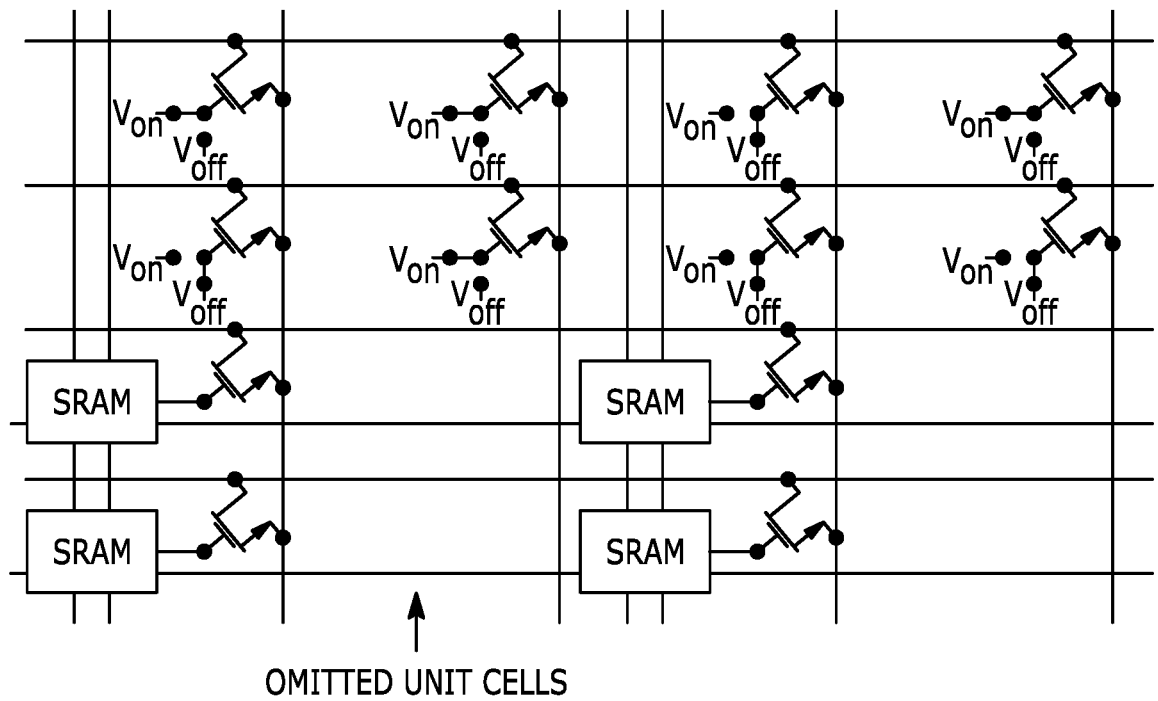
Figure 33D:
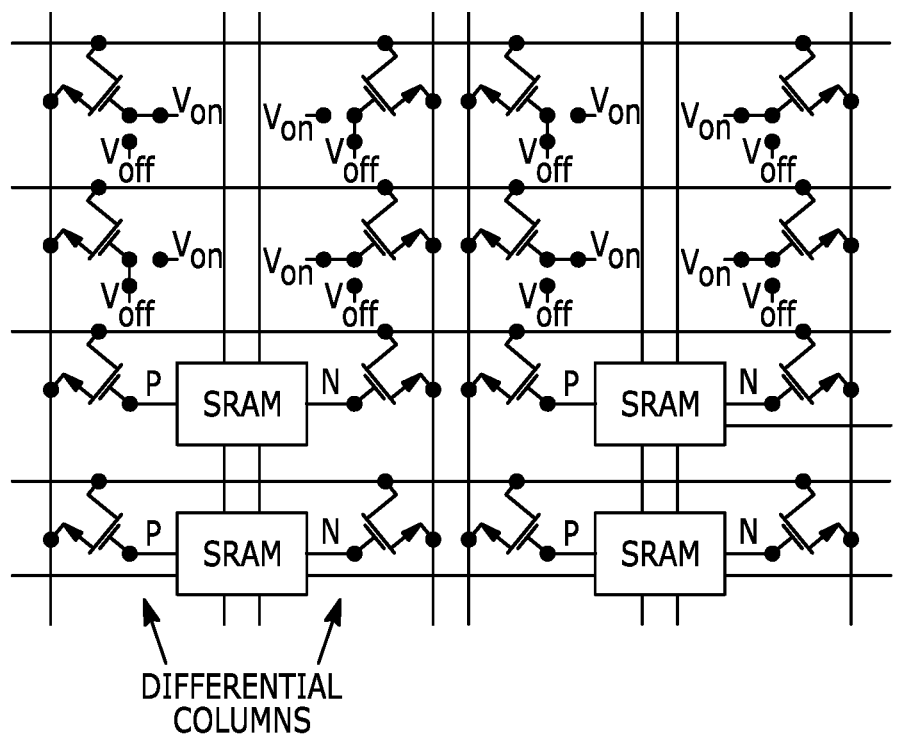

FIG. 33(a) illustrates an embodiment of a 1T ROM-based unit cells used in the same IMC array as SRAM-based unit cells with analog summation on the bitlines. FIG. 33(b) illustrates an embodiment of a standard 6T unit cell using $V_{on}$ and $V_{off}$ as the high and low supply voltage levels. FIG. 33(c) illustrates an example of an SRAM-based unit cells may be omitted in some columns in order to save area and cost. FIG. 33(d) illustrates a differential implementation where a single SRAM is used to provide complementary values to transistors in adjacent columns.

The embodiments shown in FIG. 32 and FIG. 33 are just example embodiments and other combinations of the ROM-based elements described above and RAM-based elements are also possible. The choice of hybrid ROM/RAM architecture will be determined by optimizing performance metrics like area, power consumption, latency, throughput, and signal-to-noise ratio.

Several ROM-based IMC arrays (such as those embodiments with capacitive implementations shown in FIG. 24 and FIG. 25), can be fabricated entirely in the metal layers of an integrated circuit process. Additionally, it may be possible to fabricate some categories of RAM-based IMC arrays, such as for RRAM or PCM, entirely in the metal layers. This feature allows for 3D integration of IMC compute units, enabling higher density weight storage and computation that saves cost and improves performance.

Figure 34B:
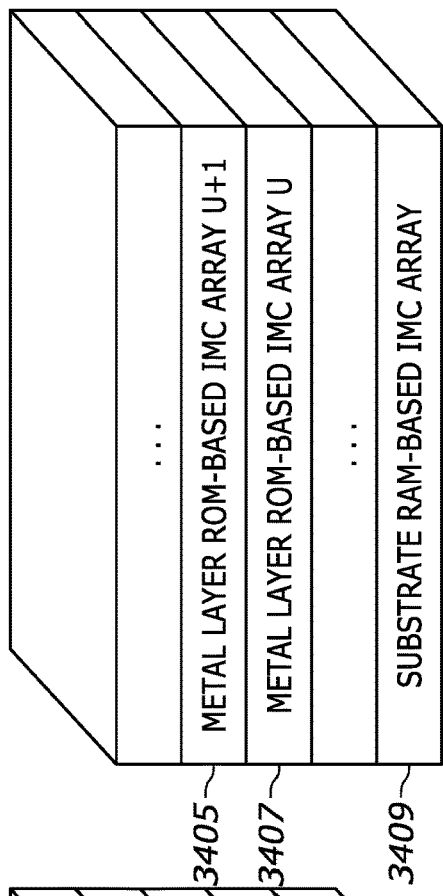
FIG. 34(a)-(d) illustrates various embodiments of a 3D Stacked ROM-based IMC array.
Figure 34D:
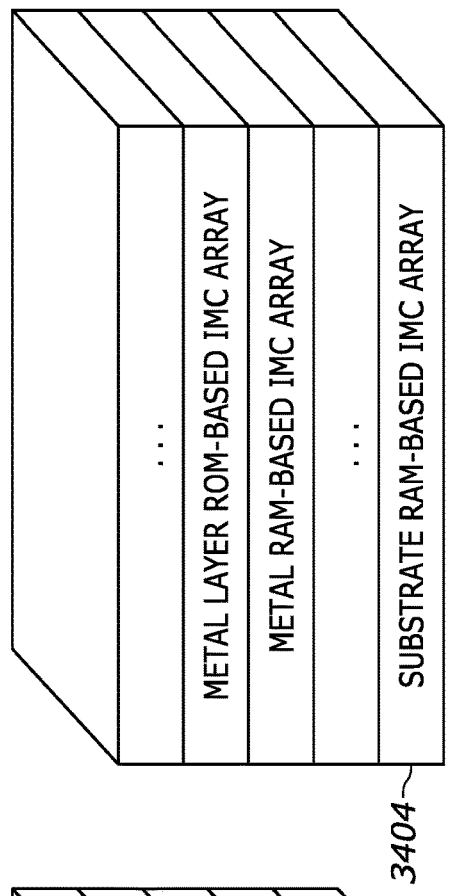
Figure 34A:
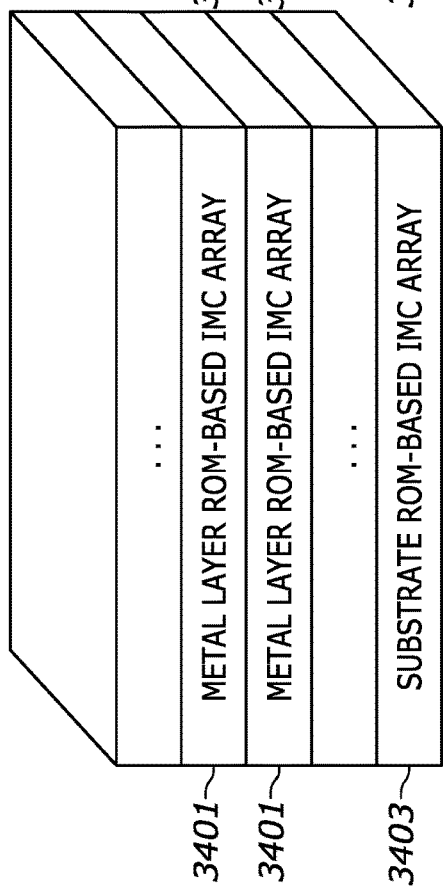
Figure 34C:
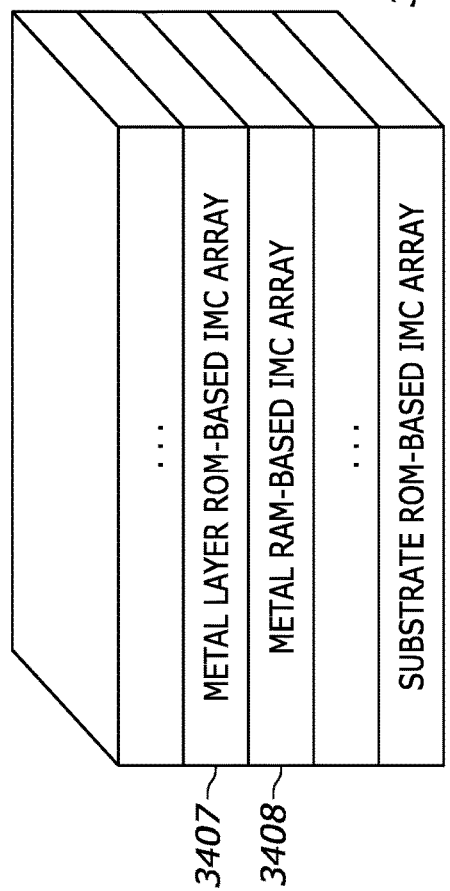

FIG. 34(a) illustrates an embodiment of a 3D Stacked ROM-based IMC array with an IMC array in the substrate layer and one or more of the IMC arrays in the metal layers. FIG. 34(b) illustrates one or more ROM-based IMC array may be 3D stacked in the metal layers above an RAM-based IMC array in the substrate. FIG. 34(c) illustrates one or more ROM-based IMC arrays may be 3D stacked in the metal layers with one or more RAM-based IMC arrays above a ROM-based IMC array in the substrate. FIG. 34(d) illustrates one or more ROM-based IMC arrays may be 3D stacked in the metal layers with one or more RAM-based IMC above another RAM-based IMC array in the substrate.

As shown in FIG. 34(a), one or more ROM-based IMC arrays (e.g., embodiments of FIG. 24 and FIG. 25) may be 3D stacked in the metal layers above another ROM-based IMC array that uses the substrate layer and lower metal layers (e.g., the embodiments of transistor-based implementations in FIGS. 21-23 and 26-29). The substrate layer may be a semiconductor material layer that may be a silicon wafer or other type of material. As shown in FIG. 34(b), one or more ROM-based IMC arrays may be 3D stacked above a substrate RAM-based IMC array based on a technology, such as SRAM. One or more metal layer RAM-based IMC arrays may be 3D stacked with or without metal layer ROM-based IMC arrays above a substrate ROM-based IMC array (FIG. 34 (c)) or a substrate RAM-based IMC array (FIG. 34 (d)).

FIG. 35 illustrates an example of an "edge" sensing device with classifier based on neural networks to classify a limited number of classes to trigger a wake-up function that in turn enables the transmission of big data for further processing to a cloud. FIG. 35(b) is a typical matrix multiple and add operation that may be carried out within a neural network. FIG. 35(c) illustrates an arrangement of memories and arithmetic logic unit (ALU).

A method of mitigating this source of energy consumption is by incorporating a scheme called in-memory-compute. In this approach, the weights of the neural network are stationary and stored where the calculation occurs and therefore the data movement can be reduced greatly. In terms of neural network hardware implementations with digital circuits, this could be arranged as an architecture where the memory and arithmetic units are distributed in such a way that the data storage is closer to its destination processor. A higher efficiency alternative to that is the realization of the multiply and add calculations (MAC) based on the electrical circuit network properties that govern the circuit voltage and currents. This enables instantaneous deployment of input activations, e.g., voltage or current levels across a large network of weights, e.g. implemented by impedances such as resistors. The multiplication operation is then achieved through the impedance of the weight element scaling the input activation and the summation occurs through the instantaneous current or charge packet summation in circuit nodes. The result of this analog MAC operation is readily available for readout by means of a data converter.

An analog circuit configuration called a crossbar network can be used for the purpose of matrix multiply and add operations. Such network (e.g., illustrated in FIG. 36) applies the integer neuron activation values, $X_i$, via digitalto-analog converters (DACs) through access rows (word lines). These word lines deploy analog voltages $X_i$. $V_{ref,DAC}$ across the word lines, where $V_{ref,DAC}$ is the reference voltage of the DAC. Along each word line, multiple weight elements are placed at crossings with columns (bit lines). These weight elements are implemented by means of impedances (conductances), where each element is an integer $W_{ij}$ multiple of a unit conductance G, resulting in a conductance of $G \cdot W_{ij}$. Each bit line crosses multiple word lines with corresponding weights at their crossings and therefore implements a summation node to add the currents. For the $j^{th}$ bit line, this current can be written as a summation of all currents through the weight elements connected to it:

$$I_j = \sum_{i=1}^{N} (V_{ref,DAC} \cdot X_i) \cdot (G \cdot W_{ij}) \qquad (45)$$

When this bit line current is processed by a transimpedance amplifier with a gain of $R_{TIA}$, the amplifier produces a voltage $V_j$ per bit line denoted by:

$$V_j = R_{TIA} \cdot I_j = R_{TIA} \cdot G \cdot V_{ref,DAC} \sum_{i=1}^{N} X_i \cdot W_{ij} \qquad (46)$$

This voltage $V_j$ is then digitized to an integer $Y_j$ by means of an analog-to-digital converter (ADC) with reference to a voltage $V_{ref,ADC}$ rounding it up to an integer number $Y_j$ (the round(x) function):

$$Y_j = \text{round}\left(\frac{R_{TIA} \cdot G \cdot V_{ref,DAC}}{V_{ref,ADC}} \sum_{i=1}^{n} X_i \cdot W_{ij}\right) \qquad (47)$$

For simplicity we can assume $V_{ref,DAC} = V_{ref,ADC}$ and $R_{TIA} = 1/G$ and then equation (3) simplifies to:

$$Y_j = \sum_{i=1}^{N} X_i \cdot W_{ij} \qquad (48)$$

This shows each bit line implements multiply and add results for the multiplication between the input activations and the $j^{th}$ column of the weight matrix and therefore all the $Y_j$ values form the matrix dot product result. For the case shown in FIG. 36, a 4×1 activation matrix X multiplied by the 4×4 weight matrix W results in the 1×4 matrix Y:

$$[Y_1 Y_2 Y_3 Y_4] = [X_1 X_2 X_3 X_4] \times \begin{bmatrix} W_{11} & W_{12} & W_{13} & W_{14} \\ W_{21} & W_{22} & W_{23} & W_{24} \\ W_{31} & W_{32} & W_{33} & W_{34} \\ W_{41} & W_{42} & W_{43} & W_{44} \end{bmatrix} \qquad (49)$$

Figure 36:
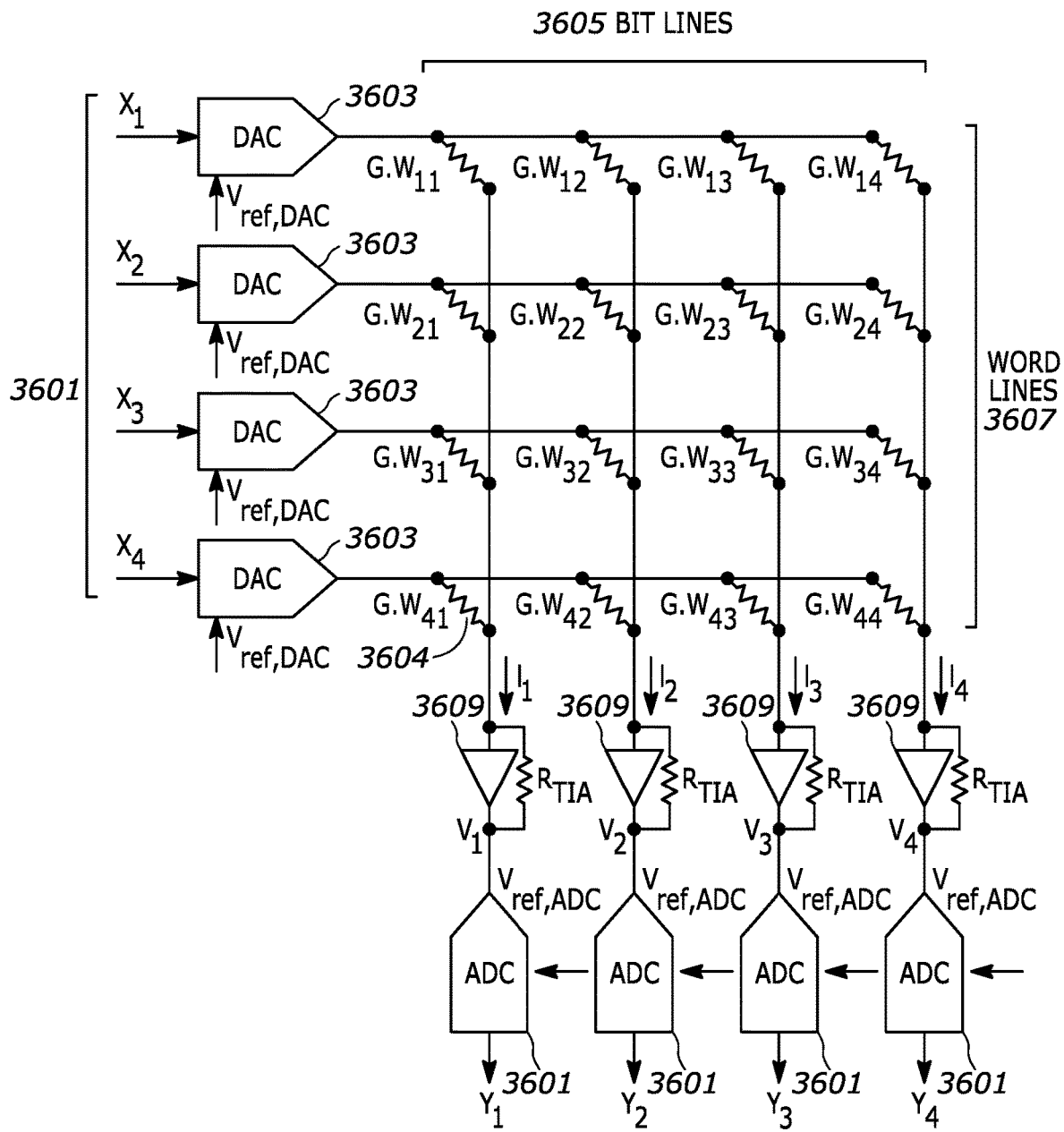
FIG. 36 illustrates an embodiment of an analog multiply and add operation implemented by a crossbar network

Some of the drawbacks of the crossbar network interface shown in FIG. 36 may be that the application of the continuous activation voltages to the word lines and the running currents in the bit-lines (highly dependent on the weight element type and value ranges) and the quiescent power consumption of ADCs, DACs, drivers and sense amplifiers add to the energy consumption. Additionally, each ADC and DAC are made of many active and passive sub-components usually translating to large chip area and hence limit the pitch size of the interface to the crossbar and limit large-scales. The assumptions of the transfer characteristics of the DACs and ADCs matching (the simple assumption of $V_{ref,DAC} = V_{ref,ADC}$) is not true in realizations due to the analog component variations. The inclusion of such non-idealities in large scale networks makes the training more complex. In deep neural networks, often the dynamic range of ADCs and DACs need to be scaled from layer to layer, which adds a significant amount of complexity and design effort.

FIG. 36 illustrates an embodiment of an analog multiply and add operation implemented by a crossbar network employing analog input activations and weights implemented by integer weighted conductance and summation in current domain.

Figure 37A:
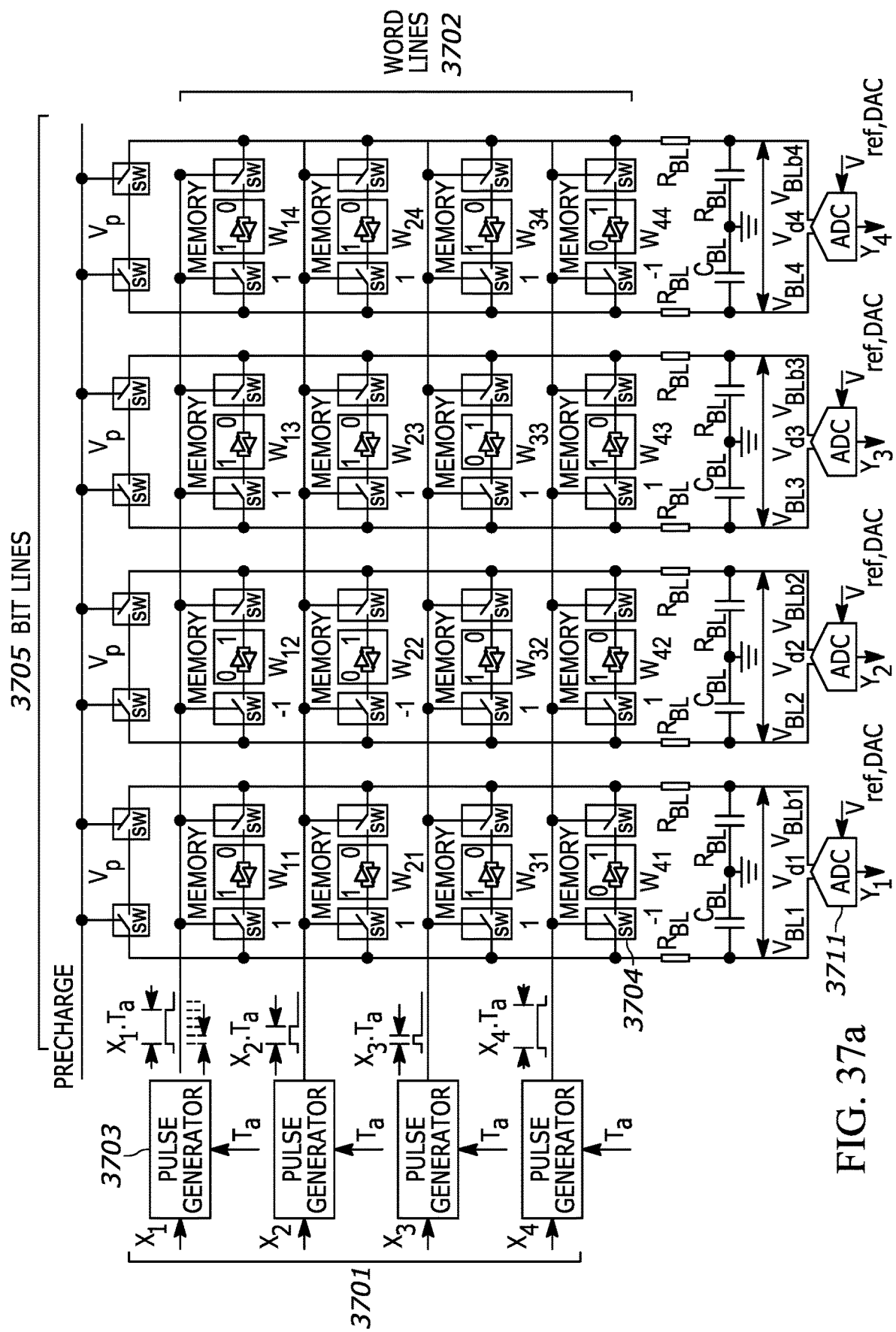
FIG. 37(a)-(b) illustrates a crossbar network with pulse-width modulated activation signals and binary weights embedded in memories.

In the past, activation inputs of crossbar networks have been modified to use pulse-width modulated time-domain signals rather than the amplitude domain activations shown in FIG. 36. An example of such network incorporating binary weights stored in binary memory cells (such as SRAM cells) is shown in FIG. 37(a). This approach may be more energy efficient compared to running currents through the bit lines as it mainly relies on charge summation on capacitors that are attached to the bit-lines (parasitic capacitance or a deliberately added capacitor). The crossbar network shown in FIG. 37(a) implements its activation inputs by means of pulse generators referenced to a unit time reference with duration $T_a$. Here the integer activation inputs, denoted by $X_i$, determine the activation duration to be equal to $X_i \cdot T_a$. For instance, an integer input activation of 7 is represented by a pulse at a duration of $7 \cdot T_a$.

Figure 37B:
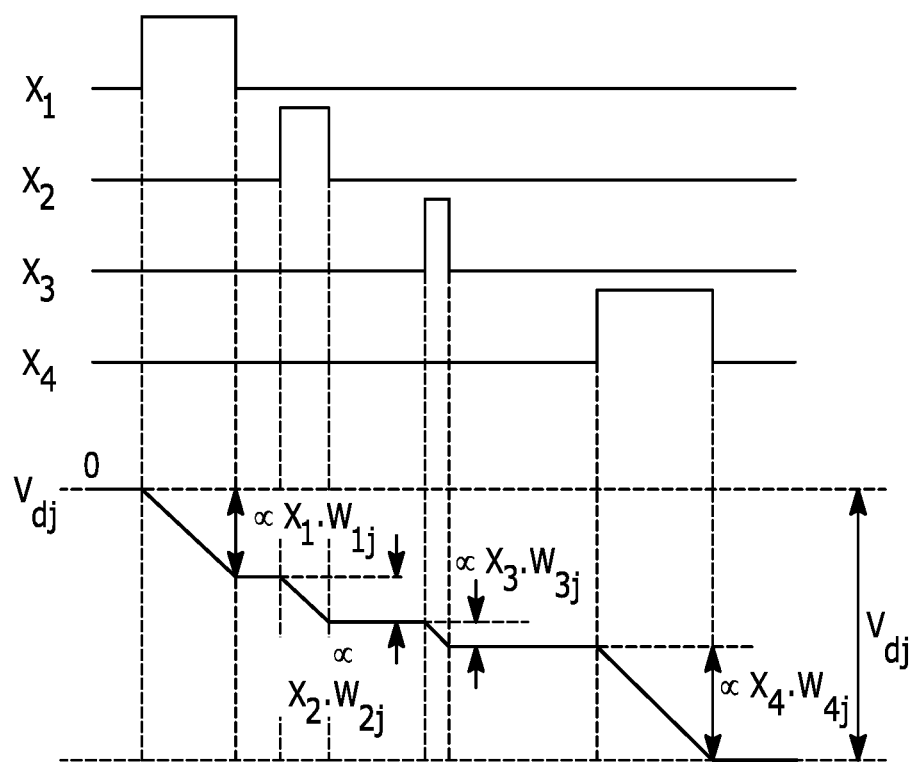

FIG. 37 (a) illustrates a crossbar network with pulse-width modulated activation signals and binary weights embedded in memories that determine polarity of discharge on differential bit line capacitances. FIG. 37(b) illustrates a timing operation of the network. Similar to the crossbar network of FIG. 36, word-lines broadcast the activations across many bit lines, where the weight elements are stored in memory cells at the crossing of each word line and bit line. The bit lines can be arranged differentially, i.e. each line being composed by two lines with voltages $V_{BLj}$ and $V_{BLbj}$. These bit lines each have a total capacitance, denoted by $C_{BL}$, and are initially charged to a pre-charge voltage, VP, before the operation. When pre-charged at the beginning of each dot product operation, the differential voltage across the bit lines denoted by $V_{dj} = V_{BLj} - V_{BLbj}$, starts from zero (shown in FIG. 37(B)). For the duration of each word line's pulse-width modulated activation, switches SW connect the bit line capacitors to the memory cells holding '10' or '01' states (left and right hand side or SRAM cell holding 0 or 1 values resulting in two states). It is assumed that the switches have no on resistance and the total resistance to the capacitor is modelled by a resistance $R_{BL}$. Depending on the state stored in the weight memory ('+1=10' or '−1=01' resembling a charge/discharge polarity for the bit line capacitances), one of the bit line capacitances charges towards supply and the other one discharges towards ground (FIG. 37(a)). Once all pulse-width modulated input activations are applied to the word lines, due to superposition, the total charge (activation dependent) removed or added (weight dependent) to each bit line capacitance results in a differential voltage across the bit lines (see FIG. 37(b)) for a case with all weights '1'):

$$V_{dj} \propto \frac{2V_p T_a}{R_{BL}C_{BL}} \sum_{i=0}^{n-1} X_i W_{ij} \qquad (50)$$

The bit line voltages $V_{dj}$ are converted by analog-to-digital conversion with reference to a voltage, $V_{ref,ADC}$ to derive the integer bit line dot product result:

$$Y_j \propto \frac{2V_p T_a}{V_{ref,ADC} R_{BL}C_{BL}} \sum_{i=0}^{n-1} X_i W_{ij} \qquad (51)$$

This scheme simplifies the activation by removing the DACs used in FIG. 36 and improves energy efficiency through charge domain operation of the bit lines, however, the complexity and energy consumption of the amplitude-domain readout (required by the bit line ADCs) remains.

Figure 38A:
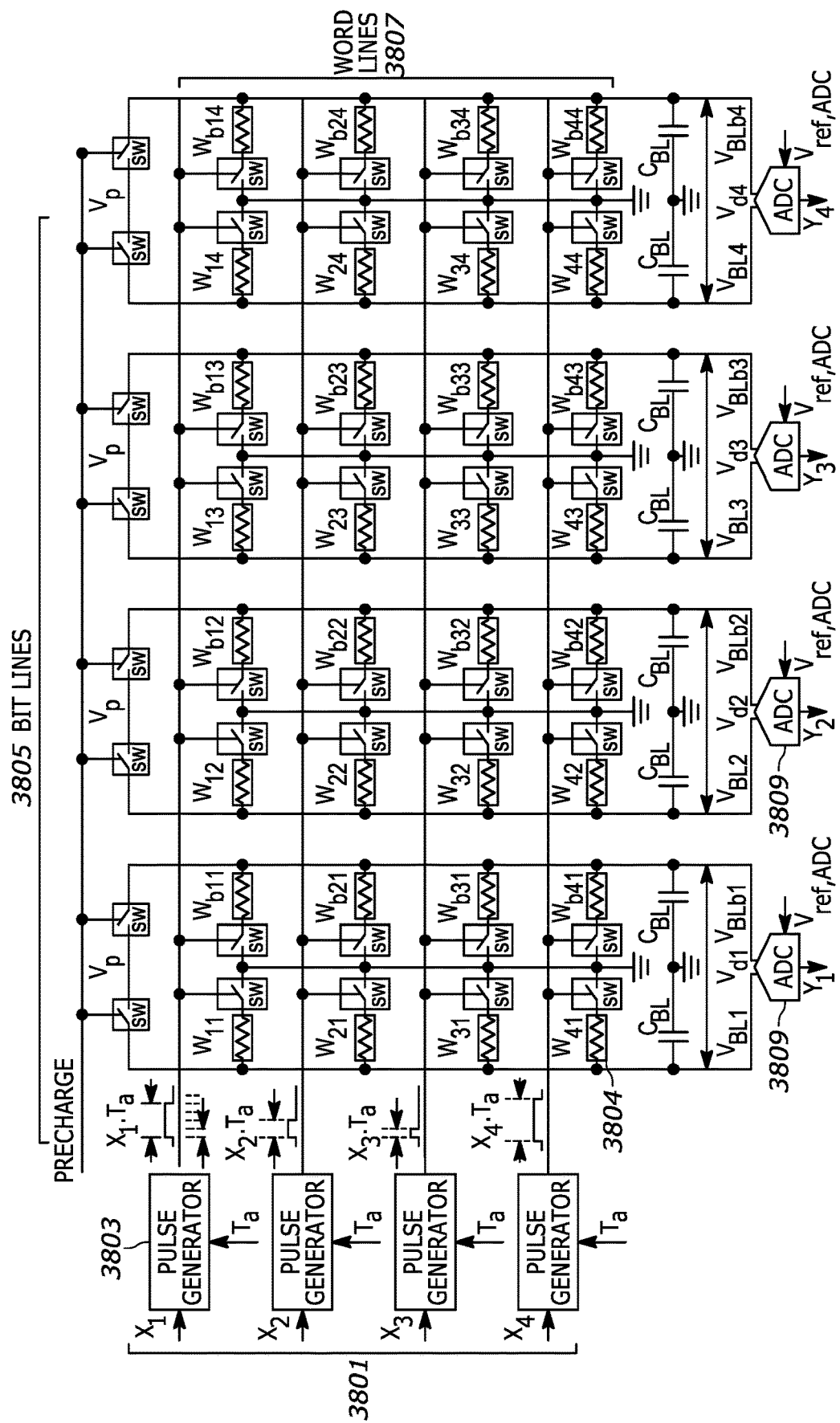
FIG. 38(a)-(c) a memristor based crossbar network activated with pulse-width modulated activations and readout in amplitude domain with amplitude-domain analog to digital converters.
Figure 38B:
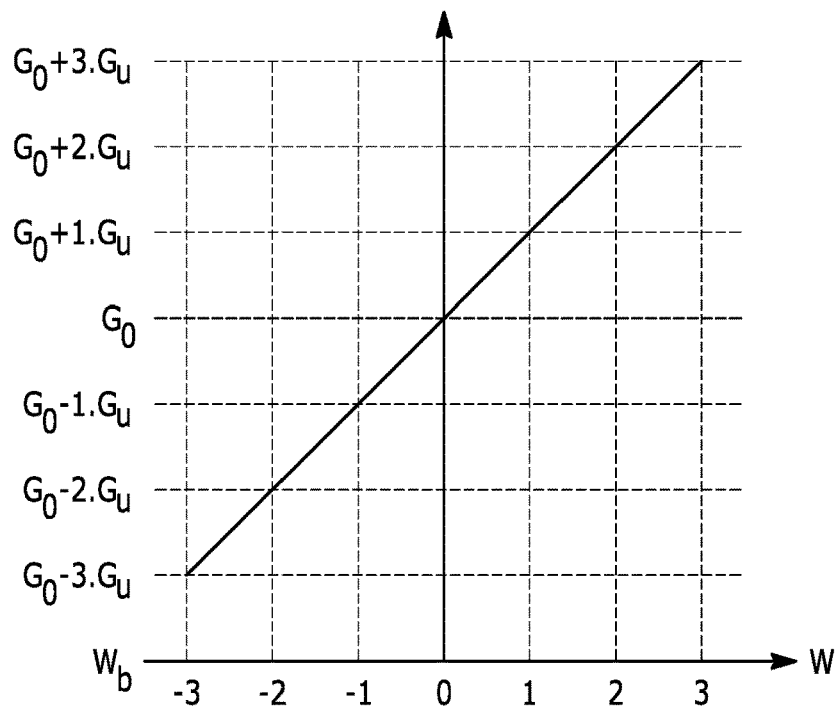
Figure 38C:
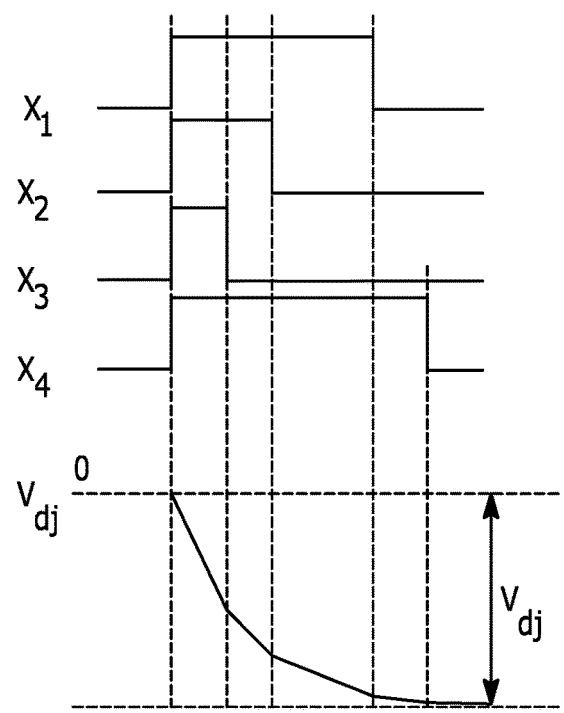

FIG. 38 illustrates a memristor based crossbar network activated with pulse-width modulated activations and readout in amplitude domain with amplitude-domain analog to digital converters. In such an embodiment, the implementation resembling the implementation of FIG. 38(a) implements the weights in weighted resistors (conductance values). This can either be fixed circuit elements for a network that has no programmability or could be made programmable by making use of elements such as memristor elements (programmable conductance values such as shown in FIG. 38(b). The configuration of the pulse-width modulated activations and their generations, as well as differential structure for bit lines resembles that of FIG. 37(a). The difference is in the weight values, $W_{ij}$, that can have more levels than the binary levels of FIG. 37(a). A case of bipolar weight values across 7 levels of conductances is shown in FIG. 38(b). Assuming $W_{ij}(W_{bij}$ for negative weight values) to be an integer value, its physical implementation is through a conductance $G_{ij}=G_0+W_{ij} \cdot G_u$ or $G_{ij}=G_0-W_{bij} \cdot G_u$. The matrix dot product multiply and add operation starts by pre-charging the bit lines to a pre-charge voltage VP. Each word-line carries the pulse-width modulated activation inputs $X_1$ to switches SW. These switches provide a discharge path through the weight conductance values determined by $W_{ij}$ (and $W_{bij}$) to ground, for the duration of the activation input. As a result of the superposition of all the time constants, once all the activation inputs are applied, a differential voltage $V_{dj}$ appears across the bit line that to the first order is determined by:

$$V_{dj} \propto 2V_P \exp\left(\frac{-T_a G_0}{C_{BL}} \sum_{i=0}^{n-1} X_i\right) \sinh\left(\frac{T_a G_u}{C_{BL}} \sum_{i=0}^{n-1} W_{ij} X_i\right) \qquad (52)$$

The bit line voltages are digitized by ADCs. In the past, in embeds the operation of the ADC with the operation of the cross bar through the application of a multi cycle charge and discharge operation in the presence of an extra row formed by reference conductance values. This helps mitigate the non-linear relationship of (Equation 52) at the cost of requiring a multi-cycle charge and discharge operation and extra rows of conductance's across the crossbar for implementation of the amplitude-domain ADC operation.

An embodiment of the present disclosure illustrates a time-domain interface for activation and readout of the analog multiply and add crossbar networks. Such interface replaces amplitude-domain schemes used in prior art. It benefits from the fact that with the activation inputs to the crossbar word-lines translated to pulse-width modulated time-domain signals, the superposition of time-constants (charging times, integration times, discharge times) implemented by various crossbar network configurations can be measured at the bit lines through time measurements, where the time-to-digital conversion can be done with reference to the same time reference that was used to generate the activations. Furthermore, this invention disclosure proposes a time measurement that is arranged in a ratiometric manner, such that the non-idealities contributing to the absolute values of resistors, capacitors, reference voltages, currents, times, etc. will cancel out, resulting in a linear dot product matrix multiplication output that is, to first order, only a function of the integer input activations and weights.

Figure 39A:
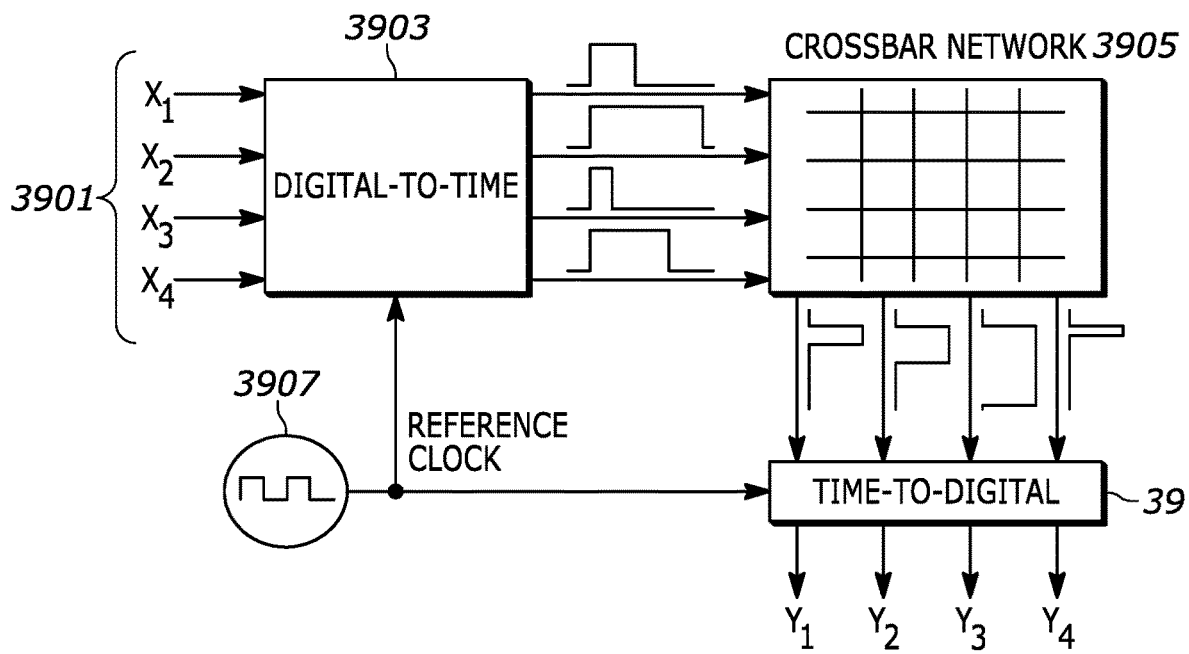
FIG. 39(a)-(c) illustrates a time-based interface to a dot product calculating crossbar network.
Figure 39B:
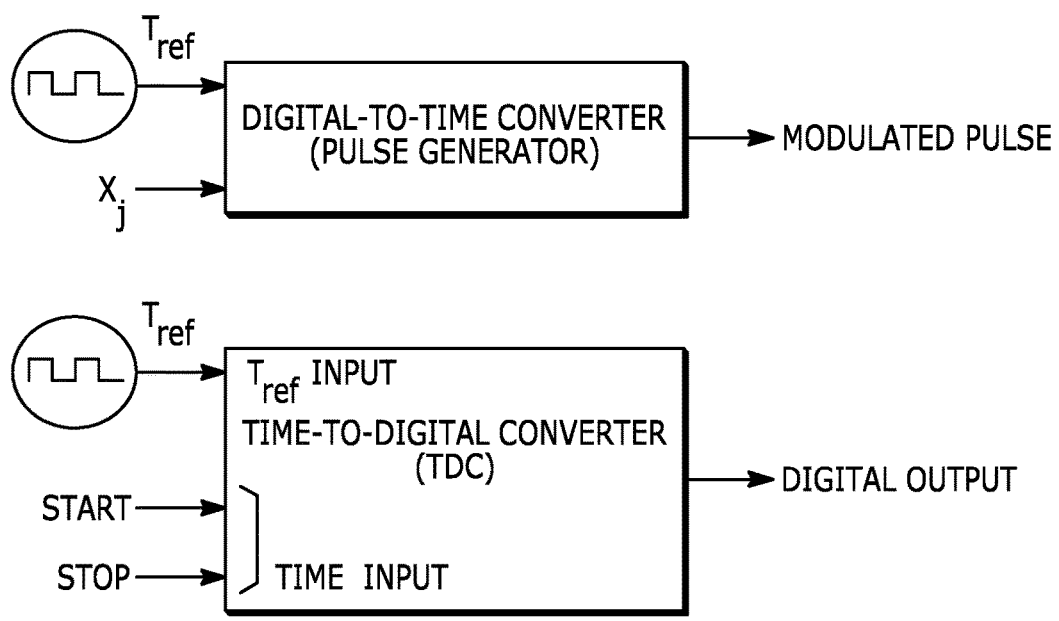
Figure 39C:
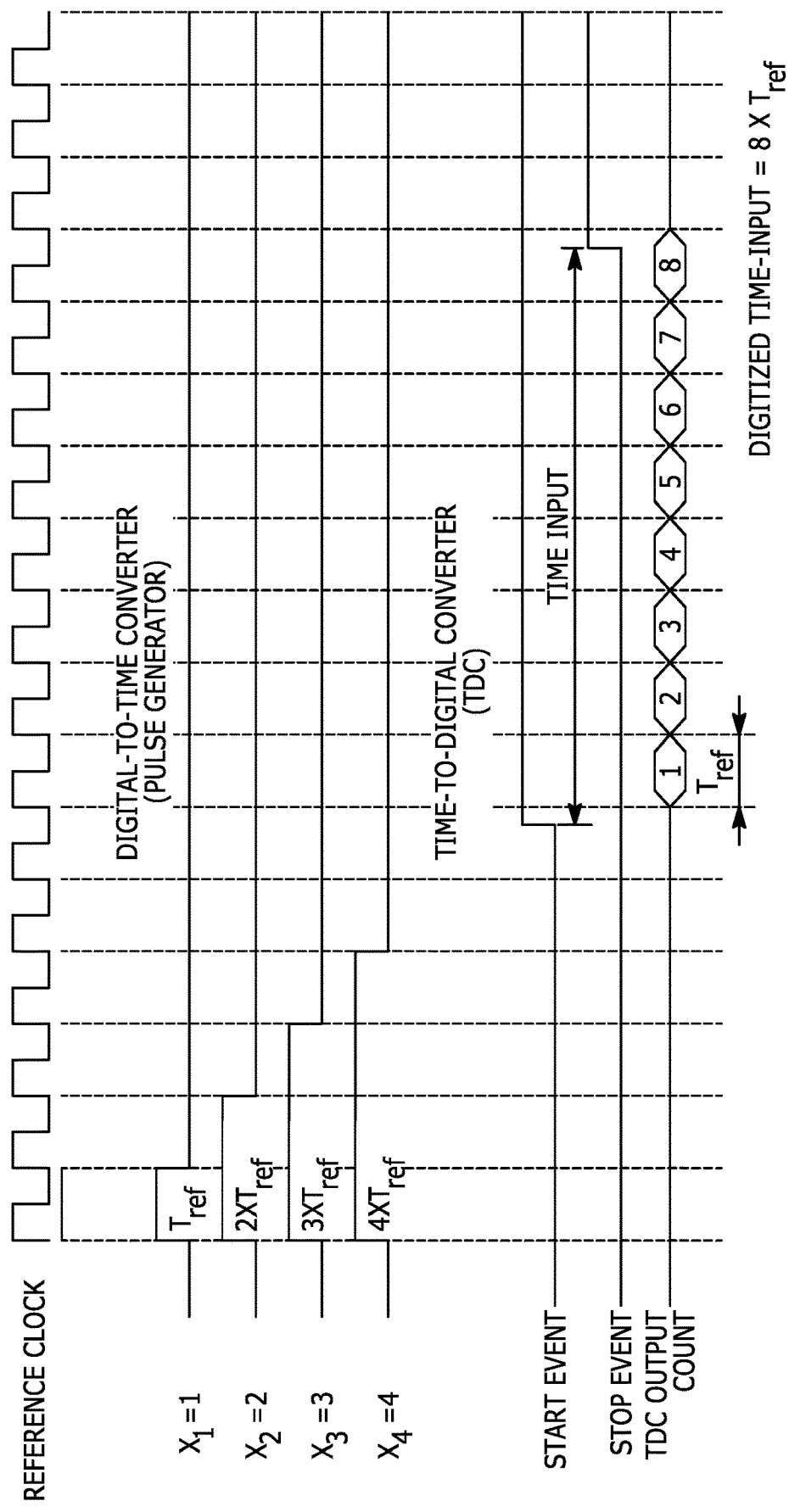

FIG. 39 illustrates a time-based interface to a dot product calculating crossbar network. The time input and output interfaces may be shown, as well as 39(b) the interface peripherals being a digital-to-time and a time-to-digital converter (TDC), and in 39(c), the time-domain operation. A time-domain operation has several benefits in terms of scalability and reliability of such analog crossbar multiply and add networks. FIG. 39(a) illustrates a time-domain interface to a crossbar network with time-domain periphery interface circuits. These periphery circuits are shown in FIG. 39(b) and mainly implement the functions of digital-to-time and time-to-digital conversion. The activations are generated by the former (a pulse generator) with reference to a time $T_{ref}$ that is scaled by an integer input $X_j$ and the MAC outputs are converted from time-domain to digital by means of time-to-digital converters (TDCs). A TDC measures an input time that is marked by a START and STOP signal marking two events (FIG. 39(c). To enable time measurement, a reference time is required. For TDCs, this is often set by an input frequency ($f_{ref}$) or time reference, $T_{ref}=1/f_{ref}$ to the TDC. Application of such converters to the interface of a dot product crossbar network has several benefits:

The circuit architecture of a TDC is closer to digital circuits (a TDC implementation can be as simple as a counter for moderate time resolutions or a ring oscillator and a register combined with a counter for high resolution cases). Such type of circuitry has several benefits:

Scaling of the dynamic range needed per hidden layer of a deep neural network is simpler to implement in a TDC rather than an ADC. When using a TDC, this can be as simple as adding an extra bit to the counter and counting for a longer period of time to double the dynamic range, while in an ADC, such adaptation can have severe impact on complexity, size and power consumption.

TDCs consume dynamic power associated with the switching of logic gates (like digital circuits) rather than quiescent power consumed by linear analog circuits used in ADCs. This provides superior energy efficiency compared to ADCs.

The semi digital circuit architectures result in very small footprints for their integrated circuit realizations and so make them amenable to larger scale deep neural networks that employ analog crossbar multiply and add networks.

The resulting output time of each bit line can be measured against a reference time constant generated by the same unit analog resistances or capacitances that are used to implement the network weights. This enables a ratiometric measurement scheme that greatly enhances the robustness of the dot product result by cancelling the variations of the analog elements to the first order.

With input and output interfaces to the crossbar network arranged in time-domain, the time reference of the pulse width modulated activation generator can be synchronized to the time reference of the TDC (FIG. 39c), which then results in a matching transfer characteristic for the analog and digital interface to the crossbar network. This is not feasible with amplitude-domain interfaces as the characteristics of DACs and ADCs or pulse-width modulators and ADCs are inherently mismatched.

Figure 40A:
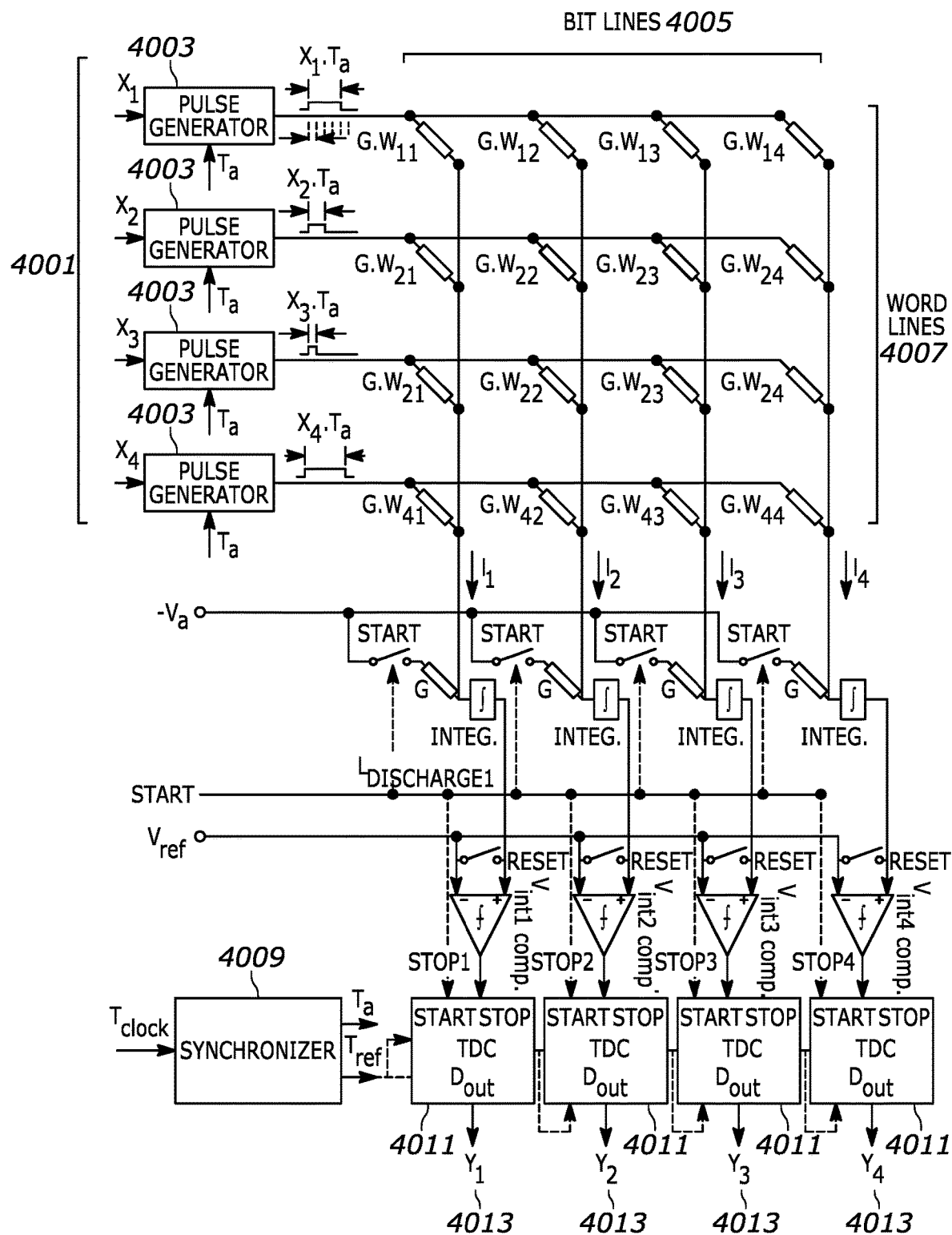
FIG. 40(a)-(c) illustrates a functional block diagram and operation of the proposed time-domain interface to a mixed-signal dot product computation hardware.
Figure 40B:
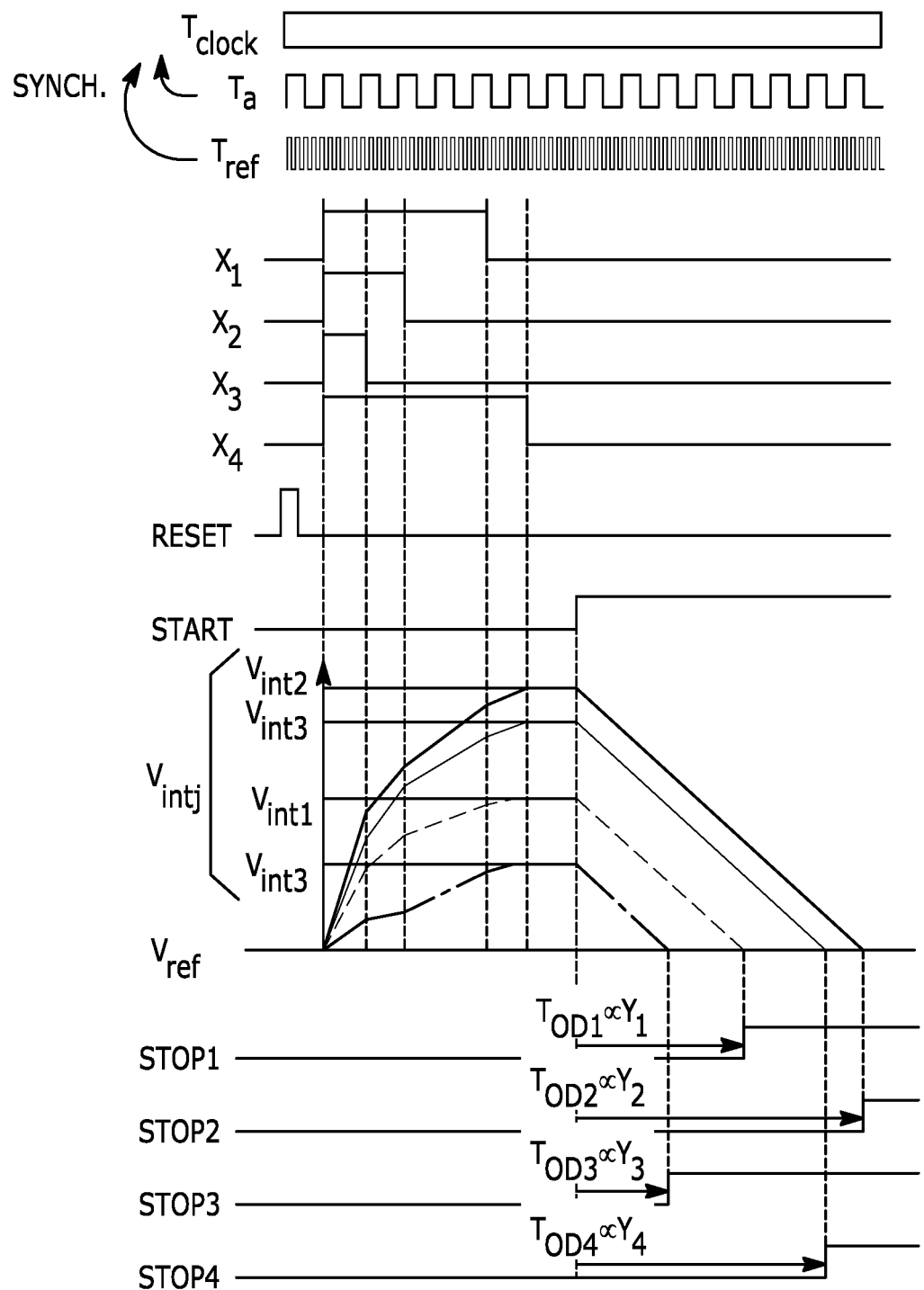
Figure 40C:
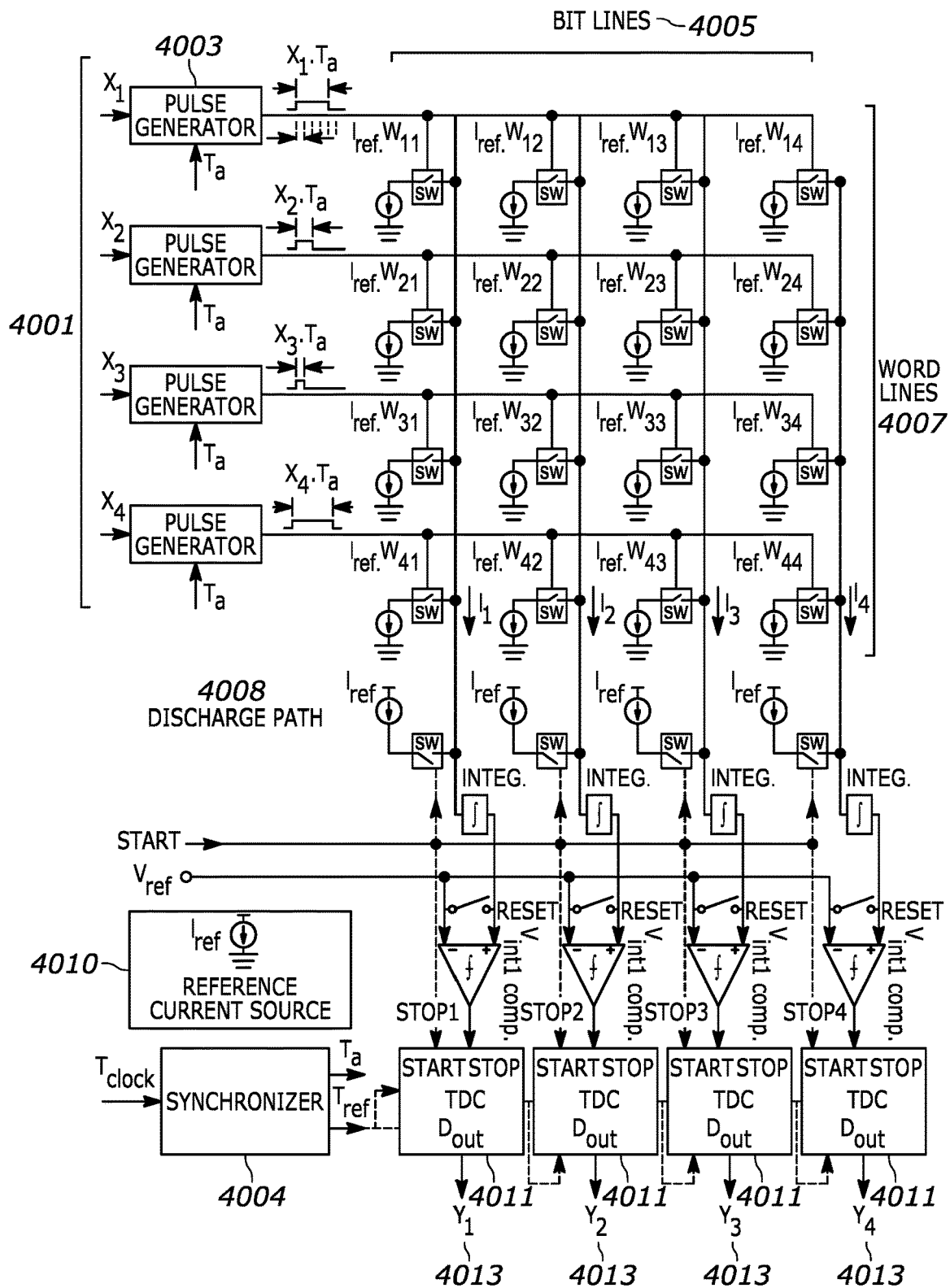

FIG. 40A illustrates a functional block diagram and operation of the proposed time-domain interface to a mixed-signal dot product computation hardware based on a crossbar network is shown in FIG. 40A and FIG. 40C with the time-domain operational waveforms in FIG. 40B. This block diagram is the foundation of the time-domain and ratiometric readout operation and will be shown to be expandable to various crossbar networks based on different electrical properties (charge-domain, current-domain, etc) and weight implementations (memory elements such as ROM, SRAM, M/R/PC/RAM). To simplify the description of the proposed method, a single ended structure (only positive weight values) is shown first. Expansion to practical implementations with bipolar operation and differential bit lines can be derived from this fundamental architecture and will be shown later.

In FIG. 40, the embodiment of a time-domain interface to a crossbar mixed signal dot product calculation network with ratiometric output evaluation is shown. In FIG. 40(a), the conceptual block diagram with pulse-width modulated input activations and TDC based readout is illustrated. In FIG. 40 (b), the waveforms associated with the time-domain inputs, outputs and the control and reference signals are illustrated. And in FIG. 40(c), the time-domain ratiometric implementation utilizing scaled current sources referenced to a reference current source $I_{ref}$.

In this embodiment, the weights are shown as impedances implemented by utilizing a unit conductance G, which is scaled by the appropriate integer weight $W_{ij}$. The input activation signals are generated by pulse-width modulated generators based on a reference time $T_a$, scaled by integer activation value $X_i$. These are broadcasted along the word lines, which then cross with the bit lines at the corresponding weight impedances that connect the word line to the bit line. Each bit line may be connected to an integrator, which starts its operation per dot product calculation from a reset state defined by a given reference voltage $V_{ref}$ (performed by means of a 'Reset' signal). Once the pulse-width modulated activations with amplitude $V_a$ are applied to all word lines, the conductance associated with the weights translate the pulse width modulated activations into a total net amount of charge injected into each bit line (delivered through flowing currents $I_j$) that is integrated by the corresponding integrator. The $j^{th}$ bit-line's charge is:

$$Q_j = V_a \cdot G \cdot T_a \cdot \sum_{i=0}^{n-1} W_{ij} X_i \qquad \text{(Eq. 53)}$$

As a result of the application of the input activations and the charge integration, each integrator develops an output voltage denoted by $V_{intj}$, which is a function of the integrator gain (FIG. 40b). Once all activations are applied (and all weighted charges are integrated), a signal denoted by START connects the integrator outputs through a unit conductance G to a voltage $-V_a$, which is the negative value of the amplitude of the pulse-width modulated input activations. At the same time, a TDC connected to the bit line starts measuring time. The connection to $-V_a$ removes charge from the integrator (through discharge current $I_{discharge,j}$). The removal of charge then reduces integrator output voltages $V_{intj}$ and this continues until a comparator monitoring the integrator output voltage detects the integrator has reached its original reset value, $V_{ref}$. Once this level is detected a STOP signal is generated by the comparator and passed to the TDC to stop measuring time. As a result, the total charge $Q_j$ integrated during the activation phase, is removed completely using the reference discharge path made by unit conductance G. The time it takes for this charge to be removed (discharge) is:

$$t_{OD,j} = \frac{Q_j}{V_a \cdot G} = \frac{V_a \cdot G \cdot T_a \cdot \sum_{i=0}^{n-1} W_{ij} X_i}{V_a \cdot G} = T_a \cdot \sum_{i=0}^{n-1} W_{ij} X_i \qquad (54)$$

The TDC produces a digital integer value $Y_j$ at its output, which is proportional to $t_{OD,j}$ and the TDC reference time $T_{ref}$ by a rounding function (quantizing function) of round (x):

$$Y_j = \text{round}\left(\frac{t_{OD,j}}{T_{ref}}\right) \qquad (55)$$

Substituting (54) in (55) results in:

$$Y_j = \left(\frac{T_a \cdot \sum_{i=0}^{n-1} W_{ij} X_i}{T_{ref}}\right) \qquad (56)$$

Both TDC reference time, $T_{ref}$ and the time reference to the pulse-width modulator activation generators, $T_a$, are synchronized to the same system clock $T_{clock}$ with integer ratios. Therefore, $T_{ref}$ and $T_a$ have an integer ratio denoted by k. Synchronization allows for k to be able to be chosen as an integer or as the ratio of two integer values M and N, i.e. k=M/N. This takes care of quantization mentioned earlier as well:

$$T_a = k \cdot T_{ref} \qquad (57)$$

Substituting (57) into (56) results in a ratiometric linear bit-line output measurement $Y_j$ that is solely dependent on the input integer activations $X_i$, integer weight values $W_{ij}$ and a fixed constant k:

$$Y_j = k \cdot \sum_{i=0}^{n-1} W_{ij} X_i \qquad (58)$$

An alternative illustration of the proposed ratiometric time-domain crossbar network implementation is shown in FIG. 40(c). In this embodiment, the integer scaled current sources referenced to a reference current source $I_{ref}$ implement the network weights. The discharge path may be composed by a row of current sources referenced to the same source and with opposite polarity. The time-domain operation and waveforms of the signals in the network exactly resemble those shown in FIG. 40(b). A difference with the embodiment illustrated in FIG. 40(a) is that the charge and discharge currents are produced by utilization of active current sources rather than passive impedances. The equations governing the dot product calculation and ratiometric operation remain the same as equations (53) to (59), with the only difference that $V_a \cdot G$ representing the charge and discharge currents of FIG. 40(a) in equations (53) and (54) should be replaced with $I_{ref}$.

In terms of dot product implementation, equation (58) illustrates the significance of the proposed method implementing a ratiometric time-domain interface to a crossbar network. The ratiometric output evaluation in time-domain is to first order independent of any absolute parameter values such as, the unit impedances or current sources forming the weights (G or $I_{ref}$), the voltage levels such as the reference voltage $V_{ref}$ or activation amplitude $V_a$, the charge integration parameters such as the integrator gain and output levels $V_{intj}$ and the time reference values $T_a$, $T_{ref}$, $T_{clock}$.

With the activation generators and the TDC relying on digital circuits (counters) and using the same time reference $T_{clock}$, their input/output transfer characteristics (digital-to-time and time-to-digital) match to the first order and hence does not affect accuracy.

In terms of hardware and energy consumption efficiency the proposed scheme may have several benefits. To a first order, one of the only analog circuits that may be used in the interface is a comparator per bit line that is operated once per dot product calculation, minimizing the quiescent power consumption of the interface circuit and maximizing its throughput (compared to an ADC interface). The charge integration can be done passively using bit line capacitances or actively with an active integrator for more accuracy, however, the bit-line integrator can be implemented with low-power circuits such as inverter based active integrators.

The proposed time-domain interface technique can be applied to various configurations of crossbar networks based on different memory elements (volatile such as SRAM or nonvolatile such as floating gate flash, ROM, RRAM, MRAM, etc.). It can also be applied to networks implementing hybrid memory architectures, e.g., partially SRAM based and partially ROM based or any combinations of different memory elements for mixed-signal in-memory compute.

Figures 41A, 41B:
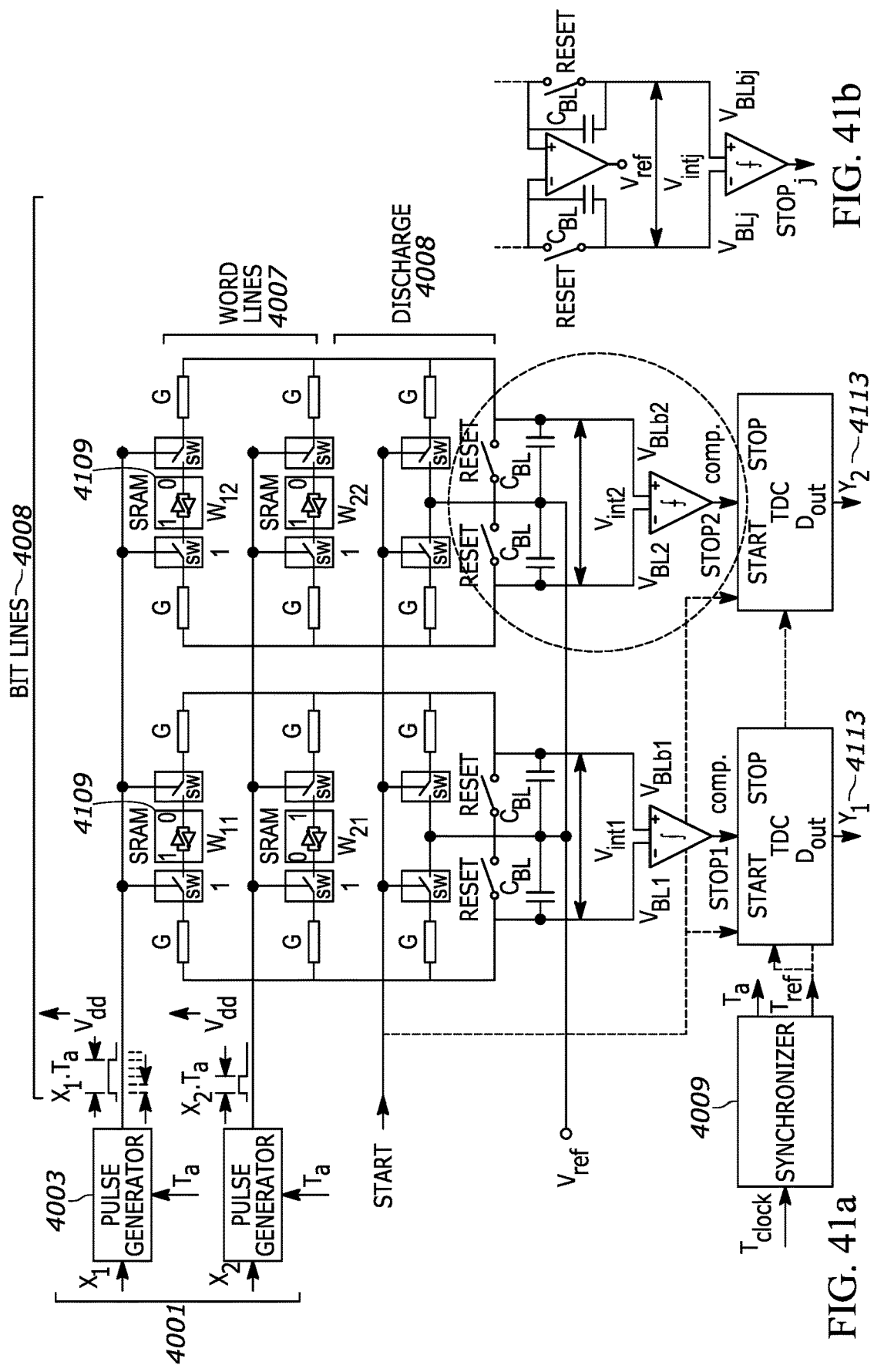
FIG. 41(a)-(c) illustrates a time-domain multi-level activation input, multi-level dot product output, SRAM based in memory compute crossbar network.
Figure 41C:
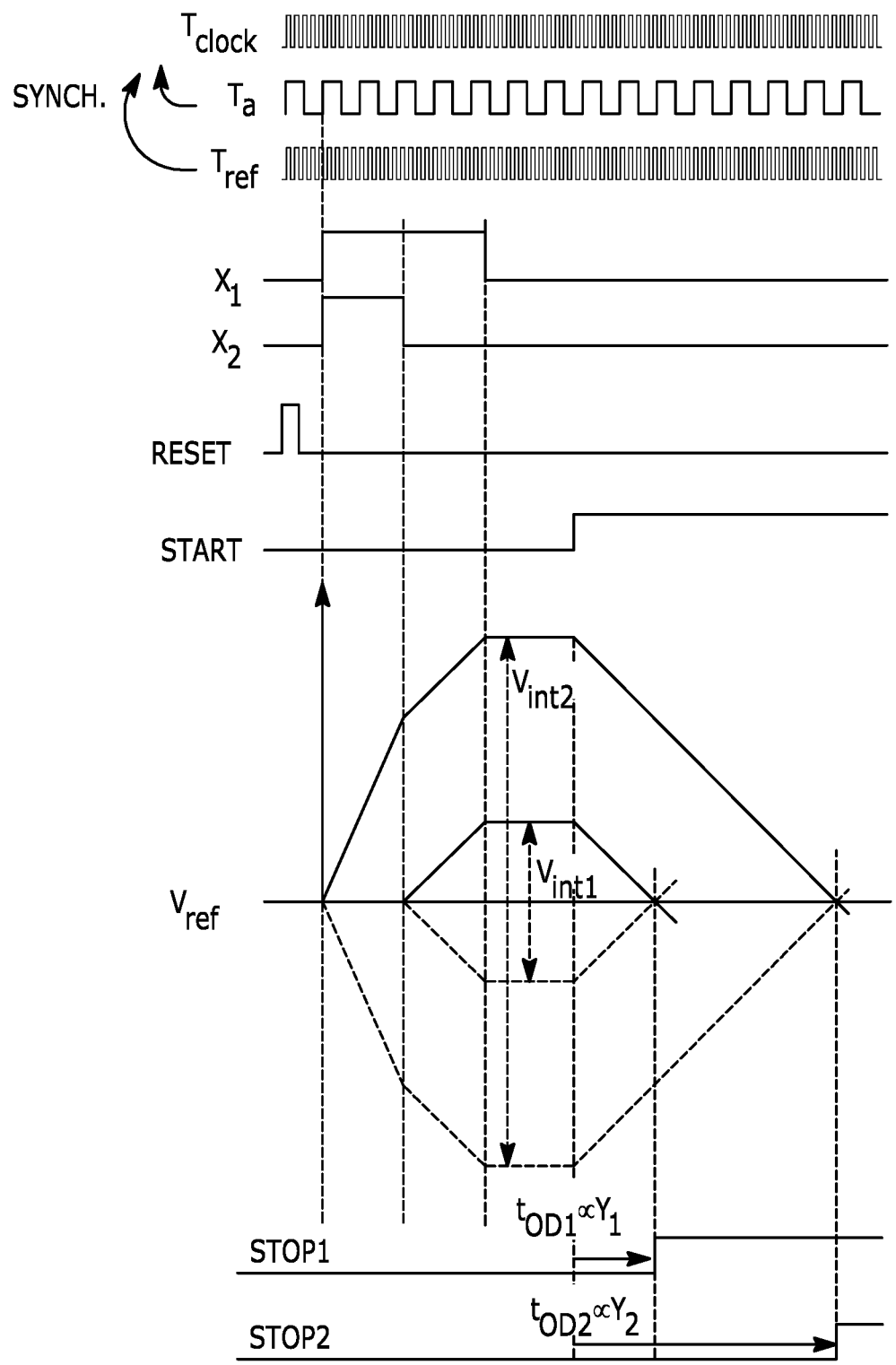

An SRAM (Static Random-Access Memory) can be used for storing the weights in memory compute. The SRAM can provide a binary weight element to be used in networks employing either multi-level inputs or binary inputs. The dot product output can also be binary or multi-level. Each configuration may have its own characteristics and pros and cons, however, when adopting a multi-level input activation and multi-level dot product output evaluation using SRAM cells in order to store the weights, the proposed time-domain interface provides hardware and energy efficiency as well as a high precision calculation result, compared to state of the art utilizing amplitude-domain interfaces. Next, three architectures are introduced that utilize a time-domain ratiometric interface with SRAM based crossbar networks:

FIG. 41 illustrates a time-domain multi-level activation input, multi-level dot product output, SRAM based in memory compute crossbar network. The network shown in FIG. 41(a) may be based on balanced current integration using unit impedances and the TDC bit line converters and employing passive integration making use of bit line capacitances. FIG. 41(b) illustrates replacing passive integrator with active integrator. FIG. 41(c) illustrates operation of the time-domain interface with input and output time values. The embodiment of this crossbar network may utilize unit conductance values G to convert the stored SRAM memory content into a bipolar current (push and pull current components) that is integrated by a differential integrator. The differential bit line structure means the binary weight values operate as +1 and −1 values. Each cell requires 6 transistors (a 6T cell), where 4 transistors implement the SRAM core and 2 are used to apply the activation signals. The integrator in FIG. 41(b) provides better integration accuracy at the cost of more energy and chip area. The operation of the network in FIG. 41(c) is the same as the foundational network architecture shown in FIG. 6a. It starts from a reset state for the bit line integrators, resetting them to a common-mode reference voltage $V_{ref}$ (e.g at half the SRAM supply $V_{dd}$, i.e. $V_{ref}=0.5V_{dd}$). This is then followed by the application of the pulse-width modulated activation inputs, $X_i$. The activation time reference $T_a$ and the TDC reference clock $T_{ref}$ are synchronized to a system clock $T_{clock}$. The weight conductance, G, result in the flow of a bipolar charge (depending on the stored SRAM value) into the bit line integrator, resulting in a differential voltage $V_{intj}$ developed per bit line. After the inputs are applied a START signal is asserted that enables the discharge branch. This branch uses two unit conductances of G to remove the integrated charge by draining it back to $V_{ref}$ (same initial condition the integrator started before the application of the activation inputs). The TDC starts measuring time when START signal is asserted. Once the integrator passes a differential zero voltage, the comparator stops the TDC by generating the $STOP_j$ signal (FIG. 41(c)). Using equation (54) and replacing $V_a$ with $V_{dd}$ (SRAM supply as well as the amplitude for the pulse-width modulated input activations), and assuming same ratio between the synchronized time references as (57) suggests, the TDC digital output can be defined as:

$$Y_j = \frac{r_{OD,j}}{T_{ref}} = \frac{\left(\frac{Q_i}{V_{dd} \cdot G}\right)}{T_{ref}} = \frac{\left(\frac{V_{dd} \cdot G \cdot T_a \cdot \sum_{i=0}^{n-1} W_{ij} X_i}{V_{dd} \cdot G}\right)}{T_{ref}} = k \cdot \sum_{i=0}^{n-1} W_{ij} X_i \qquad (59)$$

This shows a dot product result that is to the first order only a function of the integer activation inputs and the stored weights in the SRAM memories. It should be noted that conductance G can simply be represented by the on resistance of the switch transistors in the 6T cell when a binary weight network is implemented and hence does not necessarily need to be a separate physical impedance.

Figure 42A:
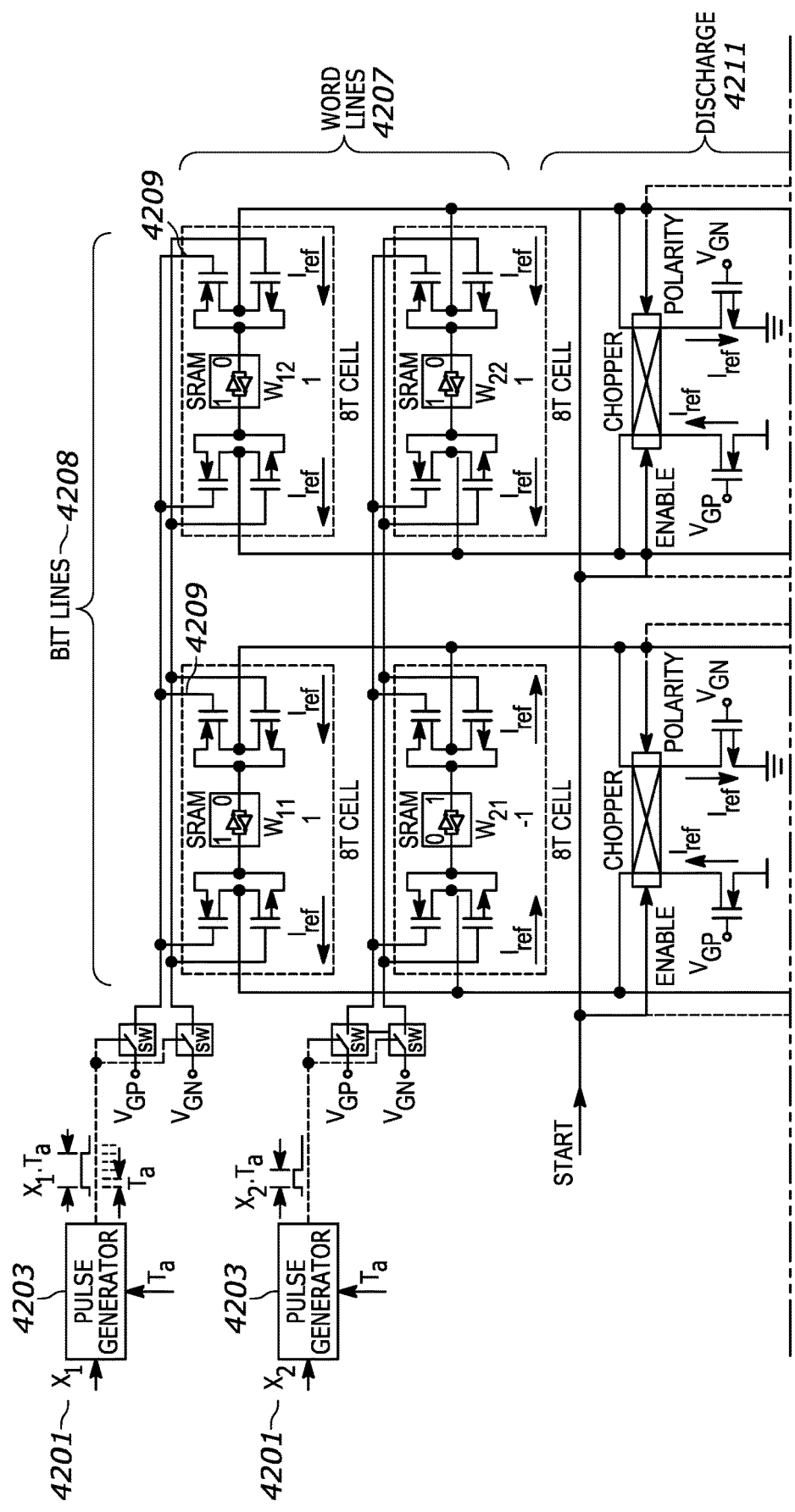
Figure 42A:
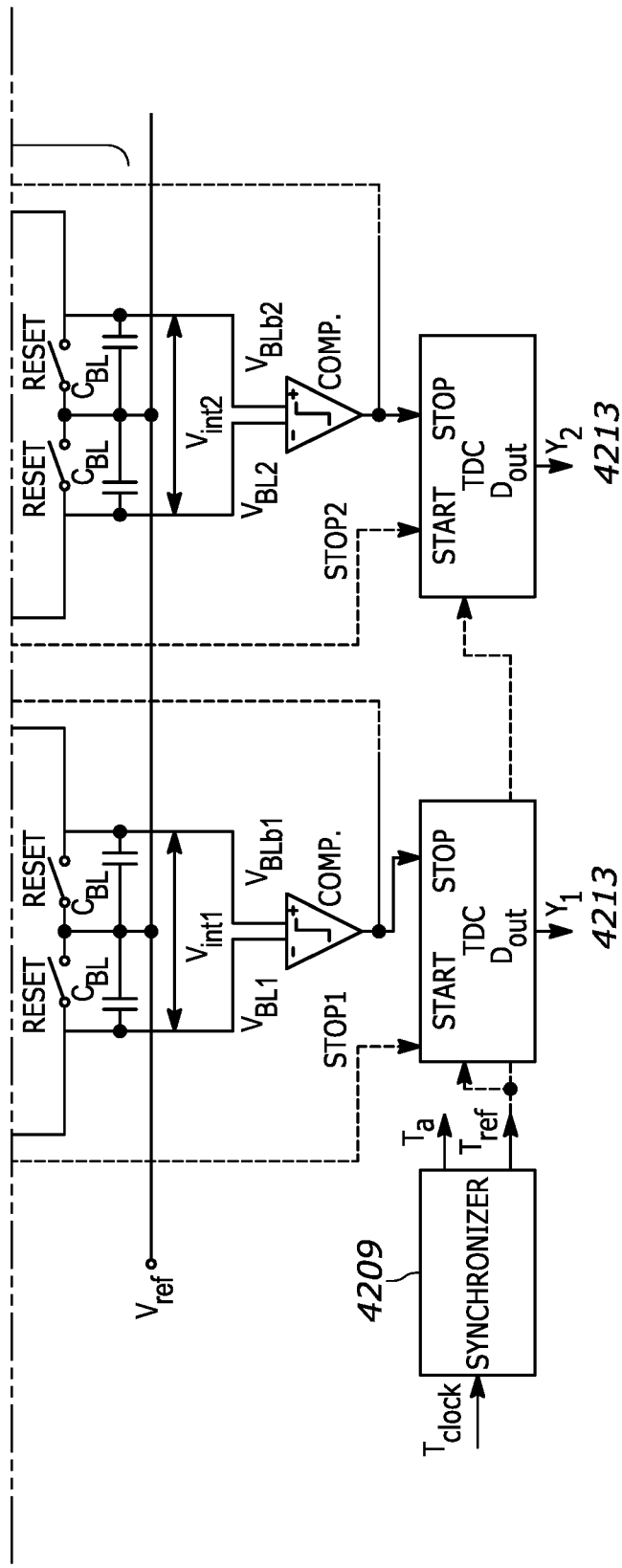

FIG. 42 illustrates a SRAM based multi-level input, multi-level output time-domain interface to a crossbar network for dot product calculation. FIG. 42(a) illustrates a network based on fully balanced current integration using 8T cell SRAM and balanced current sources and a matching fully balanced discharge path and time measurement blocks. FIG. 42(b) illustrates the polarity of the balanced current integration determined by SRAM and the polarity of the balanced discharge phase determined by integrator polarity and applied through the 'Chopper'. FIG. 42(a) illustrates another approach to an SRAM based crossbar network with time-domain ratiometric interface, where rather than unit impedances, unit transistors implement fully balanced current sources to integrate charge on the bit line capacitances for the duration of the time determined by input activations. Here, an 8 transistor (8T) cell is proposed, where 4 transistors form the SRAM core holding the weight values and the other 4 implement a fully balanced current source whose polarity is determined by the value stored in the SRAM. The push and pull unit current sources in 8T SRAM cells are referenced to a reference branch with a current $I_{ref}$. The reference current is replicated by means of the reference diode connected transistors $M_{Pref}$ and $M_{Nref}$ generating word line voltages $V_{GP}$ and $V_{GN}$ that are used to bias the 8T cell PMOS and NMOS current sources. These match $M_{Pref}$ and $M_{Nref}$ and produce $+/-I_{ref}$ currents. FIG. 42(b) shows how for two states corresponding to weight values of +1 and −1, the balanced injection polarity of the current is determined. The SRAM state determines which current source is enabled and which is disabled by simply biasing their shared source terminals to $V_{dd}$ (supply) or GND (ground). The proposed connection guarantees the balanced current direction by turning the current sources on and off in an opposing manner. The voltages $V_{GP}$ and $V_{GN}$ are applied to the 8T cell current source transistor gates through the word lines for the duration determined by the corresponding input activation $X_i$. The overall functional operation of the network is the same as the embodiment of (FIG. 41(c)). An additional consideration is required for the ratiometric discharge phase compared to such an embodiment. The discharge phase should be carried out by utilizing matching balanced current sources for ratiometric operation. The correct discharge polarity (to result in removal of charge from the integrator rather than addition of charge) is determined by utilizing the same bit line comparator output. The comparator output simply holds the information regarding the polarity of the integrated charge at the end of the activation phase. This bit is used to control the polarity at which the 'Chopper' block connects the NMOS and PMOS discharge current sources to the bit lines (See FIG. 42(b)). The chopper is disabled until the START signal is applied. At this moment the TDC starts measuring time and the discharge path unit current sources remove charge from the capacitors following the correct polarity, until the comparator trips (when the integrator output crosses zero). This event marked by the STOP signals stops the TDC time measurement. Therefore, the time-domain operation exactly resembles that of the architecture in FIG. 41(c).

The passive bit line integrator shown in FIG. 42(a) can also be replaced with the same active integrator shown in FIG. 41(b). Compared to other embodiments, this network provides precision charge integration and ratiometric output evaluation. For the same timing conditions assumed in derivation of (59), the network output is:

$$Y_j = \frac{r_{OD,j}}{T_{ref}} = \frac{\left(\frac{Q_j}{2 \cdot I_{ref}}\right)}{T_{ref}} = \frac{\left(\frac{2 \cdot I_{ref} \cdot T_a \cdot \sum_{i=0}^{n-1} W_{ij} X_i}{2 \cdot I_{ref}}\right)}{T_{ref}} = k \cdot \sum_{i=0}^{n-1} W_{ij} X_i \tag{60}$$

Which is once more a ratiometric dot product output with first order independence from circuit values. It should be noted that the architecture in FIG. 42 can also be implemented with single ended bit lines and unipolar current sources in both charge and discharge phases.

Figure 43A:
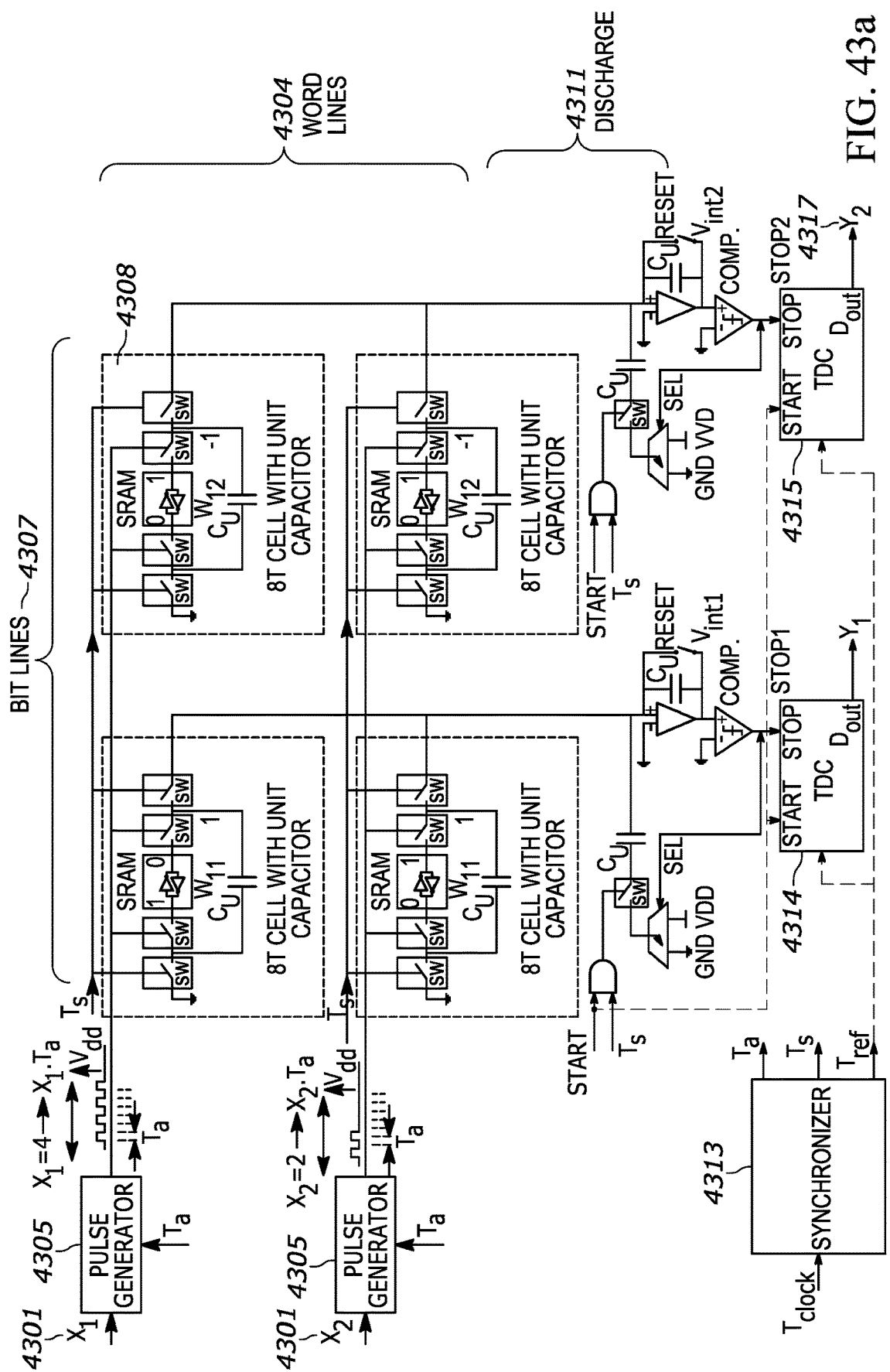
FIG. 43(a)-(b) illustrates a charge redistricting architecture.
Figure 43B:
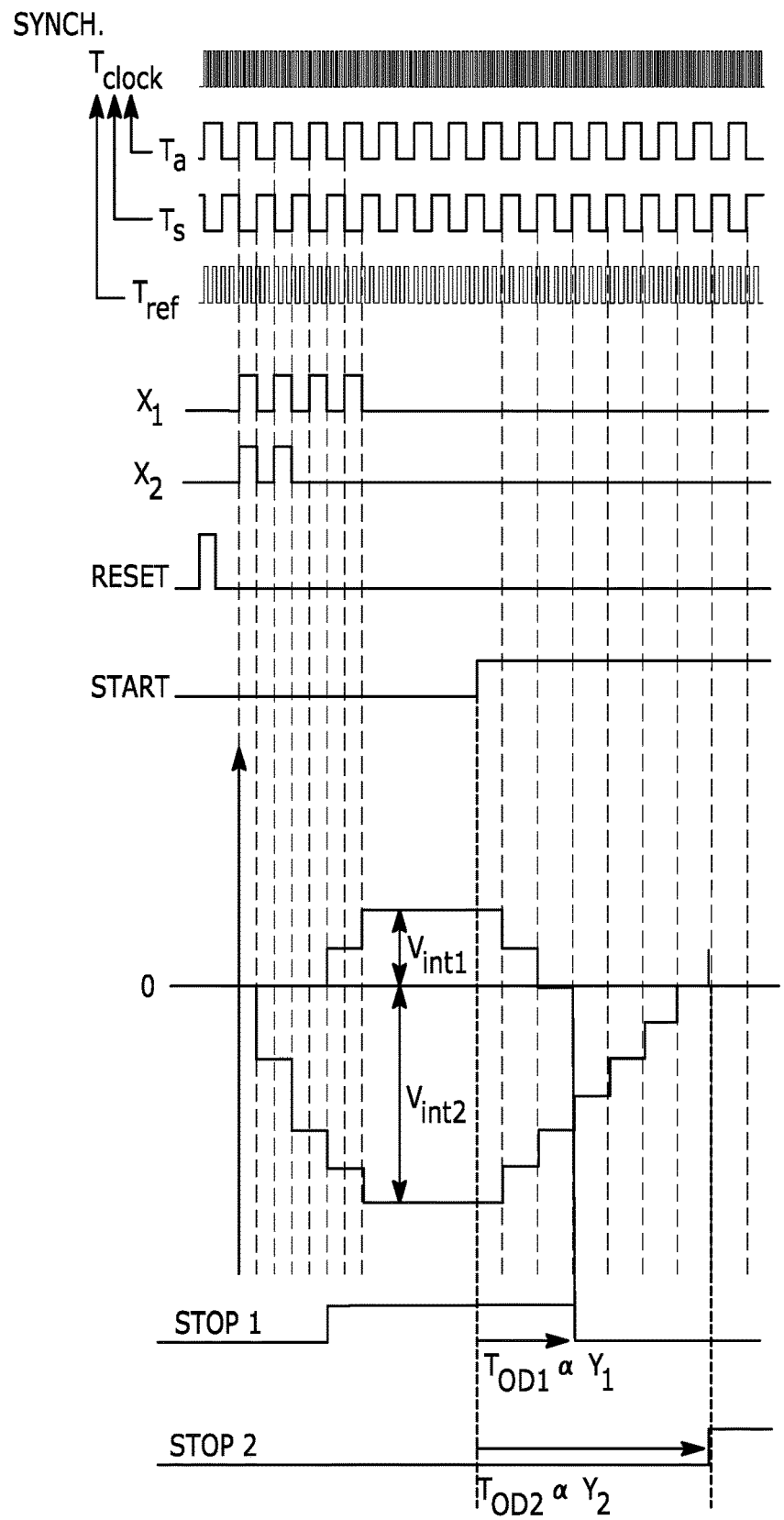

FIG. 43 illustrates a charge redistricting architecture. The charge redistribution architecture shown in FIG. 43(a) implements a multi-level input activation and multi-level output time-domain interface to an 8 transistor SRAM cell (8T cell) architecture. Here each 8T cell also includes a unit capacitance $C_U$ that depending on the programmed SRAM weight value of +1 or −1 will be charged between '$V_{dd}$' and 'GND' or between 'GND' and '$V_{dd}$'. The input activations are turned into a pulse train where the number of pulses is equal to the integer input activation $X_i$. Each pulse has a unit pulse-width extracted from a signal $T_a$ that is synchronous to the system clock $T_{clock}$. A sampling clock $T_S$ has the same period as $T_a$ but has opposite phase compared to $T_a$ (FIG. 43b). Each word line broadcasts the pulse trains for activations where it is received by the 8T cells at crossings with the bit lines. Within the 8T cell, switches operated by input activations sample a charge on $C_U$ at a polarity determined by the SRAM value. At the opposite phase (defined by $T_S$) the charge from all the $C_U$'s will be transferred to the integrator connected to the bit line (integrator starts from a reset zero phase). Once all input activation pulses are applied, the total charge integrated by the bit line integrator is:

$$Q_j = V_{dd} \cdot C_U \cdot \sum_{i=0}^{n-1} W_{ij} X_i \tag{61}$$

After this phase, the START signal is asserted (see FIG. 43(b)), when the TDC starts measuring time and at the same time it enables the discharge path through an AND gate connected to sample clock $T_S$ by switching a unit discharge capacitor $C_U$ to start draining the integrator. The discharge polarity is determined by the same comparator connected to the bit line integrator output and will be used to STOP the TDC when the integrator is drained. The discharge time $t_{OD,j}$ may be determined by the total charge removed until it reaches the initial reset state of zero and the effective resistance of the capacitor $C_U$ switched at rate $T_S$ ($T_S=T_a$):

$$t_{OD,j} = \left(\frac{Q_j}{V_{dd} \cdot C_U \cdot \frac{1}{T_a}}\right) = \left(\frac{V_{dd} \cdot C_U \cdot T_a \cdot \sum_{i=0}^{n-1} W_{ij} X_i}{V_{dd} \cdot C_U}\right) = T_a \cdot \sum_{i=0}^{n-1} W_{ij} X_i \tag{62}$$

Time $t_{OD,j}$ is measured with the TDC referenced to a reference clock $T_{ref}$ following the same synchronized ratio as described by Equation (57), the TDC's digital output count $Y_j$ can be determined by:

$$Y_j = \text{round}\left(\frac{r_{OD,j}}{T_{ref}}\right) = \text{round}\left(\frac{T_a \cdot \sum_{i=0}^{n-1} W_{ij} X_i}{T_{ref}}\right) = k \cdot \sum_{i=0}^{n-1} W_{ij} X_i \tag{63}$$

This shows the ratiometric dot product output calculation to be independent of all circuit parameters to the first order and only a function of the integer activations and weights. It should be noted that the bit lines can be implemented with fully differential switched capacitor circuits. Furthermore, the integration capacitance does not need to match the 8T cell capacitance as the integrator gain is irrelevant to the ratiometric dot product output. Only the discharge path's capacitor should be made as an integer ratio of the 8T cell capacitance and with the same type of capacitor. The value of this capacitance and the discharge clock frequency are also irrelevant to the dot product output for as long as the discharge clock (in the case of FIG. 43(a) sample clock $T_S$ was used) is synchronous to the master clock of the system.

Figure 44A:
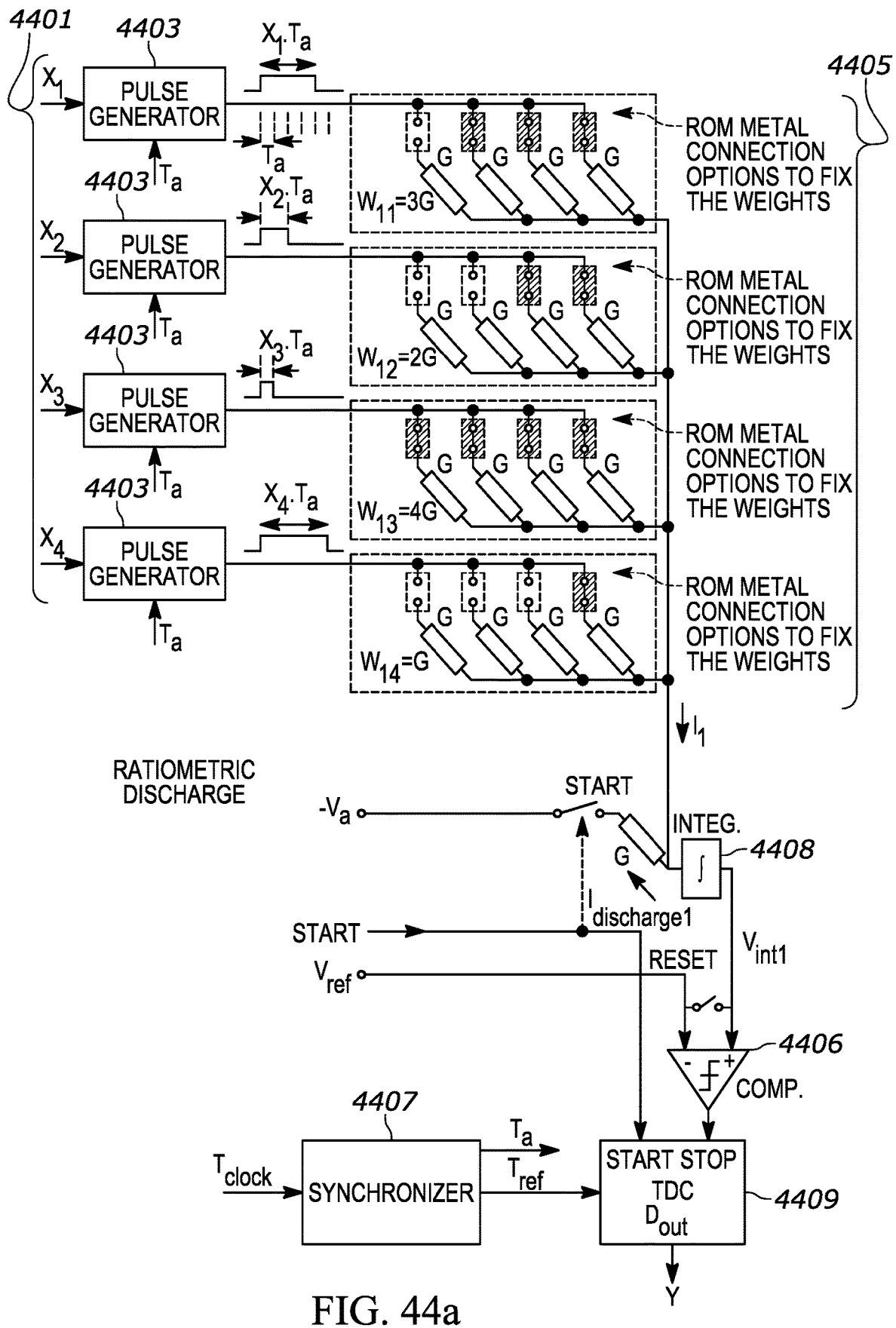
FIG. 44(a)-(b) illustrates a Read Only Memory (ROM) based examples for time-domain interface schemes applied to crossbar networks for in memory compute dot product calculations.
Figure 44B:
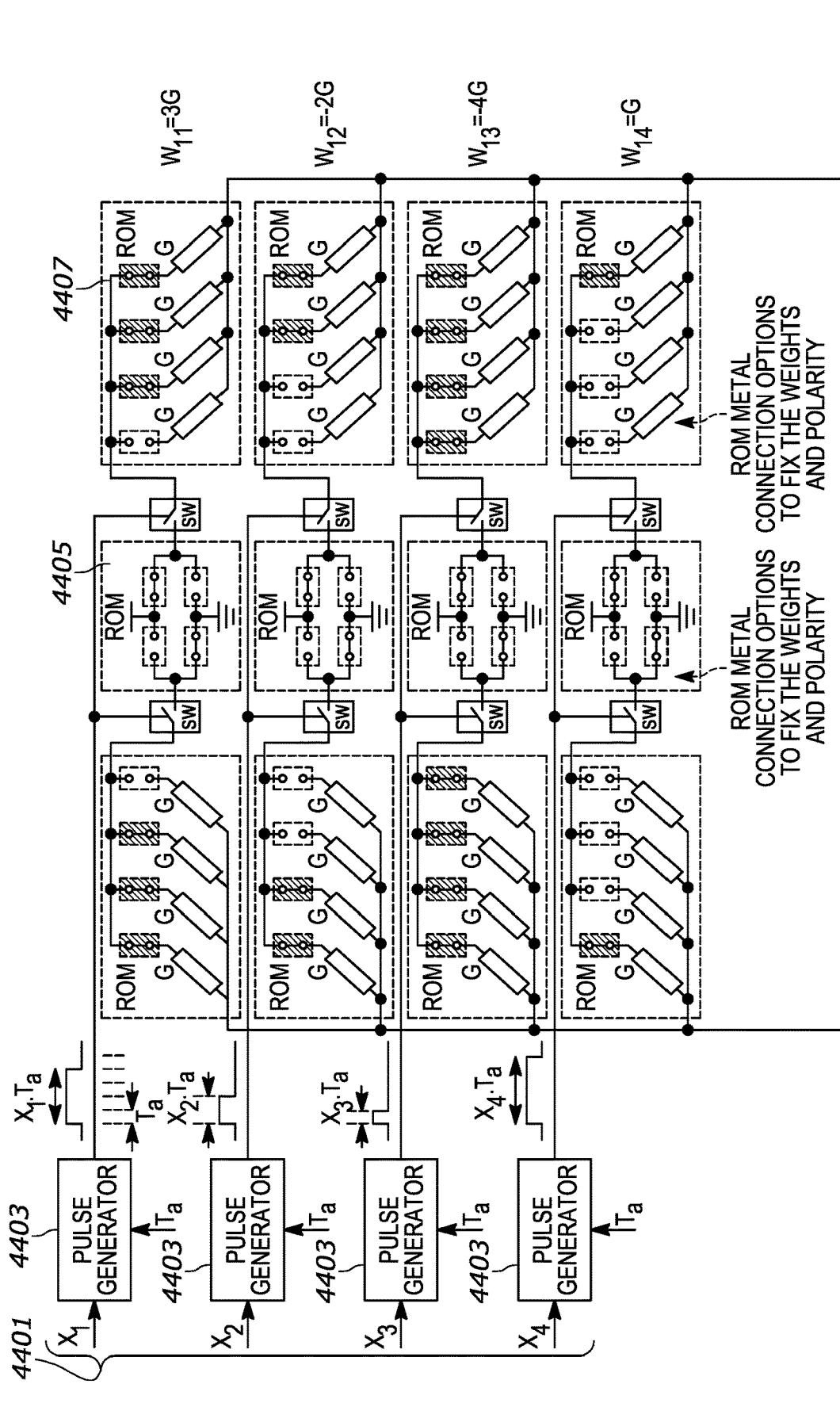
Figure 44B:
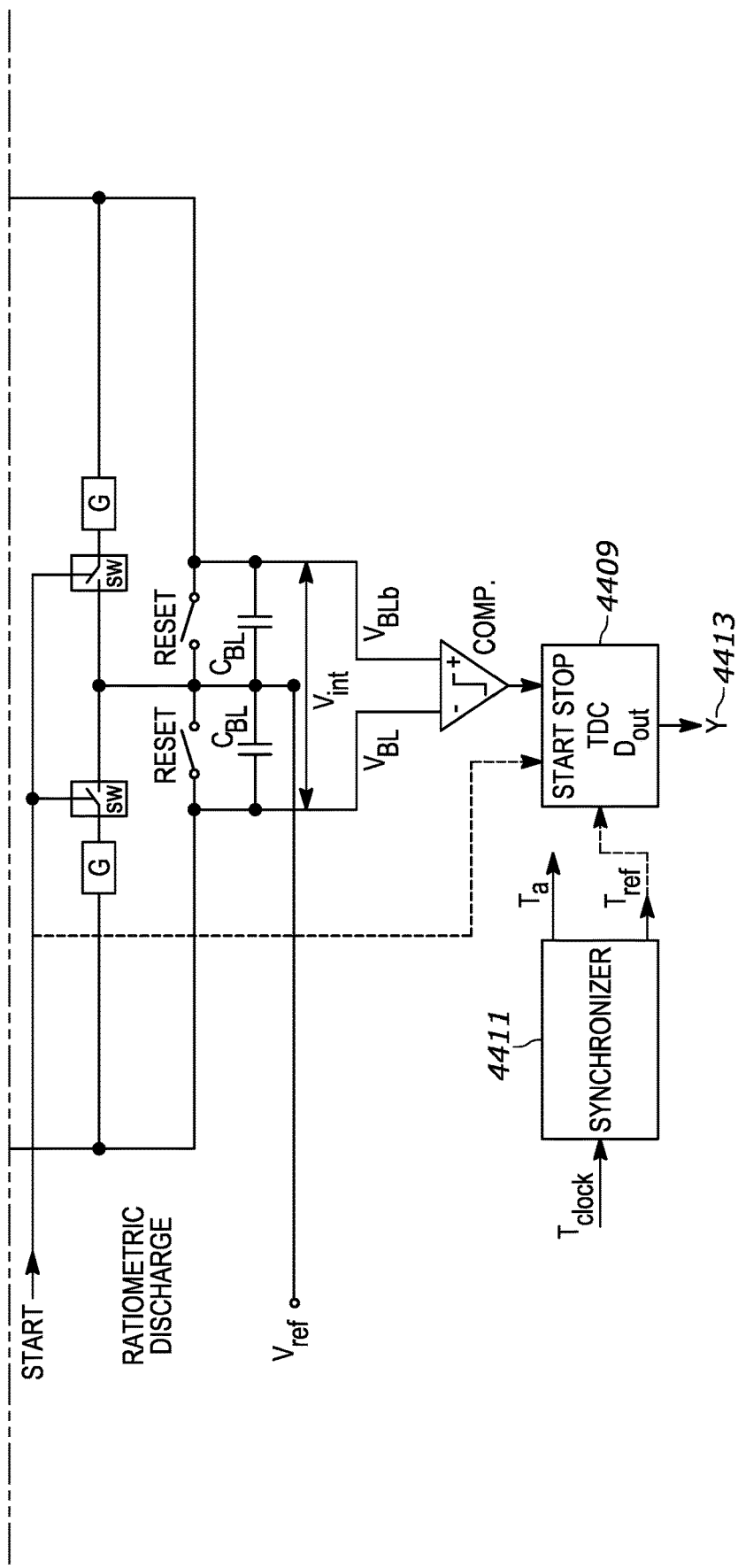
Figure 45A:
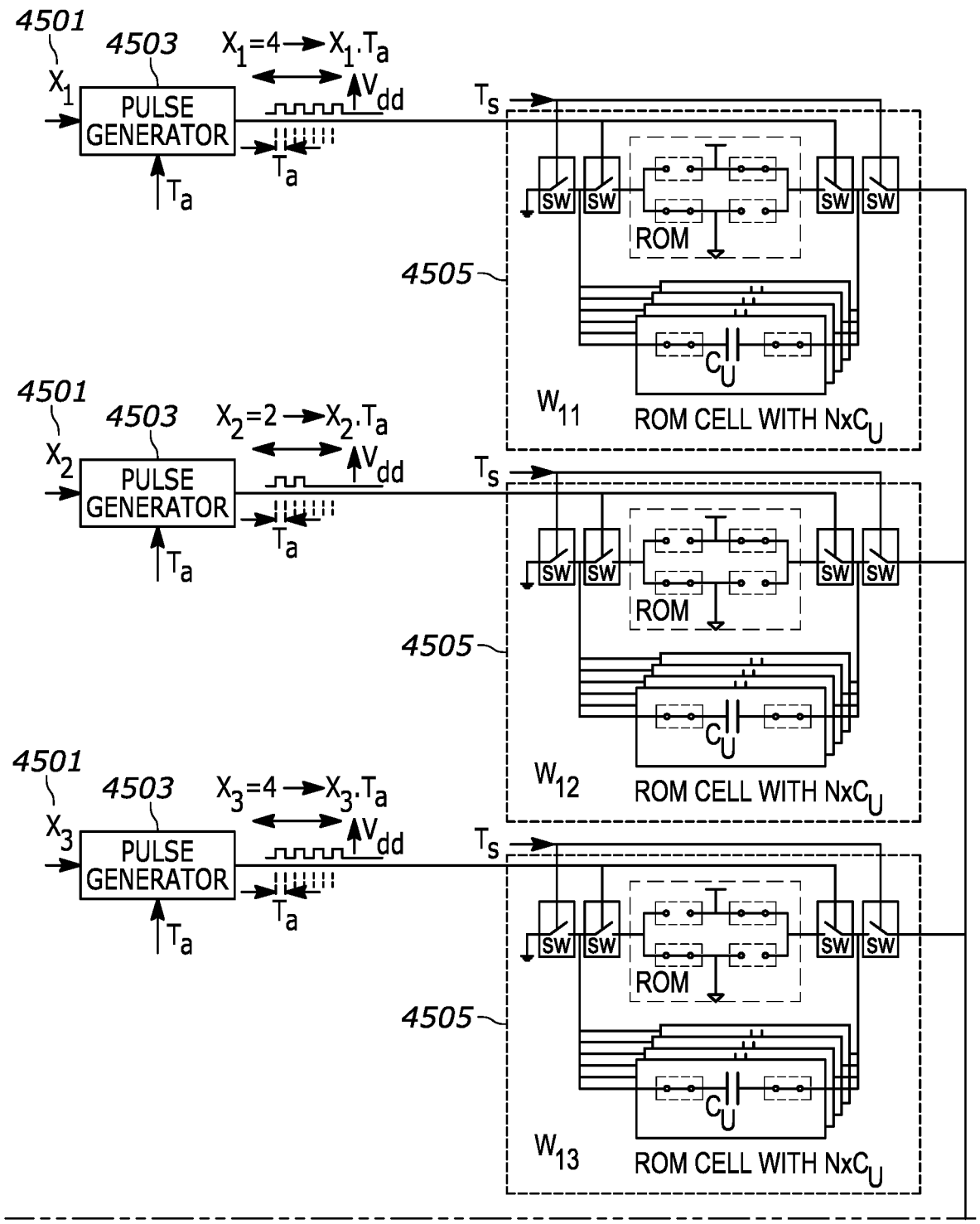
FIG. 45(a)-(b) illustrates a ROM based charge redistribution time-domain interface.
Figure 45A:
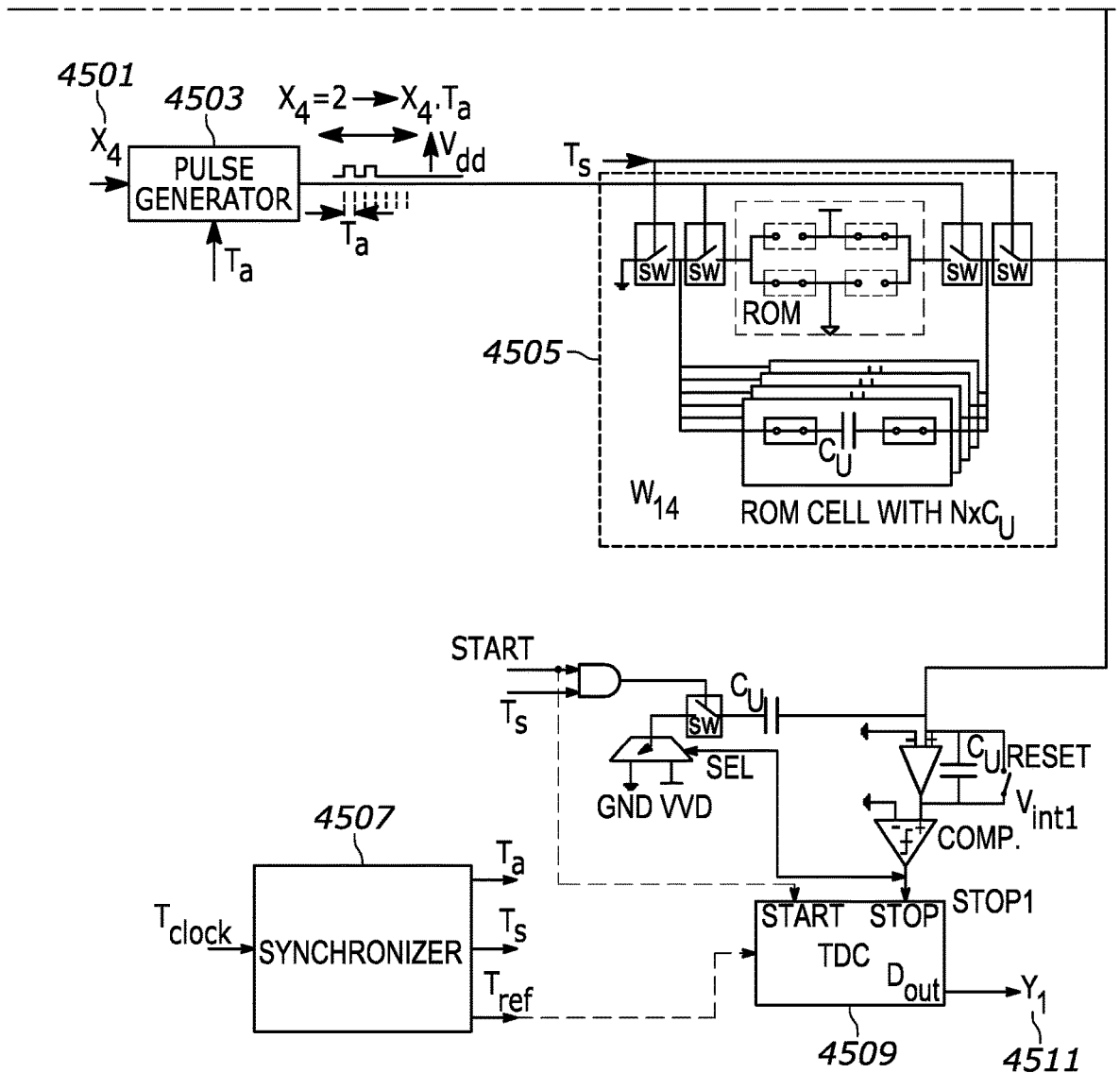
Figure 45B:
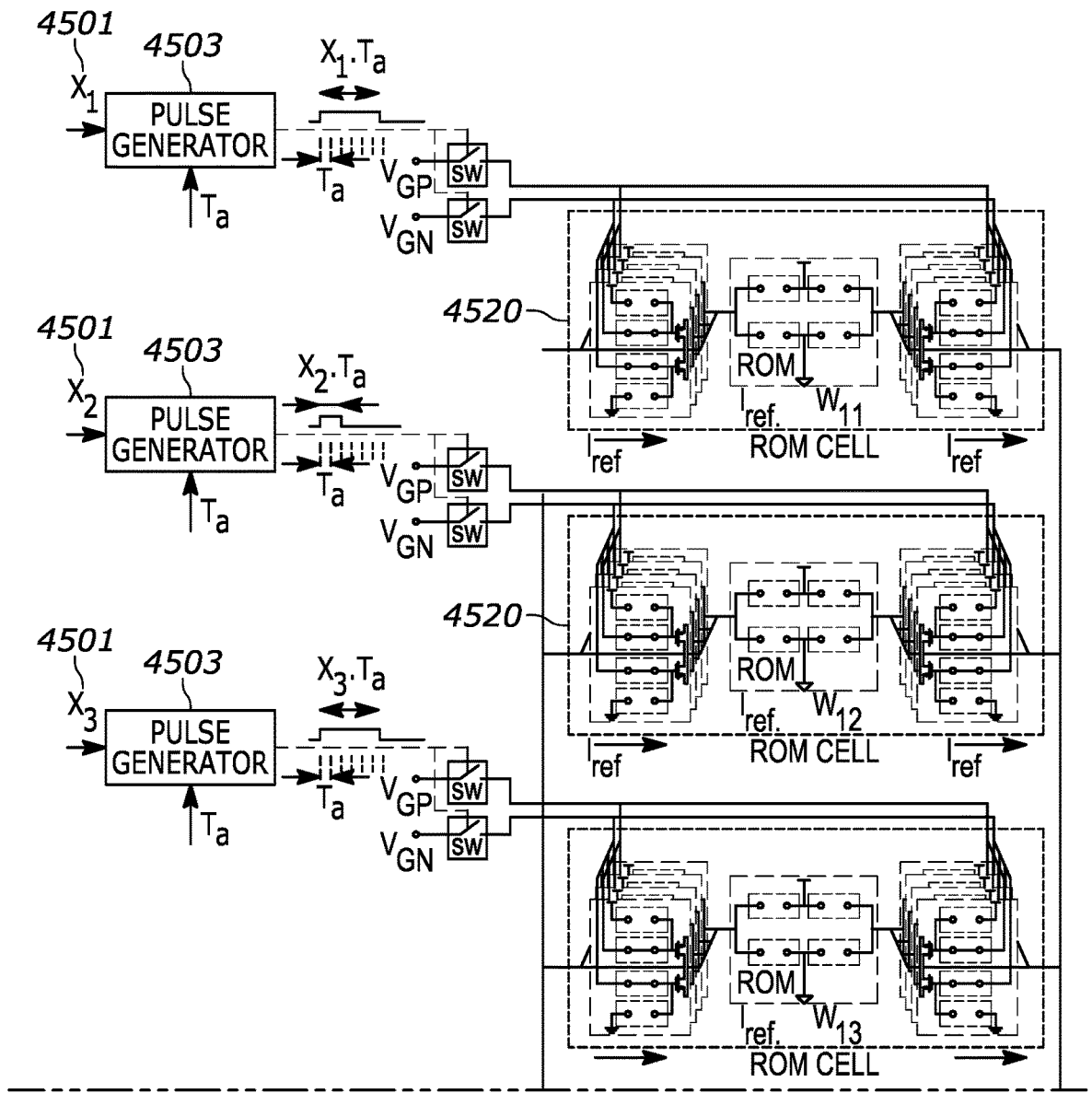
Figure 45B:
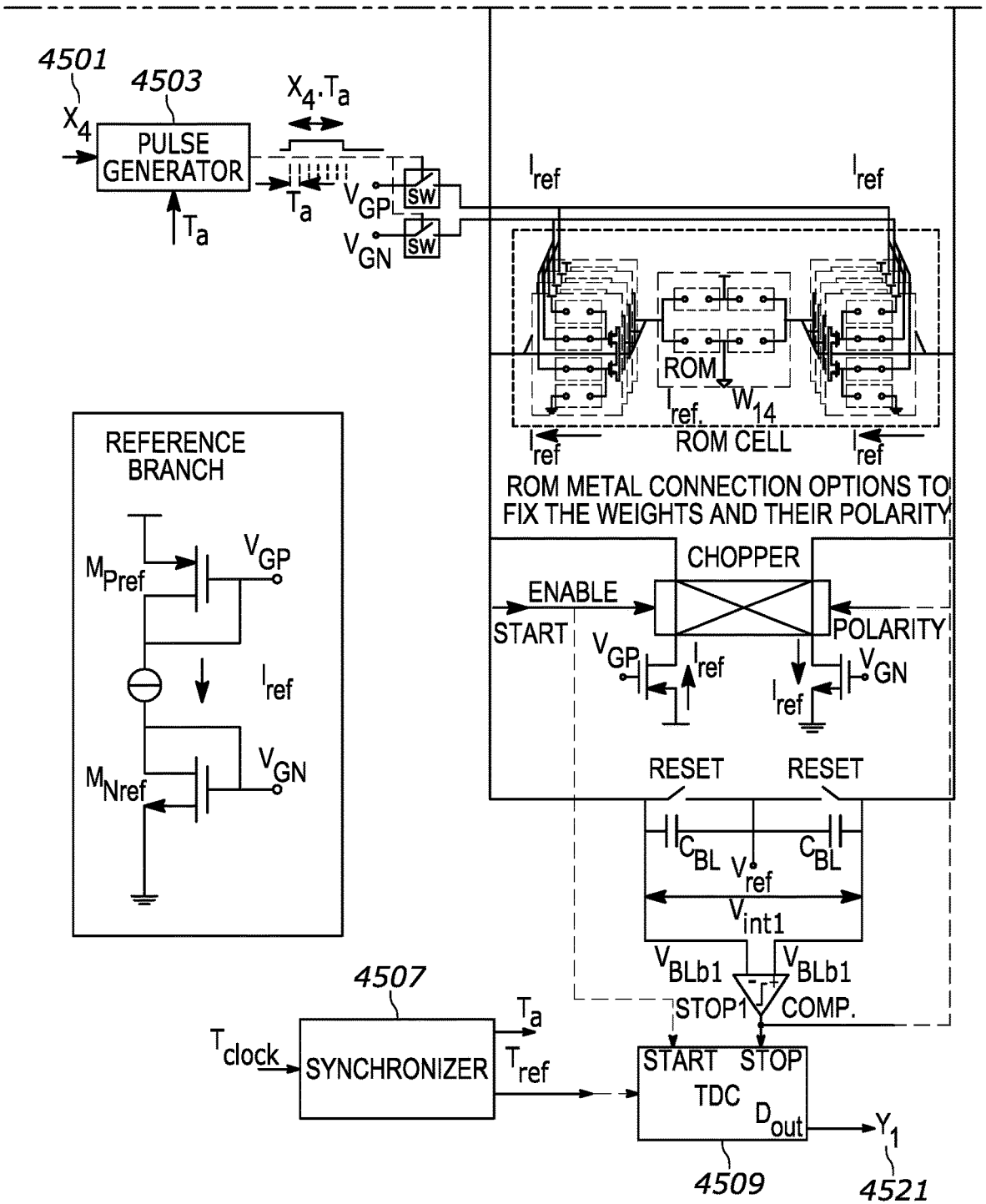

FIG. 44 illustrates a Read Only Memory (ROM) based examples for time-domain interface schemes applied to crossbar networks for in memory compute dot product calculations. The inputs 4401 may be received by the pulse generators 4403. In FIG. 44(a), an embodiment of a foundational architecture with ROM based programmable weights is shown. In FIG. 44(b), an embodiment of the differential bitline conductance based architecture with ROM based weight programming (magnitude and polarity). The time-domain dot product matrix multiply and add cross bar networks shown in other embodiments (such as FIGS. 40-43) can be considered for implementations where the weight values are hard wired as read only memory (ROM). This is suitable for applications where the network weights (or part of the network weights) are not expected to be changed after the hardware for in-memory-compute has been implemented. This technique will enable programming of weight polarity or even weigh values by having more unit circuit elements such as impedances (e.g., as shown in FIG. 44) or current sources and capacitors (e.g., as shown in FIG. 45 below) readily made and chosen to be connected at a later stage, for instance as a back end of line metal option or an NVM laser fuse option. The underlying hardware can still be modified for a different pattern of weight values 4405 for a different product. Various parts of the network can still be realized with SRAM memory cells as a hybrid of SRAM and ROM implementation to provide some programmability.

The embodiment of FIG. 44 alters the general baseline architecture of FIG. 40, as well as the differential structure of FIG. 41 (based on unit impedances), and thus have been converted to a ROM based time-domain crossbar network and shown in FIG. 44. For the sake of illustration a number of unit impedances G are pre-fabricated in the circuit per word line and bit line crossing and a metal option allows a desired number of them to be connected to the bit lines and so enables a scaling of the weight values. The polarity can also be changed by means of the middle section that determines which side of the bit line impedances should be connected to positive or negative voltages. The time-domain ratiometric operation of this structure remains unchanged compared to FIG. 40 and FIG. 41 and provides the exact same benefits.

FIG. 45 illustrates a ROM based time-domain interface. FIG. 45(a) illustrates an embodiment that is applied to charge redistribution-based crossbar network bit lines with programmable capacitance value and polarity. FIG. 45(b) illustrates a reference current source-based crossbar network with programmable current magnitude and polarity. A ROM based alternative to the structures of FIG. 42 and FIG. 43 is shown in FIG. 45. Here the charge redistribution network of FIG. 45(a) has programmable capacitance values per ROM cell by means of metal option that brings in desired number of prefabricated capacitors in parallel and connects them to the cell. Furthermore, another metal option located in the middle determines the weight polarity by determining the capacitor charge polarity. The architecture in FIG. 45(b) is a fully balanced current integration architecture based on FIG. 42 architecture, where prefabricated unit current sources can be connected to the bit lines by means of metal options as well as a polarity selection options. The ratiometric time-domain operation of the architectures in the embodiments of FIG. 45 remain similar to those of embodiments shown FIG. 42 and FIG. 43, with all the associated benefits. The ROM based architectures may provide the possibility of a certain level of weight programmability post manufacturing at the cost of increased hardware for the prefabricated elements. The architectures can be combined with SRAM based memories to implement parts of the network or weights as a hybrid of ROM and SRAM for partial programmability.

FIG. 46 illustrates an example of a floating gate flash or FeFET based crossbar network with time-domain ratiometric interface. The inputs 4601 may be received at a pulse width generator 4603. The neural network weights can be stored (programmed) on chip in the form of a non-volatile memory. This enables a reconfigurable hardware (in contrast to ROM based networks) that can be power cycled without the need to reprogram the network weights (in contrast to SRAM based networks). Furthermore, any multi-level weight storage capability allows increasing the network performance (in contrast to binary weights) as well as saving of chip area (in contrast to ROM and SRAM based approaches). One method to implement such in-memory-compute schemes is by employing floating gate flash memory architectures where the weights are stored in the threshold voltage of a transistor. Another approach is to utilize a Ferroelectric Field Effect Transistor (FeFET) where the magnetic polarization of a ferroelectric layer is added to a transistor's gate structure and provides a nonvolatile storage method. Crossbar in memory compute networks for calculation of matrix dot products can be realized utilizing such devices. The time-domain ratiometric activation and output evaluation techniques can be applied to these networks in order to provide the foundational benefits of ratiometric measurement, linearity, small footprint and scalable interface. The structure involving the floating gate transistor or the FeFET is treated the same as a 2 transistor (2T) cell with one transistor acting as an access switch and the other transistor as a programmable threshold voltage transistor implementing the weight of the neural network. The programmable threshold transistors can be used either as a variable resistor in triode region of operation or as a current source in subthreshold or saturation regions of operation. In more simplified implementations, a 1T-cell merges the selector switch at the word line 4607 level.

If programmable threshold transistors are used as a resistor, then the transistor's channel conductance $G_{ij}$ is determined by:

$$G_{ij}=\beta(V_{gs}\cdot V_{TH,ij}) \qquad (64)$$

Where $V_{gs}$ is the transistor gate-source voltage, $\beta$ is the transistor parameter proportional to the aspect ratio of its dimensions (width/length), charge carrier mobility, etc. and $V_{TH,ij}$ is the programmed threshold voltage through the floating or magnetic gate, which eventually controls the weight conductance $G_{ij}$. In order to arrange the weight conductance to have an integer ratio of m, i.e. to have values of: G, 2G, 3G, 4G, etc. the programmed threshold voltages must fulfil a relationship with the baseline threshold voltage $V_{TH,b}$ that results in the smallest unit weight conductance G. In other words, for a transistor to provide a conductance of m×G (with m=1, 2, 3, 4, . . . ), its threshold voltage $V_{TH,m}$ compared to the baseline transistor should fulfill a relationship:

$$\beta(V_{gs}-V_{TH,m})=m\cdot G=m\cdot\beta(V_{gs}-V_{TH,b}) \qquad (65)$$

Which results in:

$$V_{TH,m}=m\cdot V_{TH,b}+(1-m)\cdot V_{gs} \qquad (66)$$

The design space for obtaining linear ratio conductance using equation (63) is limited to perhaps 3 or 4 conductance levels as the boundaries for the smallest possible $V_{gs}$ and the possible programmed threshold voltages are limited (by supply voltages and transistor characteristics). In other words, due to the nature of Equation 66, obtaining larger conductances results in negative threshold voltage levels for the same type of transistor that might not be feasible (FIG. 47 top). Within the design space and following equation (66), the integer ratios between channel conductance can be achieved to a first order (for a limited number of levels) and using the same aspect ratio for the transistors. With this consideration, a ratiometric time-domain interface can be applied to a crossbar network adopting floating gate flash or FeFET transistors.

FIG. 46 illustrates a floating gate flash or FeFET based crossbar networks with time-domain ratiometric interface. FIG. 46(a) shows a 2T-cell based network 4620 based on transistor channel conductance (triode operation). FIG. 46(b) illustrates a 2T-cell based network based on current sources (sub-threshold or saturation). FIG. 46(c) illustrates a 1T-cell based network with merged word-line switch based on transistor channel conductance (triode operation). FIG. 46(d) illustrates a 1T-cell based network with merged word-line switch based on current sources (sub-threshold or saturation). The baseline conductance G can be used in order to form the discharge path. This is shown in in FIG. 46(a). The activations are applied as pulse width modulated signals. The operation of this network resembles that of FIG. 40(a) and its output determined by equations (54) to (58). It should be noted that the channel conductance is modulated by the transistor's drain-source voltage Vas and therefore it is better that the bit lines are held at a controlled DC voltage, i.e. by adopting the active integrator providing a regulated DC voltage at the summation node rather than a passive integrator. An alternative to network of FIG. 46(a) is shown in FIG. 46(c) where a 1T-cell transistor is used and the selector switched is merged at the word line.

If programmable threshold transistors are used as current sources, then the transistor's channel current follows the square law if operated in saturation:

$$I_{ij} = 0.5\beta(V_{gs} - V_{TH,ij})^2 \quad (67)$$

If the transistor is operated in sub-threshold, it follows an exponential relationship:

$$I_{ij} = I_s e^{\frac{(V_{gs} - V_{TH,ij})}{nV_T}} \propto e^{\frac{-V_{TH,ij}}{nV_T}} \quad (68)$$

Where $I_S$ is a saturation current, n a transistor parameter in sub-threshold and $V_T$ is the thermal voltage (25 mV at room temperature). For linear weight ratio's implemented by $I_{ij}$, i.e. in order to get the channel current of the transistor to have an integer ratio with respect to a unit transistor with baseline threshold voltage $V_{TH,b}$, i.e. $I_m = m \times I_{ref}$, once more the $V_{TH,m}$ should be arranged to have the following relationships:

For the saturation operation:

$$V_{TH,m} = \sqrt{m} \cdot V_{TH,b} + (1 - \sqrt{m}) \cdot V_{gs} \quad (69)$$

For the sub-threshold operation:

$$V_{TH,m} = V_{TH,b} - nV_T \ln(m) \quad (70)$$

Figure 46A:
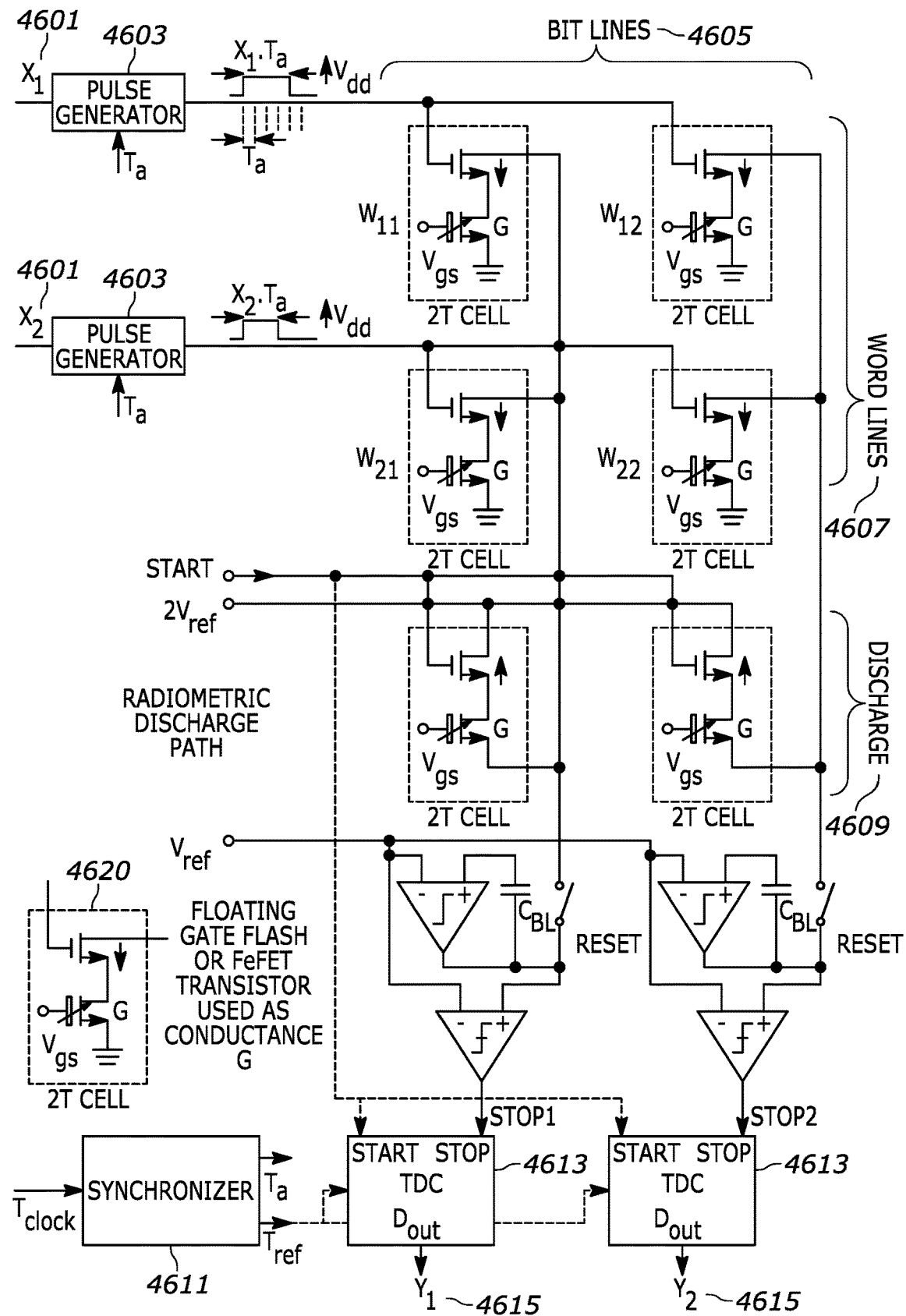
FIG. 46(a)-(d) illustrates an example of a floating gate flash or FeFET based crossbar network with time-domain ratiometric interface.
Figure 46B:
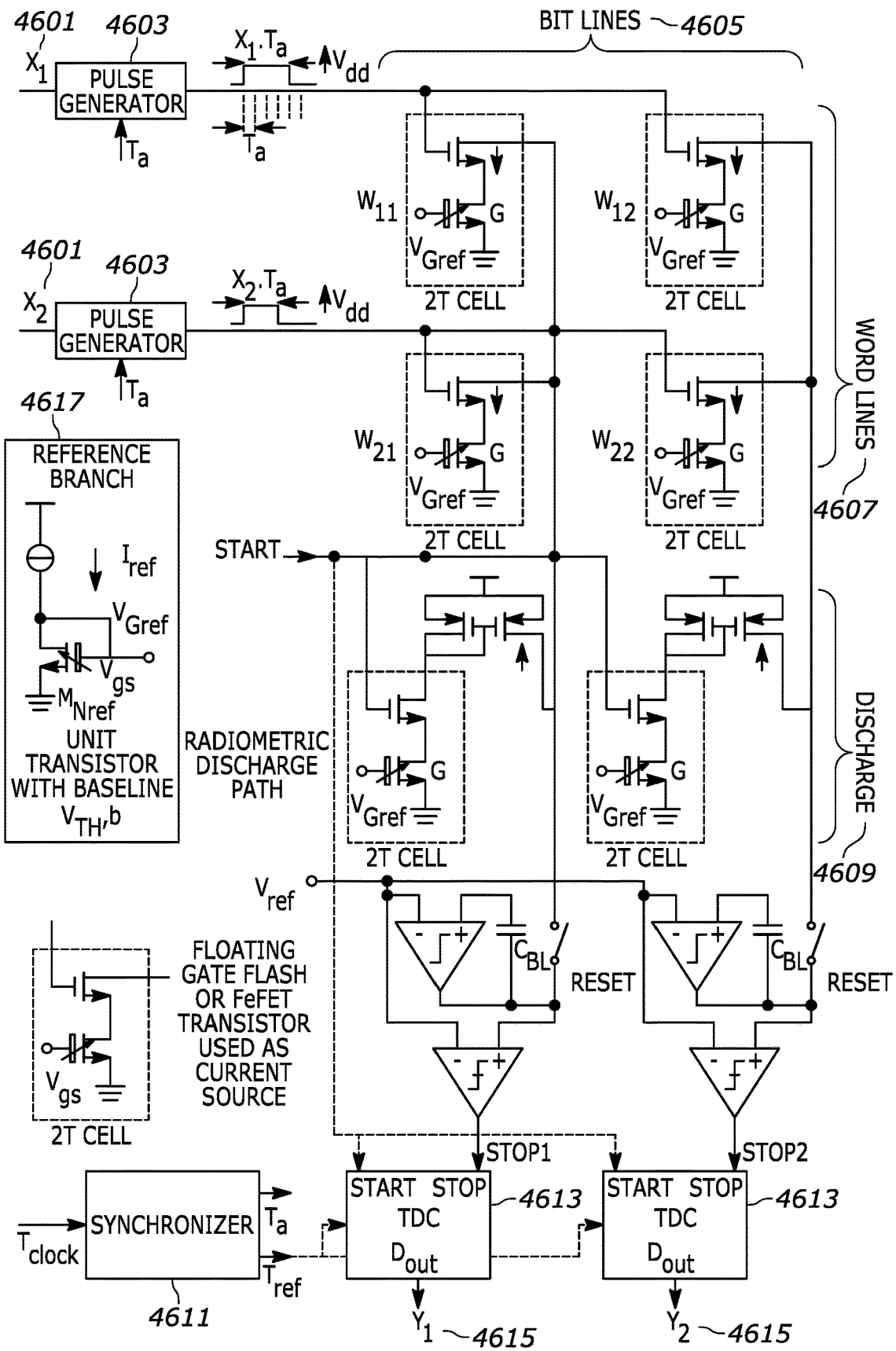
Figure 46C:
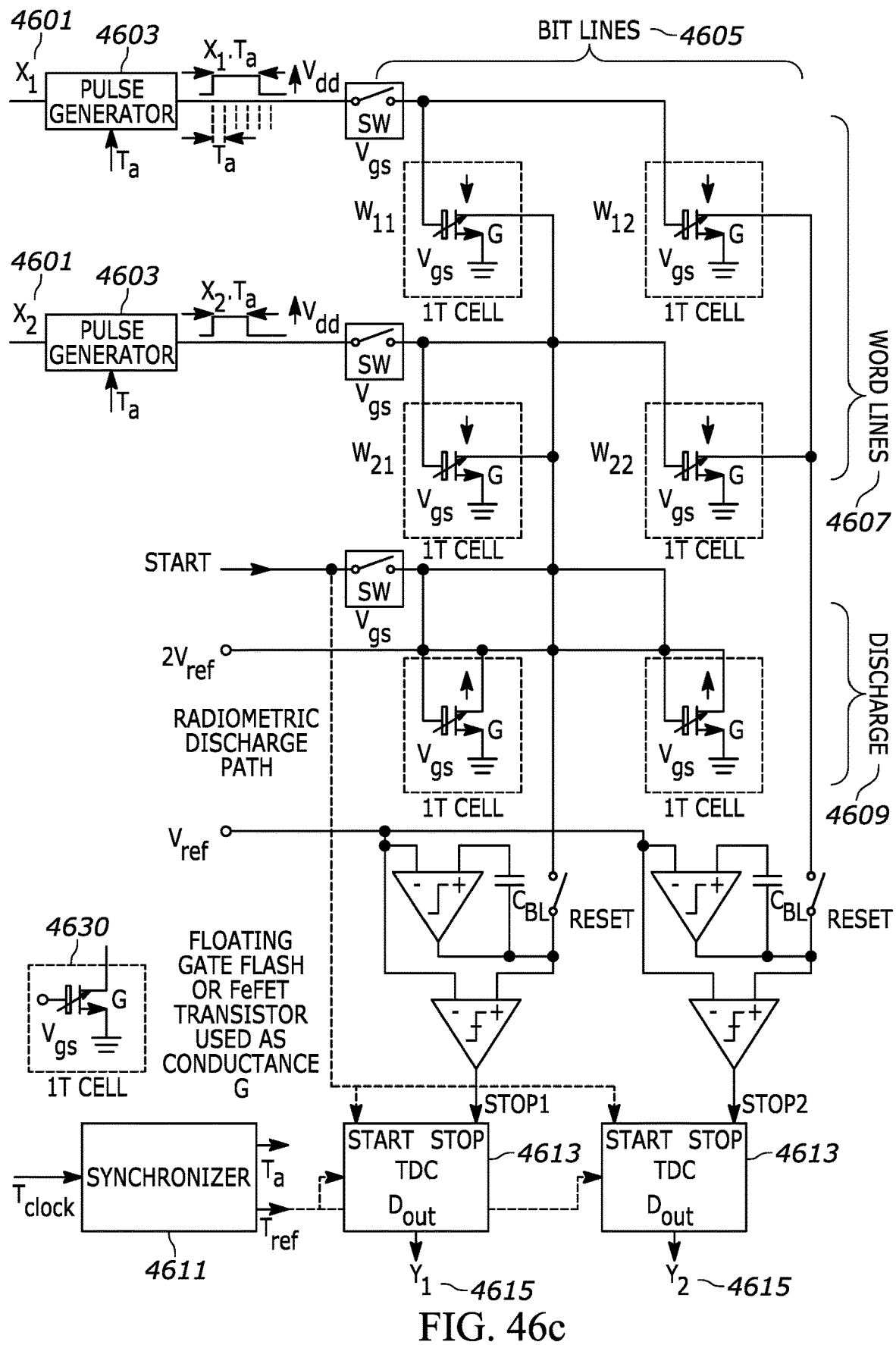
Figure 46D:
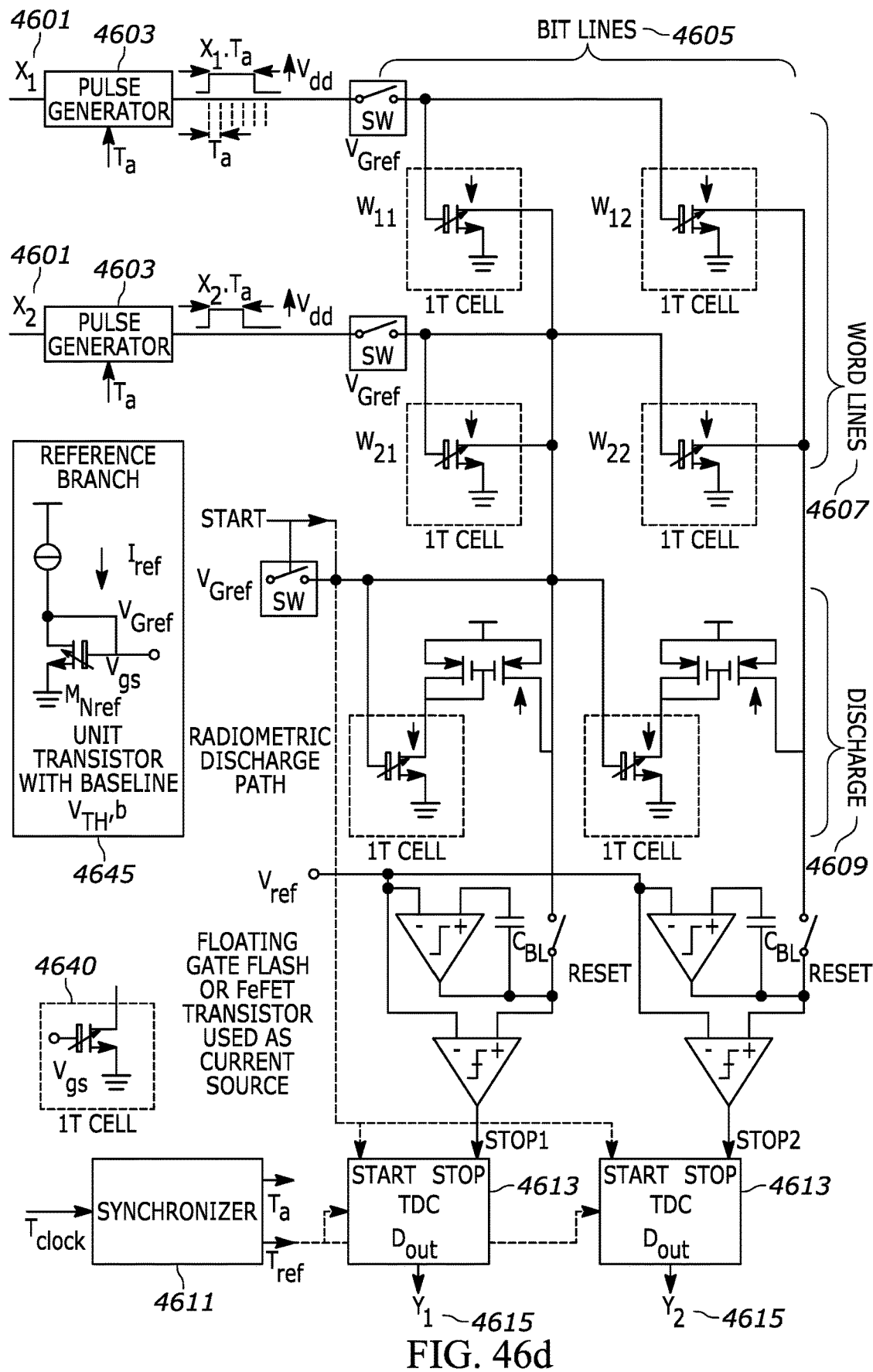

Once more, the limitations of supply and min and max programmable threshold values sets a limit on the possible number of levels realizable to get integer ratio between weights. The programmable threshold transistors can be arranged as current sources in a crossbar network implementing the network weights as shown in FIG. 46(b) including a ratiometric time-domain readout with a discharge path utilized with a unit current source. The operation of this network resembles that of FIG. 40(c) and its ratiometric matrix dot product output is derived by equation (58). An alternative to network of FIG. 46(b) is shown in FIG. 12d where a 1T-cell transistor is used and the selector switched is merged at the word line.

It should be noted that for the implementation of a larger number of weight levels with the time-domain ratiometric operation scheme, the current source-based architectures of the floating gate flash or FeFET enable larger number of levels than the networks implementing weights by means of channel conductance (although negative threshold voltages can be implemented, however, generating the linear levels means application of near zero or negative gate-source voltages, which might be less practical). Current-source implementations enable more integer ratioed levels with positive threshold voltages mainly because of their exponential nature of the current source implementation (in contrast to the linear dependence of the channel conductance to the programmed threshold voltages). This is illustrated in FIG. 47 that illustrates the threshold voltage ranges for an integer number of levels implementing conductance and current sources (in saturation region and subthreshold region). This is not an issue if binary weights are implemented in which case the unit floating gate or FeFET transistors will operate in a binary (ON/OFF) manner. In that case the time-domain networks of FIG. 46(a) and FIG. 46(b) operate the same and have the same ratiometric operation benefits.

FIG. 47 illustrates the range of $V_{TH,ij}$ to implement linearly scaled weights of a crossbar network utilizing channel conductances (top) or current sources in saturation (mid) or sub-threshold (bottom).

Resistive memories (memristors) such as RRAM or Phase Change Memory (PCM), etc. provide an area efficient way to implement neural network weights by utilizing memory elements for the purpose of in memory compute. Implementing crossbar networks that calculate matrix dot products using memristors can be combined with the proposed time-domain ratiometric interface to maximize area and energy efficiency as well as provide a scalable interface that to first order is independent of the process, temperature and voltage variations of the circuit elements. Several embodiments may be utilized for the architecture.

In a first embodiment, the embodiment may be based on the foundational architecture shown in FIG. 40, and is realized by replacing the weight conductance $G \cdot W_{ij}$ with programmable memristor elements implementing those conductance values and using the baseline memristor conductance G to implement a discharge path that enables the ratiometric charge and discharge operations. The time-domain evaluation of the discharge time, with the conditions on matching weight and discharge path elements as well as synchronized time references, results in a dot product that to a first order is a function of the integer input and weight scaling values. Equation (58) represents the output and the integration function can be implemented by means of active (integrator with an amplifier) or passive (bit line capacitance) integration.

Figure 48A:
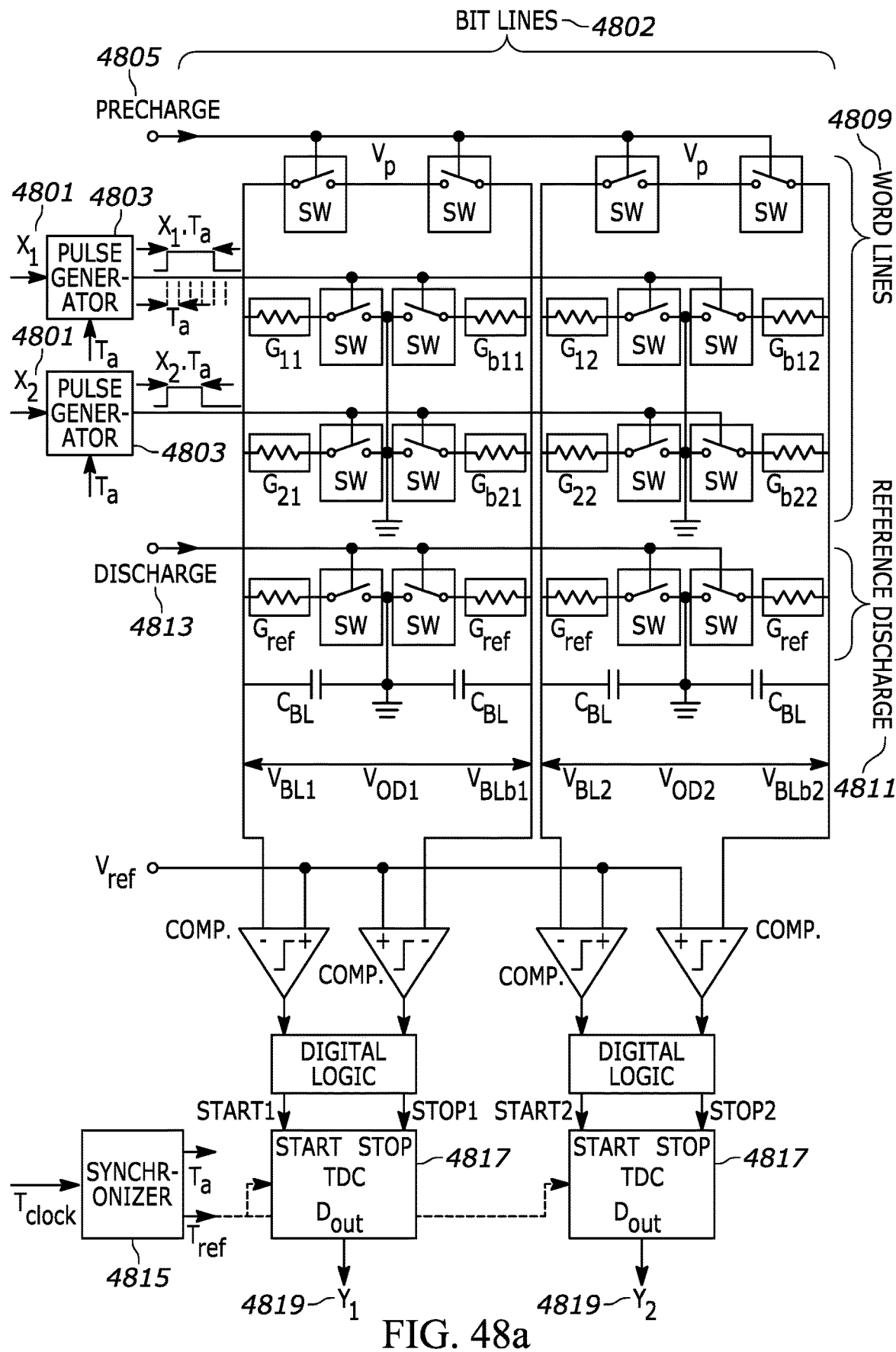
FIG. 48(a)-(b) illustrates a two-phase passive discharge utilizing a bit line capacitance and memristor conductance.

FIG. 48 illustrates a two-phase passive discharge utilizing a bit line capacitance and memristor conductance. Assuming the availability of a sign comparator with sufficient input common-mode voltage rejection capability, this approach is slightly different from other embodiments in terms of how the ratiometric time measurement is performed. Illustrated in FIG. 48a, this approach may utilize a two-phase passive discharge using the bit line capacitances $C_{BL}$ and memristor conductance that are arranged differentially around a baseline conductance $G_0$ by means of bipolar integer weights±$W_{ij}$ that scale a unit conductance $G_u$ (conductance characteristic shown in FIG. 38(b):

$$G_{ij}=G_0+W_{ij} \cdot G_u \ \& \ Gb_{ij}=G_0-W_{ij} \cdot G_u \tag{71}$$

Figure 48B:
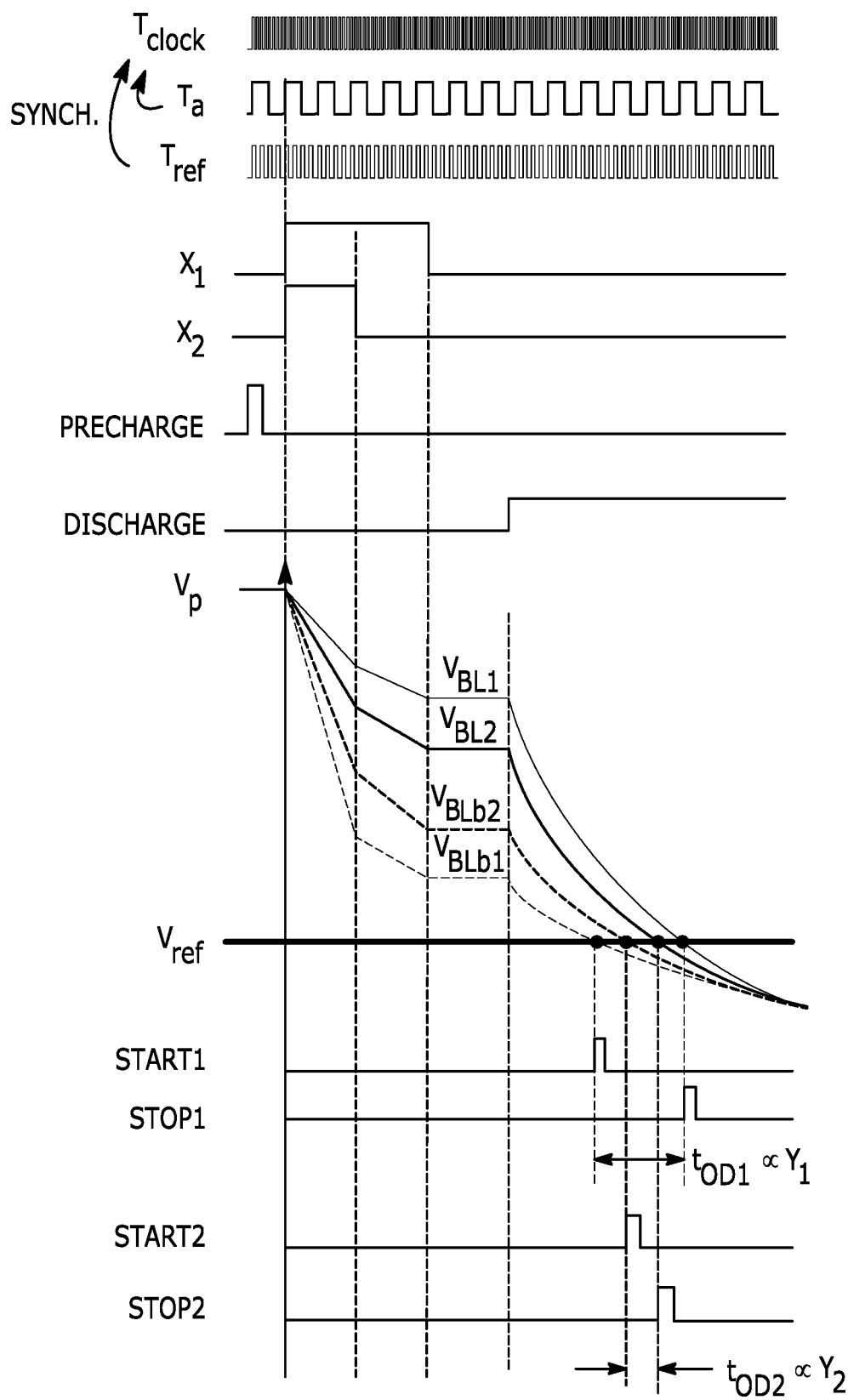

The differential bit-line voltages denoted by $V_{BLj}$ and $V_{BLbj}$, each connected to a capacitance $C_{BL}$, have discharge paths to ground. The pulse width modulators 4803 control the word lines 4809 which are attached to the memristor switches. These provide a discharge phase 4813 of the bit lines 4802 towards ground governed by weighted memristors and the activation pulse widths. A second discharge path is controlled by a reference conductance and provides ratiometric time measurement. Two analog comparators connected to the two terminals of each differential bit line compare the bit-line voltages $V_{BLj}$ and $V_{BLbj}$ to a threshold voltage $V_{ref}$ (comparators could also be shared among bit lines at the cost of throughput). The operation of the time-domain readout scheme is shown in FIG. 48(b). The bit-lines start from a pre-charge state to a pre-charge voltage, VP. Then the pulse-width modulated activation signals (scaled by activation inputs $X_i$ and synchronous to a time reference $T_a$) are applied. The activations drive switches that discharge the bit line capacitors through the weight conductance for the duration determined by the activation. Once all activations are applied (as shown in FIG. 48(b)), the superposition of the exponential discharge times through the weighted time constants results in a total differential voltage VOD across the bit lines, i.e. $V_{OD,j}=V_{BLj}-V_{BLbj}$:

$$V_{BLj} - V_{BLbj} = V_P \exp\left(-1 \cdot \sum_{i=0}^{n-1} \frac{G_0 - W_{ij} \cdot G_u}{C_{BL}} \cdot T_a \cdot X_i\right) - V_P \exp\left(-1 \cdot \sum_{i=0}^{n-1} \frac{G_0 + W_{ij} \cdot G_u}{C_{BL}} \cdot T_a \cdot X_i\right) \tag{72}$$

In the second phase, the bit-lines are discharged through the reference conductance branches with conductance $G_{ref}$ and enabled by the discharge switches controlled by a 'Discharge' signal. During this phase, each bit-line voltage eventually crosses the threshold level, $V_{ref}$, at which time the corresponding comparator creates a logic signal. A logic block receives both comparator outputs and produces START and STOP signals (START is generated when the first comparator triggers and STOP when the second comparator triggers). These signals are fed to the bit line's time-to-digital converter (TDC) 4819 that measures the time $t_{OD,j}$ between START and STOP events. The $t_{OD,j}$ time, is the difference between the time it takes for each bit-line to discharge from their state after the application of the activations to the comparator threshold voltage $V_{ref}$ (see FIG. 48(b)), denoted by $t_{dis,Pj}$ and $t_{dis,Mj}$ and can be derived as:

$$t_{dis,Pj} = \frac{C_{BL}}{G_{ref}} \cdot \ln\left(\frac{V_P}{V_{ref}}\right) + \frac{G_0}{G_{ref}} \cdot T_a \sum_{i=0}^{n-1} X_i - \frac{G_u}{G_{ref}} \cdot T_a \cdot \sum_{i=0}^{n-1} W_{ij} X_i \tag{73}$$

$$t_{dis,Mj} = \frac{C_{BL}}{G_{ref}} \cdot \ln\left(\frac{V_P}{V_{ref}}\right) + \frac{G_0}{G_{ref}} \cdot T_a \cdot \sum_{i=0}^{n-1} X_i - \frac{G_u}{G_{ref}} \cdot T_a \cdot \sum_{i=0}^{n-1} W_{ij} X_i \tag{74}$$

$$t_{OD,j} = t_{dis,Mj} - t_{dis,Pj} = \frac{2G_u}{G_{ref}} \cdot T_a \cdot \sum_{i=0}^{n-1} W_{ij} X_i \tag{75}$$

By choosing $G_{ref}$ to be an integer multiple of Gur, i.e. $G_{ref}=M \cdot G_u$, the time-domain measurement of $t_{OD,j}$ is ratiometric in terms of conductance:

$$t_{OD} = \frac{2T_a}{M} \sum_{j=0}^{n-1} W_{ij} X_j \tag{76}$$

The function of a time-to-digital converter can be simplified to that of a counter that counts to N, which is the number of periods of a reference clock with period $T_{ref}$ that fit into the time duration $t_{OD,j}$:

$$Y_j = N = \text{round}\left(\frac{t_{OD}}{T_{ref}}\right) = \text{round}\left(\frac{2T_a}{M \cdot T_{ref}} \sum_{j=0}^{n-1} W_{ij} X_j\right) \tag{77}$$

Synchronizing 4815 the time unit $T_a$ of the pulse-width modulated activations to the TDC's time reference $T_{ref}$ as described by equation (57), the quantization function (round (x)) is no longer required and the digitized integer N output of the TDC can be re-written as:

$$Y_j = \frac{2 \cdot k}{M} \sum_{j=0}^{n-1} W_{ij} X_j \tag{78}$$

Which shows the proposed scheme implementing a linear and ratiometric evaluation of the matrix dot product output.

Figure 49A:
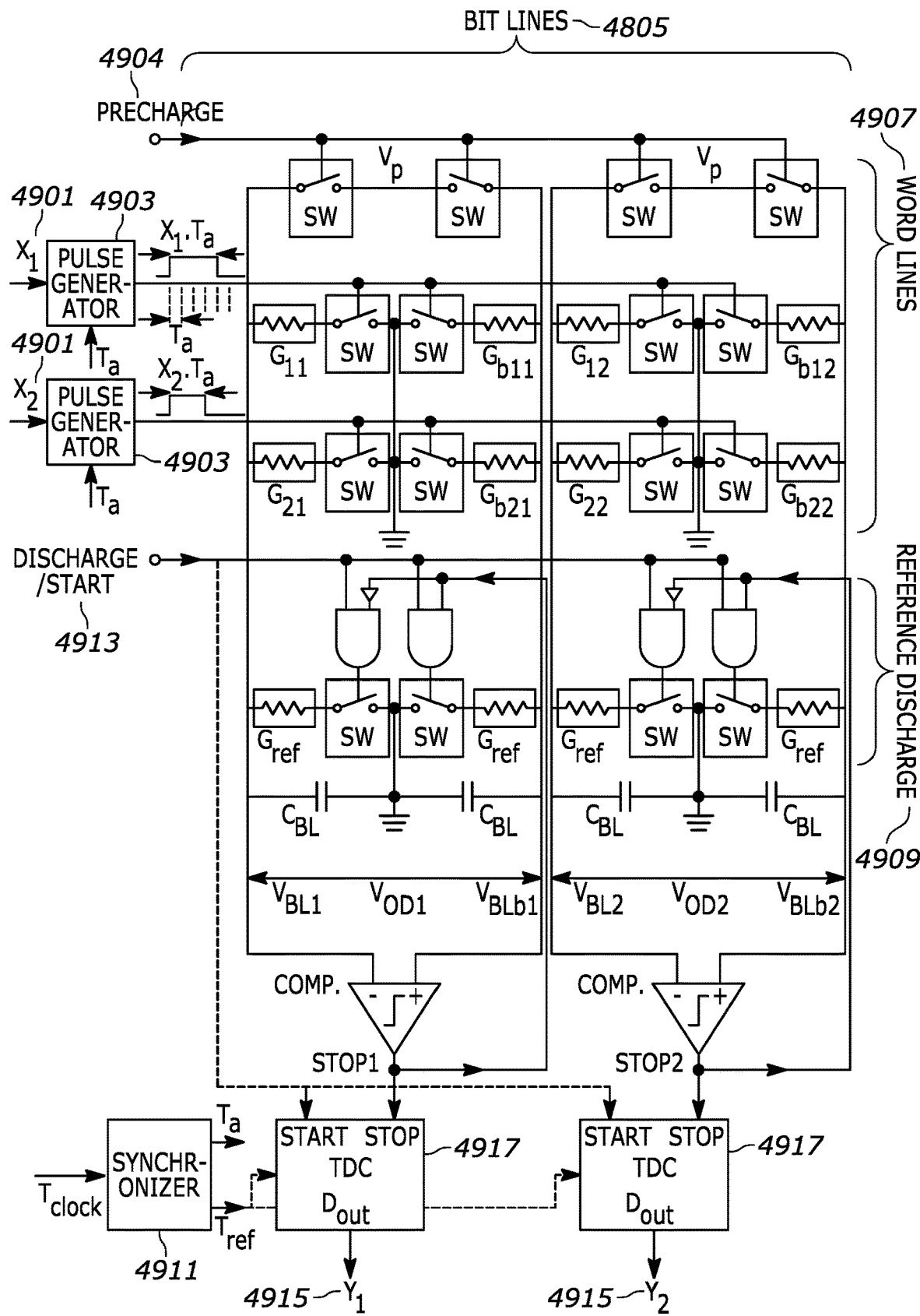
FIG. 49(a)-(b) illustrates a memristor based passive discharge method with ratiometric time-domain dot product output evaluation using one comparator.
Figure 49B:
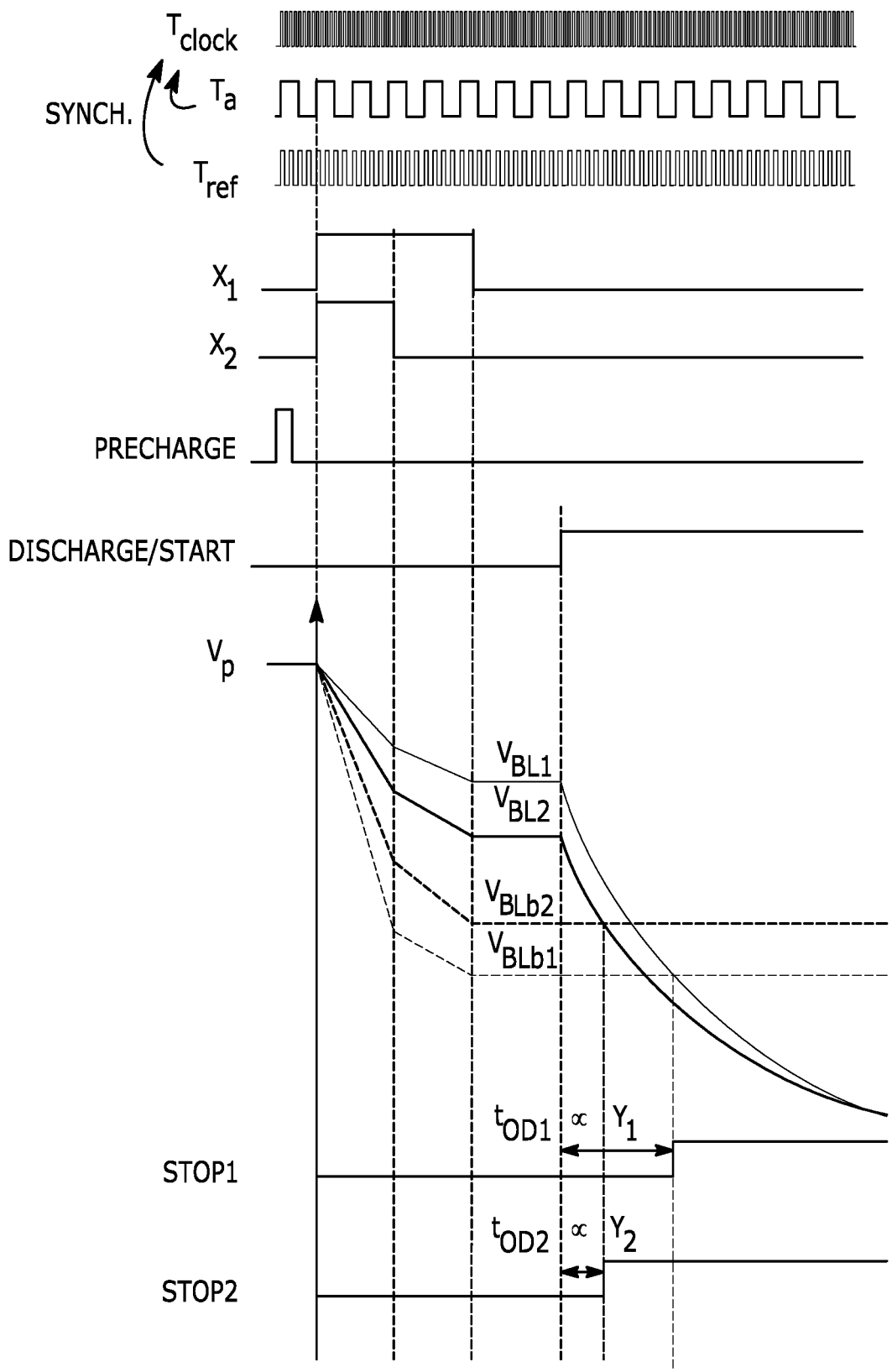

FIG. 49 illustrates a memristor based passive discharge method with ratiometric time-domain dot product output evaluation using one comparator. In FIG. 49(a), the illustration shows crossbar network and the conductance. In FIG. 49(b) illustrates a time-domain operation waveforms. An alternative to the operation of the network shown in FIG. 48(a) is the implementation shown in FIG. 49(a). Here, a single comparator block (rather than two) can be used twice and the reference voltage $V_{ref}$ can be eliminated. After the application of the pulse-width modulated activation inputs to the word-lines and the completion of the weighted discharge of the bit-line capacitances, the comparator determines which one of the bit line voltages, $V_{BLj}$ or $V_{BLbj}$ is the larger of the two. The comparator output signal then determines the bit-line with the larger voltage to be discharged through the reference discharge path while the charge on the other bitline's capacitor (with smaller voltage) remains unchanged (see FIG. 49(b)). This is simply applied to the reference path discharge control switches by means of an AND and a NOT logical gates shown in FIG. 49(a). The reference path discharge starts when the control signal 'Discharge/START' is asserted, which discharges the bit line with largest voltage and starts the TDC time measurement. When the sign of the comparator input changes, for example, the discharging bit-line terminal's voltage becomes smaller than the non-discharging line, the comparator output toggles and marks the STOP event to the TDC to stop the time measurement. The time difference between the START and STOP forms a time $T_{OD,j}$ that can be derived by equating the time it takes for the larger voltage bit line to discharge through the reference conductance $G_{ref}$ to the voltage of the smaller voltage bit line. Equating the two voltages after time $T_{OD,j}$ results in:

$$V_P \exp\left(-1 \cdot \sum_{i=0}^{n-1} \frac{G_0 + W_{ij} \cdot G_u}{C_{BL}} \cdot T_a \cdot X_i\right) = \quad (79)$$

$$V_P \exp\left(-1 \cdot \sum_{i=0}^{n-1} \frac{G_0 - W_{ij} \cdot G_u}{C_{BL}} \cdot T_a \cdot X_i\right) \exp\left(\frac{-t_{OD} \cdot G_{ref}}{C_{BL}}\right)$$

Rearranging the equation results in:

$$\exp\left(-2\frac{G_u}{C_{BL}} \cdot T_a \cdot \sum_{i=0}^{n-1} W_{ij} X_i\right) = \exp\left(\frac{-t_{OD} \cdot G_{ref}}{C_{BL}}\right) \quad (80)$$

Where $T_{OD}$ can be derived as:

$$t_{OD} = 2\frac{G_u}{G_{ref}} \cdot T_a \cdot \sum_{j=0}^{n-1} W_{ij} X_j \quad (81)$$

Equation (81) shows once more that the third approach also implements a ratiometric evaluation of the crossbar network dot product output with first order independence from the circuit element values with synchronous activation and TDC time references (equation 57) and ratiometric impedance levels ($G_{ref} = M \cdot G_u$), which results in the same digital output $Y_j$ as described by equation (78), e.g., only a function of integer activations and weights.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, to the extent any embodiments are described as less desirable than other embodiments or prior art implementations with respect to one or more characteristics, these embodiments are not outside the scope of the disclosure and can be desirable for particular applications.

What is claimed is:

1. A read-only memory (ROM) computing unit utilized in matrix operations of a neural network, comprising:
   a unit element including one or more connections, wherein a weight associated with the computing unit is responsive to either a connection or lack of connection internal to the unit cell or between the unit element and a wordline and a bitline utilized to form an array of rows and columns in the ROM computing unit;
   one or more passive or active electrical elements located in the unit element, wherein the passive or active electrical elements are configured to adjust the weight associated with the compute unit, wherein the ROM computing unit is configured to receive an input and output a value associated with the matrix operation, wherein the value is responsive to the input and weight, wherein the weight is configured to be coded in a gate connection of one or more transistors of a read-only memory unit associated with the ROM computing unit, and wherein the one or more transistors include a conductance value, wherein the conductance value is scaled via a scaling factor applied to the weight, wherein the weight modifies the capacitance of the ROM computing unit, and the weight is unmodifiable upon being programmed and an order of one or more transistors and one or more capacitors is configured to be switched.

2. The ROM computing unit of claim 1, wherein the weight associated with the computing unit is responsive to either the connection or lack of connection between components internal to the unit cell.

3. The ROM computing unit of claim 1, wherein the passive elements includes at least a resistor or a capacitor.

4. The ROM computing unit of claim 1, wherein the active electrical elements includes a single transistor that includes a first terminal connected to the bit line and a second terminal connected to a reference voltage.

5. The ROM computing unit of claim 1, wherein one or more connections utilize one or more metal contacts or via connections.

6. The ROM computing unit of claim 1, wherein the one or more active elements includes a plurality of transistors that each includes a first terminal connection to the wordline or the bitline, and a second terminal connection to the wordline or bitline.

7. The ROM computing unit of claim 1, wherein the active electrical elements includes a single transistor that includes a gate terminal connected to the wordline.

8. The ROM computing unit of claim 1, wherein the passive electrical elements includes a single resistor or capacitor connected to the bitline for a first binary weight value and connected to the wordline for a second binary weight value, wherein the first binary weight value and the second binary weight value are a same value or different value.

9. The ROM computing unit of claim 1, wherein the passive electrical elements includes a single resistor or capacitor connected to the bitline and to the wordline for a binary weight value.

10. A hybrid memory computing unit utilized in matrix operations of a neural network, comprising:
- a first layer including random access memory (RAM) including a RAM compute unit, wherein the RAM compute unit is configured to store reprogrammable task parameters, wherein the task parameters are modifiable as associated with a neural network models;
- a second layer including a read only memory (ROM) that includes a read only memory unit including one or more connections, wherein a weight associated with a ROM computing unit is responsive to either a connection or lack of connection internal to the unit cell or between the read only memory unit and a wordline and a bitline utilized to form an array of rows and columns in the ROM computing unit, wherein the weight associated with the ROM computing unit is one-time programmable via a contact or connection and the weight is unmodifiable upon being programmed; and
- one or more passive or active electrical elements located in the read only memory unit, wherein the passive or active electrical elements are configured to adjust the weight associated with the ROM compute unit, wherein the ROM computing unit is configured to receive an input and output a value associated with the matrix operation, wherein the value is responsive to the input and weight.

11. The hybrid memory computing unit of claim 10, wherein the first layer and the second layer are a same layer.

12. The hybrid memory computing unit of claim 10, wherein the ROM is a non-volatile memory.

13. The hybrid memory computing unit of claim 10, wherein the first layer is in a first block and the second layer is a same layer in an adjacent block.

14. A read-only memory (ROM) computing unit utilized in matrix operations of a neural network, comprising:
- a plurality of levels forming a three dimensional (3D) structure containing at least a read-only memory unit including one or more connections, wherein a weight associated with the ROM computing unit is responsive to either a connection or lack of connection internal to the read-only memory unit and a wordline and a bitline utilized to form an array of rows and columns in the ROM computing unit, wherein the weight associated with the ROM computing unit is one-time programmable via a contact or connection; and
- one or more passive or active electrical elements located in the read-only memory unit, wherein the passive or active electrical elements are configured to adjust the weight associated with the ROM computing unit, wherein the ROM computing unit is configured to receive an input and output a value associated with the matrix operation, wherein the value is responsive to the input and weight, wherein the weight is unmodifiable upon being programmed.

15. The ROM computing unit of claim 14, wherein the 3D structure includes a plurality of the ROM computing units.

16. The ROM computing unit of claim 14, wherein the 3D structure includes one or more reprogrammable memory-based compute units that are RRAM, PCM, SRAM, FeRAM, or flash memory.

17. The ROM computing unit of claim 14, wherein one or more ROM-based IMC arrays are 3D stacked in a metal layer above another ROM-based IMC array utilizing a substrate layer and a lower metal layer.

18. The ROM computing unit of claim 1, wherein the weight is encoded to either a voltage $V_{on}$ or to a voltage $V_{off}$.

19. The hybrid memory computing unit of claim 10, wherein the passive elements include either a resistor or capacitor and the active element includes a transistor, and the resistor, capacitor, or transistor are configured to adjust the weight associated with the ROM computing unit.

20. The ROM computing unit of claim 17, wherein the substrate layer includes a semiconductor material layer.

* * * * *